US009495929B2

(12) United States Patent
Horiuchi et al.

(10) Patent No.: US 9,495,929 B2
(45) Date of Patent: Nov. 15, 2016

(54) SHIFT REGISTER, DRIVER CIRCUIT AND DISPLAY DEVICE

(71) Applicant: Sharp Kabushiki Kaisha, Osaka-shi, Osaka (JP)

(72) Inventors: Satoshi Horiuchi, Osaka (JP); Shinya Tanaka, Osaka (JP); Akira Tagawa, Osaka (JP); Yasuaki Iwase, Osaka (JP); Takayuki Mizunaga, Osaka (JP); Akihisa Iwamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 154 days.

(21) Appl. No.: 14/383,146

(22) PCT Filed: Mar. 5, 2013

(86) PCT No.: PCT/JP2013/056004
§ 371 (c)(1),
(2) Date: Sep. 5, 2014

(87) PCT Pub. No.: WO2013/137069
PCT Pub. Date: Sep. 19, 2013

(65) Prior Publication Data
US 2015/0030116 A1    Jan. 29, 2015

(30) Foreign Application Priority Data
Mar. 12, 2012    (JP) ................................. 2012-055086

(51) Int. Cl.
*G11C 19/00*    (2006.01)
*G09G 3/36*    (2006.01)
(Continued)

(52) U.S. Cl.
CPC .......... *G09G 3/3677* (2013.01); *G09G 3/3674* (2013.01); *G11C 19/28* (2013.01); *G11C 27/04* (2013.01); *G09G 2310/0281* (2013.01); *G09G 2310/0286* (2013.01)

(58) Field of Classification Search
None
See application file for complete search history.

(56) References Cited

U.S. PATENT DOCUMENTS 7,233,308 B2 *  6/2007  Park .................... G09G 3/3677
345/100
7,436,923 B2 * 10/2008  Tobita ................. G09G 3/3677
377/64
(Continued)

FOREIGN PATENT DOCUMENTS

JP    2010-049767 A    3/2010
WO    2011/007464 A1    1/2011

OTHER PUBLICATIONS

Official Communication issued in International Patent Application No. PCT/JP2013/056004, mailed on Jun. 11, 2013.
(Continued)

*Primary Examiner* — Tuan T Lam
(74) *Attorney, Agent, or Firm* — Keating & Bennett, LLP

(57) ABSTRACT

A shift register is configured so that each of first and second intermediate stages includes (i) a first input terminal supplied with a clock signal, (ii) a second input terminal supplied with a clock signal different in phase from the clock signal supplied to the first input terminal, (iii) an output terminal connected to the first input terminal via an output transistor, and (iv) a setting circuit, which is connected to the second input terminal and the output transistor, for setting an electric potential of a control terminal of the output transistor, the second intermediate stage includes a control circuit which is (i) connected to the setting circuit of the second intermediate stage and (ii) supplied with a control signal, an operation period (i) starts at a time when a shift start signal supplied to an initial stage is activated and (ii) ends at a time when an output of a final stage changes from activation to inactivation, and when the clock signal supplied to the first input terminal of the second intermediate stage is initially activated after the operation period starts, the clock signal supplied to the second input terminal of the second intermediate stage is inactive.

20 Claims, 88 Drawing Sheets

(51) Int. Cl.
*G11C 19/28* (2006.01)
*G11C 27/04* (2006.01)

(56) References Cited

U.S. PATENT DOCUMENTS

| | | | | |
|---|---|---|---|---|
| 7,949,086 B2* | 5/2011 | Tsai | ........................ | G11C 19/28 377/64 |
| 8,548,115 B2* | 10/2013 | Shang | .................. | G09G 3/3677 377/64 |
| 8,587,508 B2* | 11/2013 | Iwase | .................. | G09G 3/3677 345/100 |
| 8,923,473 B2* | 12/2014 | Sasaki | .................. | G11C 19/184 377/64 |
| 2005/0220262 A1* | 10/2005 | Moon | .................... | G11C 19/00 377/64 |
| 2006/0146978 A1* | 7/2006 | Jang | ..................... | G09G 3/3677 377/64 |
| 2010/0007653 A1 | 1/2010 | Ahn et al. | | |
| 2010/0084651 A1* | 4/2010 | Yamazaki | ........... | H01L 27/1225 257/43 |
| 2011/0222645 A1 | 9/2011 | Tobita | | |
| 2012/0121061 A1* | 5/2012 | Sakamoto | .............. | G11C 19/28 377/64 |
| 2012/0242630 A1* | 9/2012 | Ohara | .................. | G09G 3/3677 345/204 |
| 2013/0028370 A1* | 1/2013 | Kikuchi | ................ | G09G 3/3677 377/64 |
| 2013/0100007 A1* | 4/2013 | Yamamoto | ........... | G09G 3/3677 345/100 |
| 2014/0119491 A1* | 5/2014 | Liu | ........................ | G11C 19/28 377/64 |
| 2014/0119493 A1* | 5/2014 | Yang | ...................... | G11C 19/28 377/64 |
| 2014/0160000 A1* | 6/2014 | Ma | ........................ | G09G 3/3677 345/100 |
| 2014/0321599 A1* | 10/2014 | Cho | ..................... | G11C 19/28 377/64 |
| 2015/0269899 A1* | 9/2015 | Ma | ........................... | G09G 3/20 345/213 |

OTHER PUBLICATIONS

Official Communication issued in corresponding European Patent Application No. 13760746.1, mailed on Mar. 20, 2015.

* cited by examiner

SHIFT REGISTER, DRIVER CIRCUIT AND DISPLAY DEVICE

TECHNICAL FIELD

The present invention relates to a shift register for use in a display device etc.

BACKGROUND ART

Patent Literature 1 discloses a technique for reducing power consumption by, during a vertical blanking period of time, causing no clock signal to be supplied to a shift register included in a scan line driving circuit (keeping a clock signal inactive).

CITATION LIST

Patent Literature

Patent Literature 1
Japanese Patent Application Publication, Tokukai, No. 2010-49767 A

SUMMARY OF INVENTION

Technical Problem

The inventors of the present invention found that, in a case where a plurality of clock signals to be supplied to each stage of a shift register are caused not to be supplied to the each stage during a non-operation period of the shift register, the shift register probably malfunctions due to a phase relation between the plurality of clock signals during an initial part of an operation period of the shift register.

An object of the present invention is to prevent malfunction of a shift register in which a plurality of clock signals are supplied to each stage.

Solution to Problem

A shift register of the present invention is configured to include an initial stage, a first intermediate stage, a second intermediate stage, and a final stage, wherein: each of the first and second intermediate stages includes (i) a first input terminal, (ii) a second input terminal, (iii) an output terminal connected to the first input terminal via an output transistor, and (iv) a setting circuit, which is connected to the second input terminal and the output transistor, for setting an electric potential of a control terminal of the output transistor; the first input terminal and the second input terminal are supplied with respective clock signals different in phase from each other; the second intermediate stage includes a control circuit which is (i) connected to the setting circuit and (ii) supplied with a control signal; an operation period (i) starts at a time when a shift start signal supplied to the initial stage is activated and (ii) ends at a time when an output of the final stage changes from activation to inactivation (or an operation period starts at a time when a shift start signal is activated and ends at a time when the final stage is reset); when the clock signal supplied to the first input terminal of the second intermediate stage is initially activated after the operation period starts, the clock signal supplied to the second input terminal of the second intermediate stage is inactive.

By providing the setting circuit in the second intermediate stage, it is possible to prevent malfunction of the second intermediate stage even in a case where the clock signal supplied to the second input terminal of the second intermediate stage is inactive when the clock signal supplied to the first input terminal of the second intermediate stage is initially activated after the operation period starts.

Advantageous Effects of Invention

It is possible to prevent malfunction of a shift register in which a plurality of clock signals are supplied to each stage.

Figure 1:
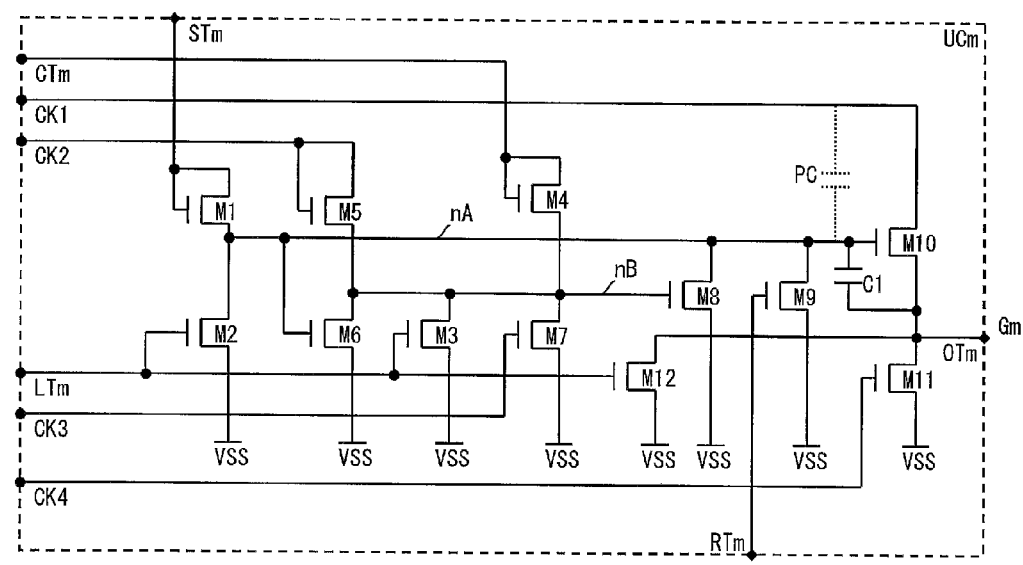
FIG. 1 is a circuit diagram illustrating a unit stage of a shift register of Example 1.
Figure 13:
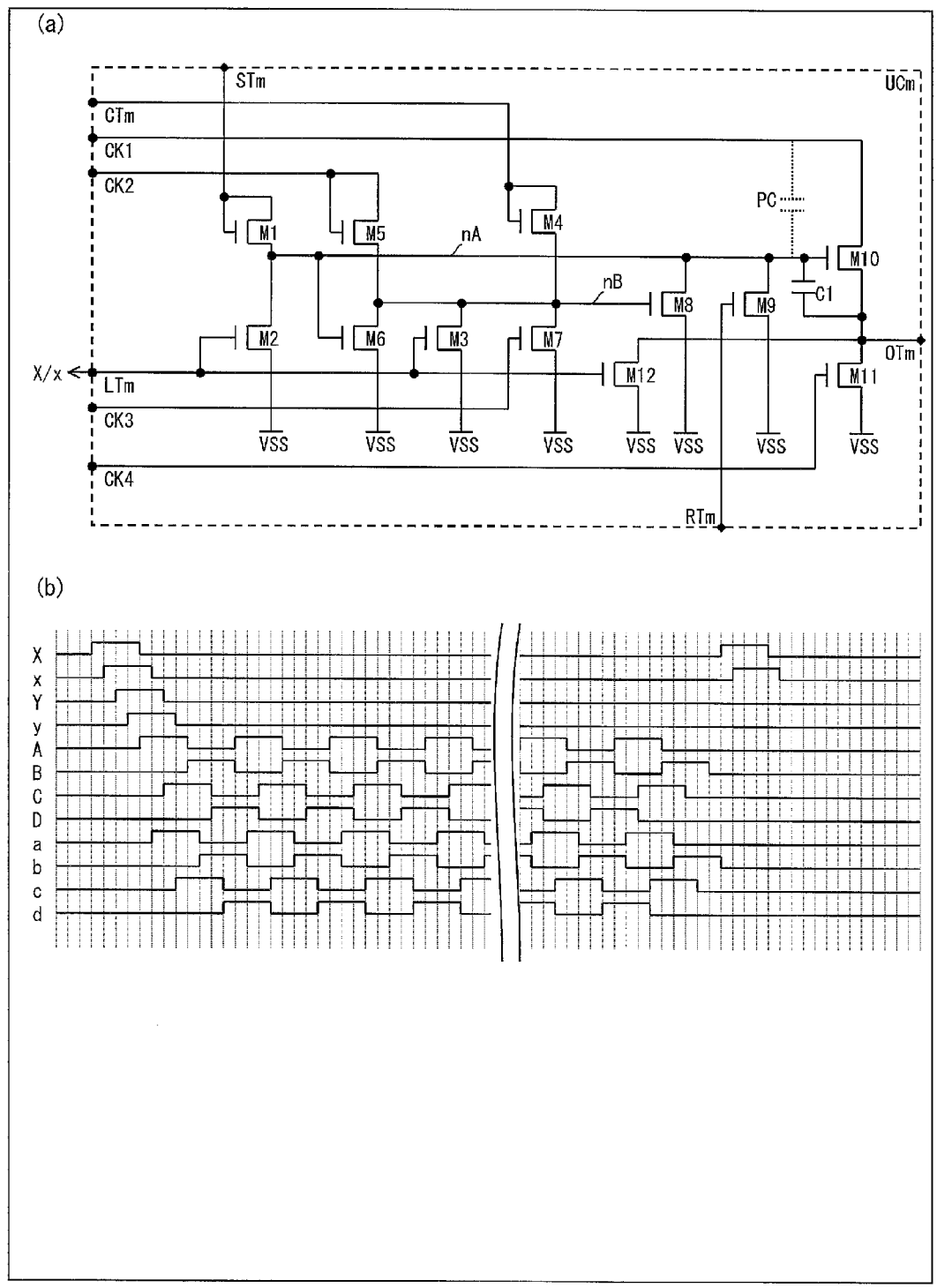

(a) of FIG. 13 is a circuit diagram illustrating a modification of an example configuration illustrated in FIG. 1. (b) of FIG. 13 illustrates waveforms of input signals.

Figure 14:
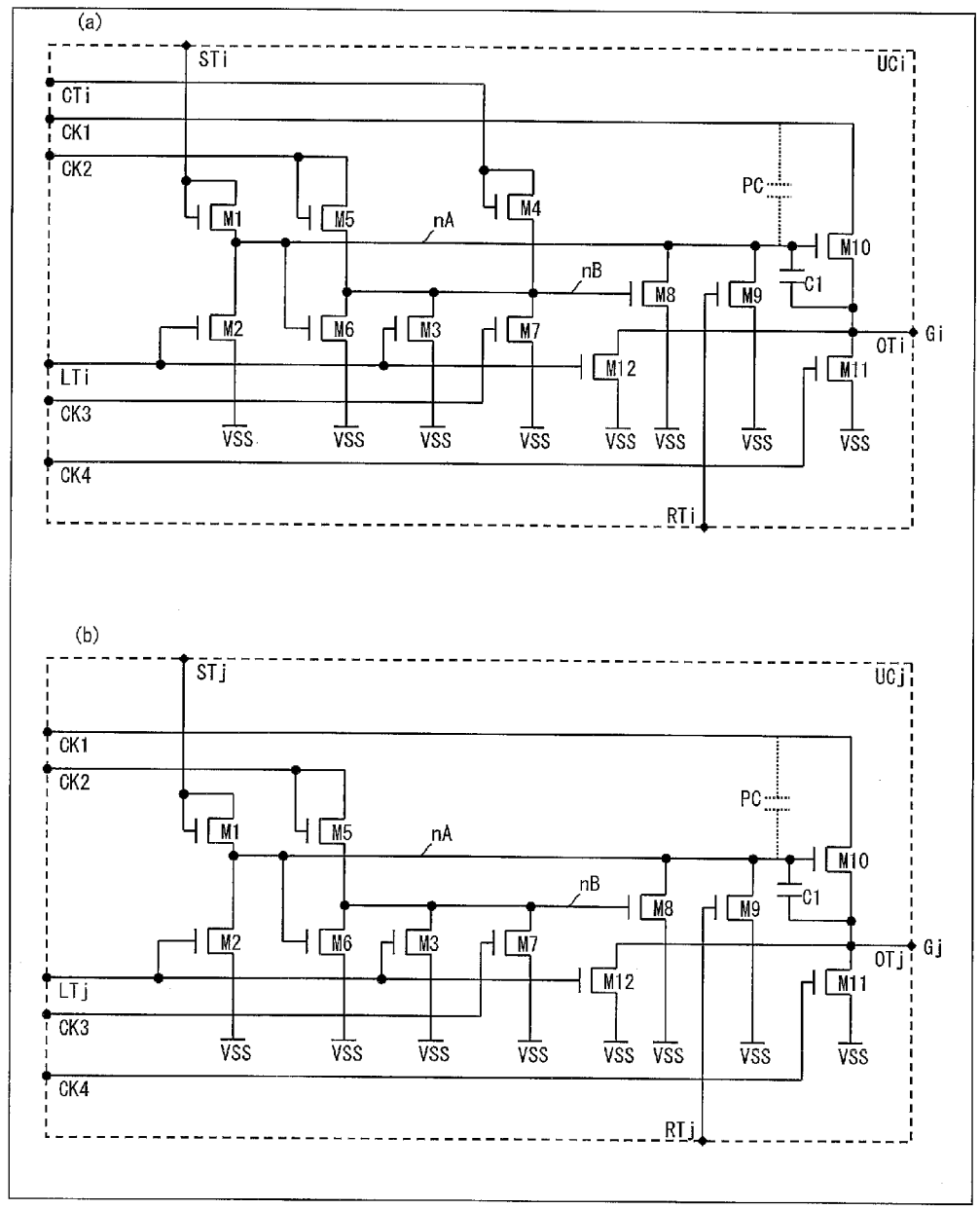

(a) and (b) of FIG. 14 each are a circuit diagram illustrating a unit stage of a shift register of Example 2.

Figure 15:
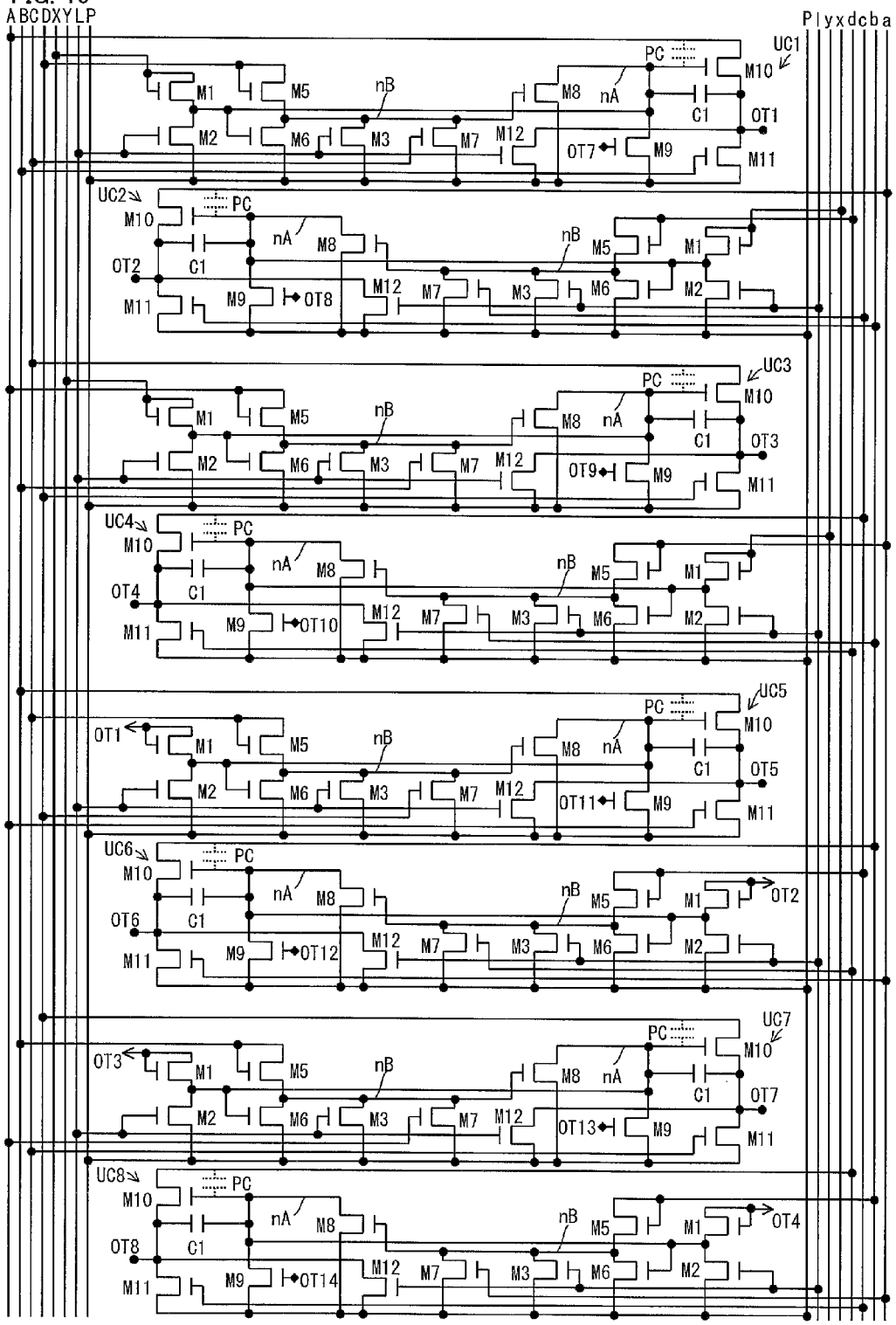

FIG. 15 is a circuit diagram illustrating first through eighth stages of the shift register of Example 2.

Figure 16:
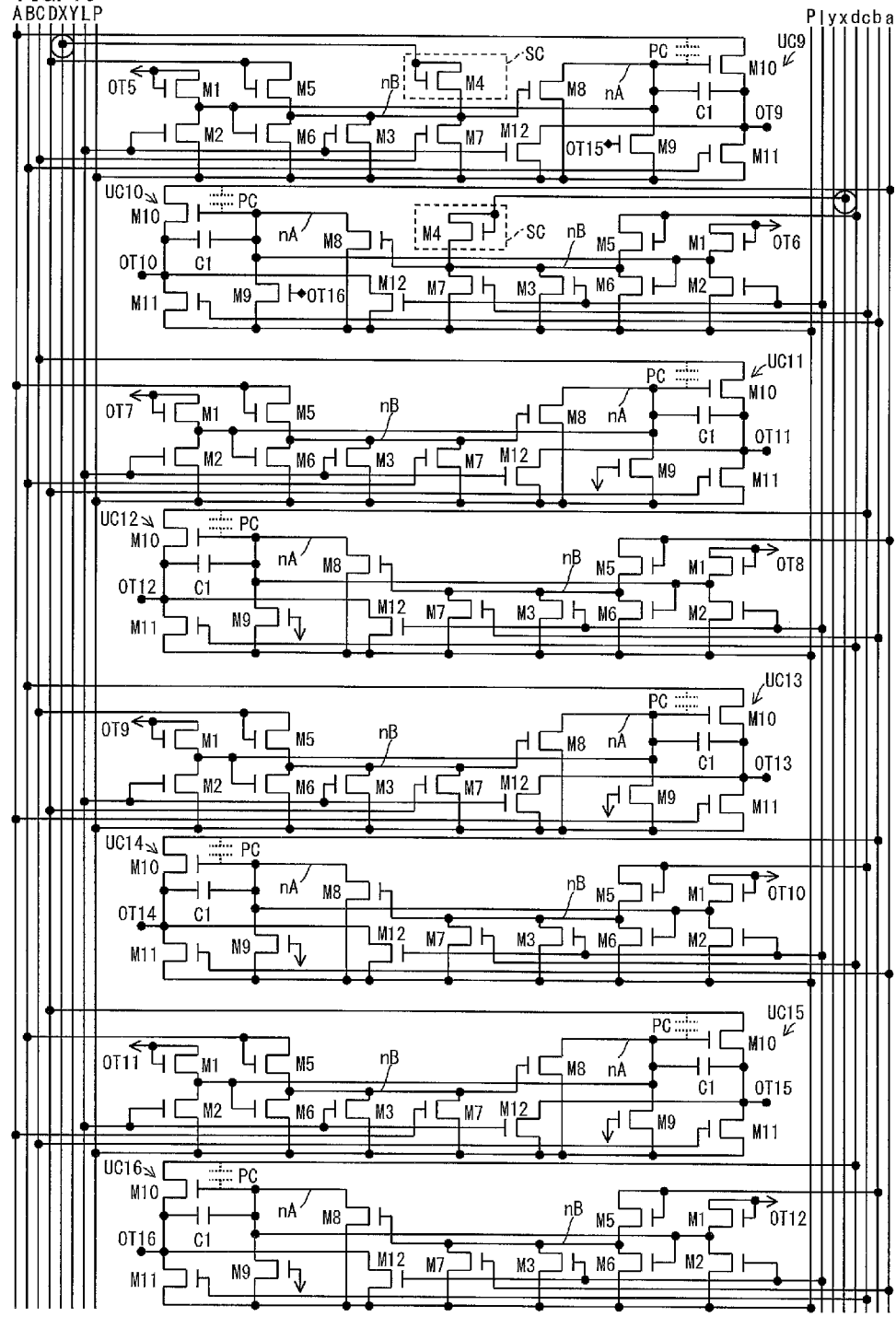

FIG. 16 is a circuit diagram illustrating ninth through $16^{th}$ stages of the shift register of Example 2.

Figure 17:
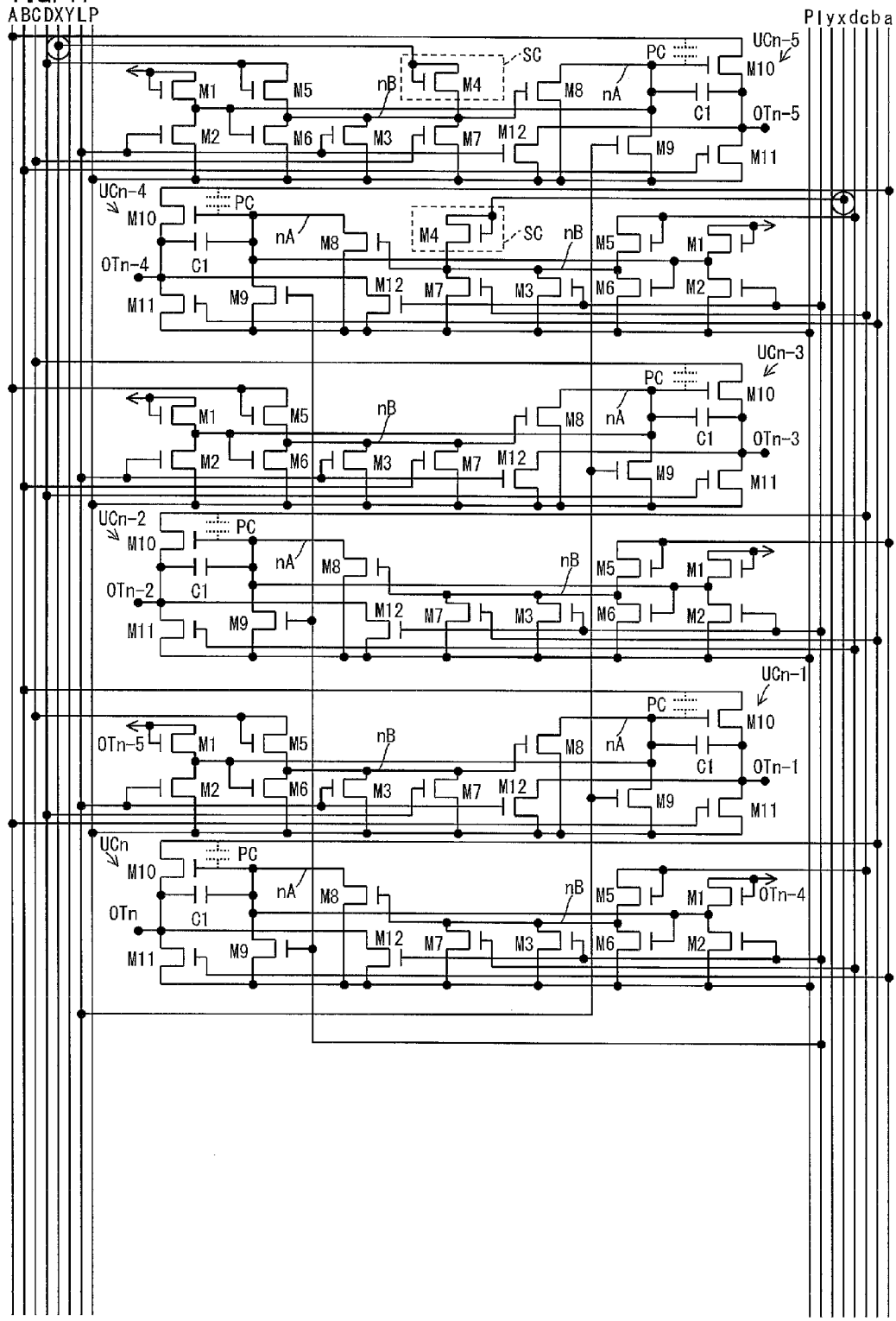

FIG. 17 is a circuit diagram illustrating $(n-5)^{th}$ through $n^{th}$ stages of the shift register of Example 2.

Figure 18:
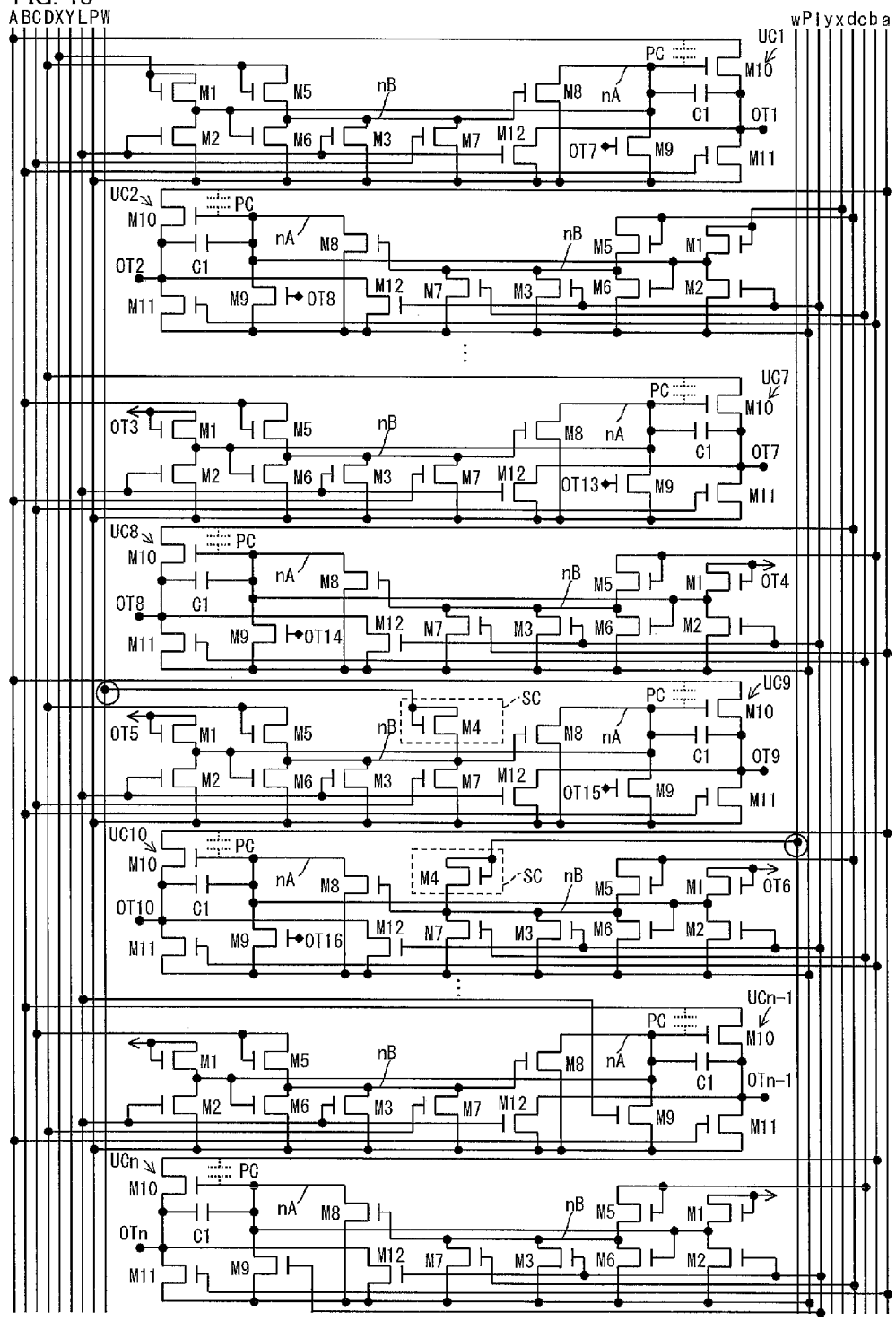

FIG. 18 is a circuit diagram illustrating a first modification of the shift register of Example 2.

Figure 19:
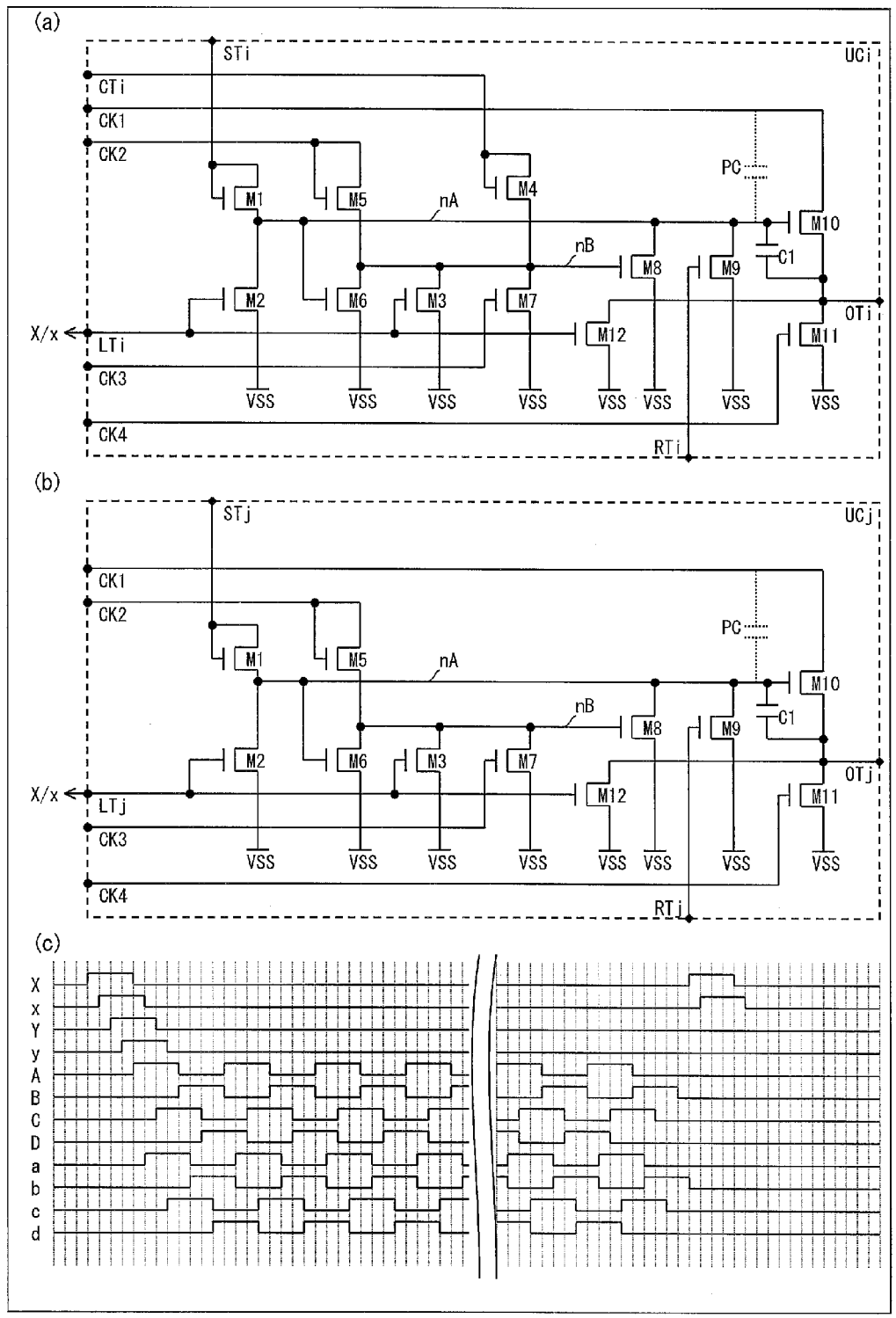

(a) and (b) of FIG. 19 each are a circuit diagram illustrating a modification of an example configuration illustrated in FIG. 14. (c) of FIG. 19 illustrates waveforms of input signals.

Figure 20:
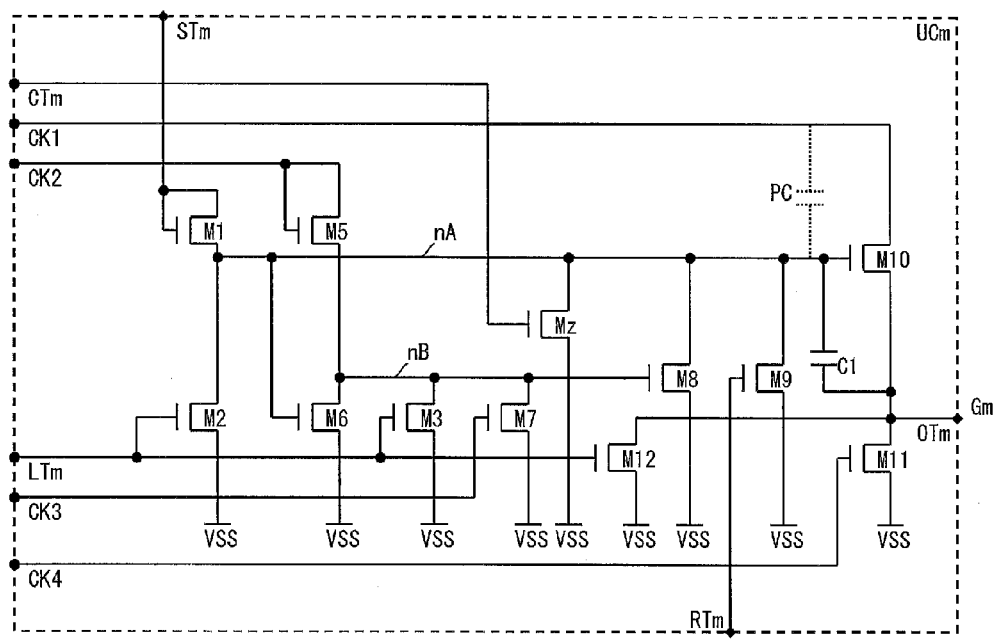

FIG. 20 is a circuit diagram illustrating a unit stage of a shift register of Example 3.

Figure 21:
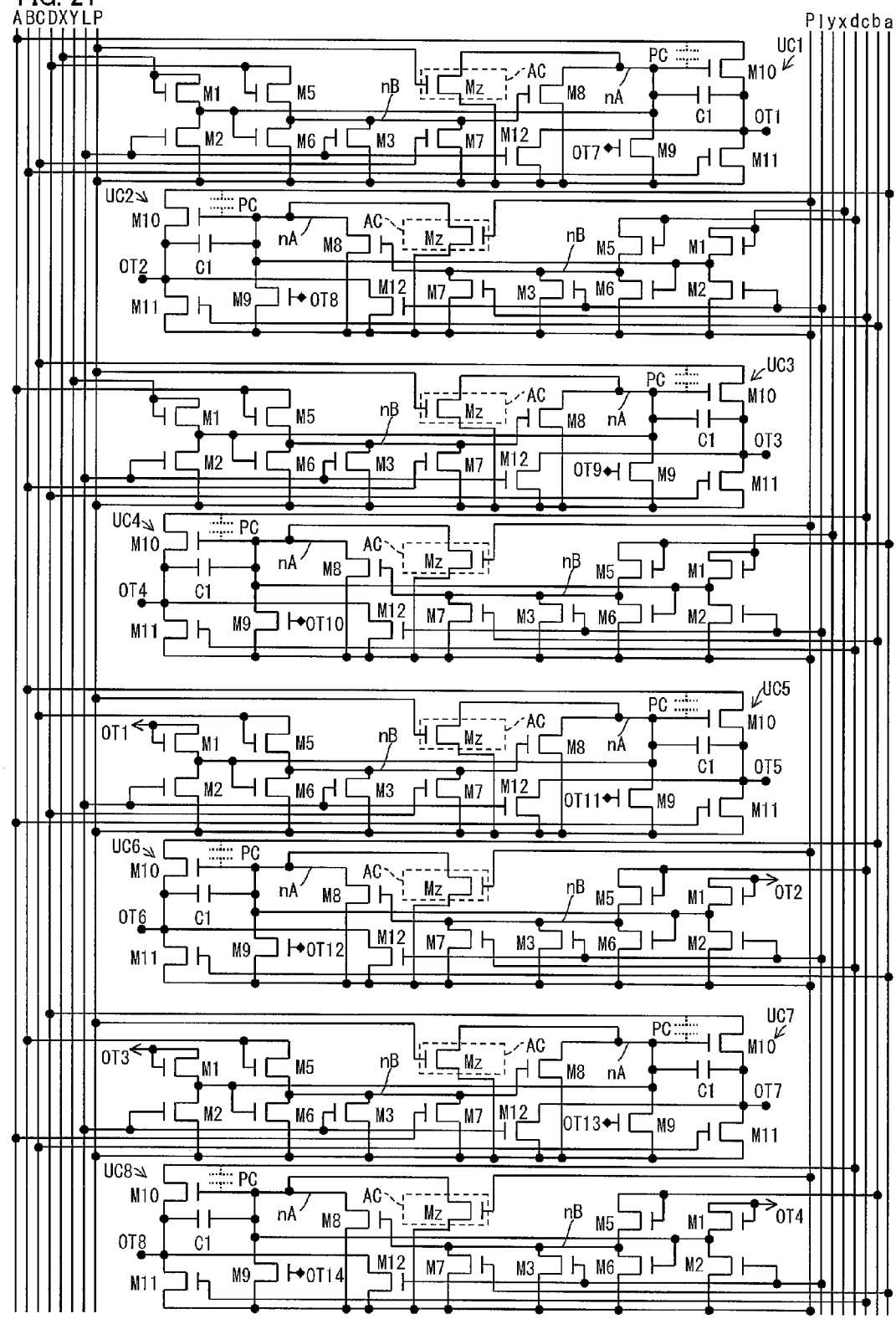

FIG. 21 is a circuit diagram illustrating first through eighth stages of the shift register of Example 3.

Figure 22:
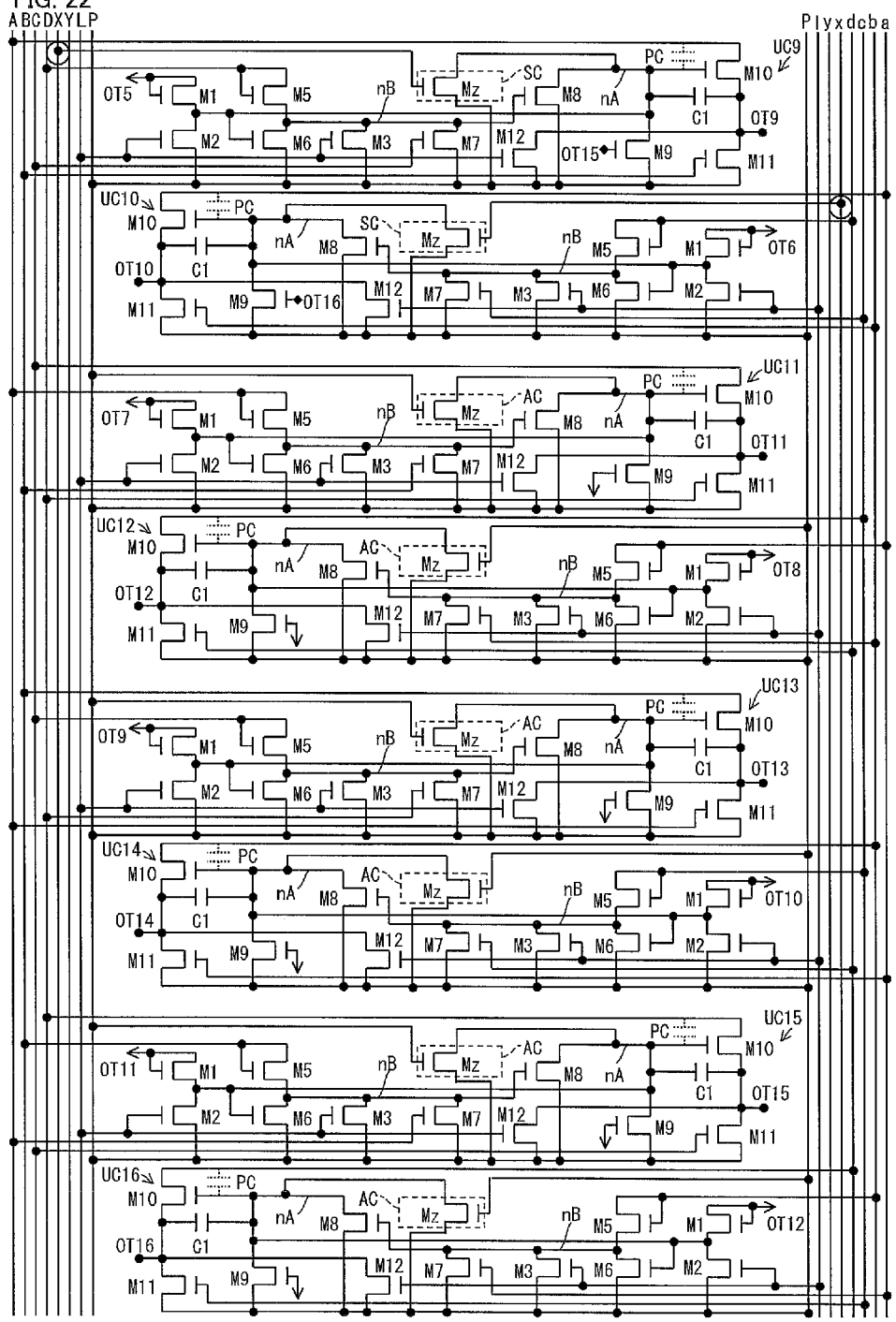

FIG. 22 is a circuit diagram illustrating ninth through $16^{th}$ stages of the shift register of Example 3.

Figure 23:
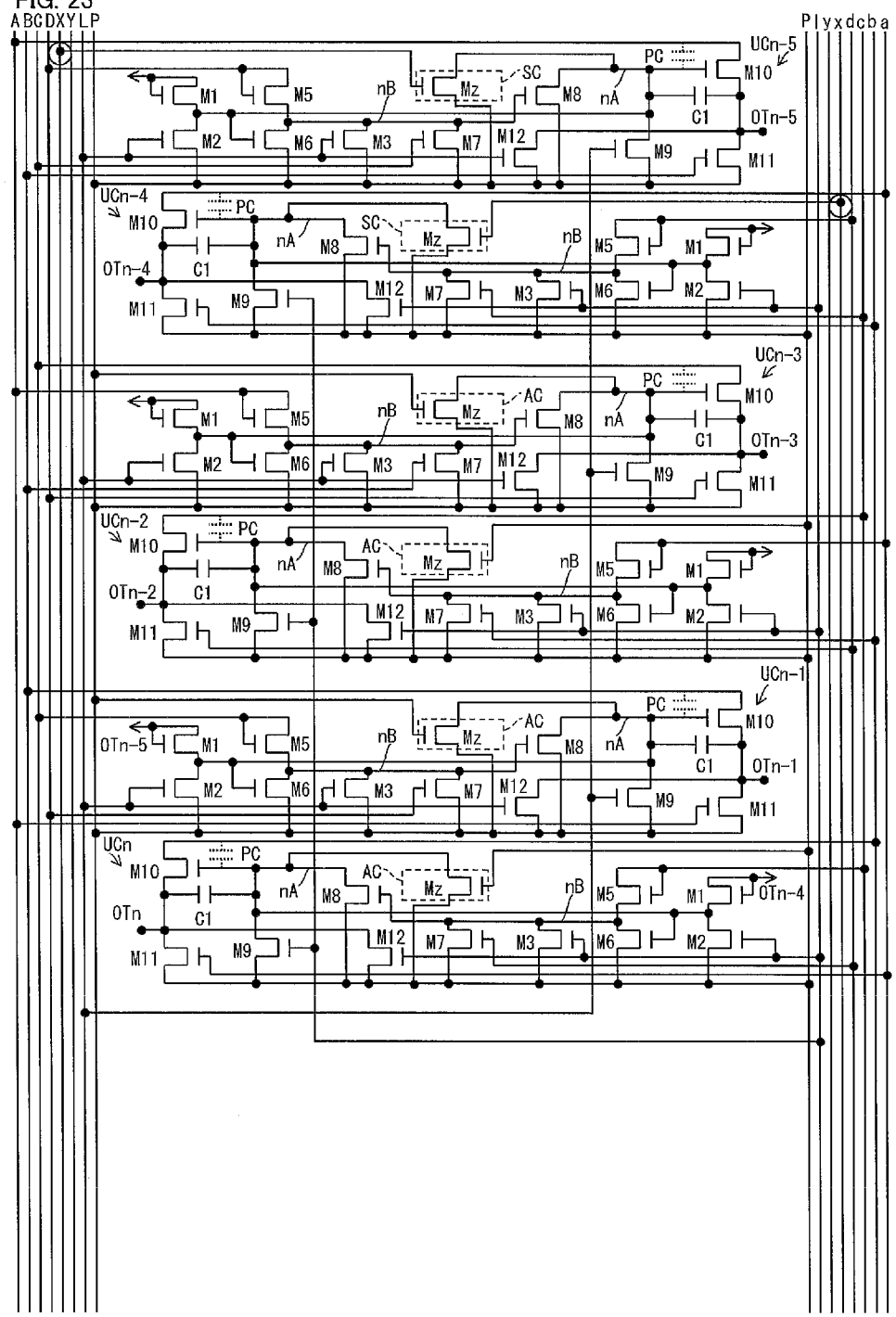

FIG. 23 is a circuit diagram illustrating $(n-5)^{th}$ through $n^{th}$ stages of the shift register of Example 3.

Figure 24:
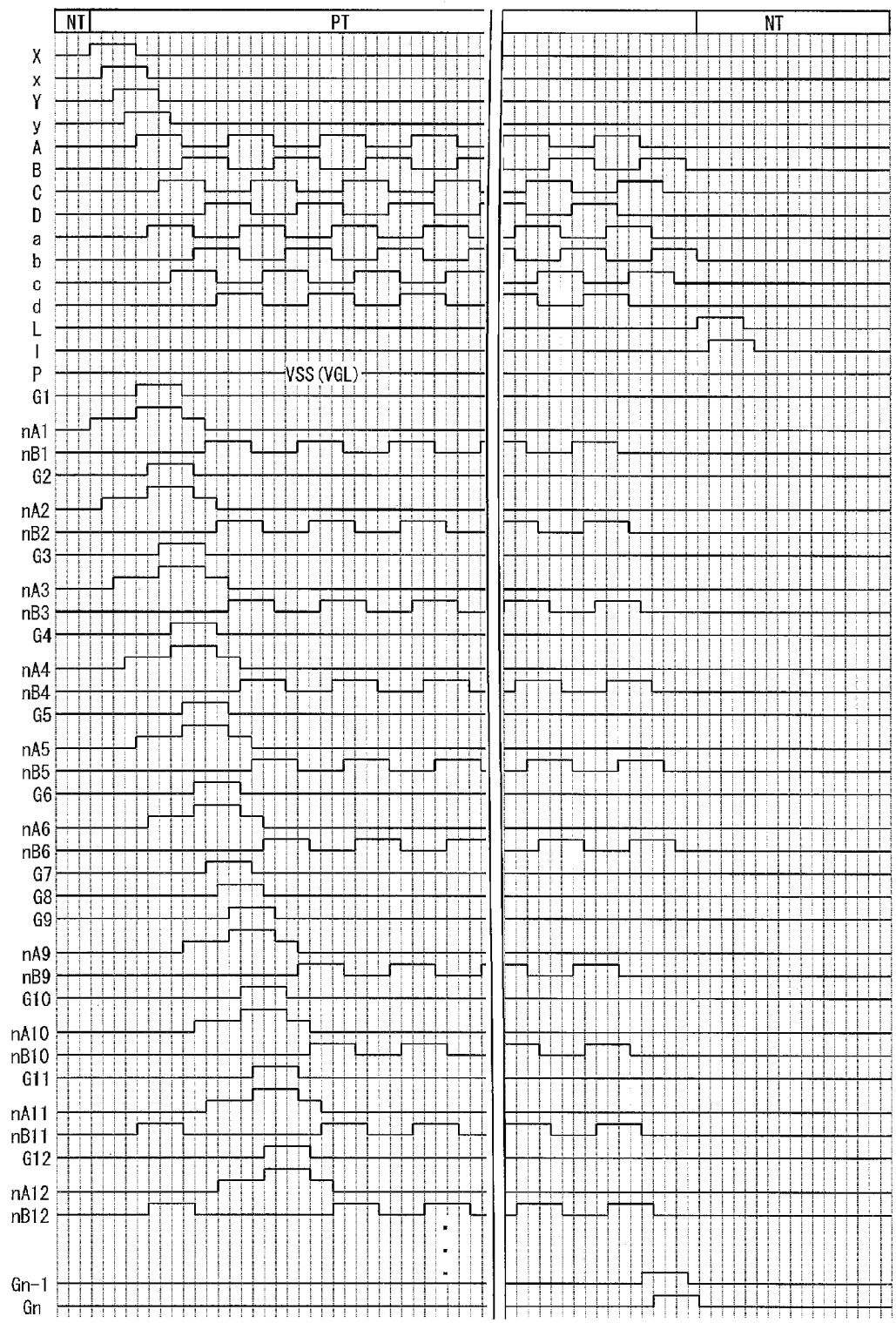

FIG. 24 is a timing chart illustrating an operation of the shift register of Example 3.

Figure 25:
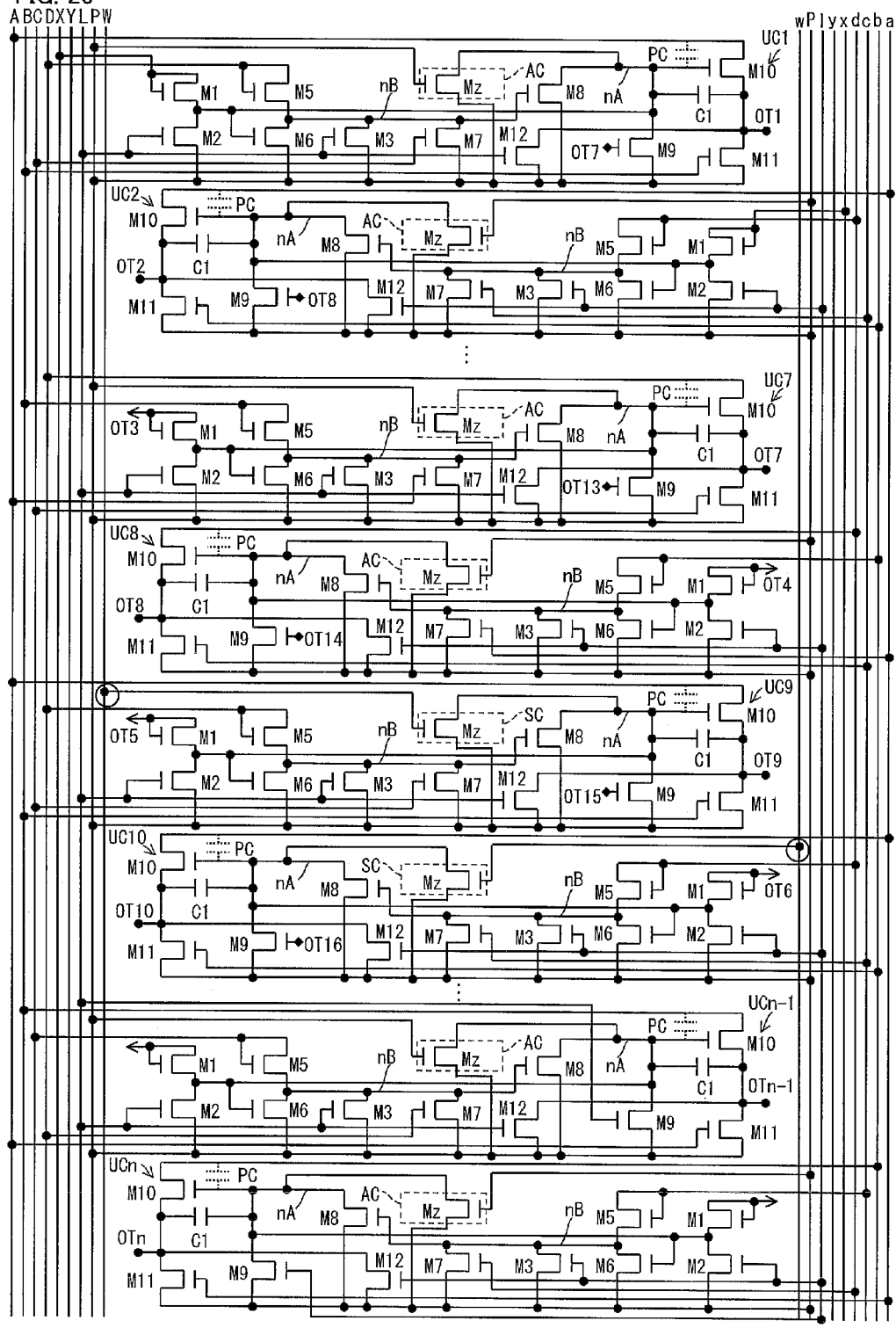

FIG. 25 is a circuit diagram illustrating a first modification of the shift register of Example 3.

Figure 26:
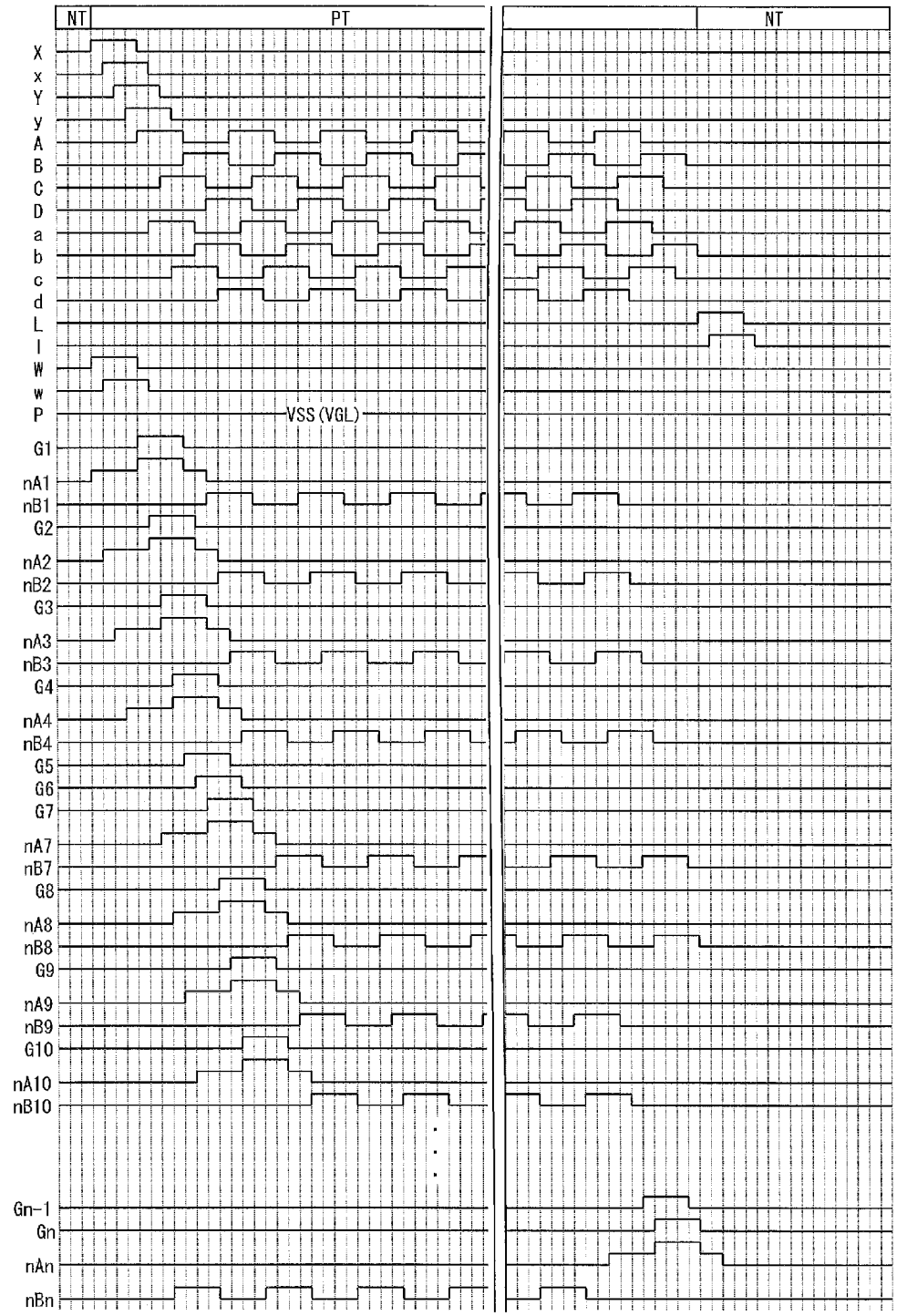

FIG. 26 is a timing chart illustrating an operation of a shift register illustrated in FIG. 25.

Figure 27:
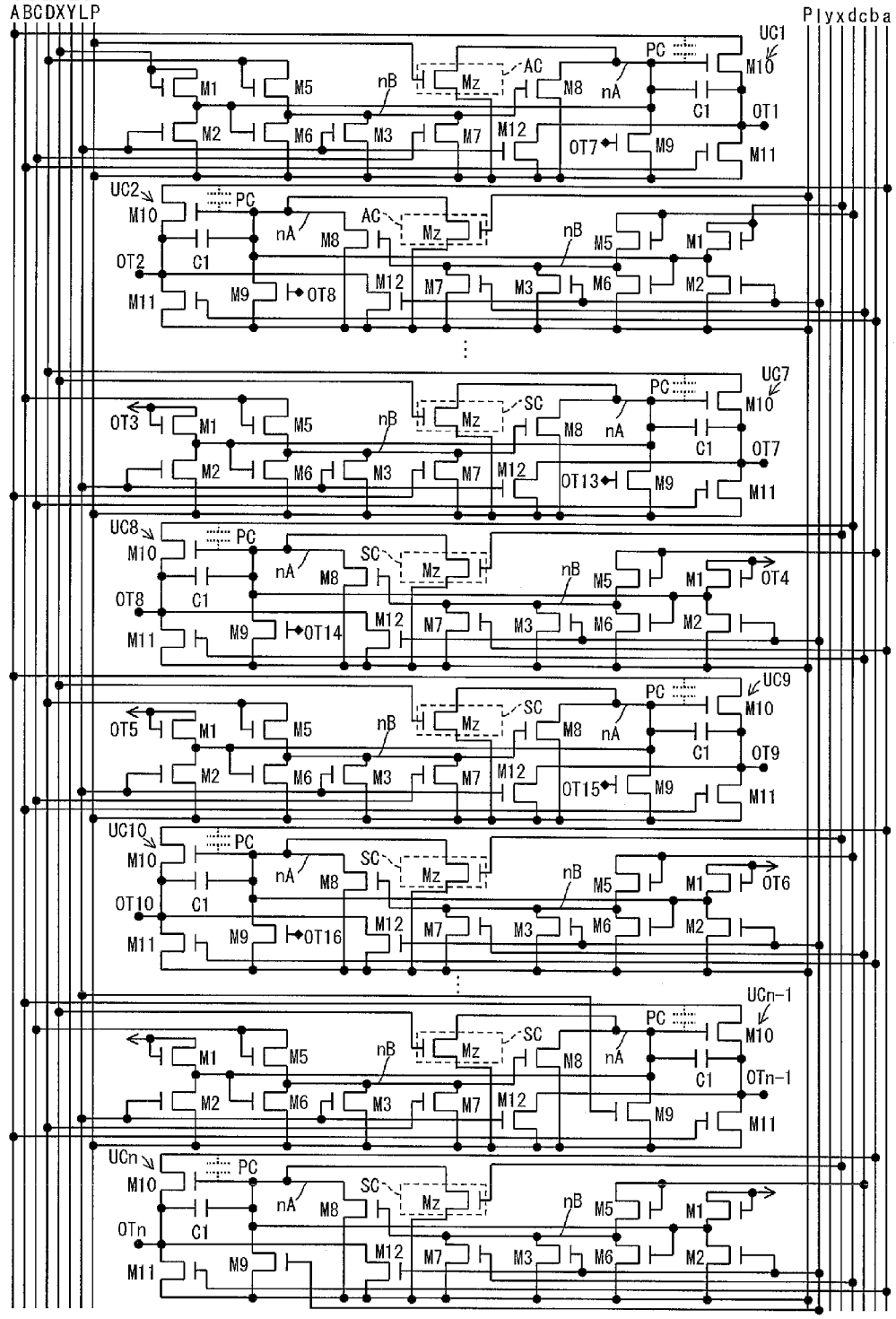

FIG. 27 is a circuit diagram illustrating a second modification of the shift register of Example 3.

Figure 28:
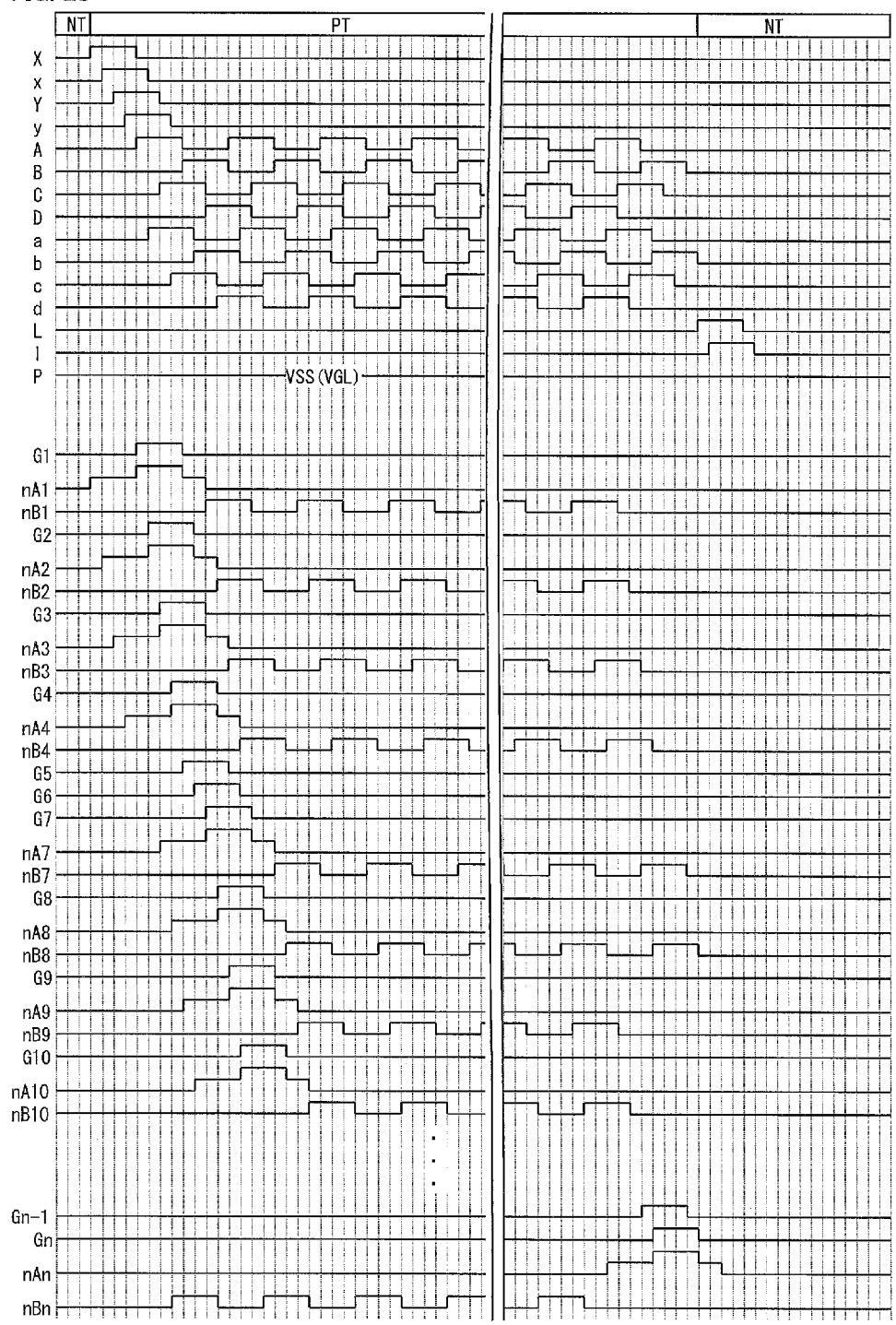

FIG. 28 is a timing chart illustrating an operation of a shift register illustrated in FIG. 27.

Figure 29:
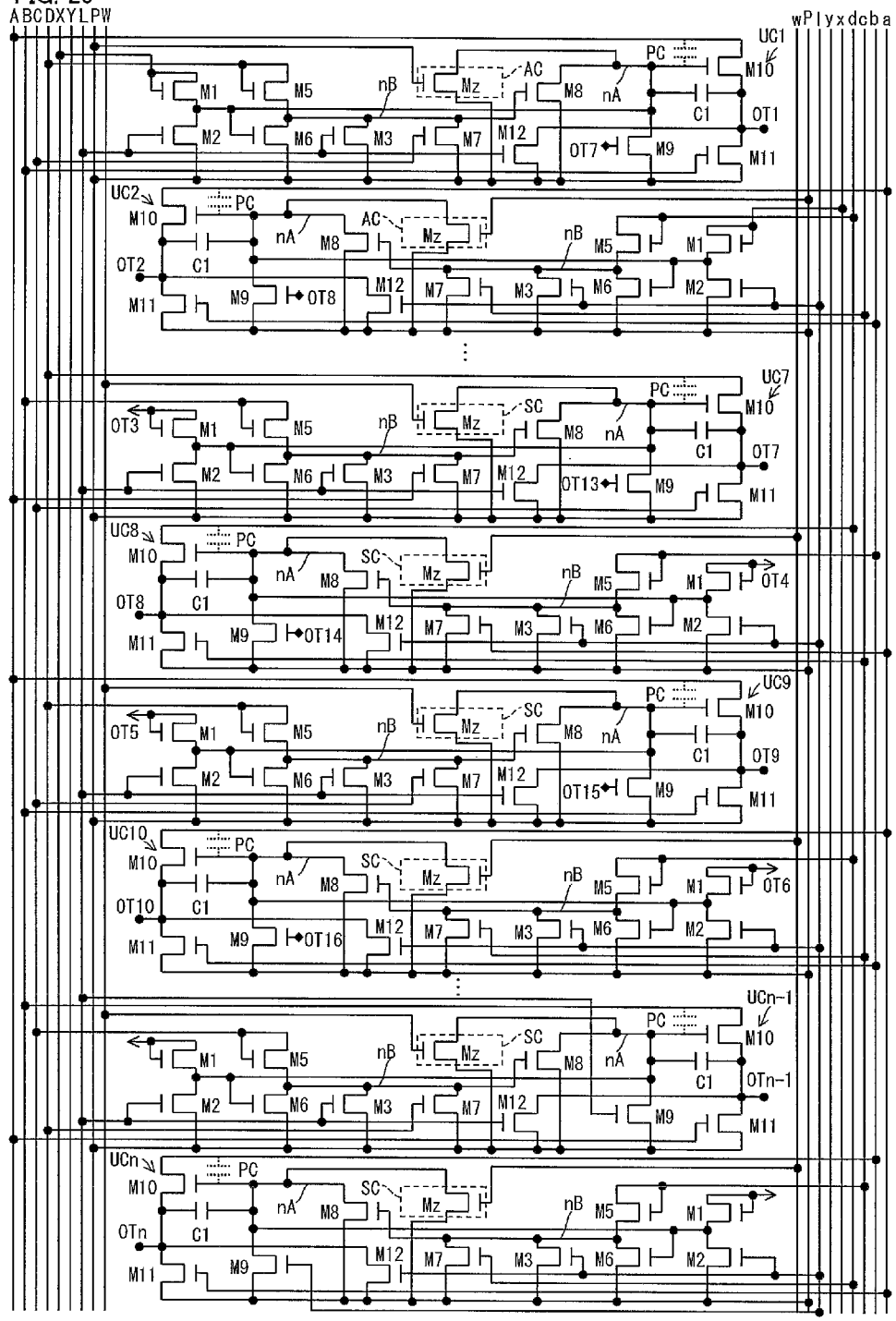

FIG. 29 is a circuit diagram illustrating a third modification of the shift register of Example 1.

Figure 30:
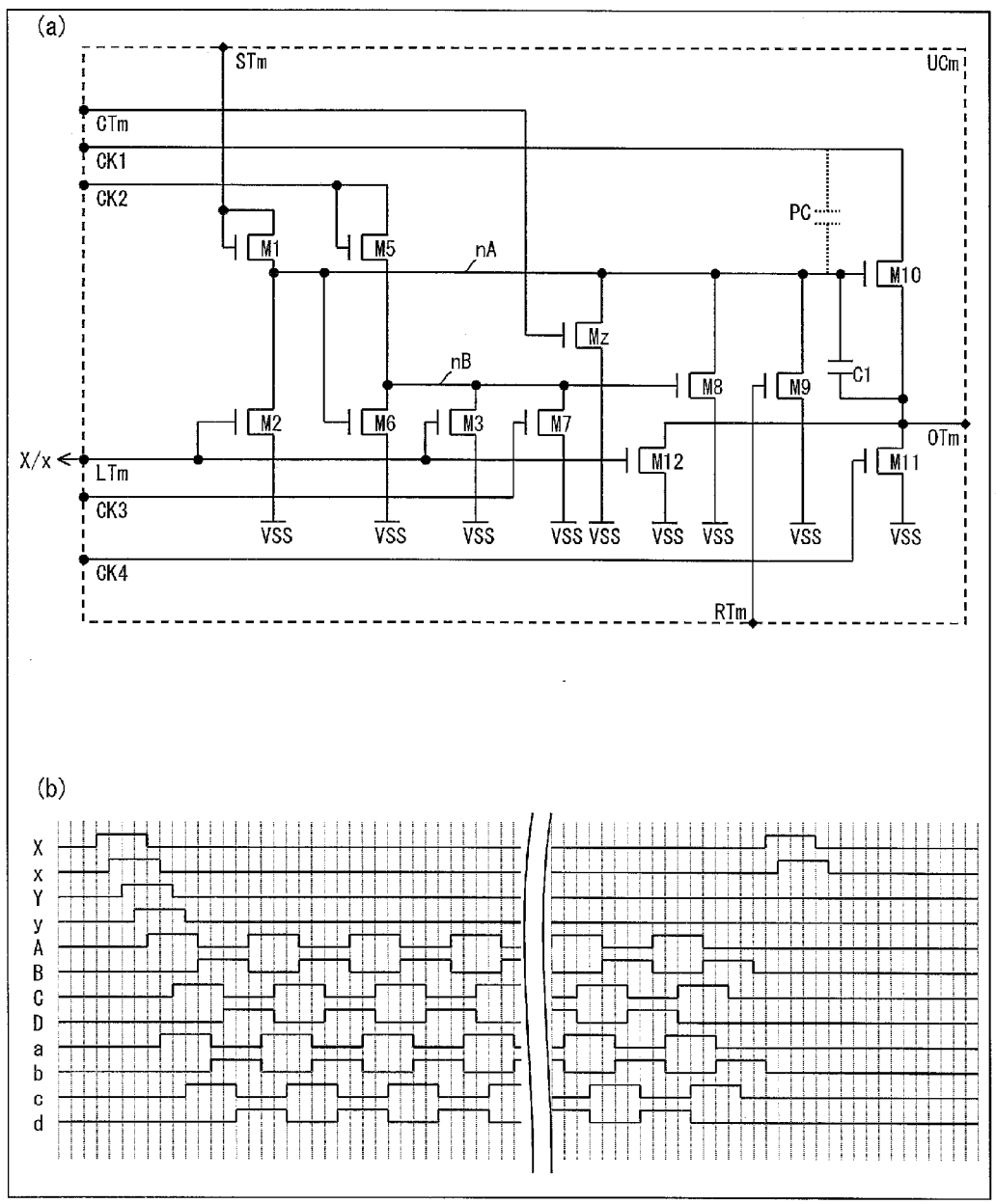

(a) of FIG. 30 is a circuit diagram illustrating a modification of an example configuration illustrated in FIG. 20. (b) of FIG. 30 illustrates waveforms of input signals.

Figure 31:
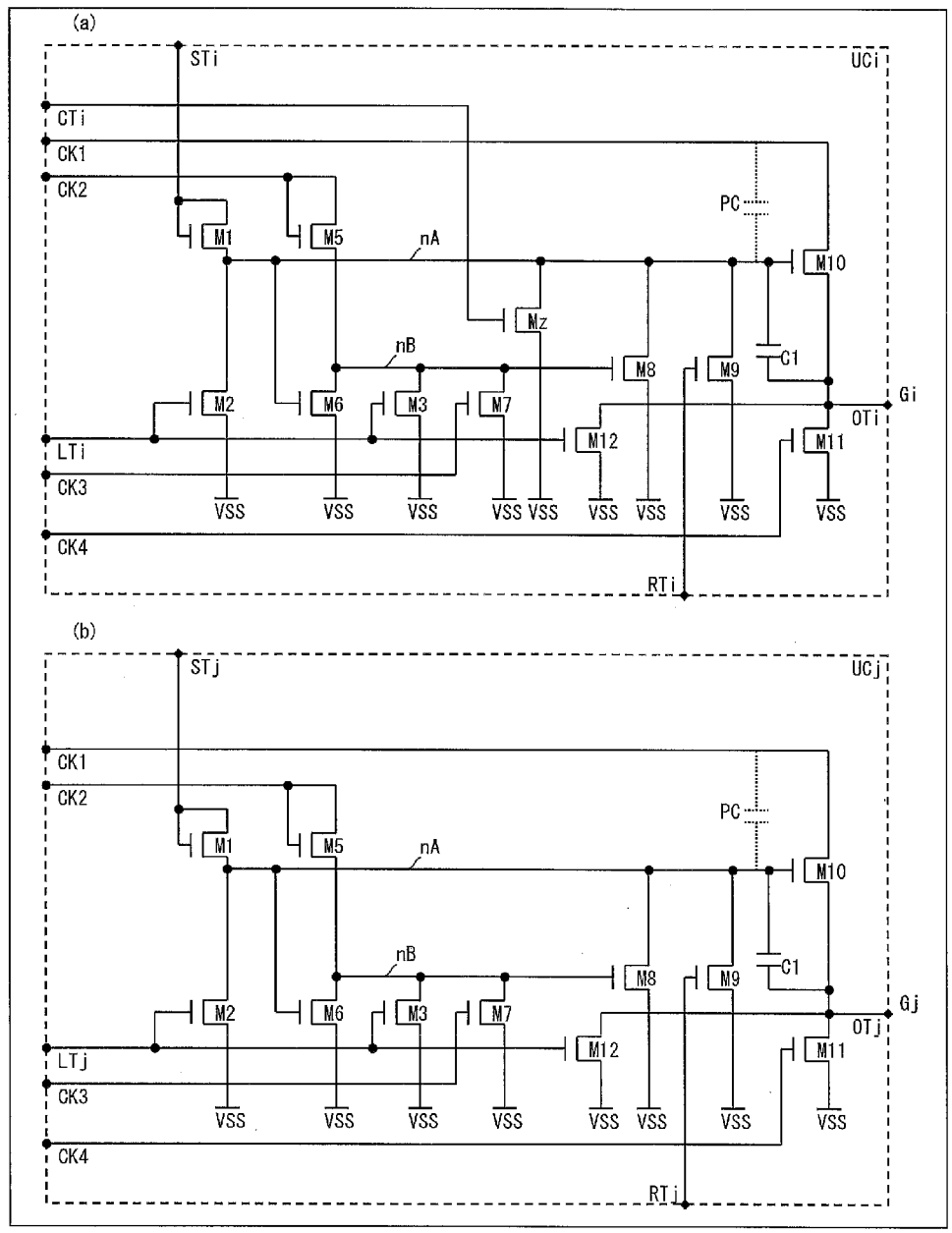

(a) and (b) of FIG. 31 each are a circuit diagram illustrating a unit stage of a shift register of Example 4.

Figure 32:
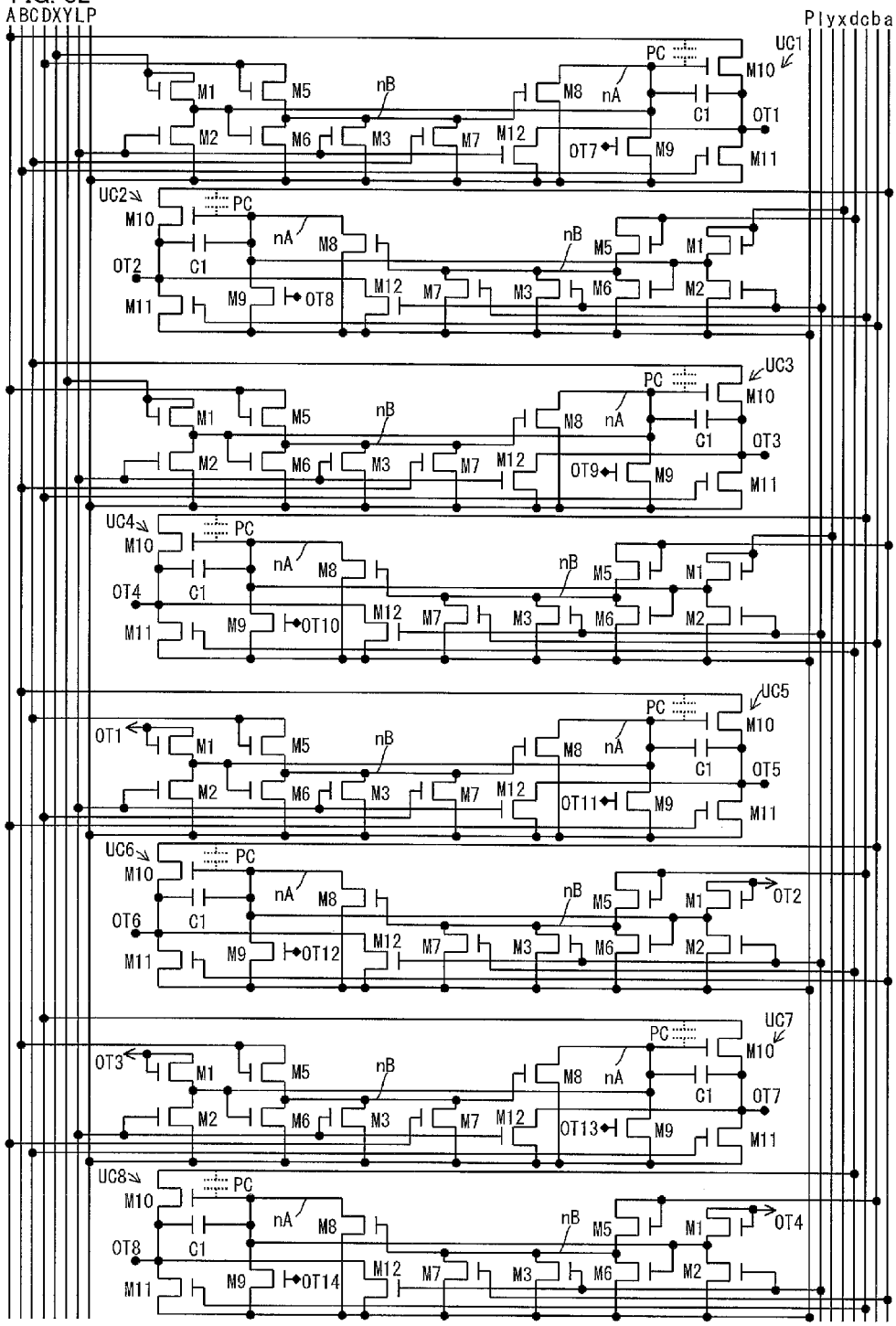

FIG. 32 is a circuit diagram illustrating first through eighth stages of the shift register of Example 4.

Figure 33:
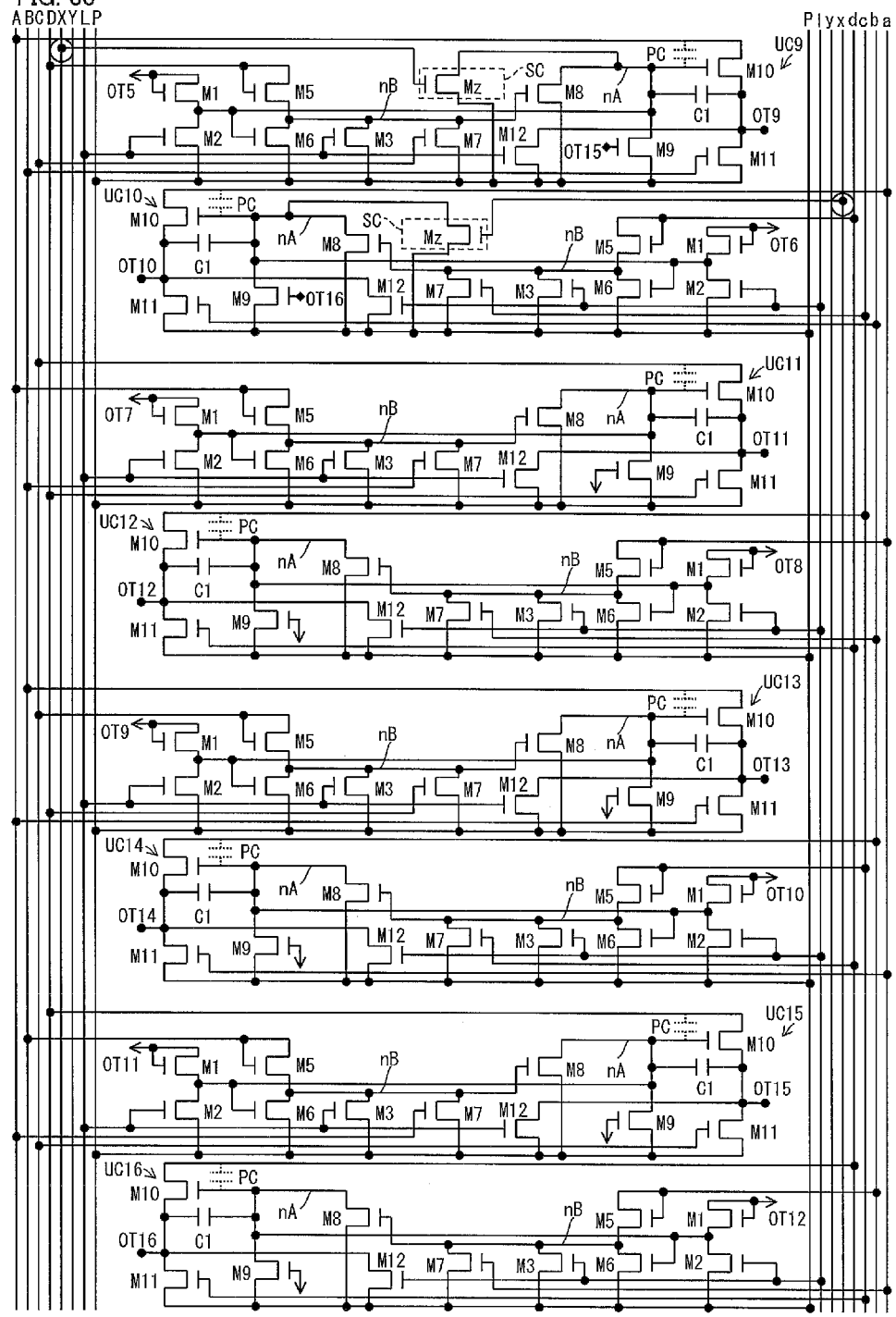

FIG. 33 is a circuit diagram illustrating ninth through $16^{th}$ stages of the shift register of Example 4.

Figure 34:
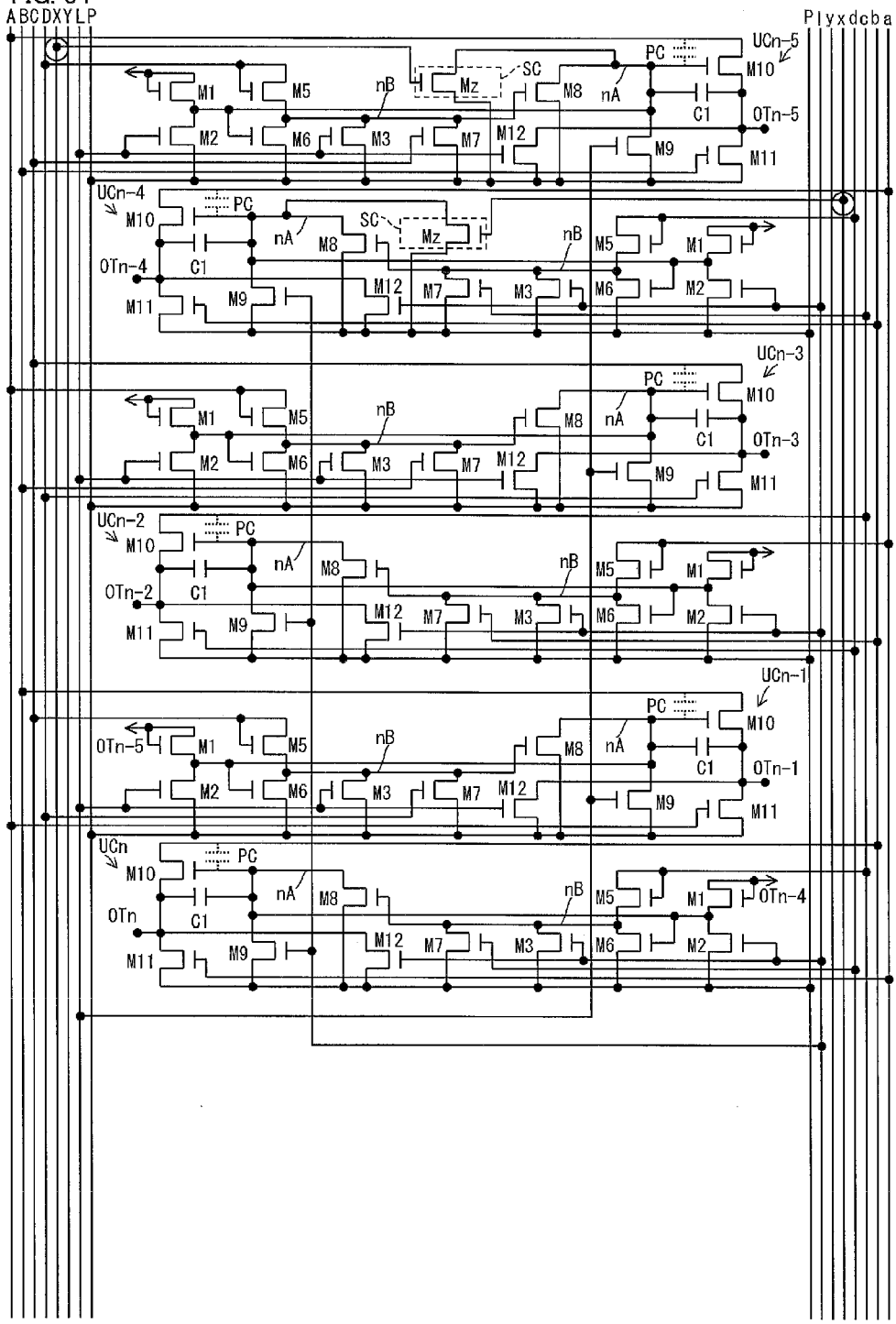

FIG. 34 is a circuit diagram illustrating $(n-5)^{th}$ through $n^{th}$ stages of the shift register of Example 4.

Figure 35:
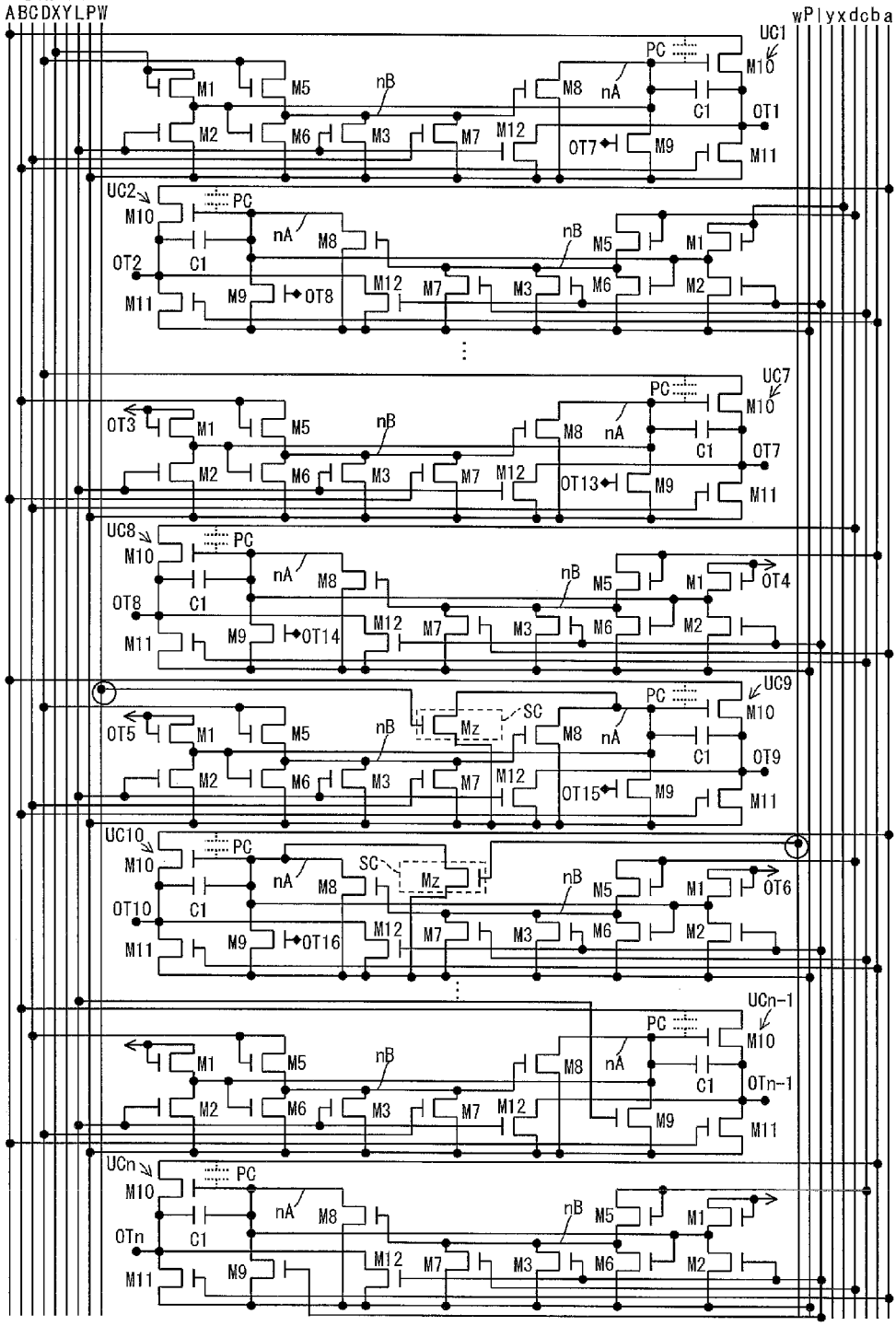

FIG. 35 is a circuit diagram illustrating a first modification of the shift register of Example 4.

Figure 36:
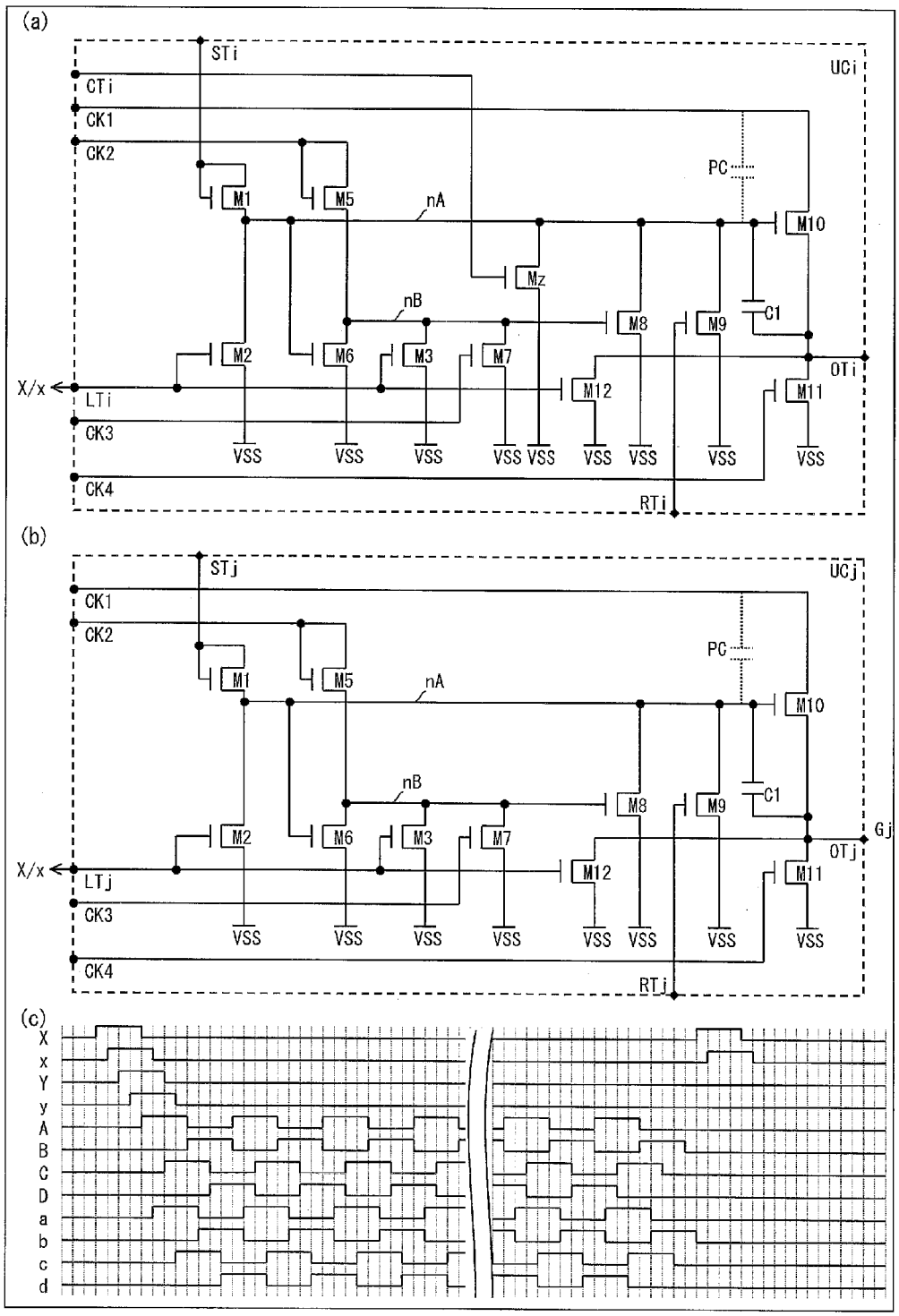

(a) and (b) of FIG. 36 each are a circuit diagram illustrating a modification of an example configuration illustrated in FIG. 31. (c) of FIG. 36 illustrates waveforms of input signals.

Figure 37:
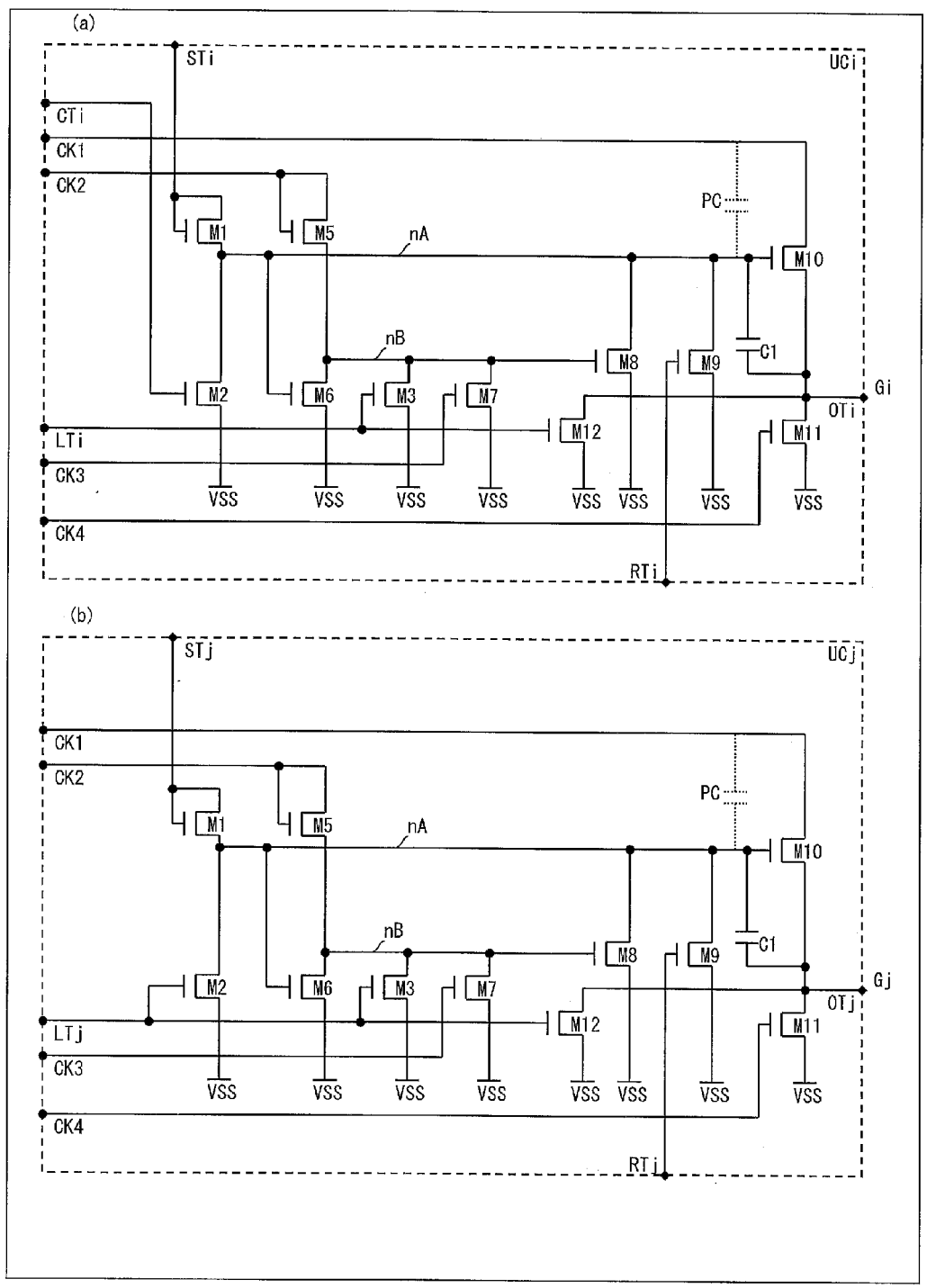

(a) and (b) of FIG. 37 each are a circuit diagram illustrating a unit stage of a shift register of Example 5.

Figure 38:
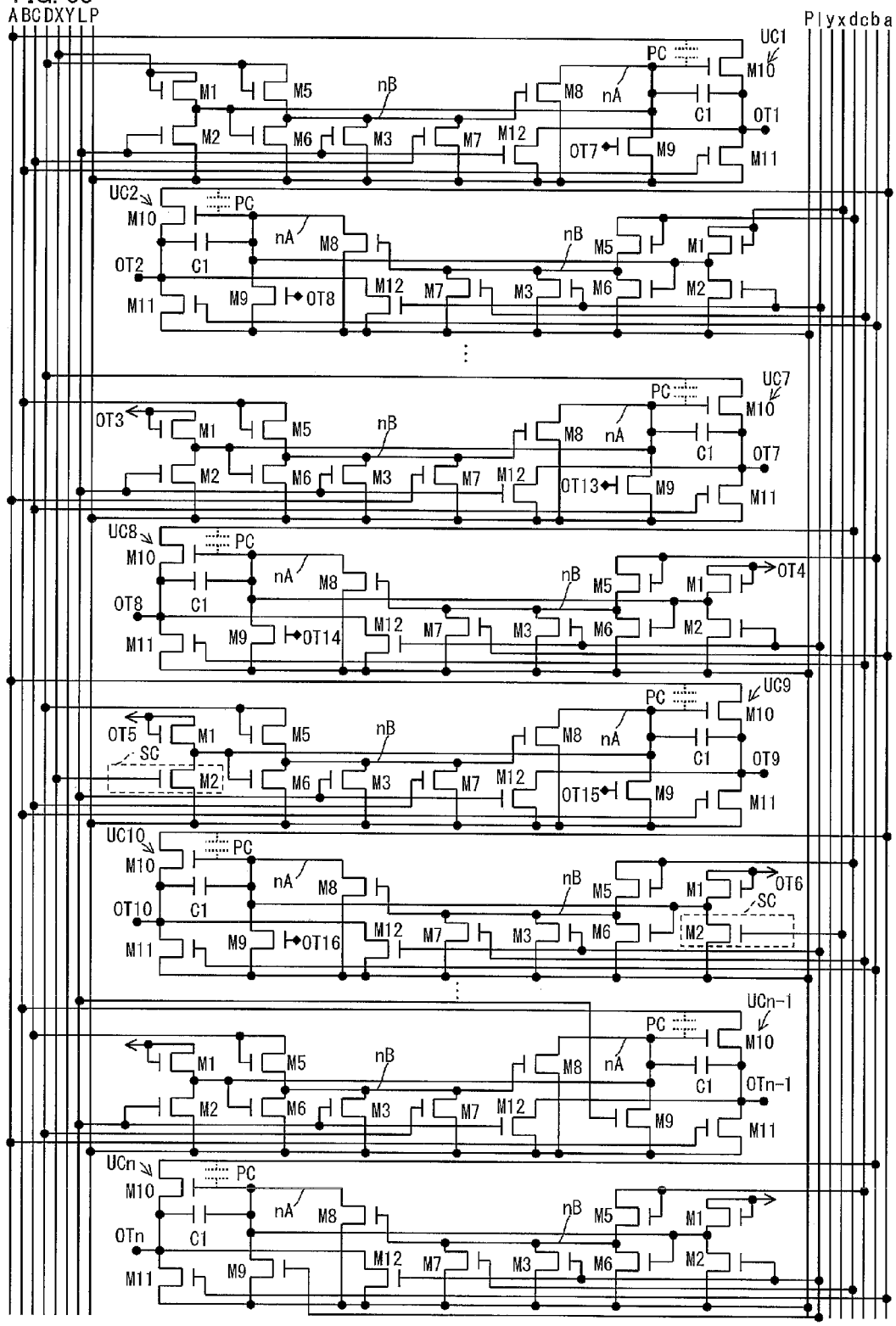

FIG. 38 is a circuit diagram illustrating first through $n^{th}$ stages of the shift register of Example 5.

Figure 39:
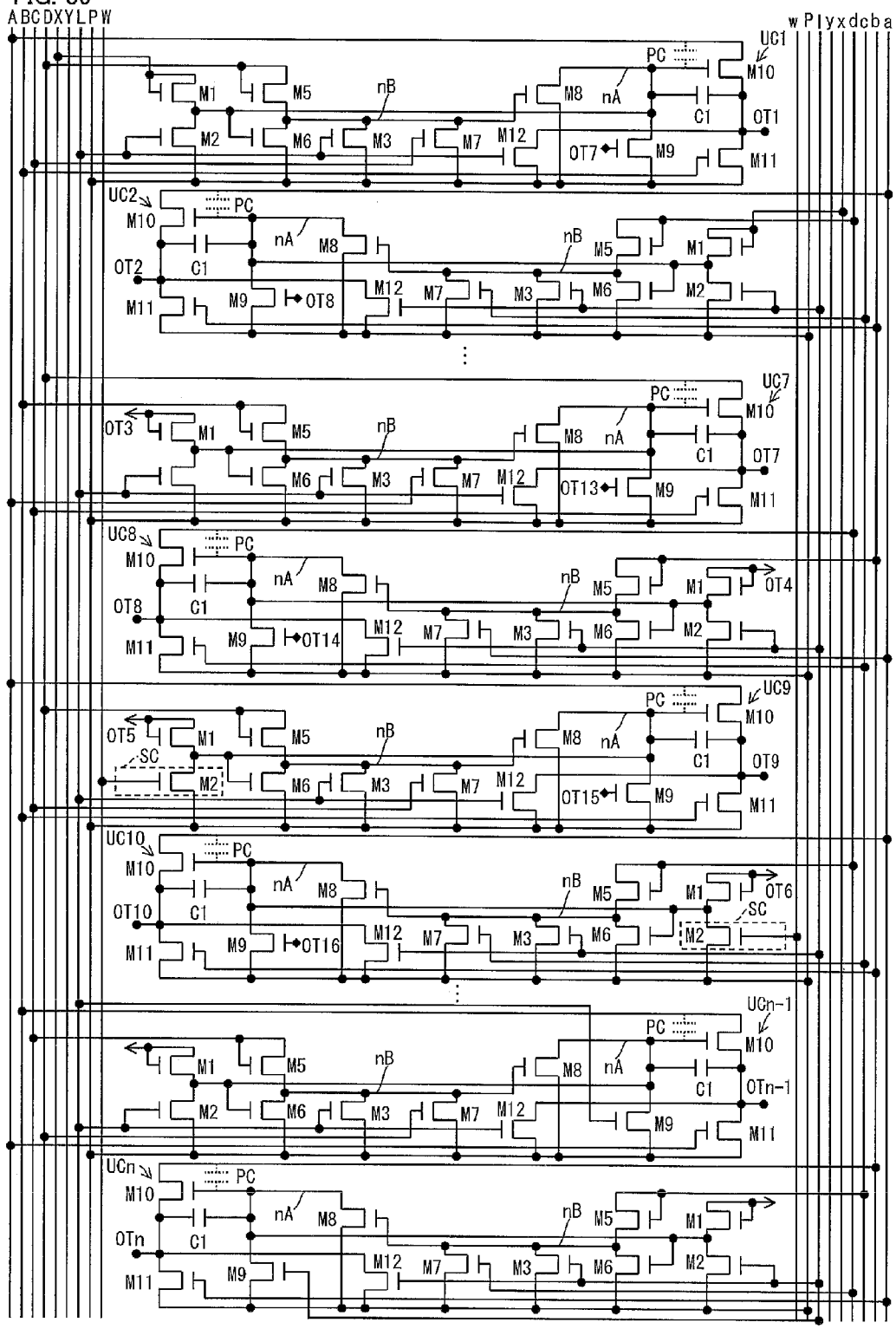

FIG. 39 is a circuit diagram illustrating a modification of the shift register of Example 5.

Figure 40:
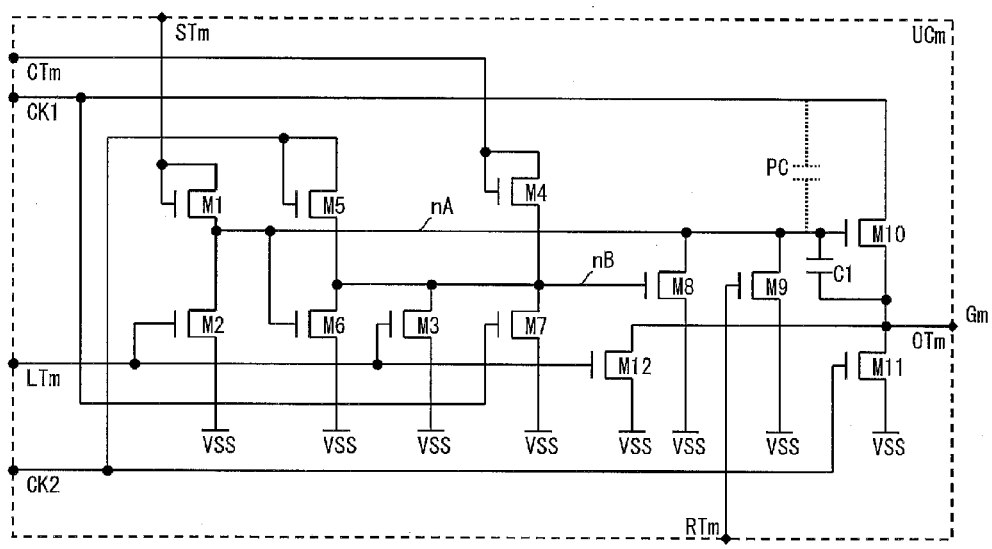

FIG. 40 is a circuit diagram illustrating a unit stage of a shift register of Example 6.

Figure 41:
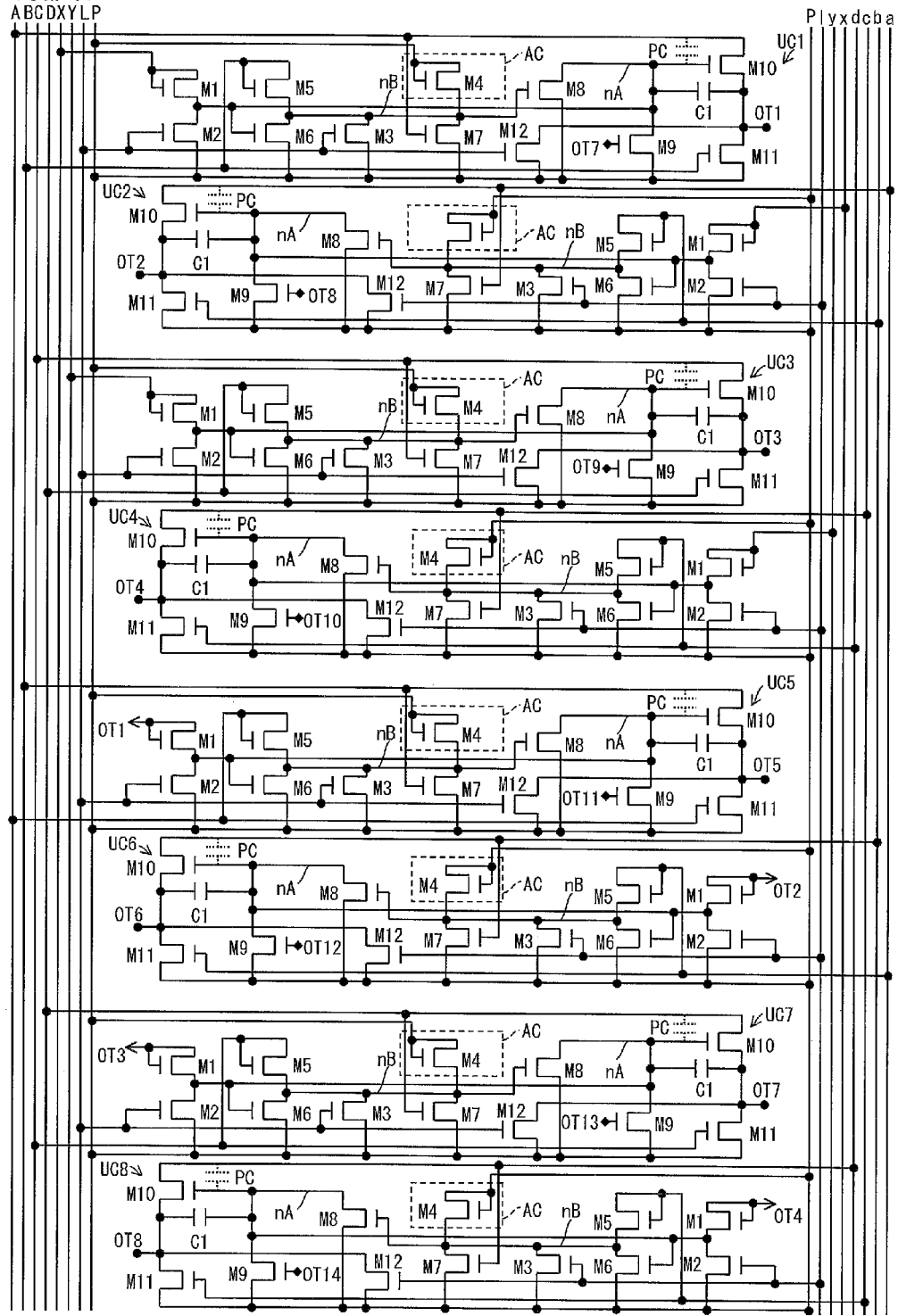

FIG. 41 is a circuit diagram illustrating first through eighth stages of the shift register of Example 6.

Figure 42:
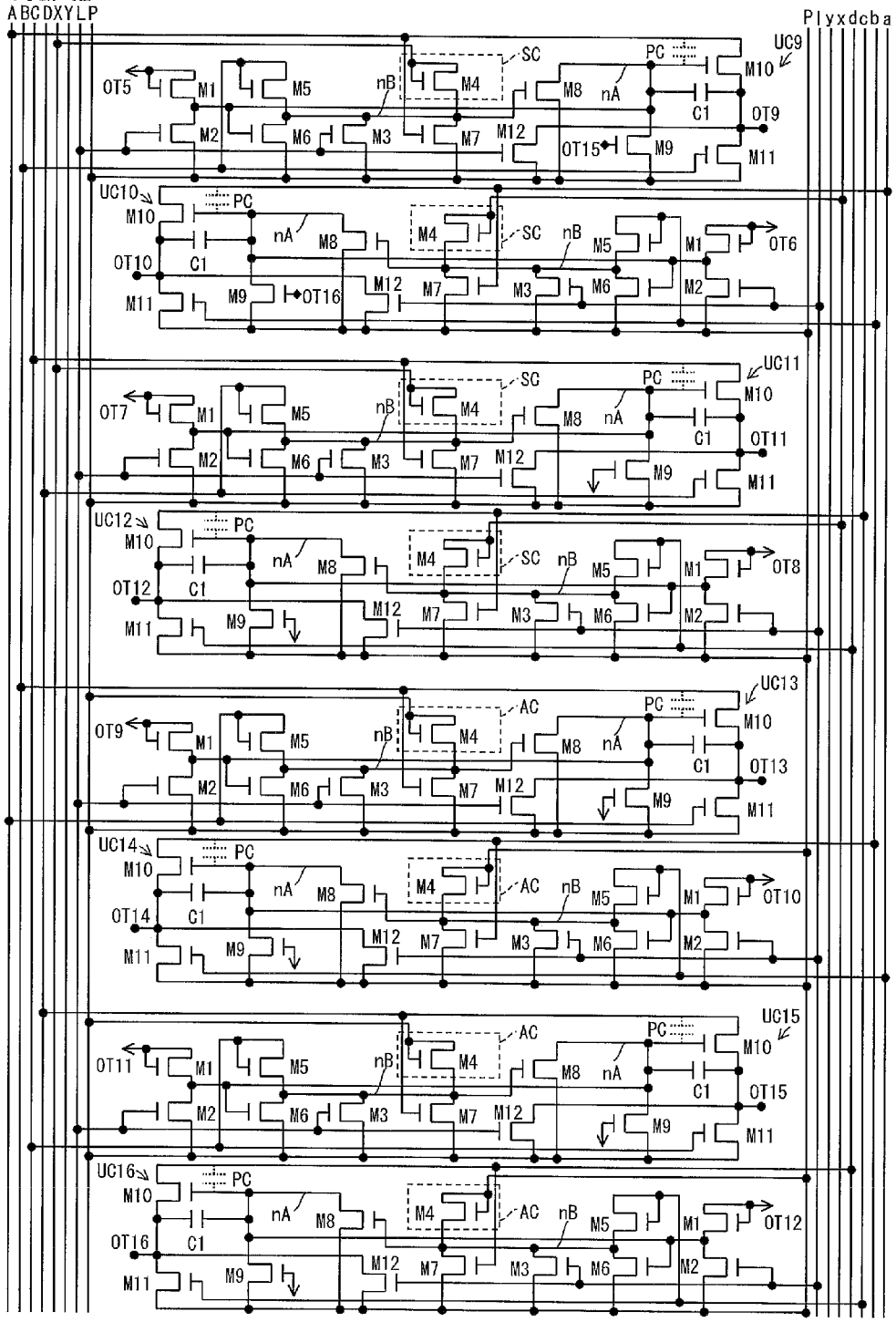

FIG. 42 is a circuit diagram illustrating ninth through $16^{th}$ stages of the shift register of Example 6.

Figure 43:
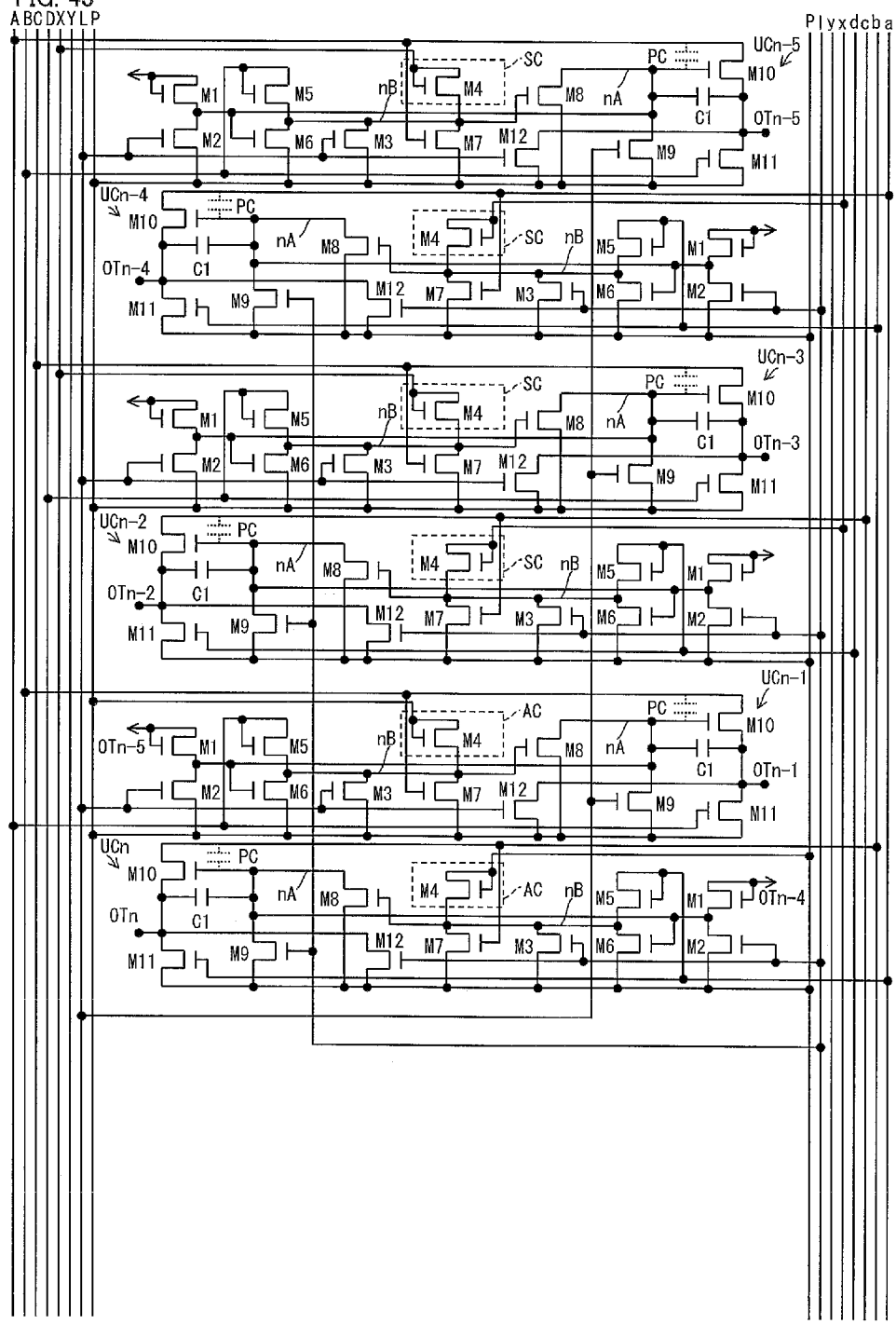

FIG. 43 is a circuit diagram illustrating $(n-5)^{th}$ through $n^{th}$ stages of the shift register of Example 6.

Figure 44:
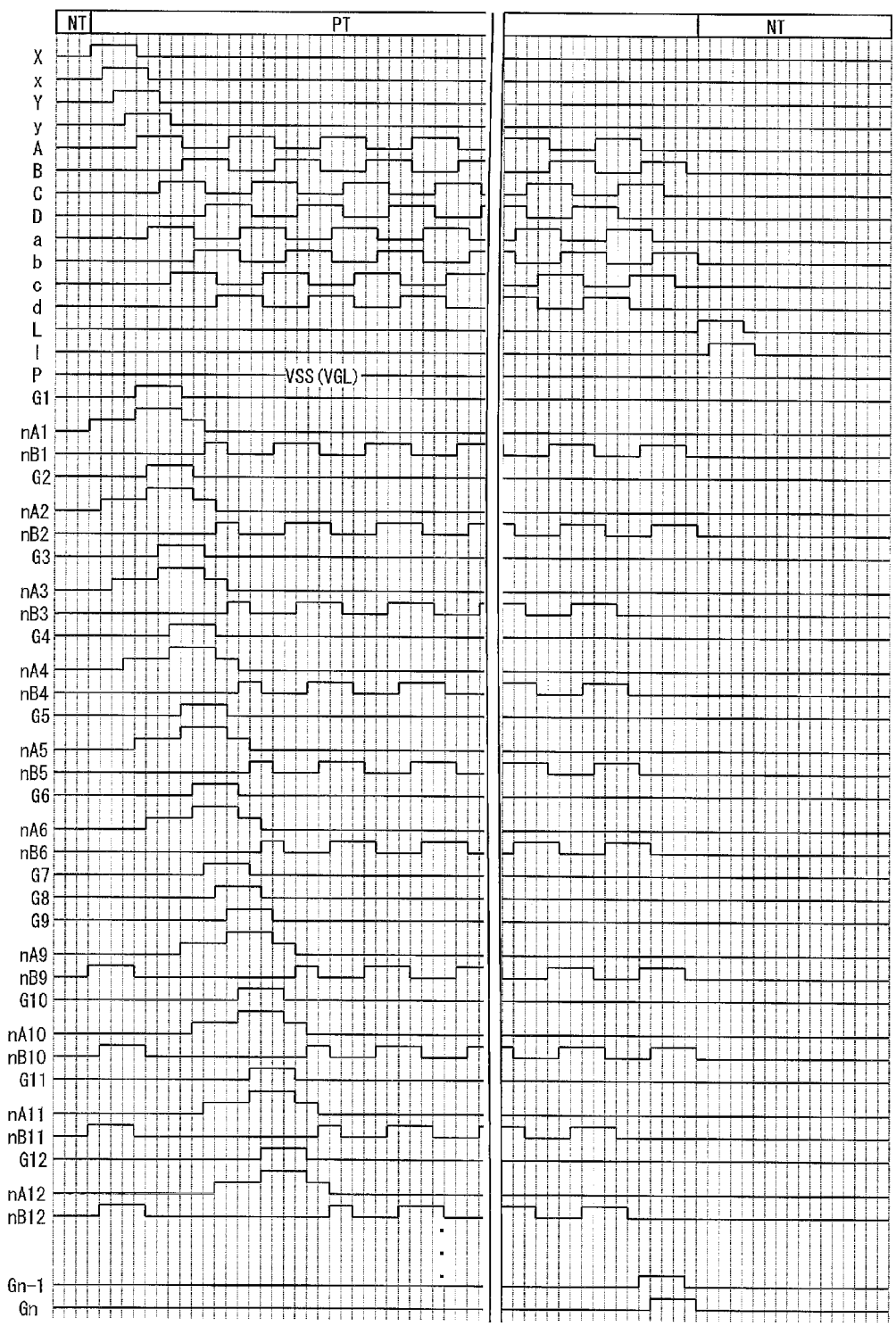

FIG. 44 is a timing chart illustrating an operation of the shift register of Example 6.

Figure 45:
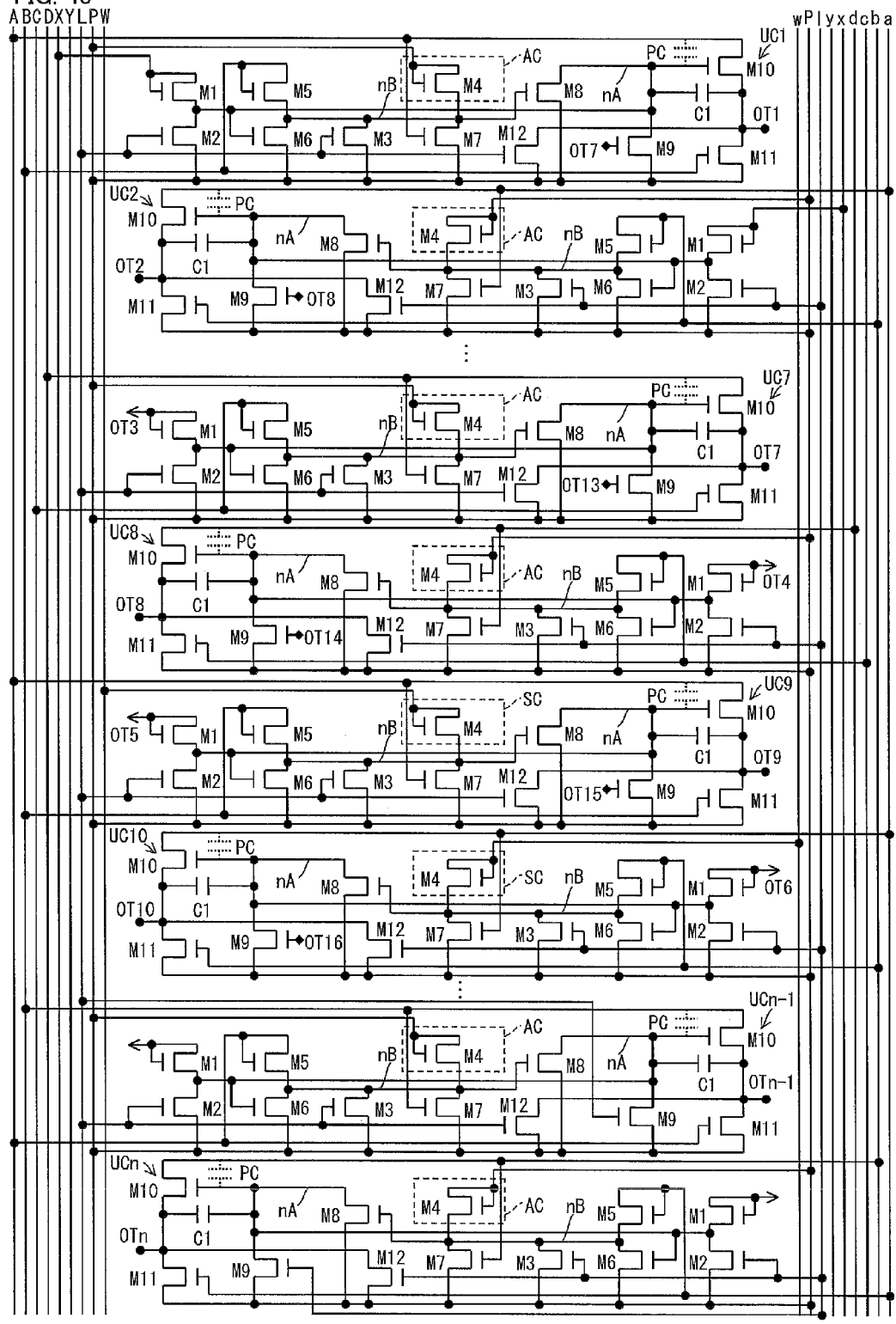

FIG. 45 is a circuit diagram illustrating a first modification of the shift register of Example 6.

Figure 46:
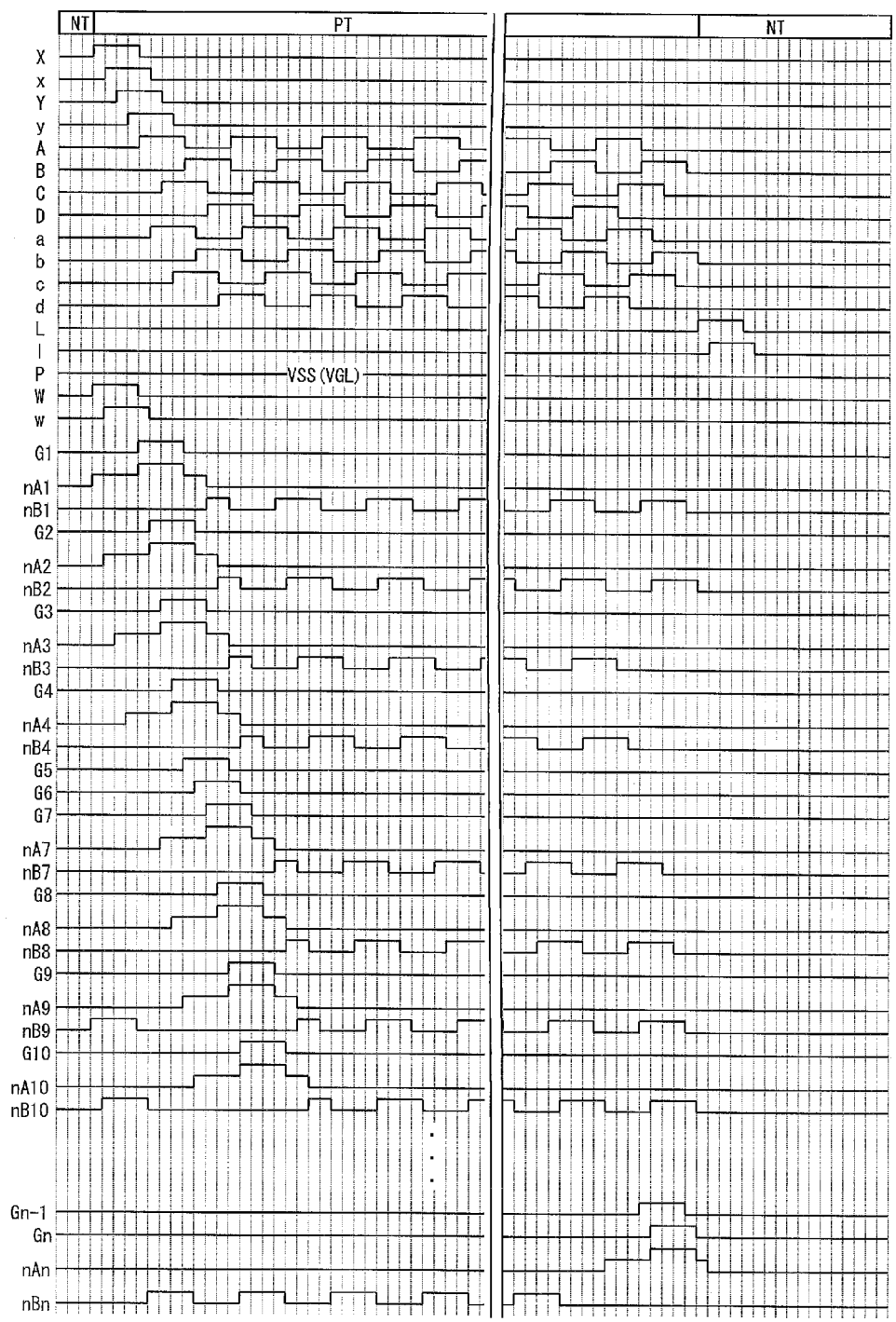

FIG. 46 is a timing chart illustrating an operation of a shift register illustrated in FIG. 45.

Figure 47:
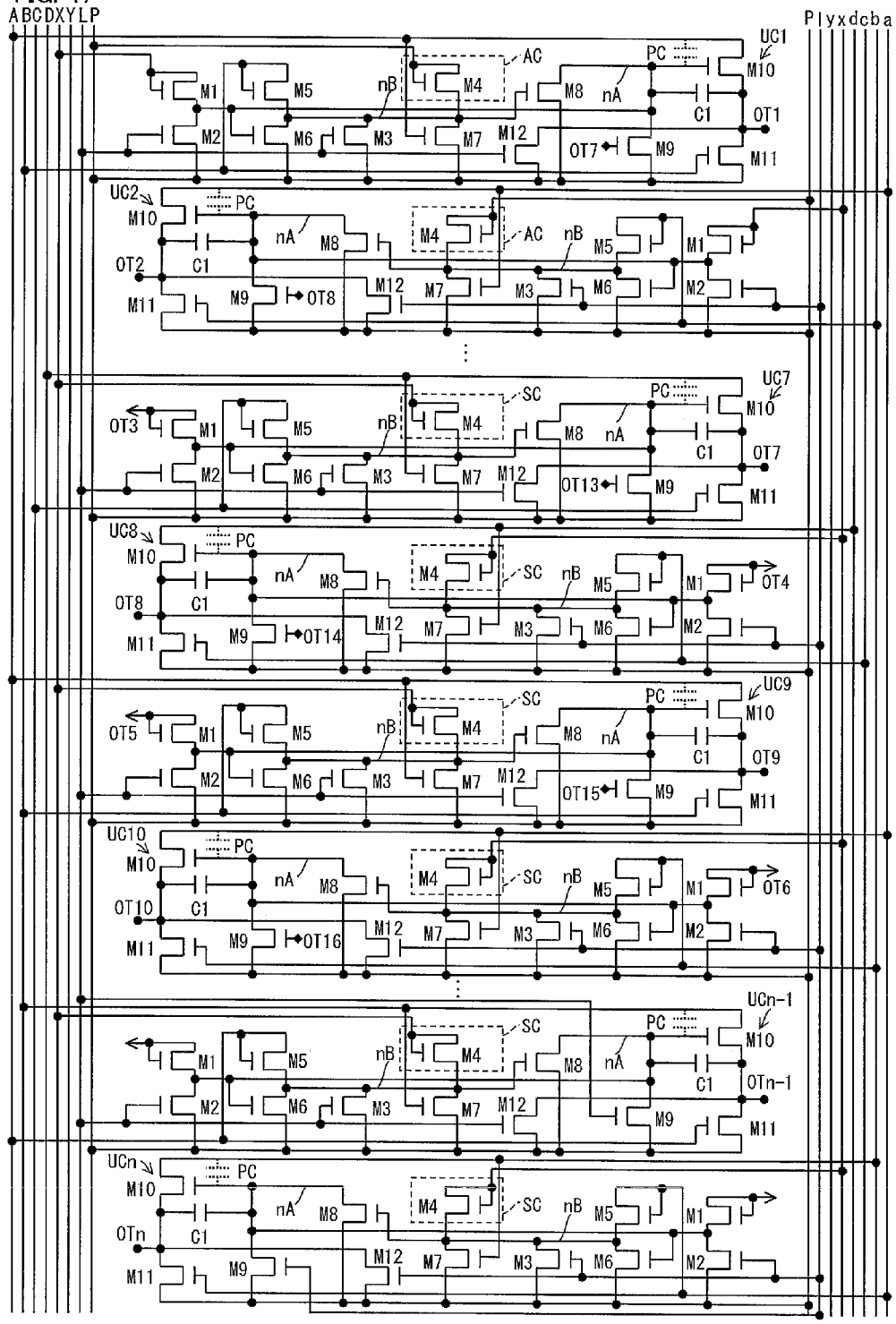

FIG. 47 is a circuit diagram illustrating a second modification of the shift register of Example 6.

Figure 48:
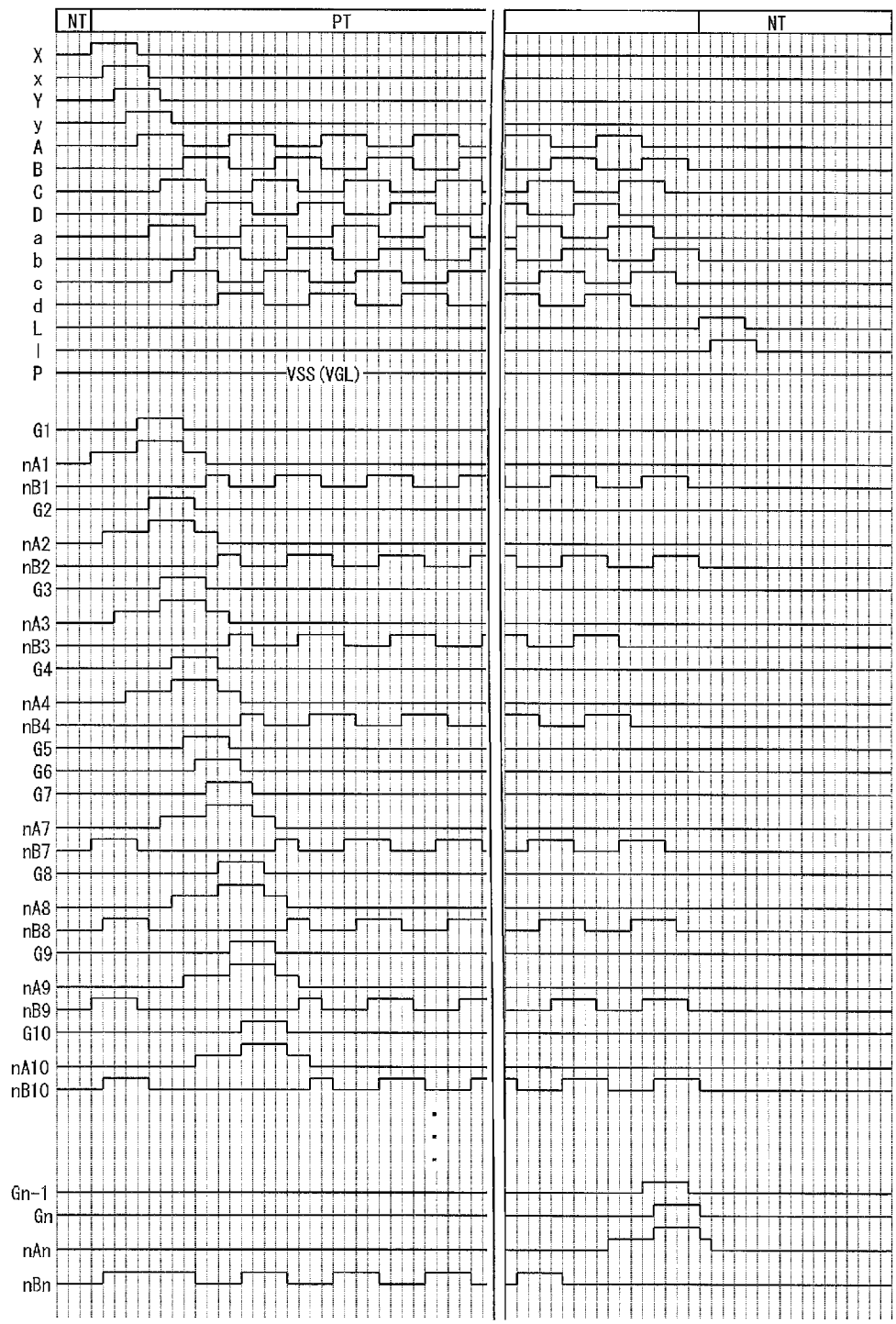

FIG. 48 is a timing chart illustrating an operation of a shift register illustrated in FIG. 47.

Figure 49:
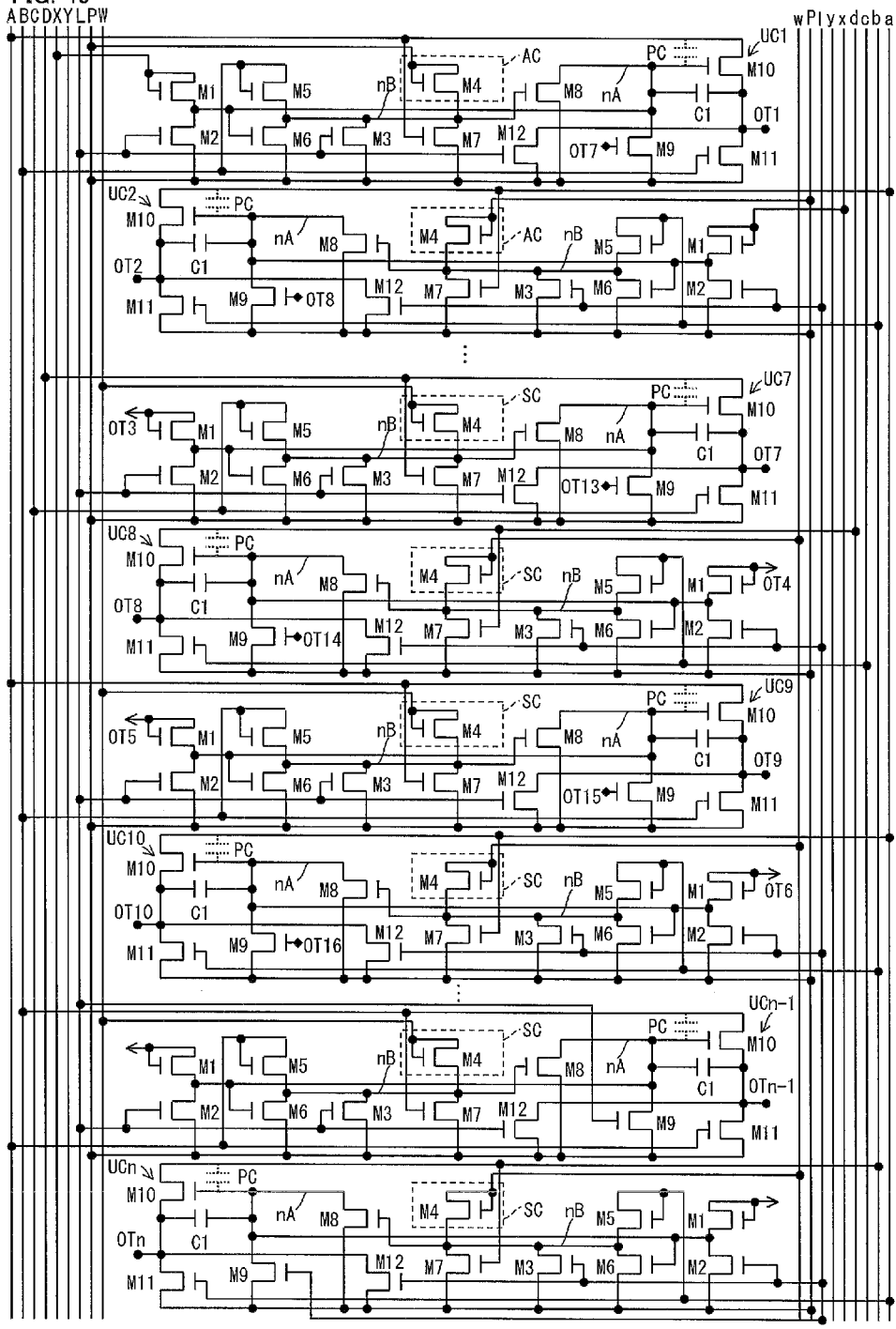

FIG. 49 is a circuit diagram illustrating a third modification of the shift register of Example 6.

Figure 50:
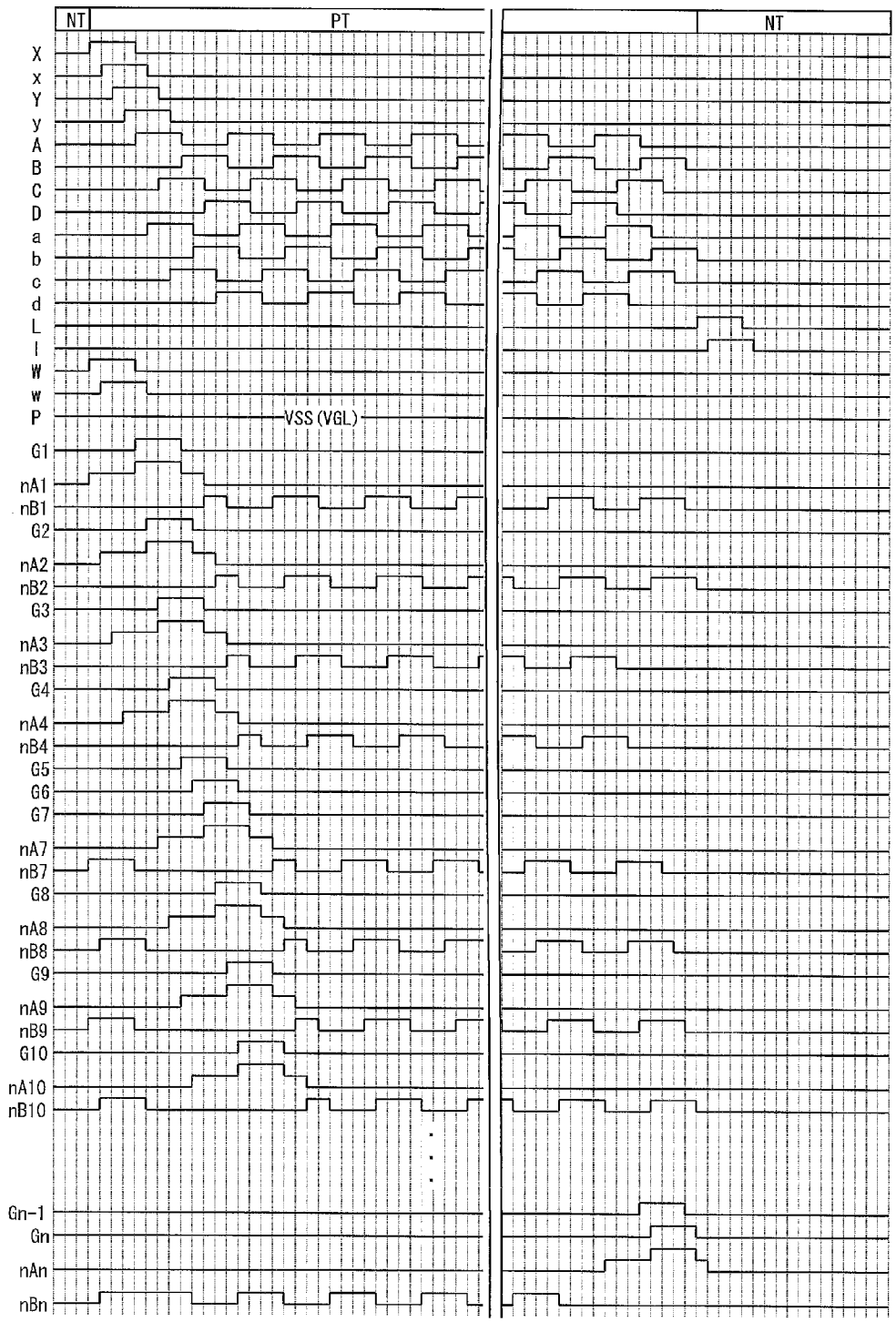

FIG. 50 is a timing chart illustrating an operation of a shift register illustrated in FIG. 49.

Figure 51:
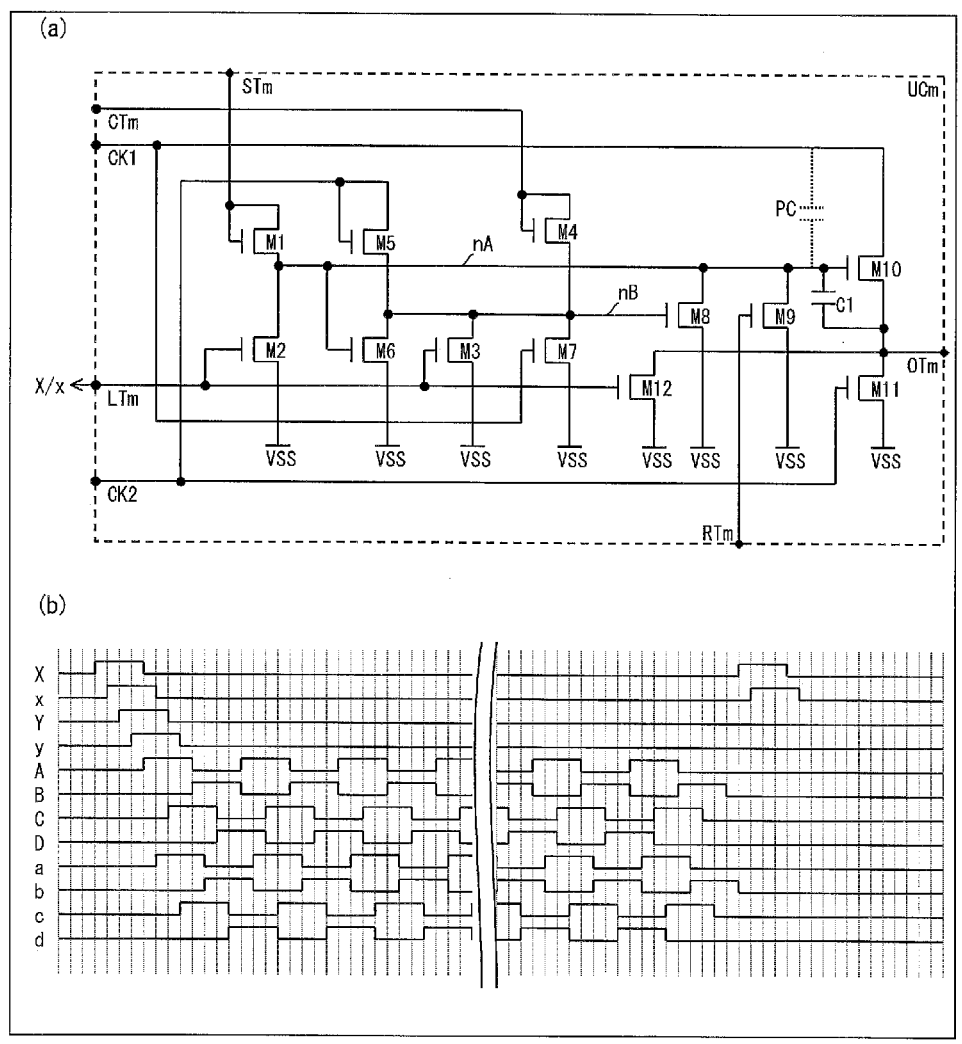

(a) of FIG. 51 is a circuit diagram illustrating a modification of an example configuration illustrated in FIG. 40. (b) of FIG. 51 illustrates waveforms of input signals.

Figure 52:
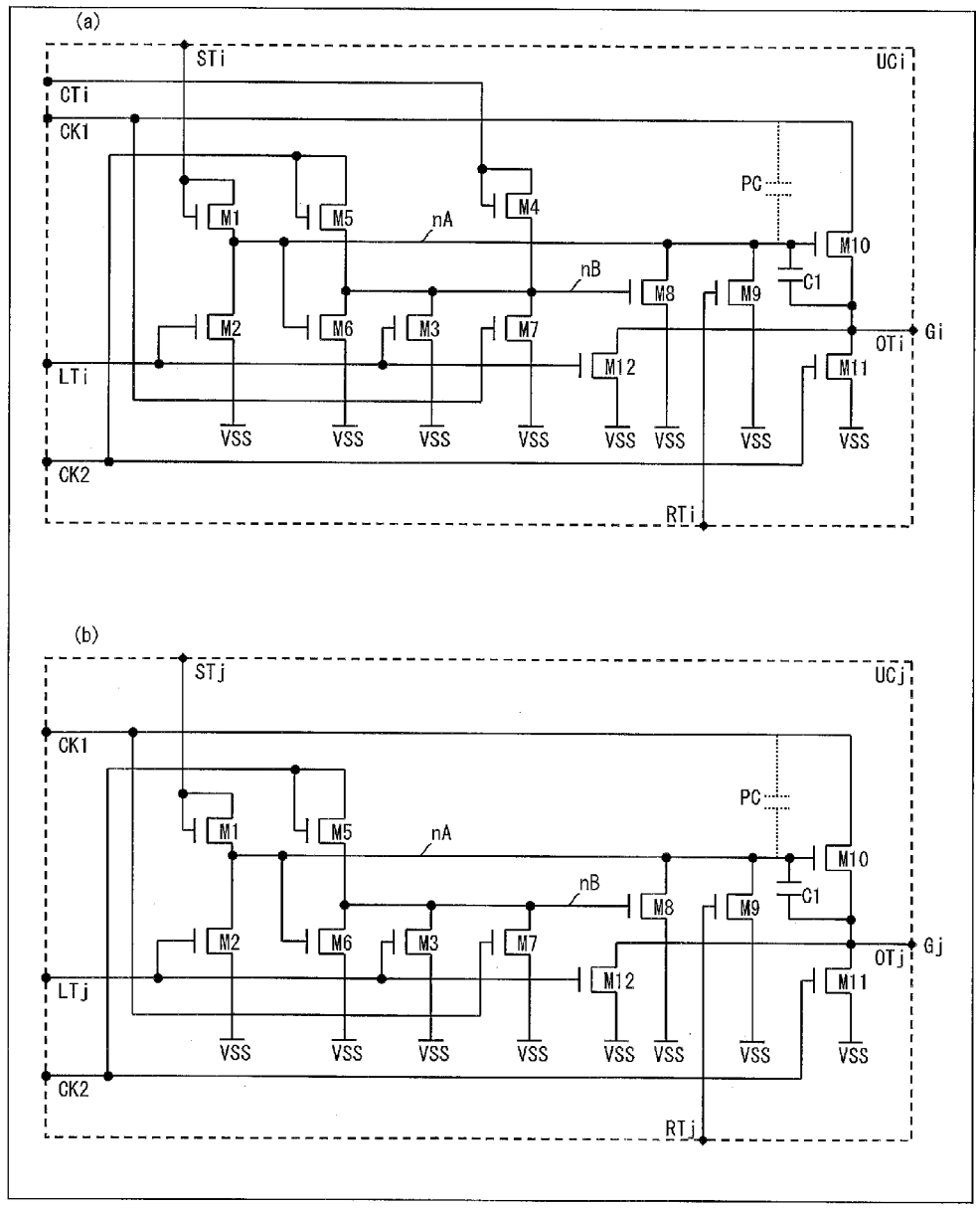

(a) and (b) of FIG. 52 each are a circuit diagram illustrating a unit stage of a shift register of Example 7.

Figure 53:
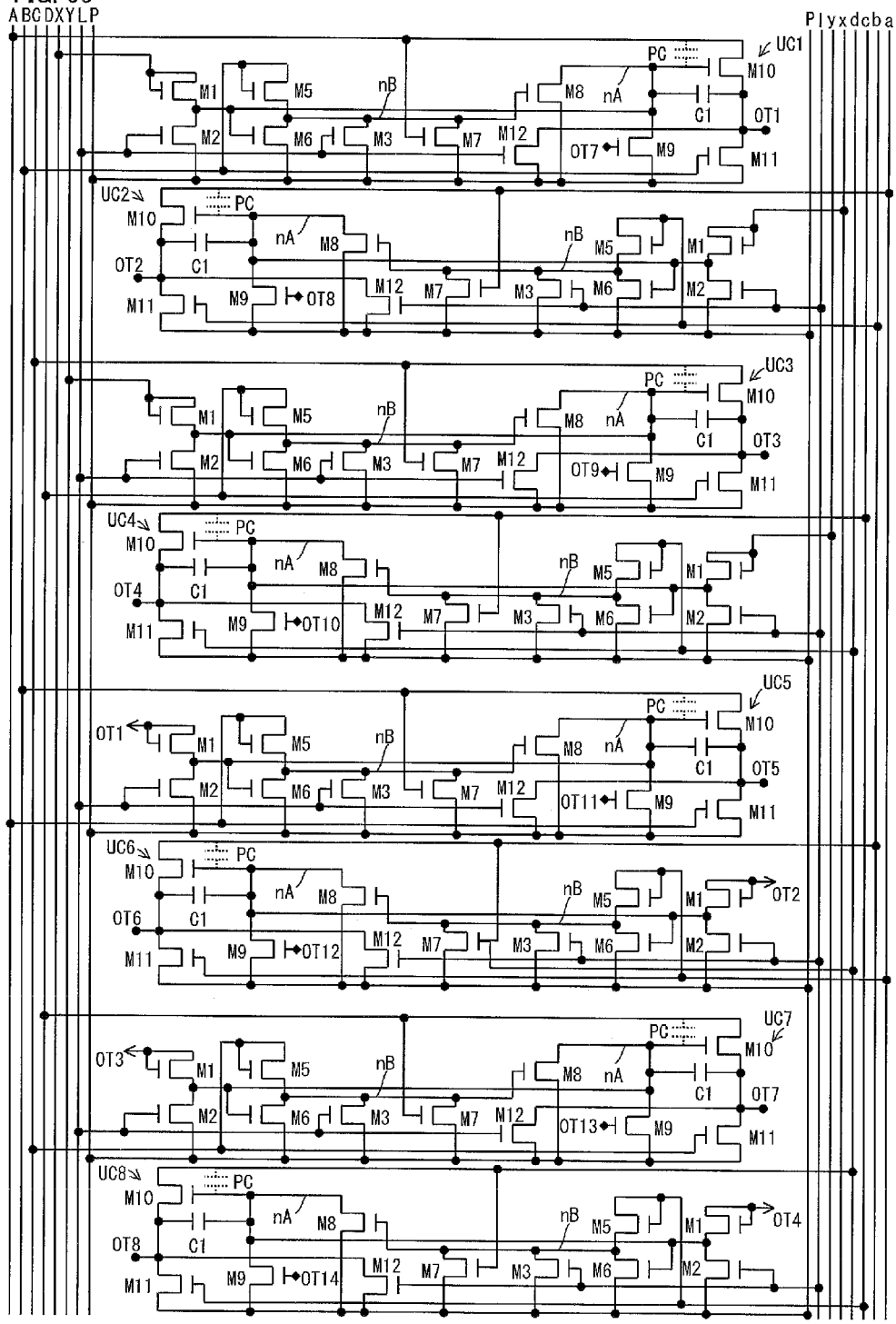

FIG. 53 is a circuit diagram illustrating first through eighth stages of the shift register of Example 7.

Figure 54:
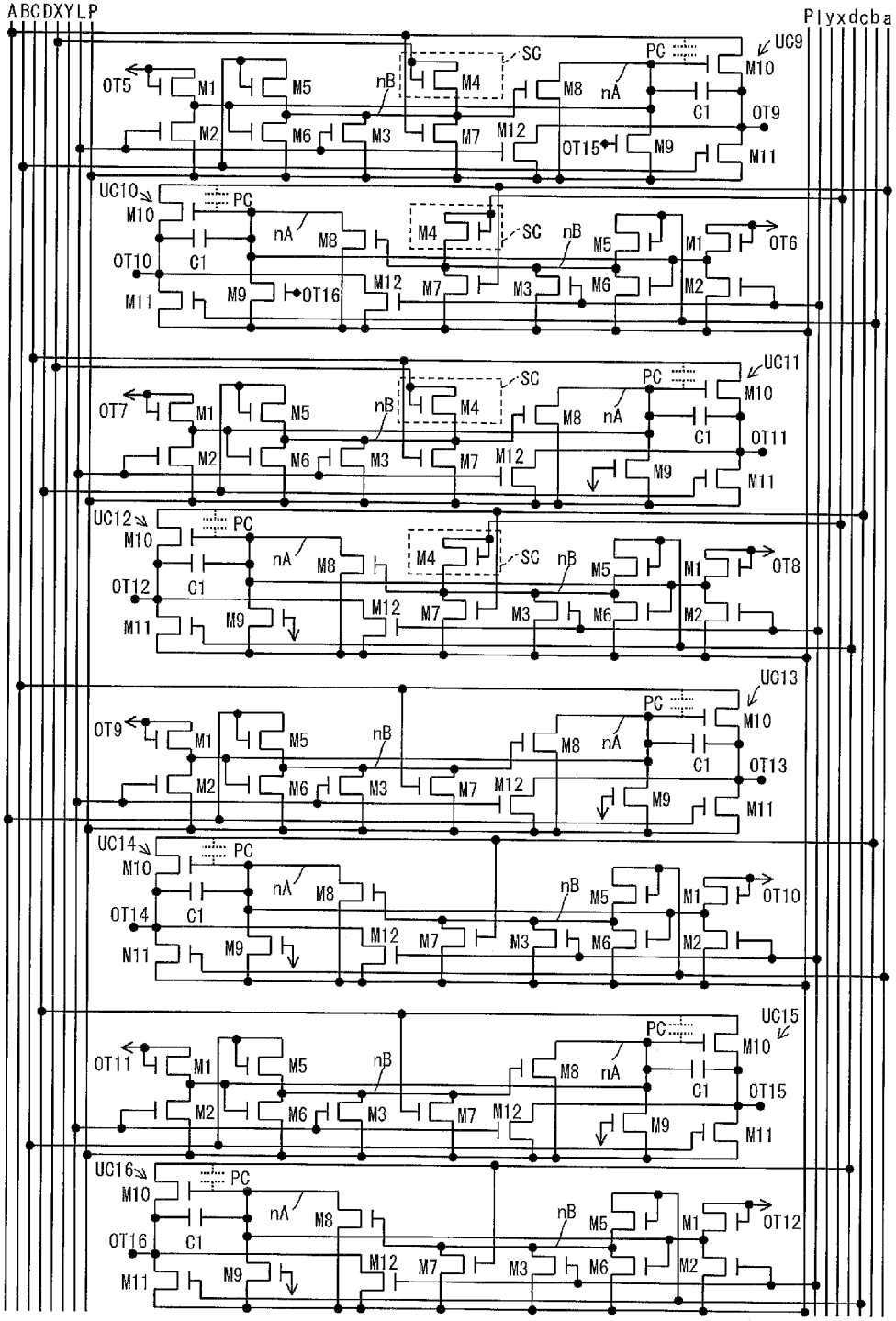

FIG. 54 is a circuit diagram illustrating ninth through $16^{th}$ stages of the shift register of Example 7.

Figure 55:
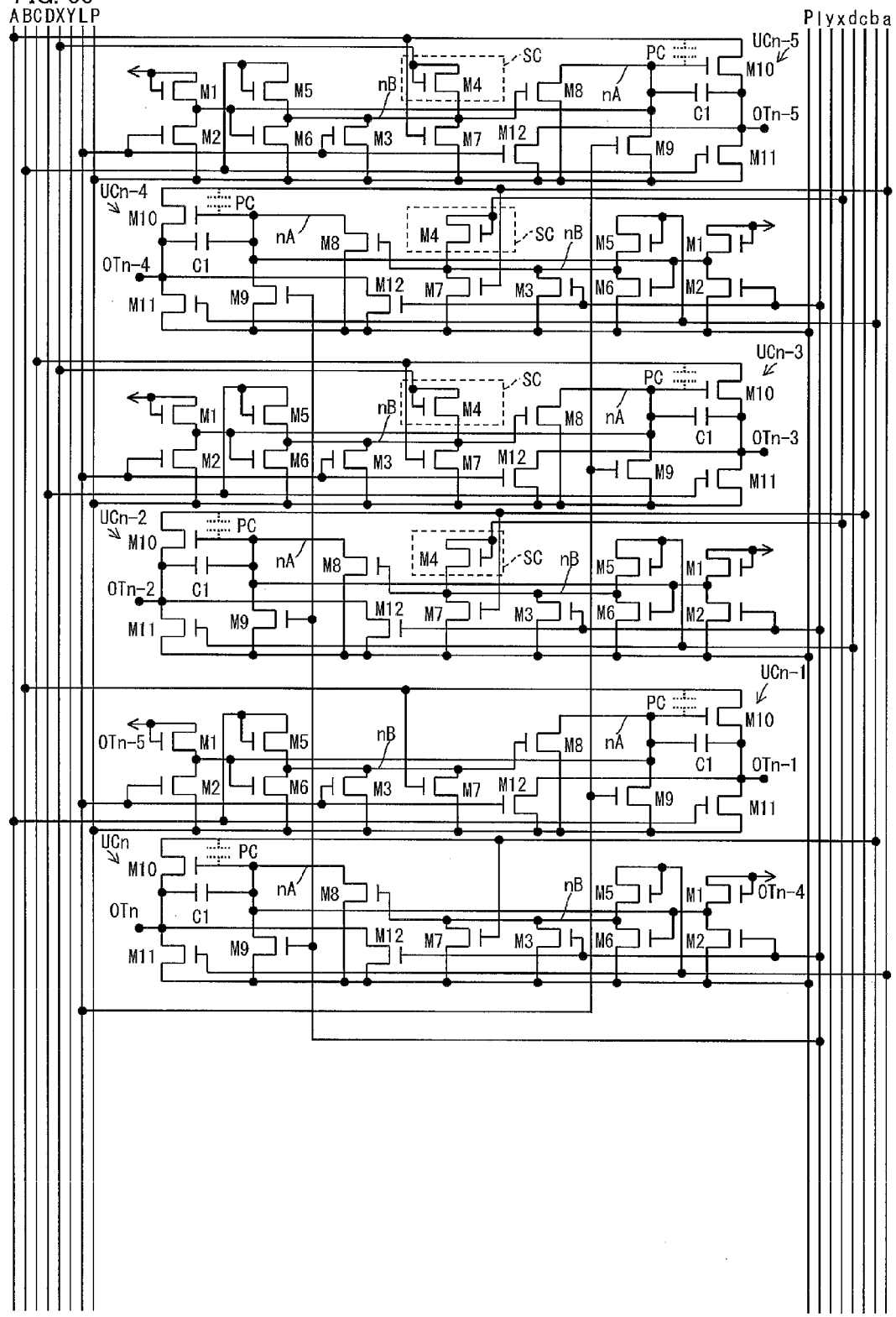

FIG. 55 is a circuit diagram illustrating $(n-5)^{th}$ through $n^{th}$ stages of the shift register of Example 7.

Figure 56:
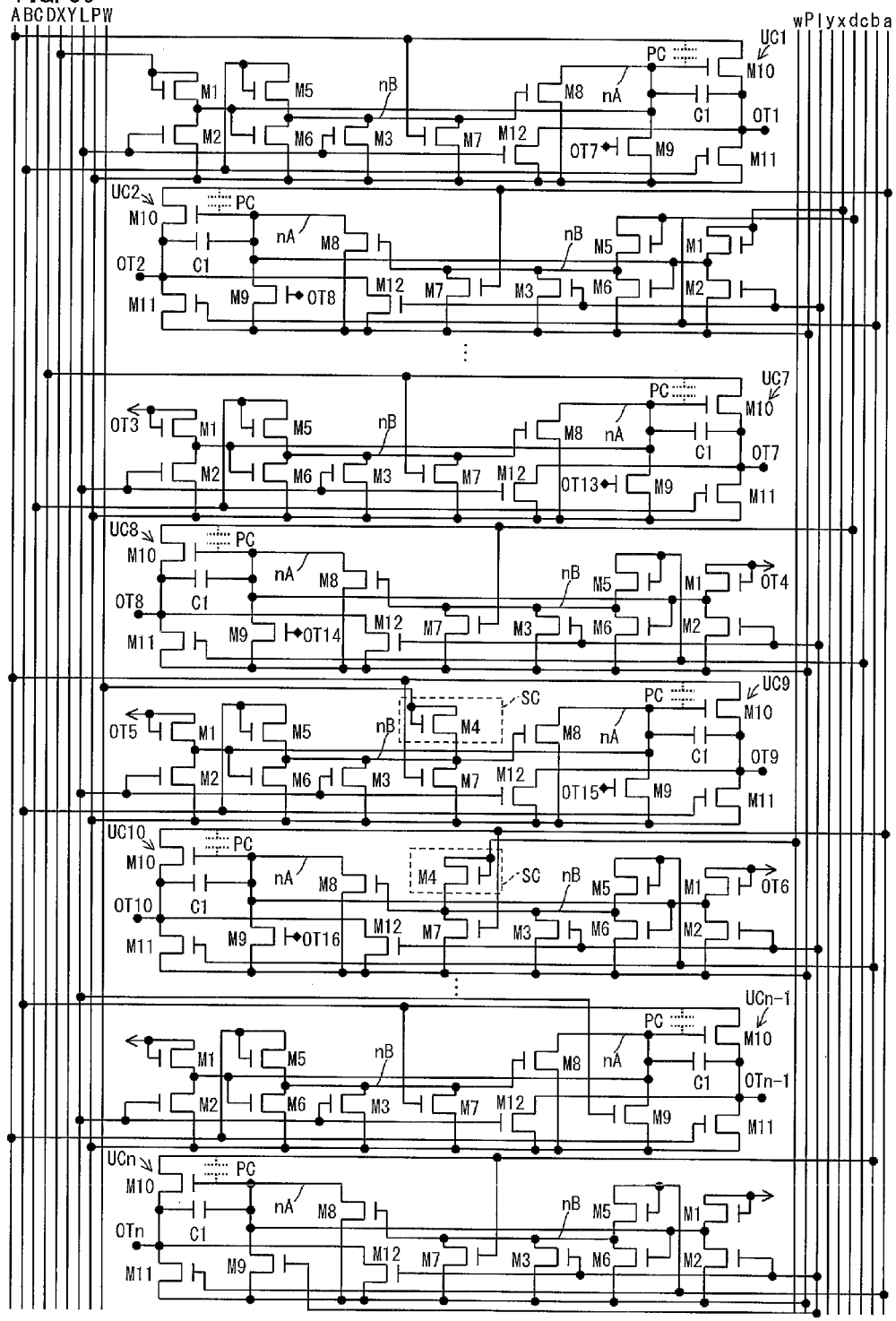

FIG. 56 is a circuit diagram illustrating a first modification of the shift register of Example 7.

Figure 57:
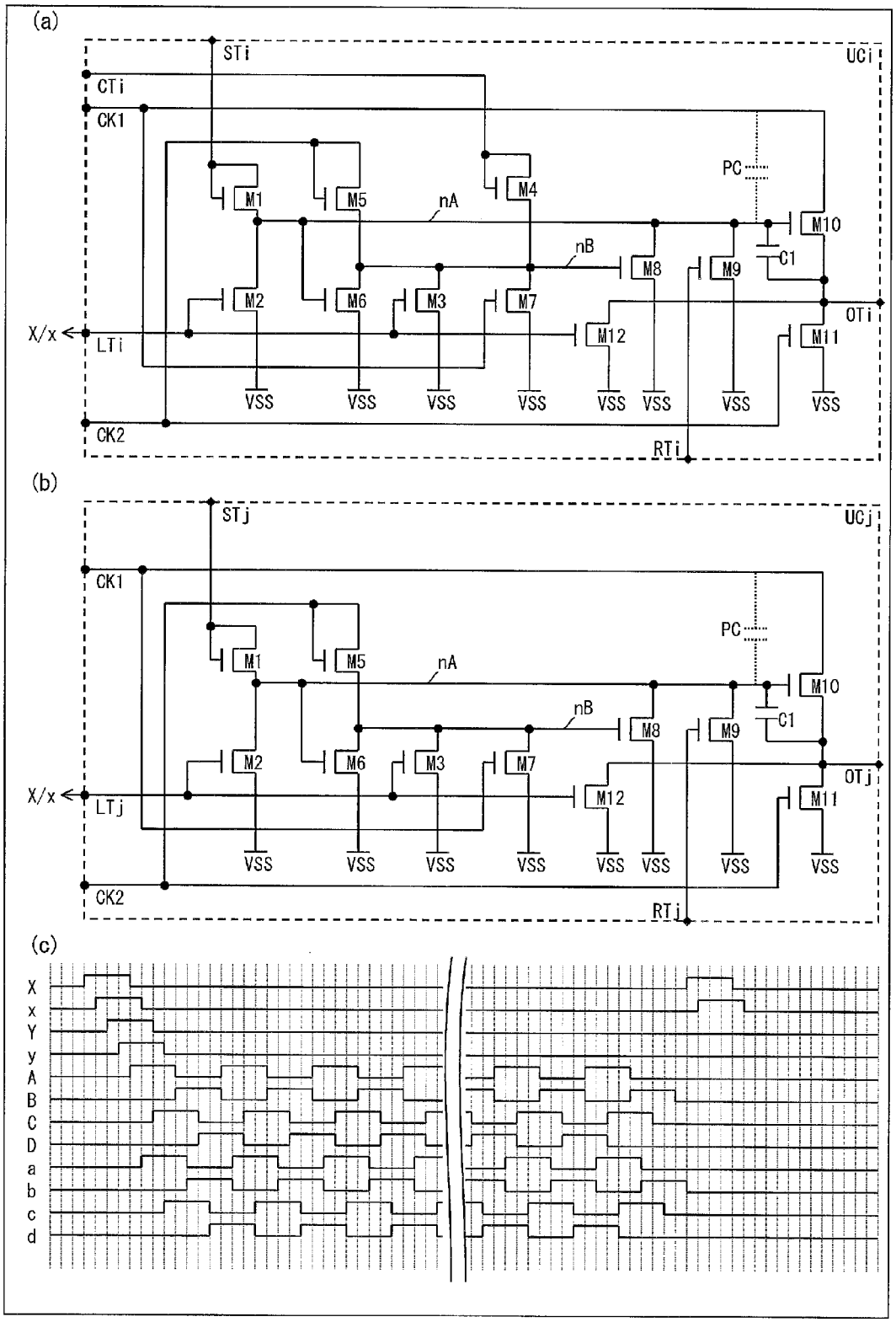

(a) and (b) of FIG. 57 each are a circuit diagram illustrating a modification of an example configuration illustrated in FIG. 52. (c) of FIG. 57 illustrates waveforms of input signals.

Figure 58:
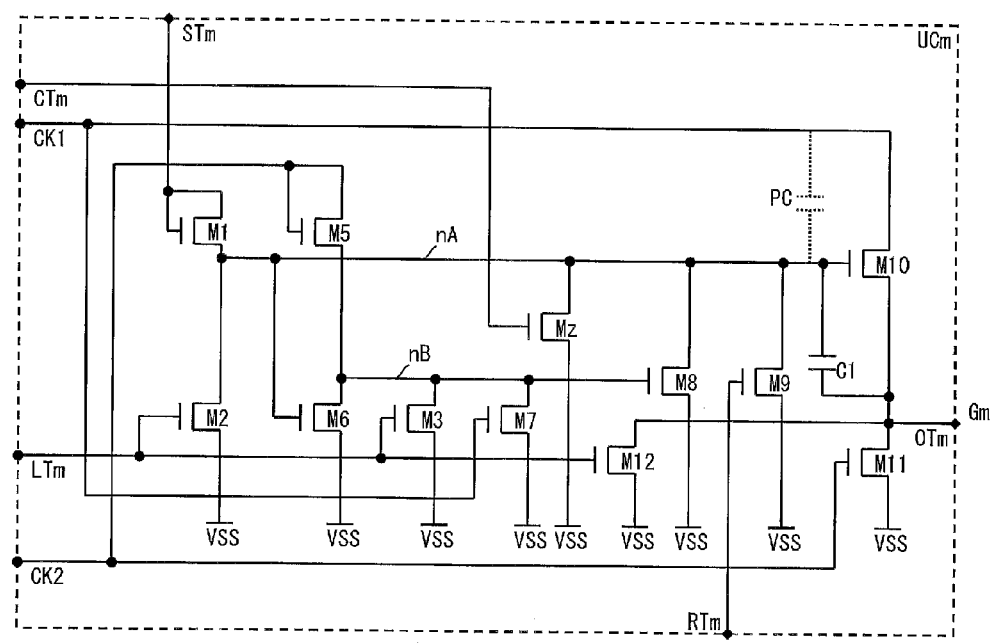

FIG. 58 is a circuit diagram illustrating a unit stage of a shift register of Example 8.

Figure 59:
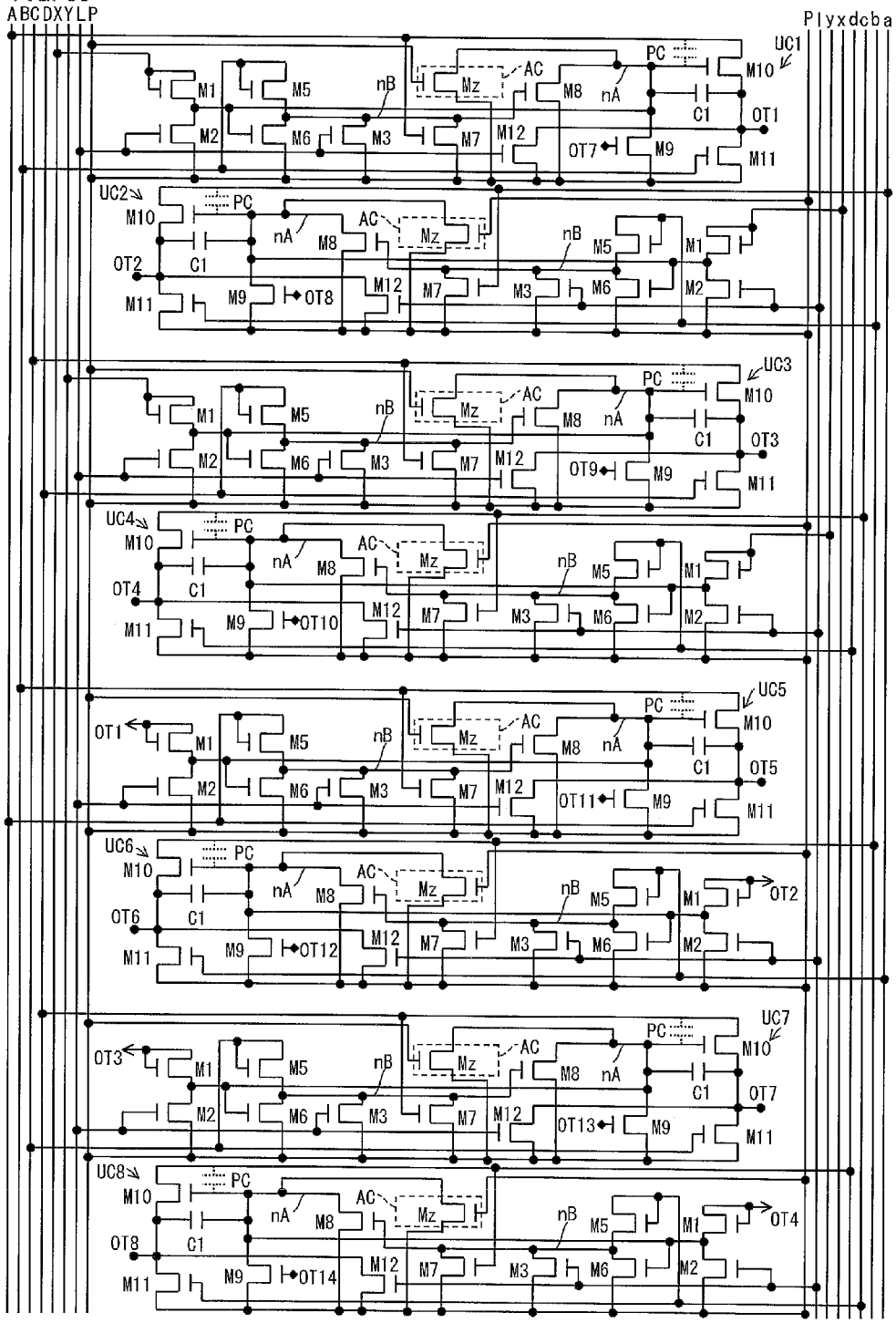

FIG. 59 is a circuit diagram illustrating first through eighth stages of the shift register of Example 8.

Figure 60:
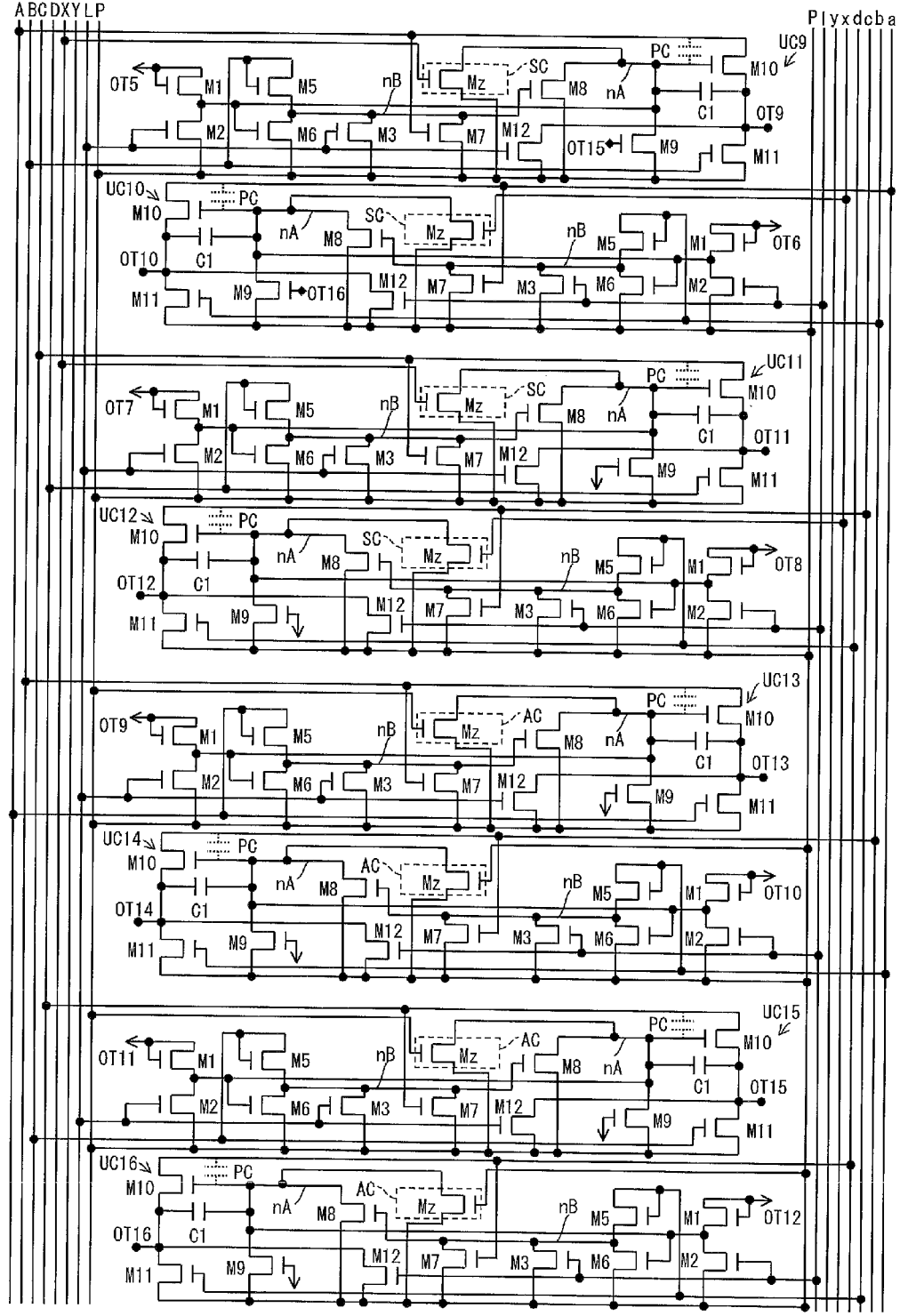

FIG. 60 is a circuit diagram illustrating ninth through $16^{th}$ stages of the shift register of Example 8.

Figure 61:
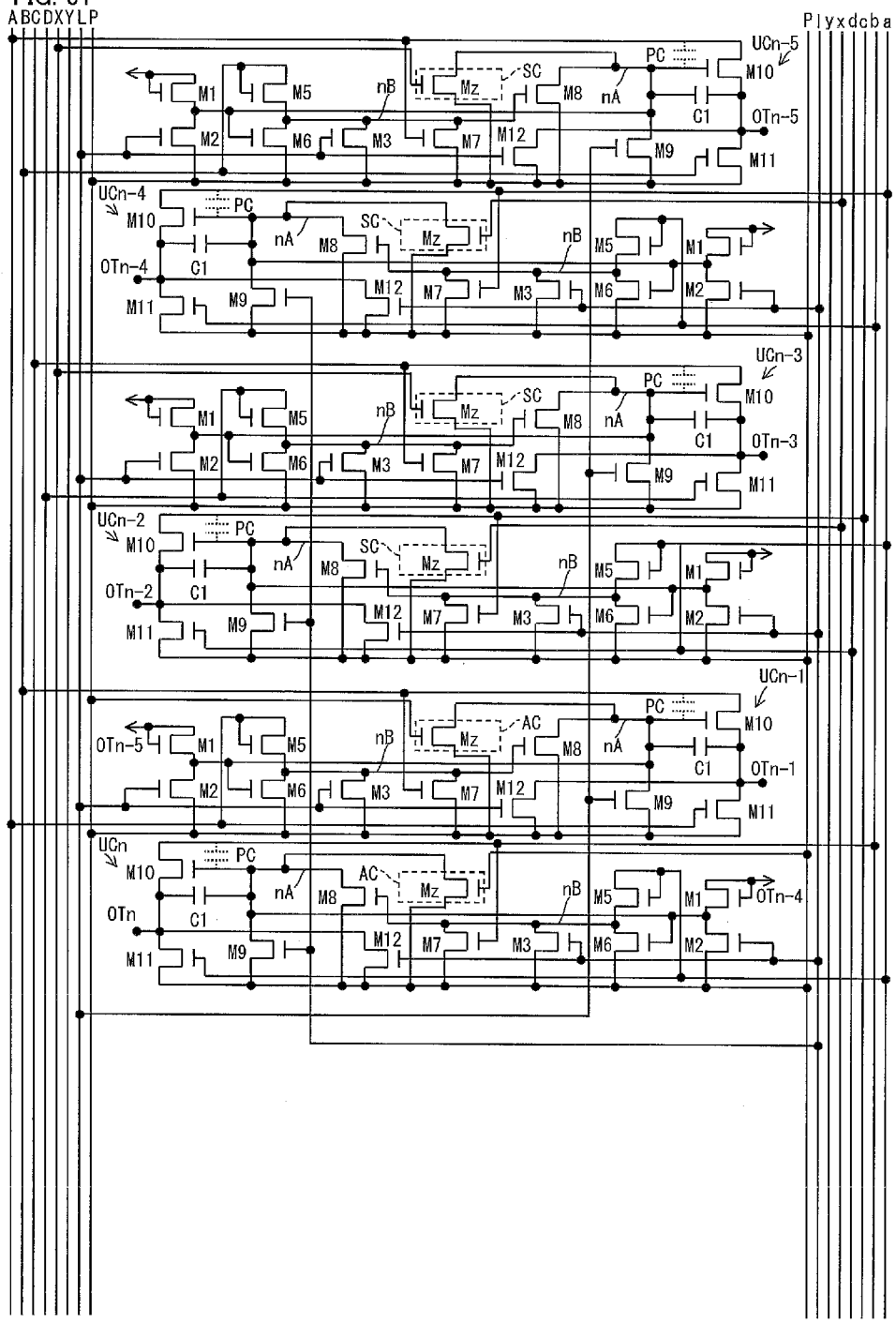

FIG. 61 is a circuit diagram illustrating $(n-5)^{th}$ through $n^{th}$ stages of the shift register of Example 8.

Figure 62:
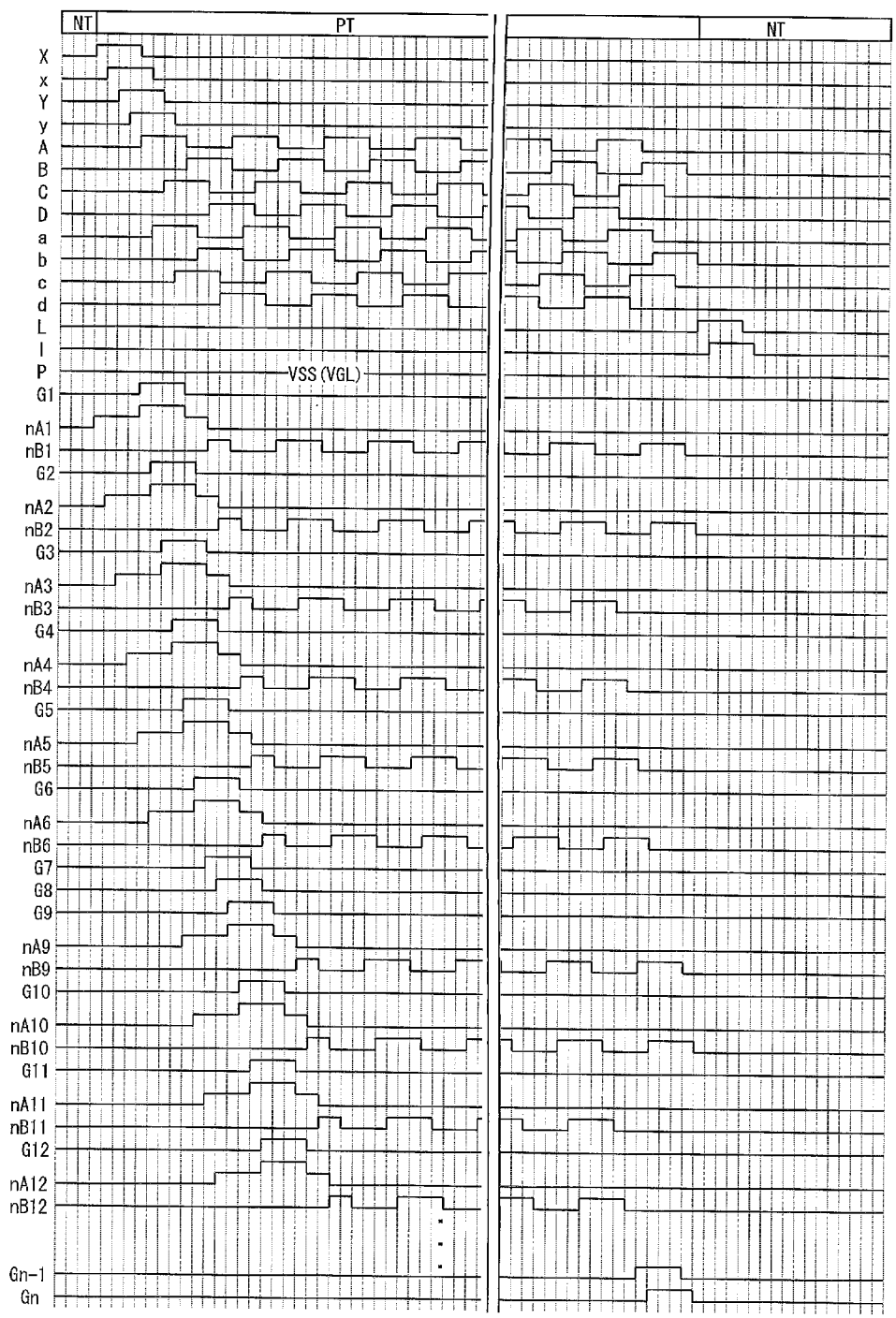

FIG. 62 is a timing chart illustrating an operation of the shift register of Example 8.

Figure 63:
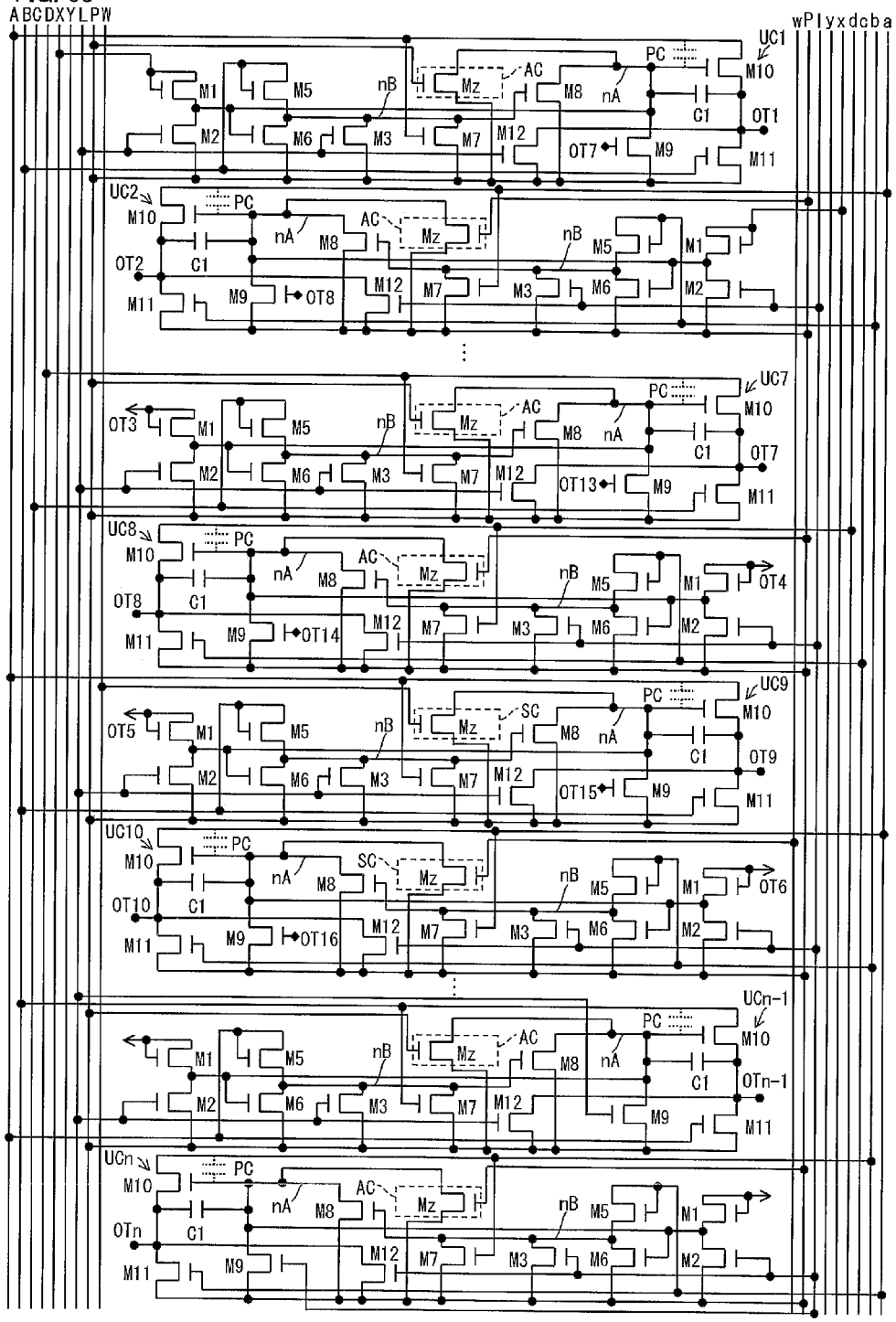

FIG. 63 is a circuit diagram illustrating a first modification of the shift register of Example 8.

Figure 64:
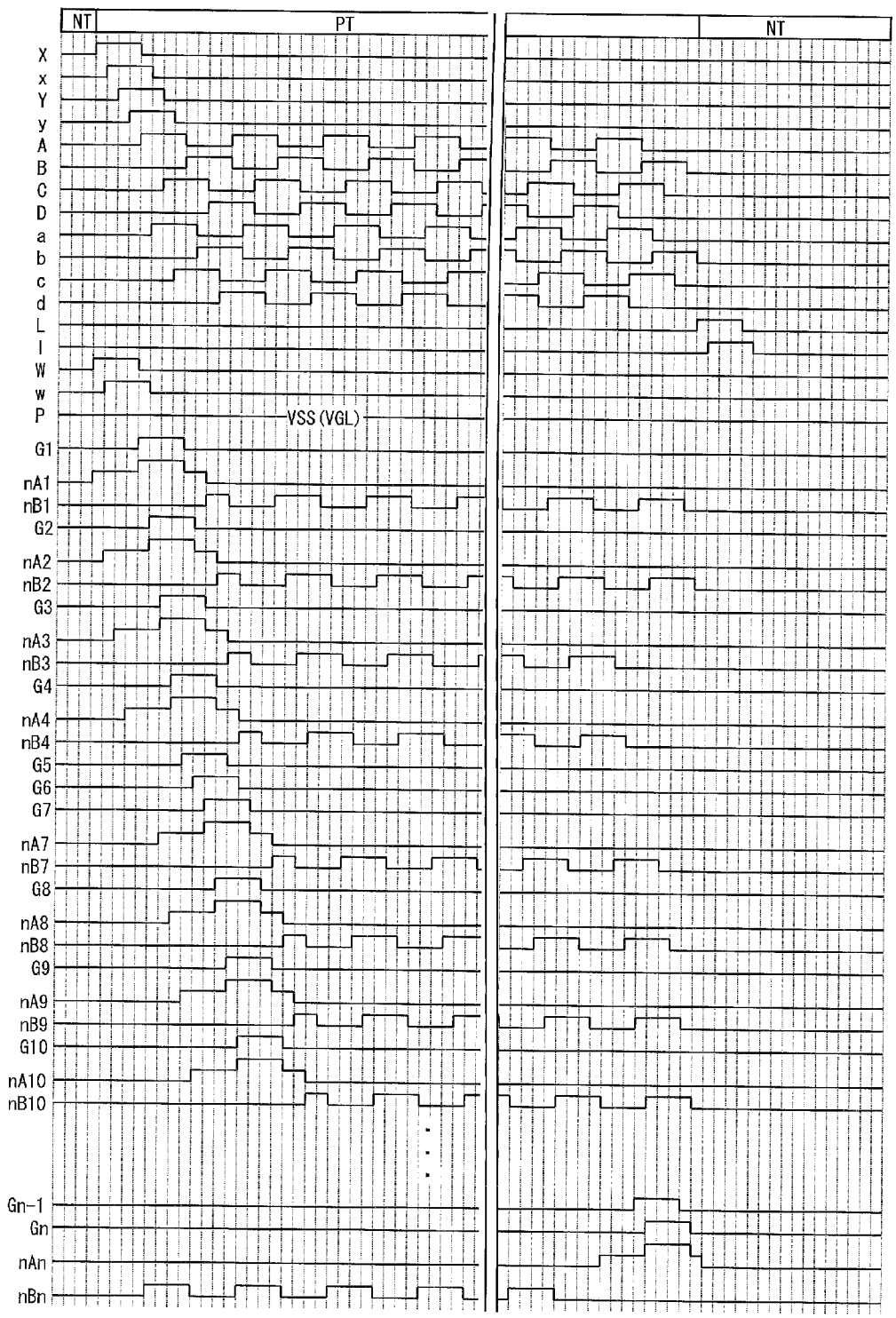

FIG. 64 is a timing chart illustrating an operation of a shift register illustrated in FIG. 64.

Figure 65:
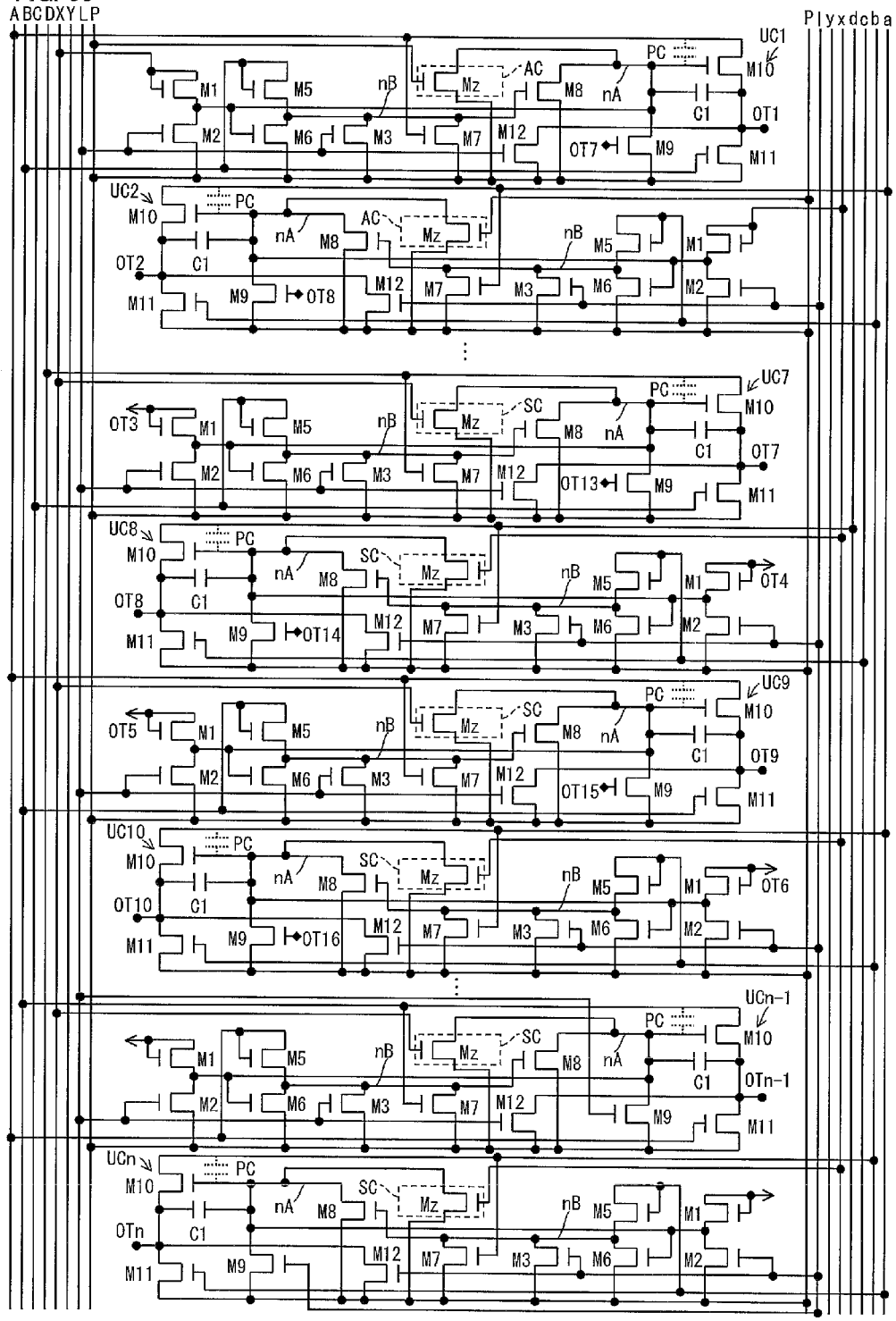

FIG. 65 is a circuit diagram illustrating a second modification of the shift register of Example 8.

Figure 66:
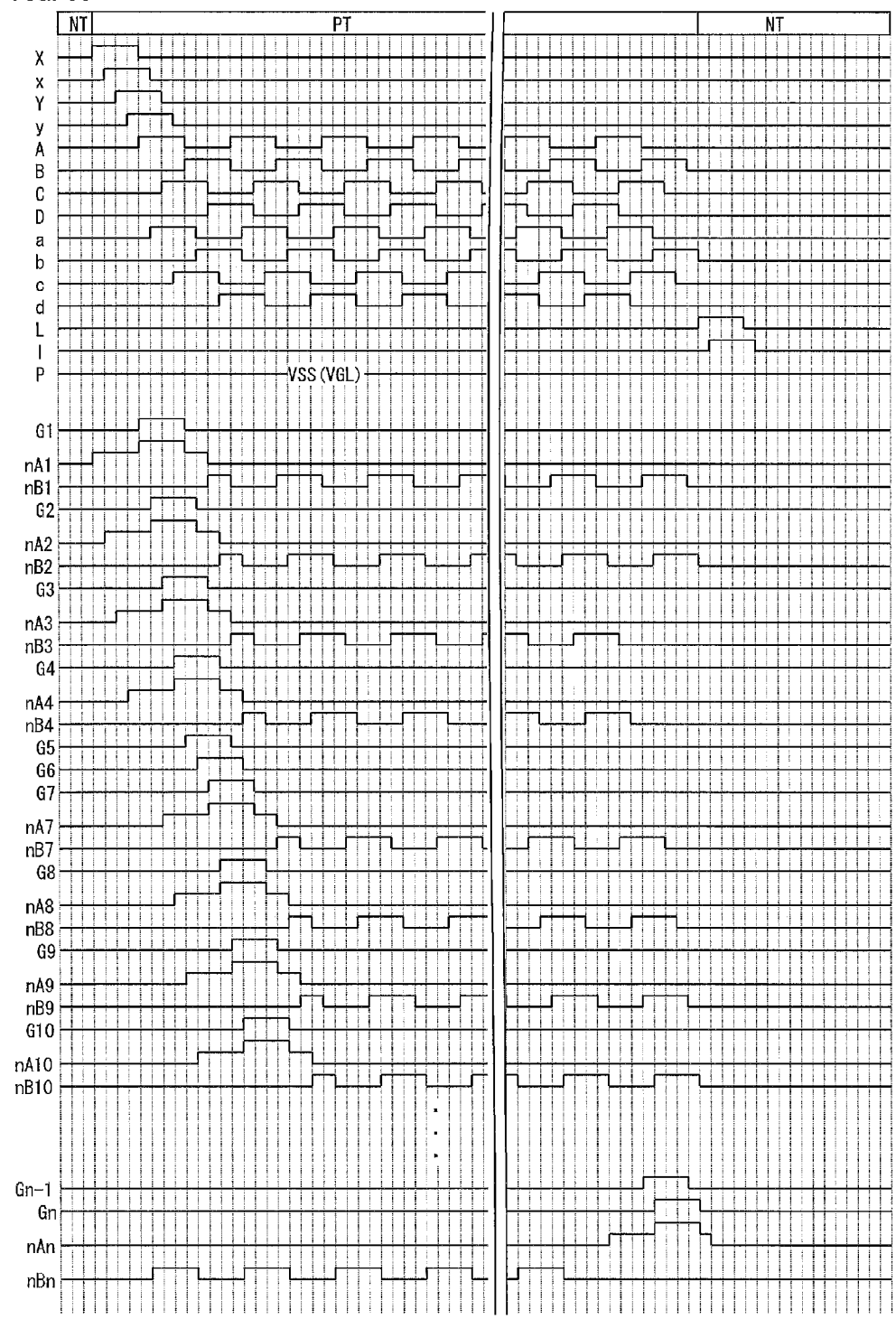

FIG. 66 is a timing chart illustrating an operation of a shift register illustrated in FIG. 65.

Figure 67:
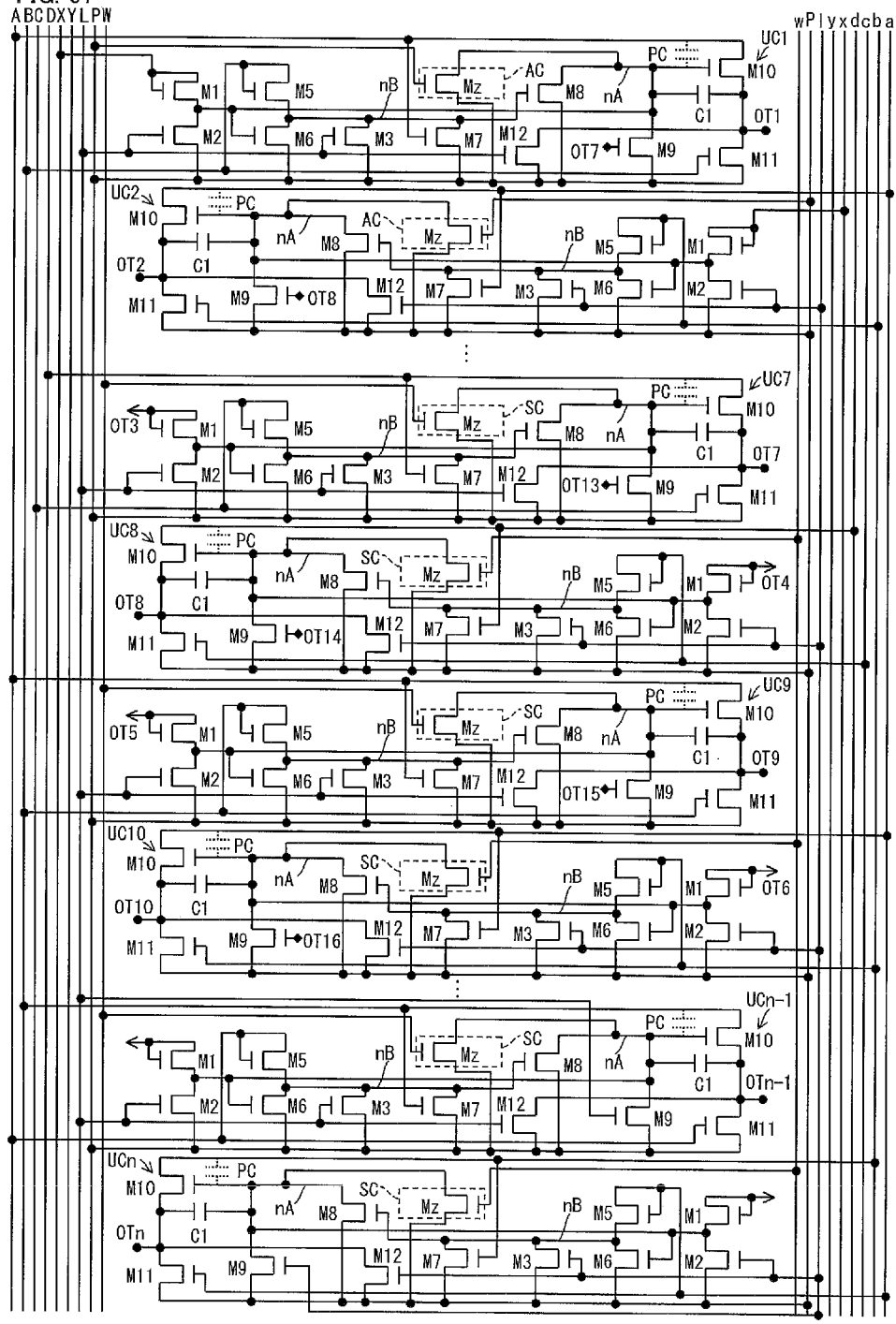

FIG. 67 is a circuit diagram illustrating a third modification of the shift register of Example 8.

Figure 68:
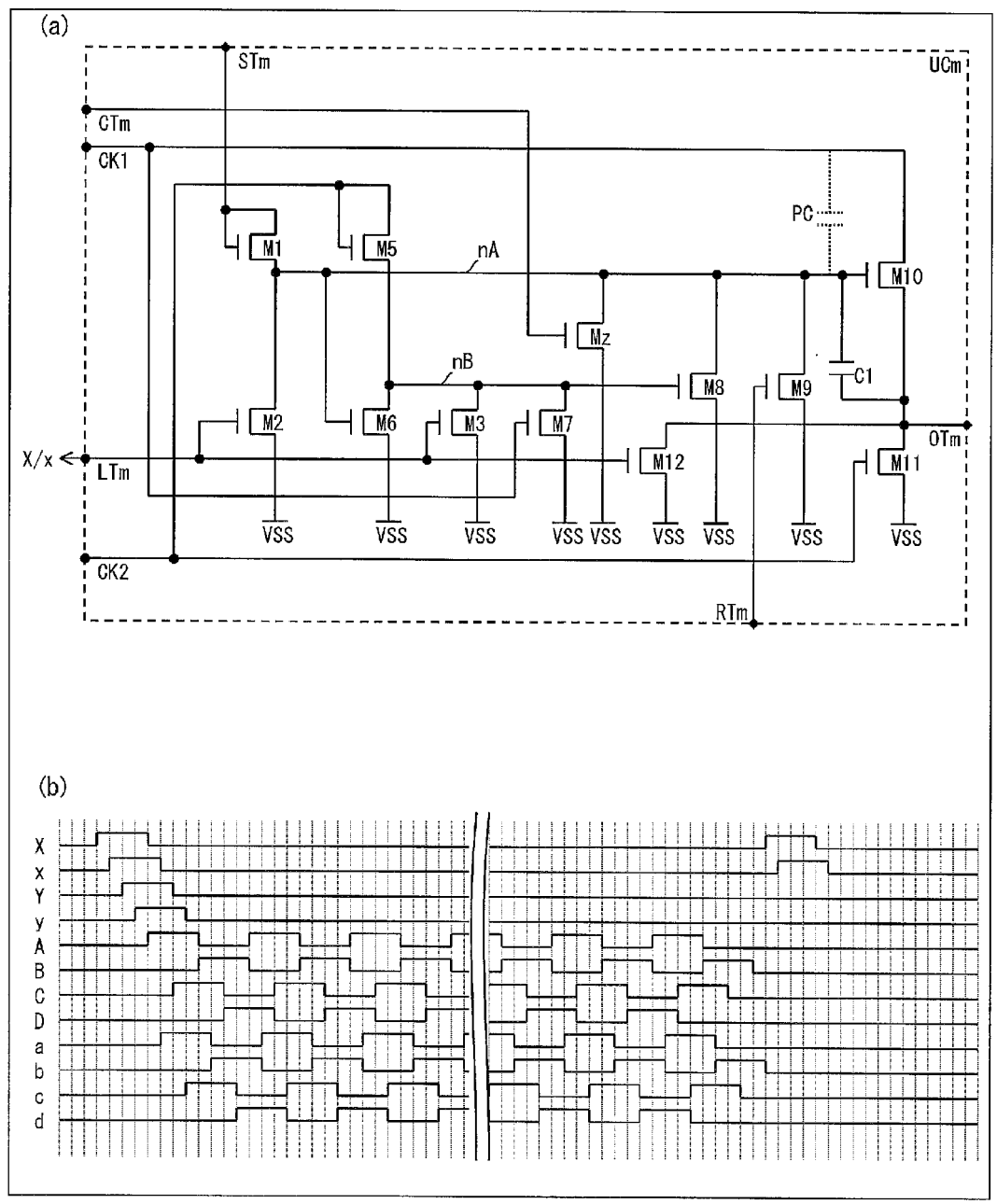

(a) of FIG. 68 is a circuit diagram illustrating a modification of an example configuration illustrated in FIG. 58. (b) of FIG. 68 illustrates waveforms of input signals.

Figure 69:
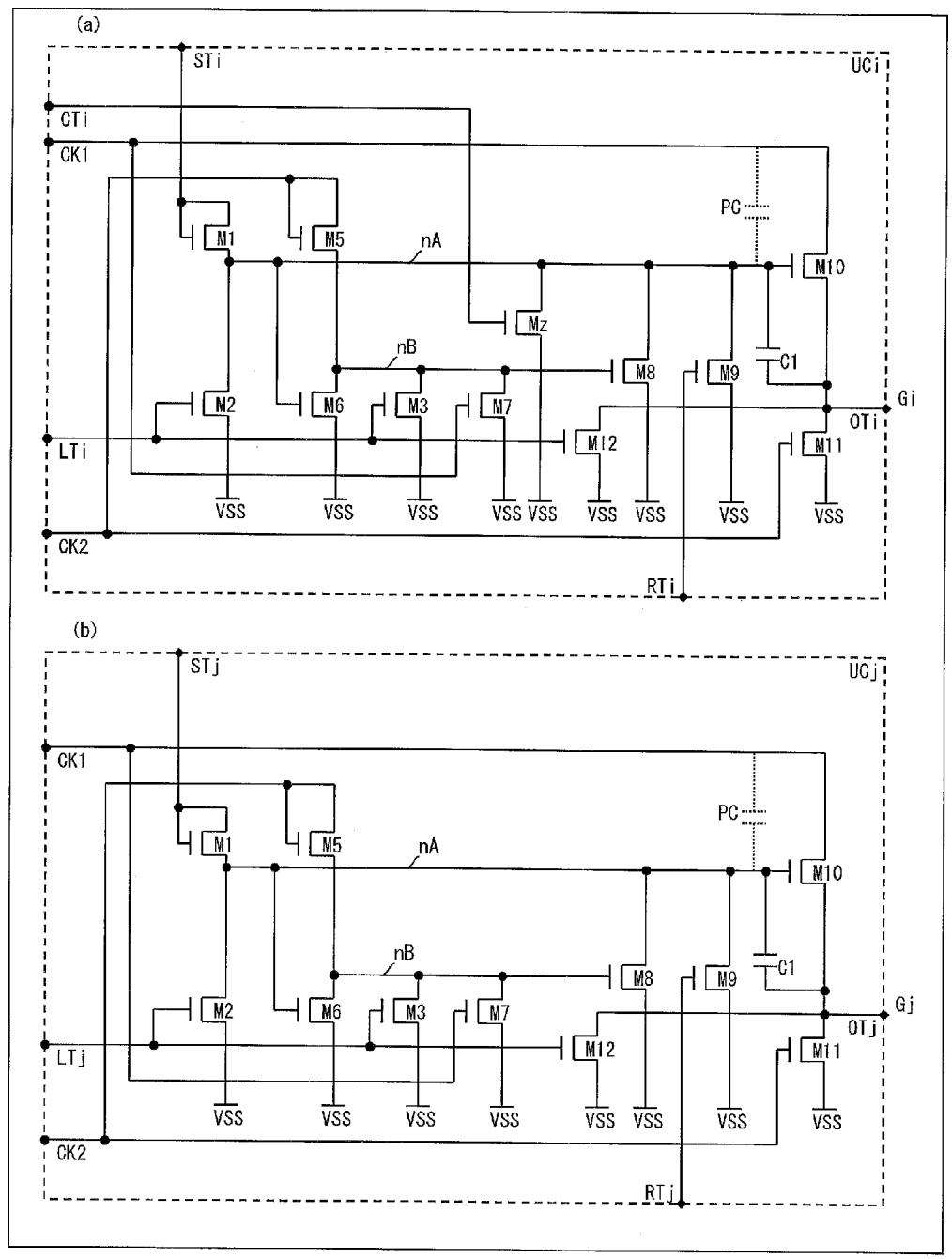

FIG. 69 is a circuit diagram illustrating a unit stage of a shift register of Example 9.

Figure 70:
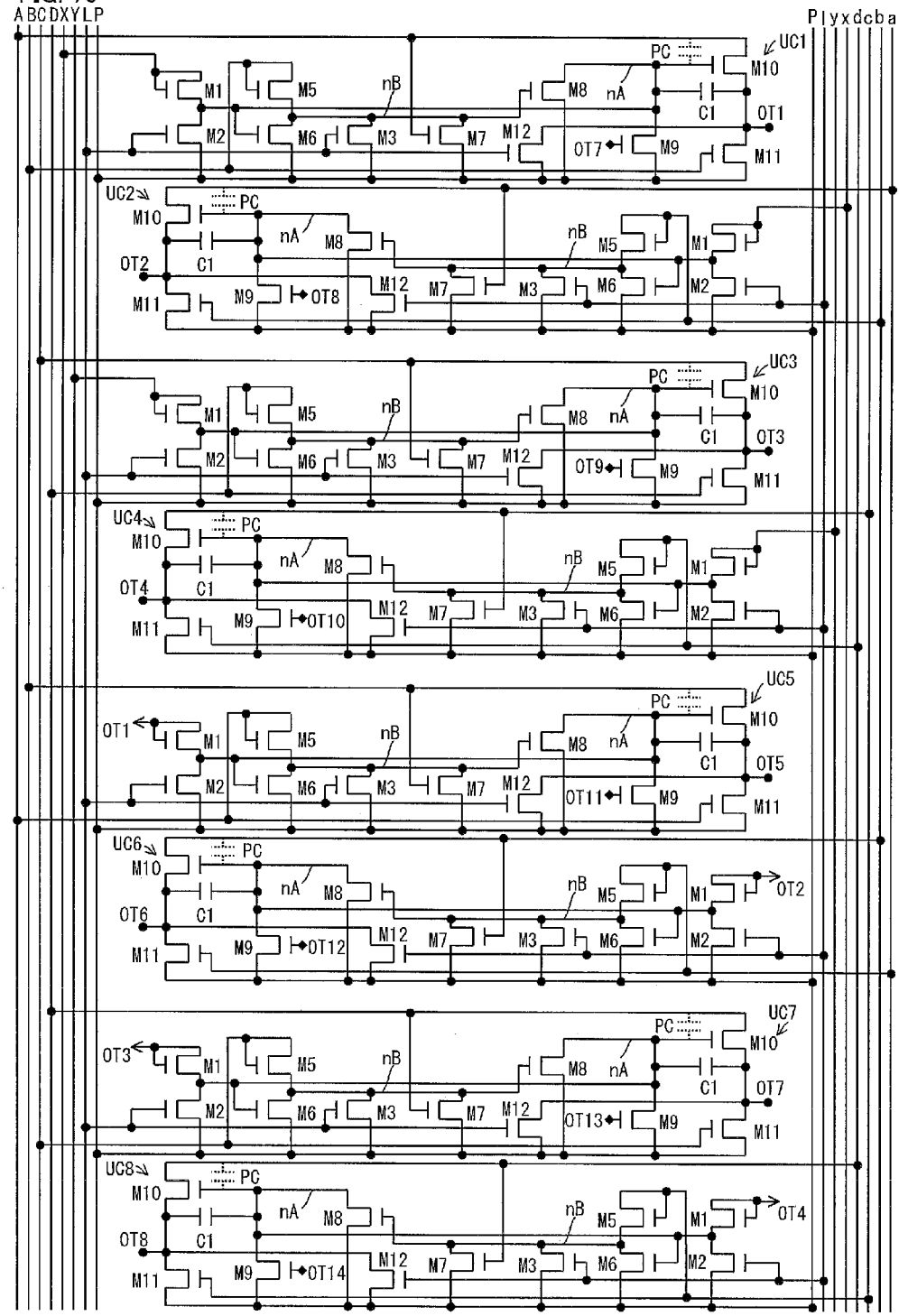

FIG. 70 is a circuit diagram illustrating first through eighth stages of the shift register of Example 9.

Figure 71:
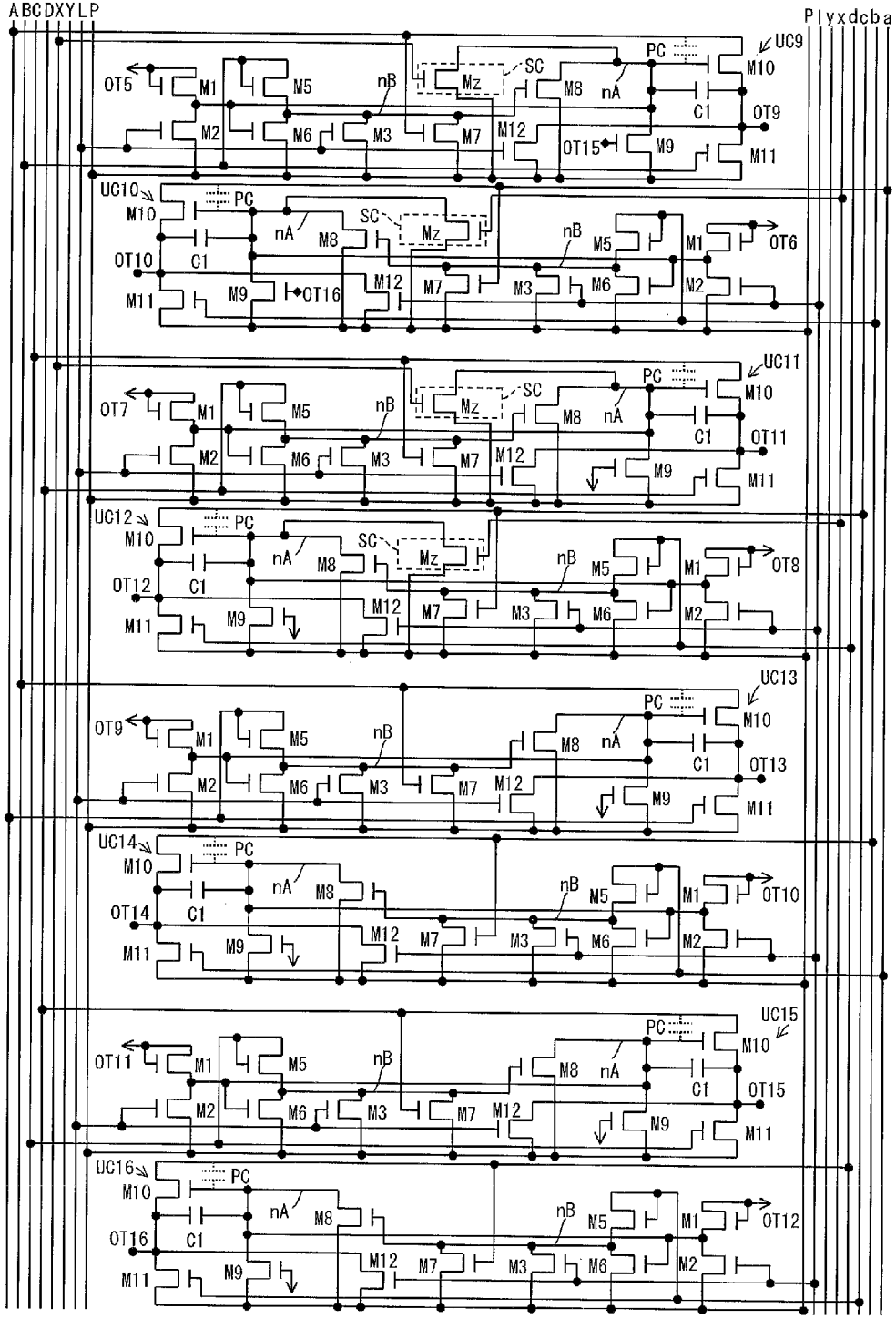

FIG. 71 is a circuit diagram illustrating ninth through $16^{th}$ stages of the shift register of Example 9.

Figure 72:
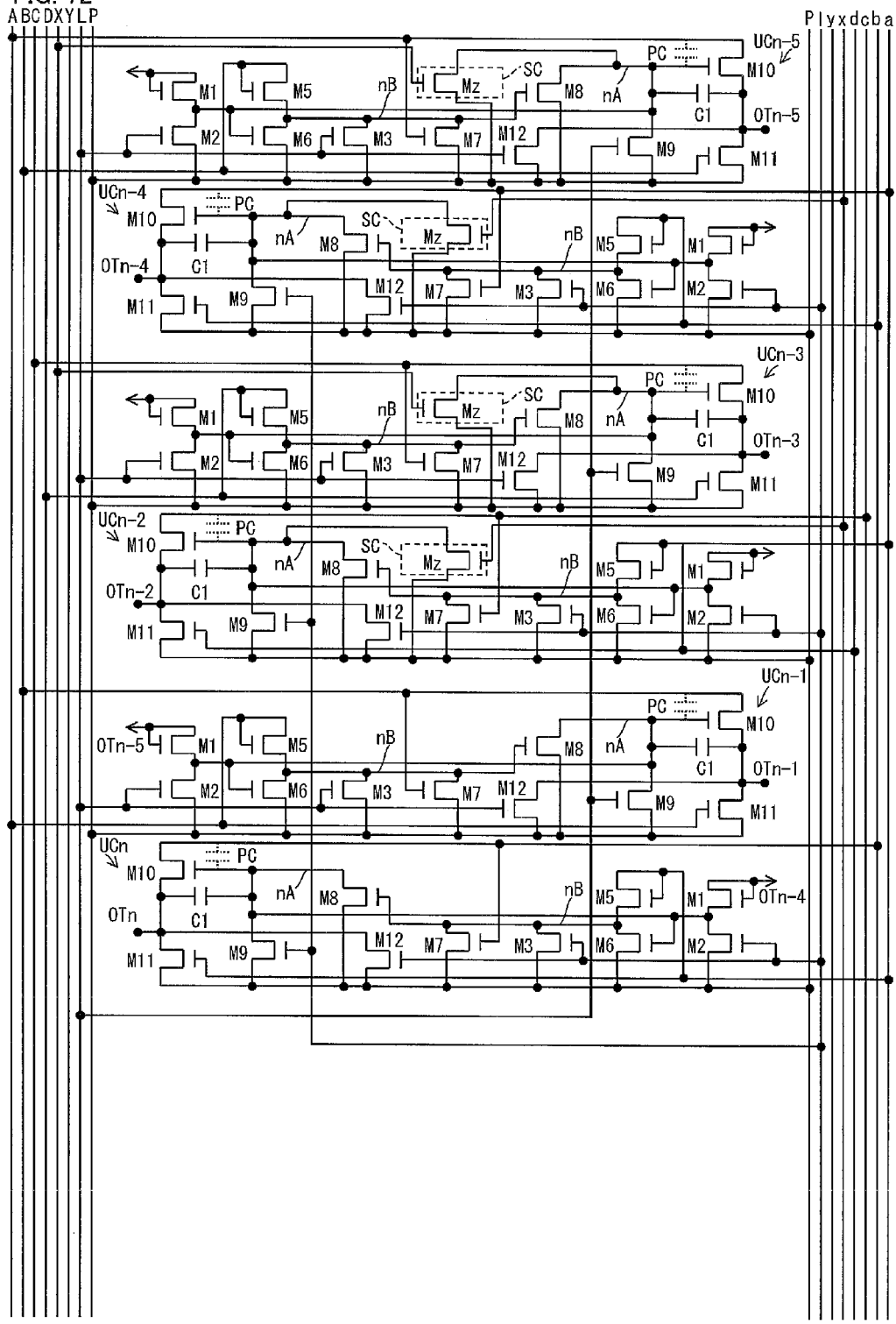

FIG. 72 is a circuit diagram illustrating $(n-5)^{th}$ through $n^{th}$ stages of the shift register of Example 9.

Figure 73:
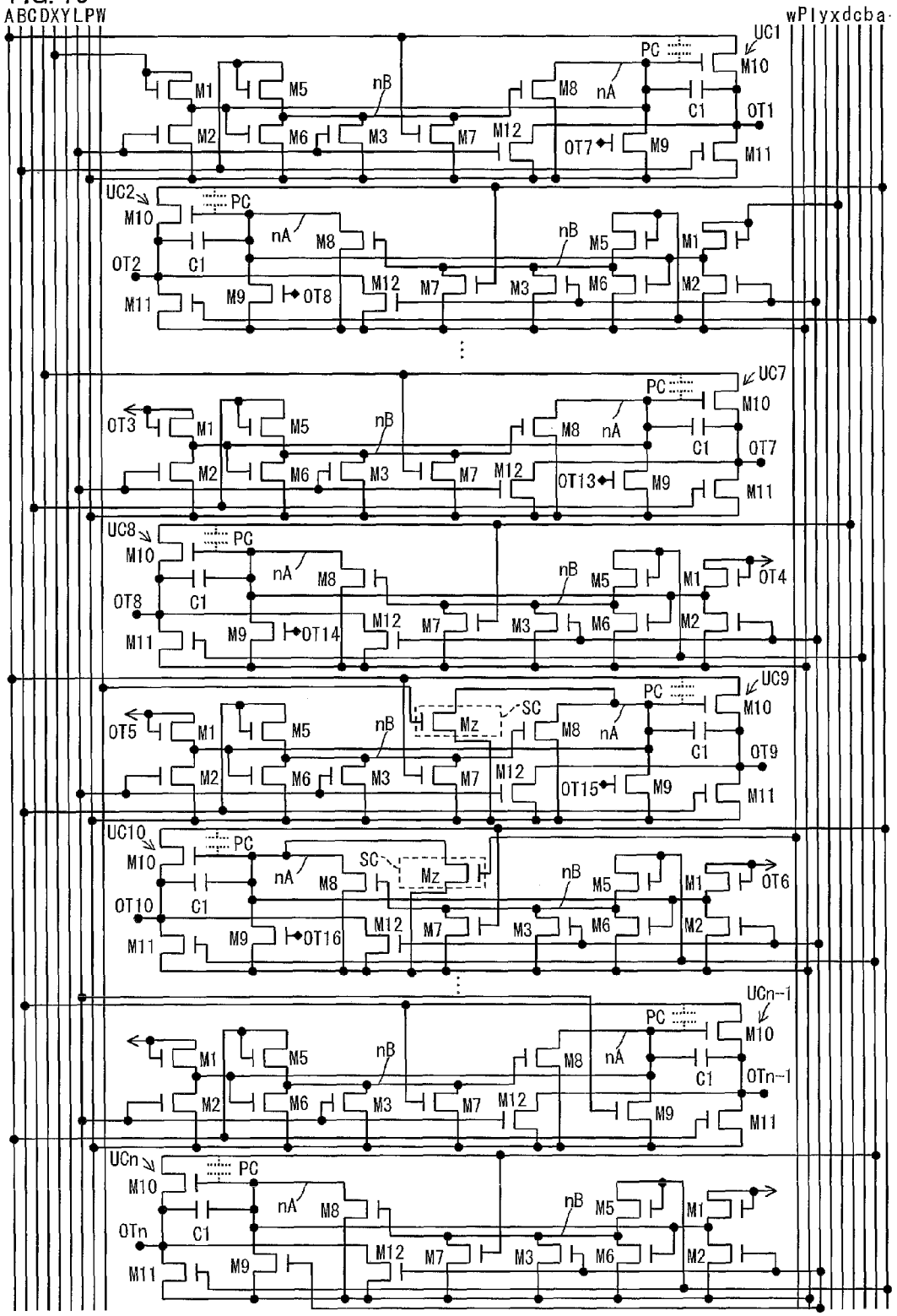

FIG. 73 is a circuit diagram illustrating a first modification of the shift register of Example 9.

Figure 74:
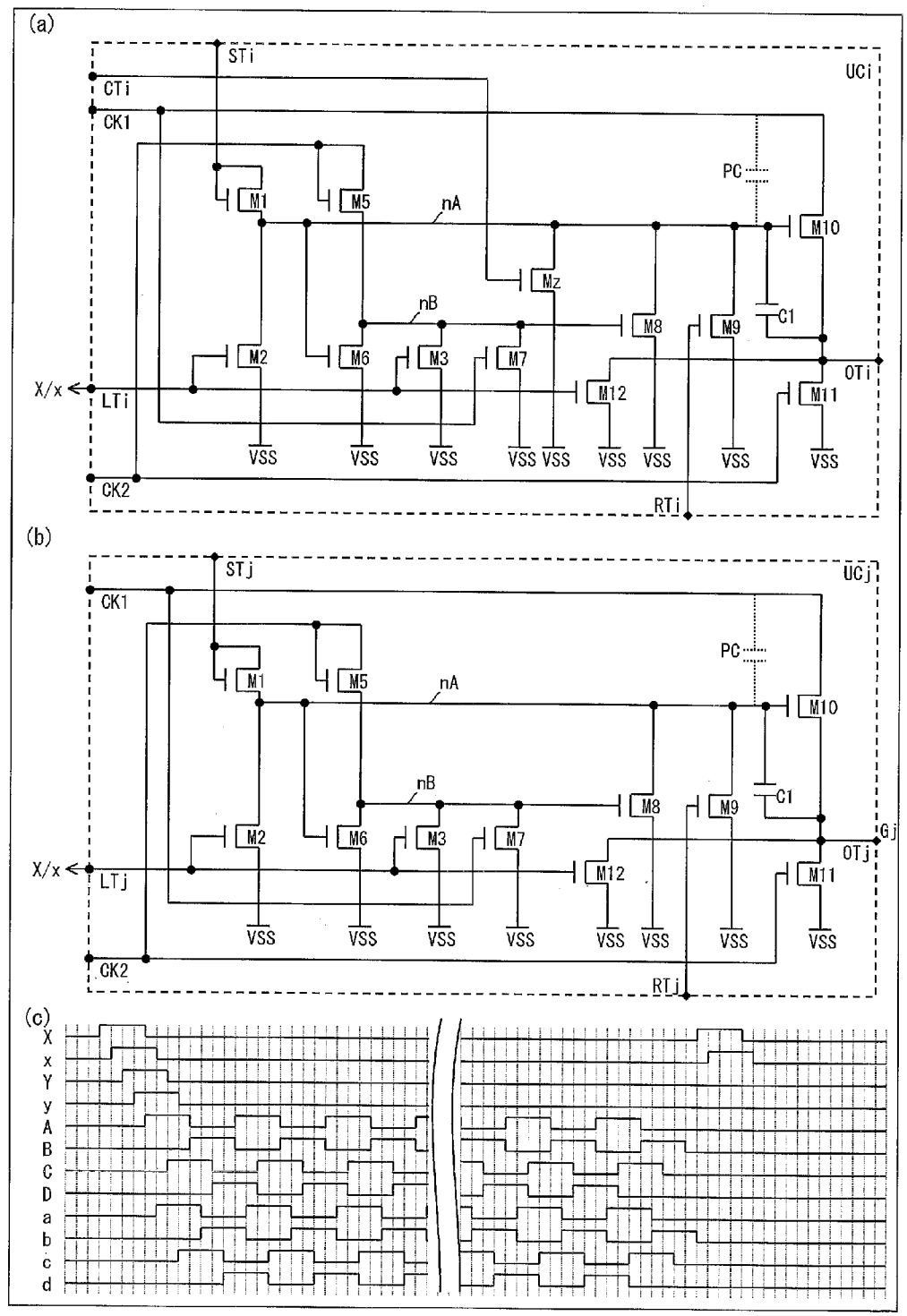

(a) and (b) of FIG. 74 each are a circuit diagram illustrating a modification of an example configuration illustrated in FIG. 69. (c) of FIG. 74 illustrates waveforms of input signals.

Figure 75:
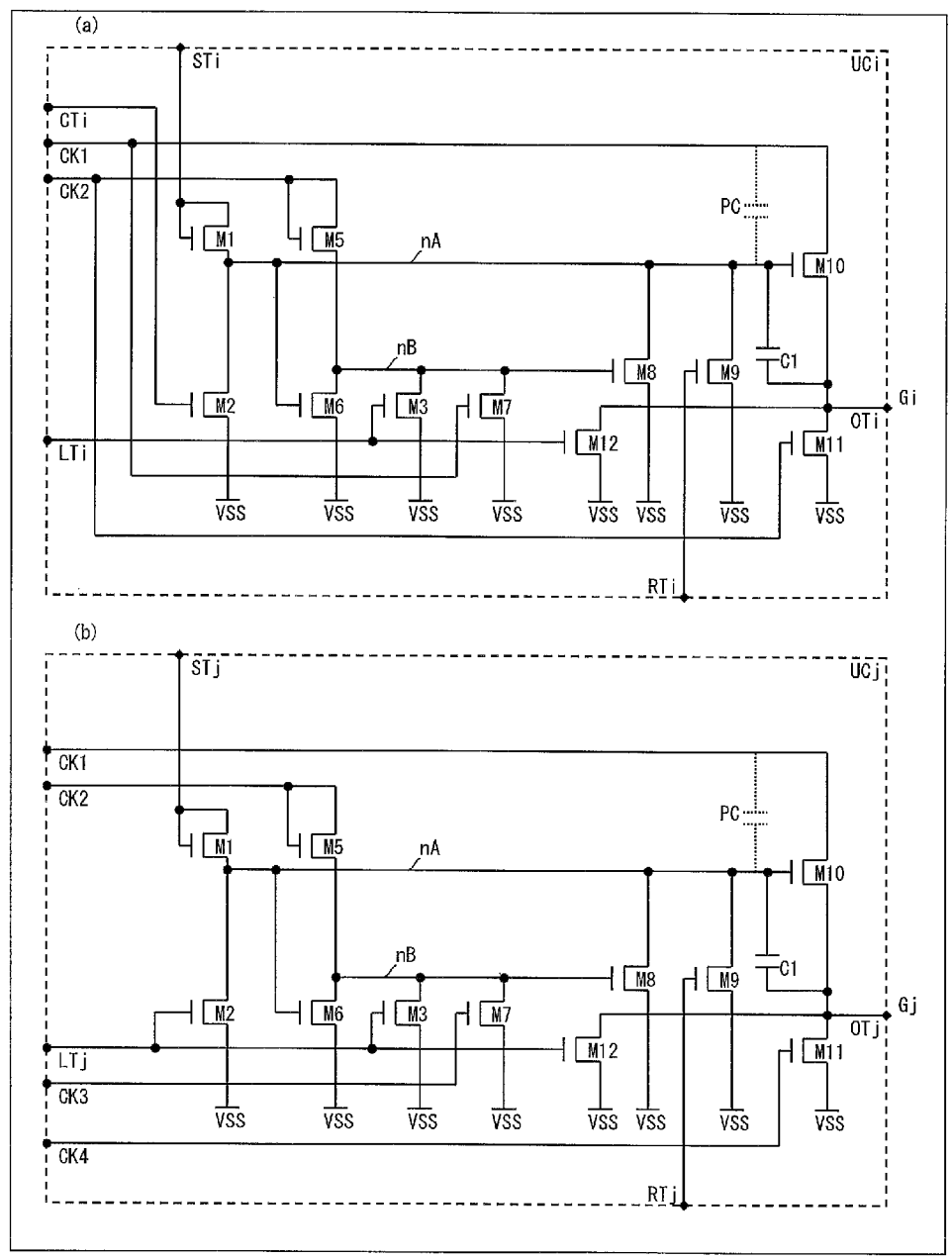

(a) and (b) of FIG. 75 each are a circuit diagram illustrating a unit stage of a shift register of Example 10.

Figure 76:
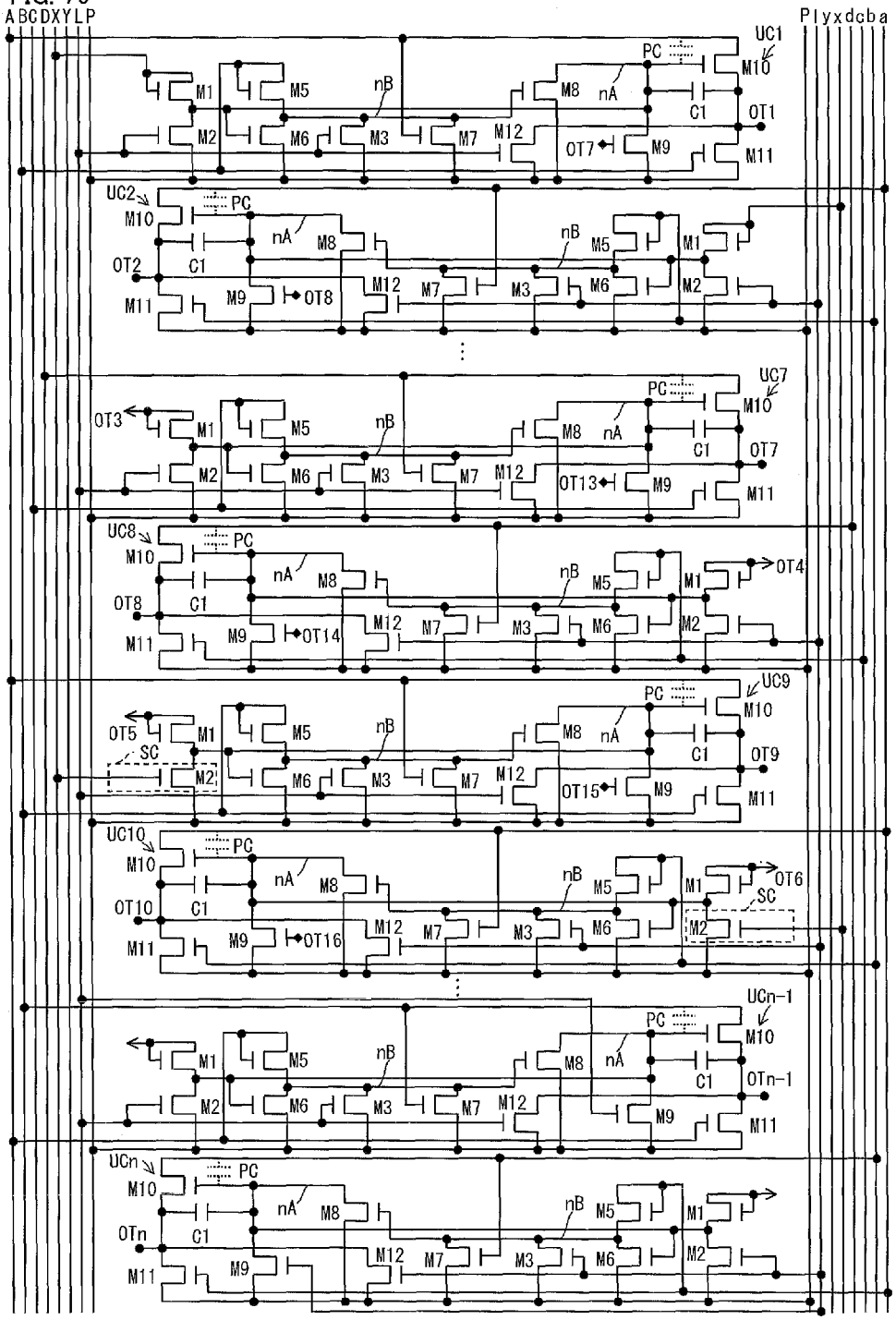

FIG. 76 is a circuit diagram illustrating first through $n^{th}$ stages of the shift register of Example 10.

Figure 77:
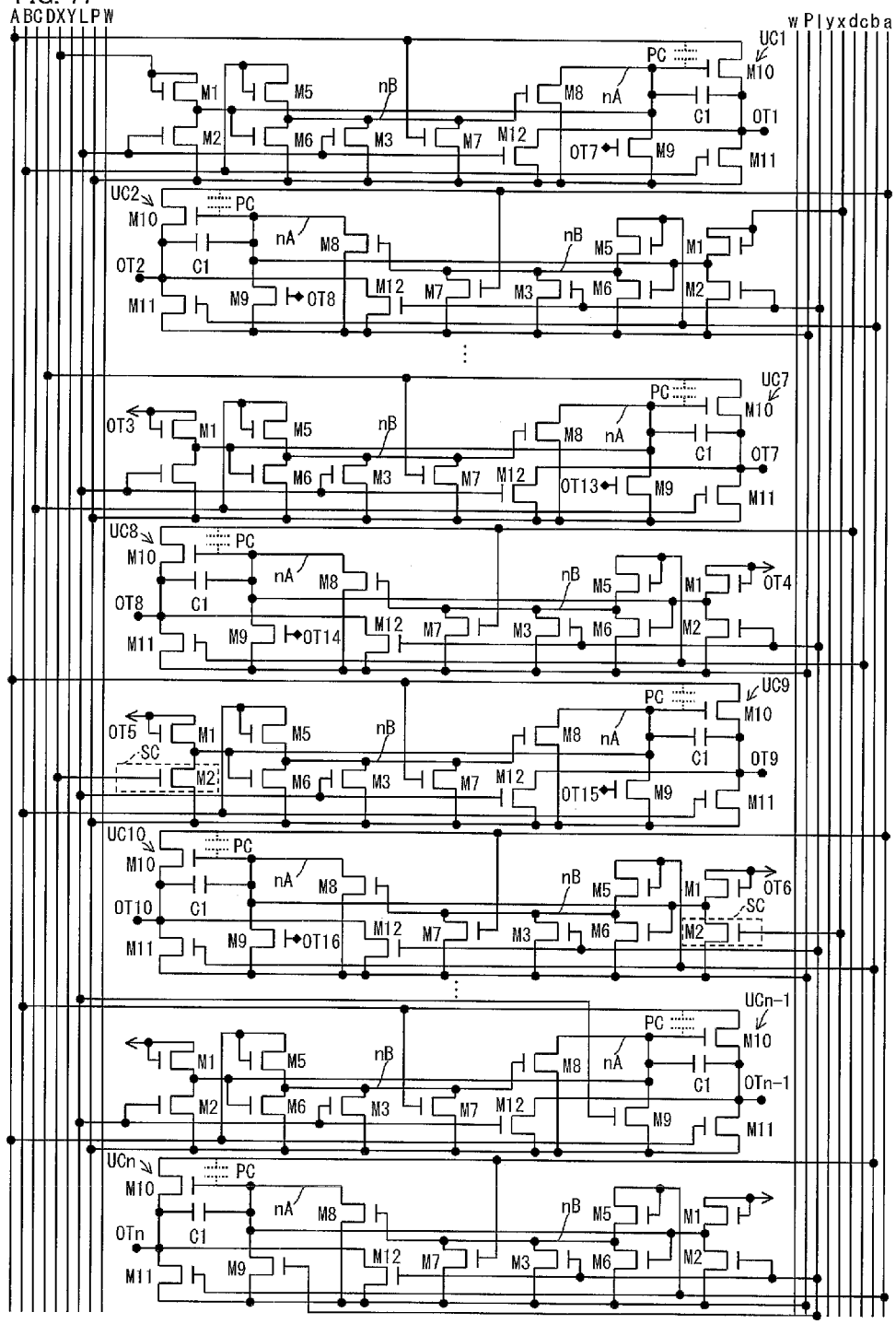

FIG. 77 is a circuit diagram illustrating a modification of the shift register of Example 10.

Figure 78:
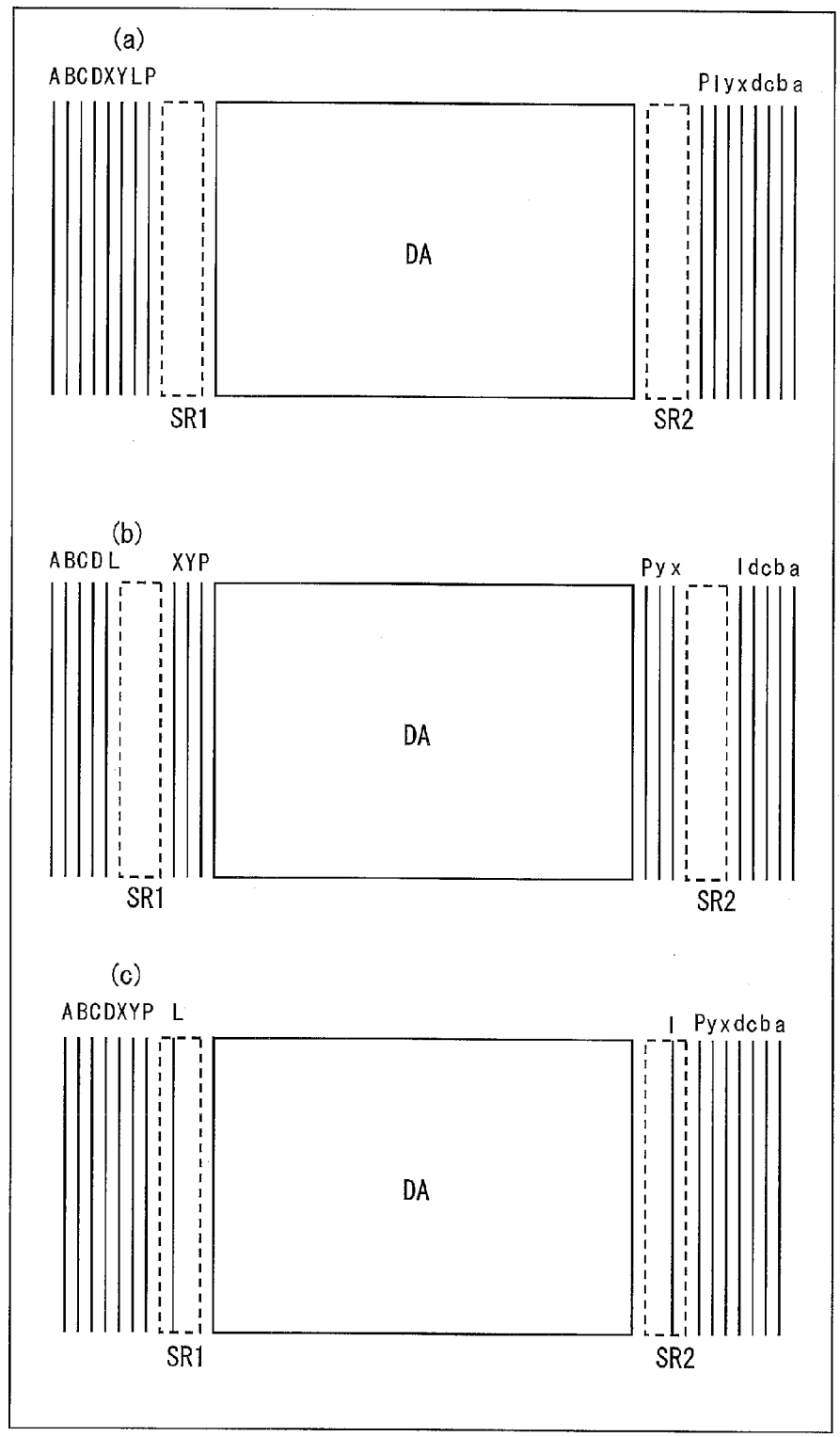

FIG. 78 is a view schematically illustrating an example configuration of a driver of the display device of the present embodiment.

Figure 79:
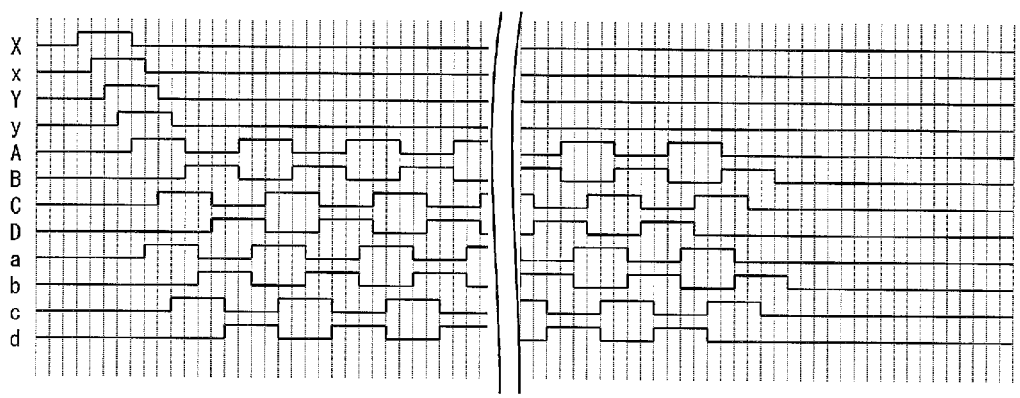

FIG. 79 is a timing chart illustrating a modification in which lines L and I are not provided.

Figure 80:
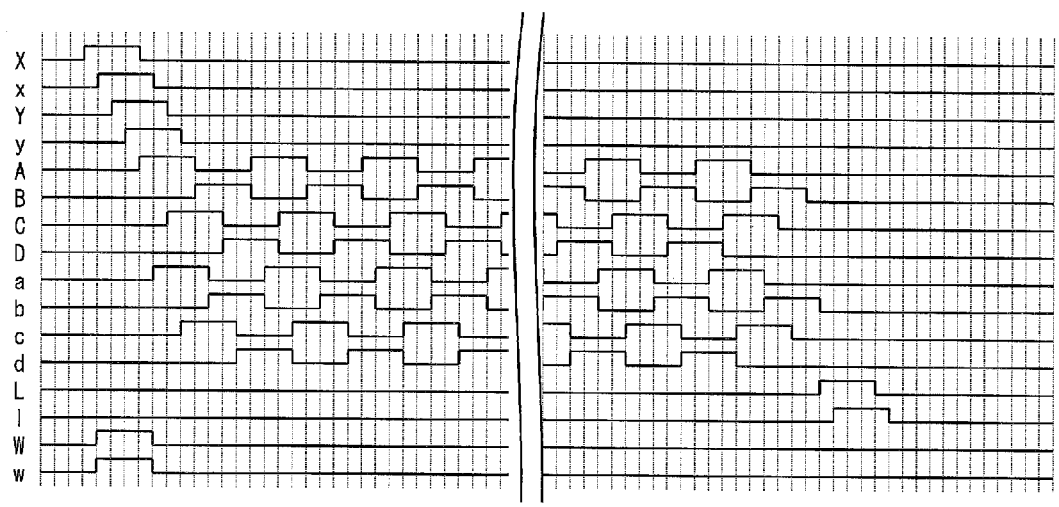

FIG. 80 is a timing chart illustrating a modification in which lines W and w are used.

Figure 81:
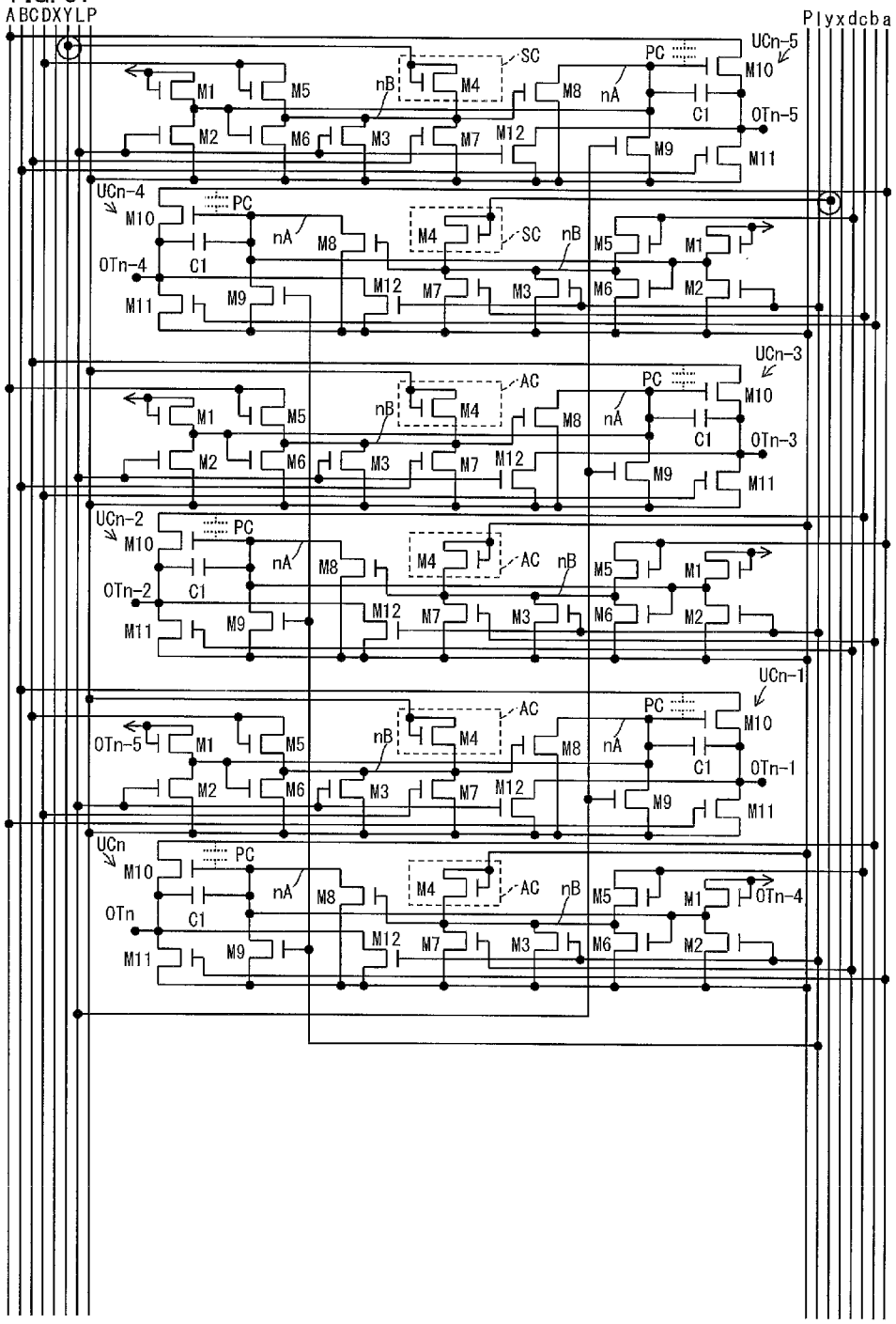

FIG. 81 is a circuit diagram ($(n-5)^{th}$ through $n^{th}$ stages) illustrating another modification of Example 1.

Figure 82:
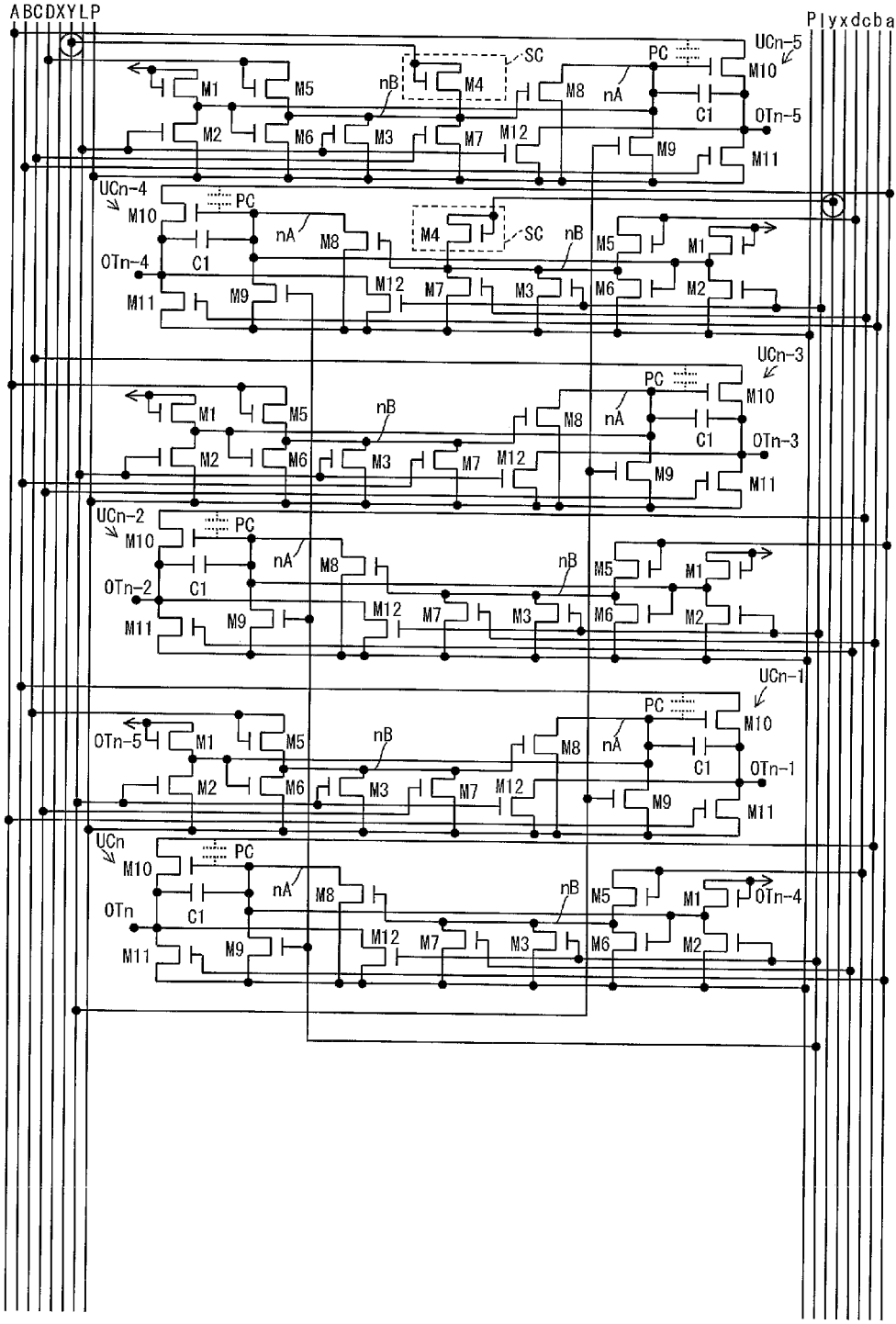

FIG. 82 is a circuit diagram ($(n-5)^{th}$ through $n^{th}$ stages) illustrating another modification of Example 2.

Figure 83:
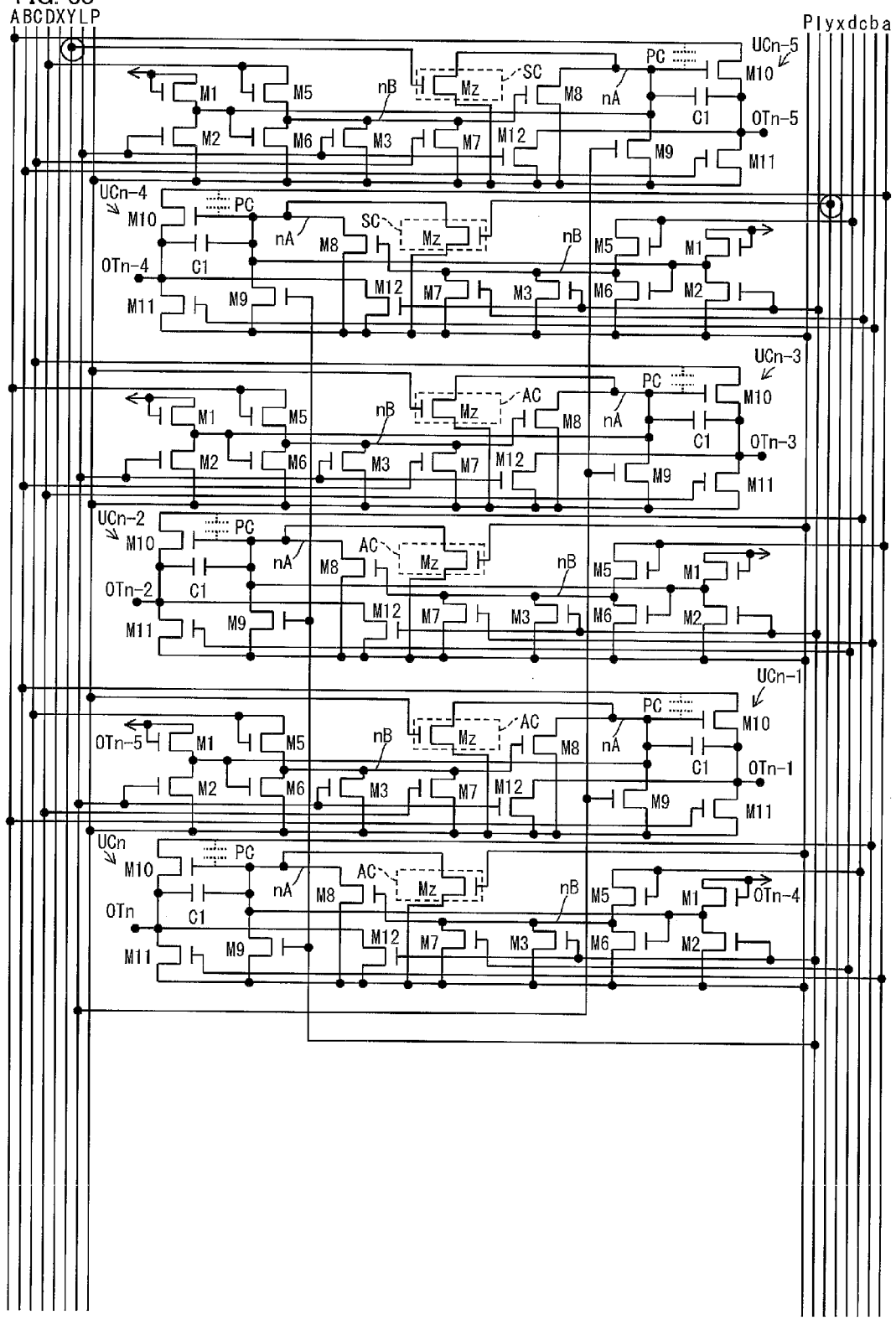

FIG. 83 is a circuit diagram ($(n-5)^{th}$ through $n^{th}$ stages) illustrating another modification of Example 3.

Figure 84:
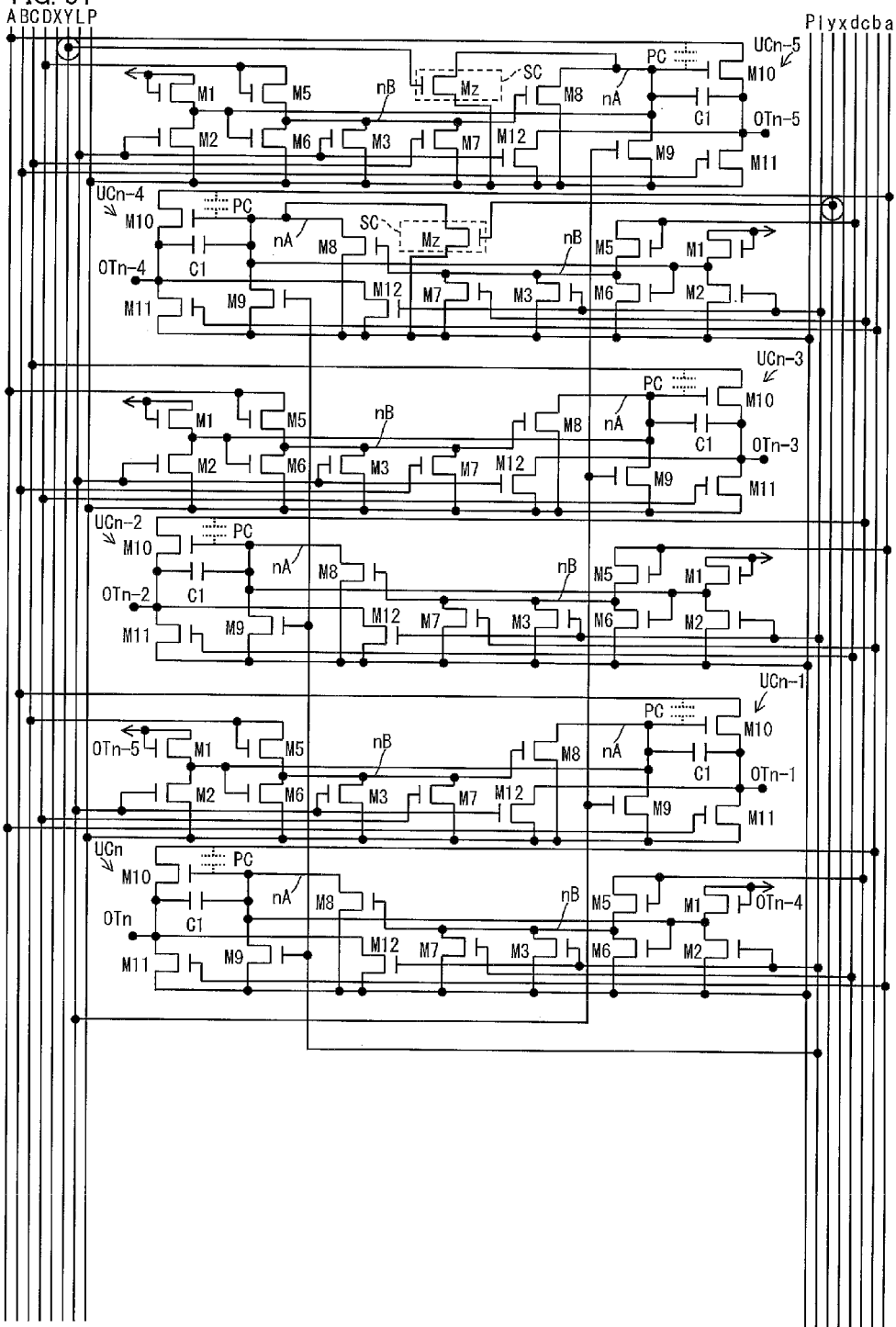

FIG. 84 is a circuit diagram ($(n-5)^{th}$ through $n^{th}$ stages) illustrating another modification of Example 4.

Figure 85:
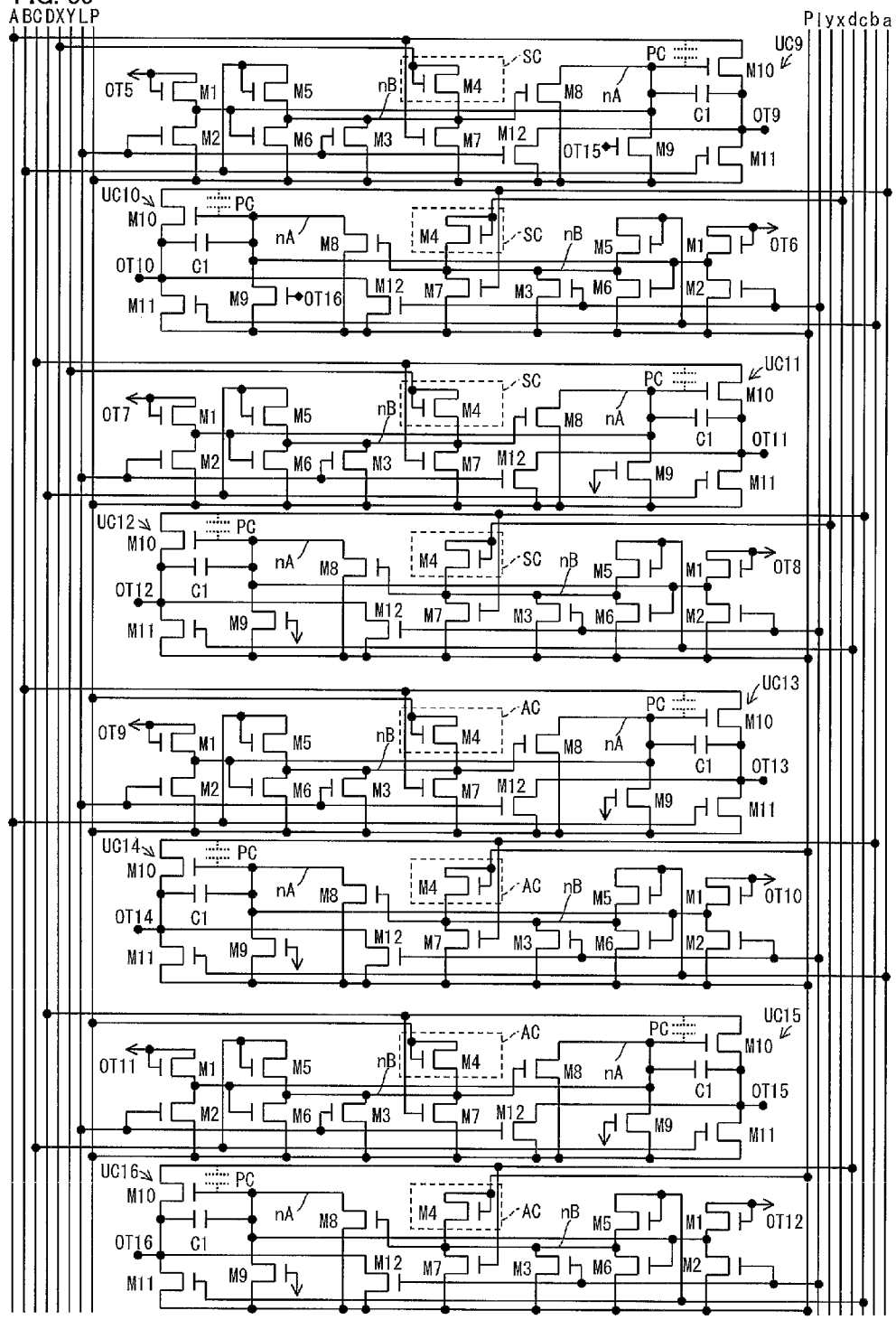

FIG. 85 is a circuit diagram (ninth through $16^{th}$ stages) illustrating another modification of Example 6.

Figure 86:
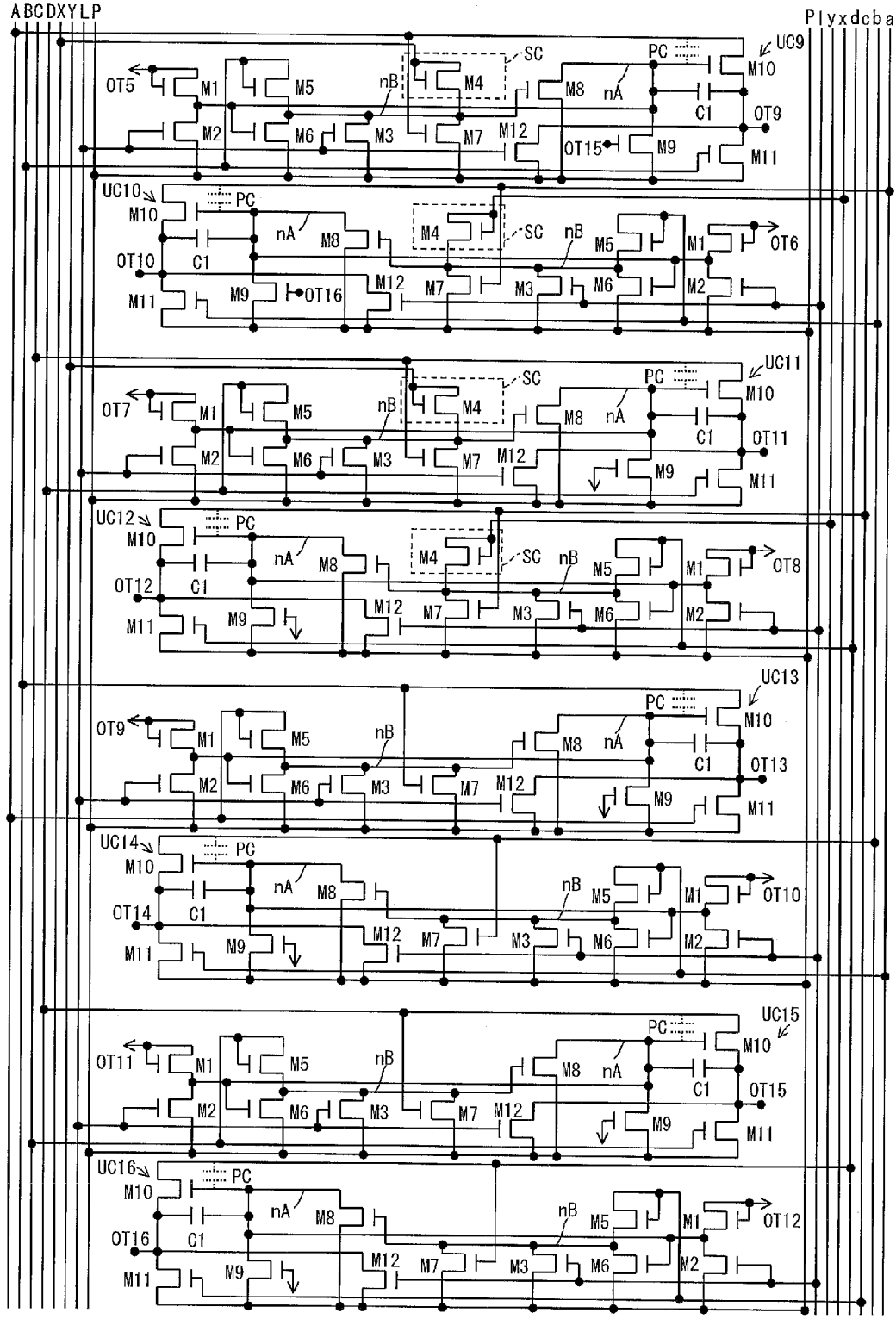

FIG. 86 is a circuit diagram (ninth through $16^{th}$ stages) illustrating another modification of Example 7.

Figure 87:
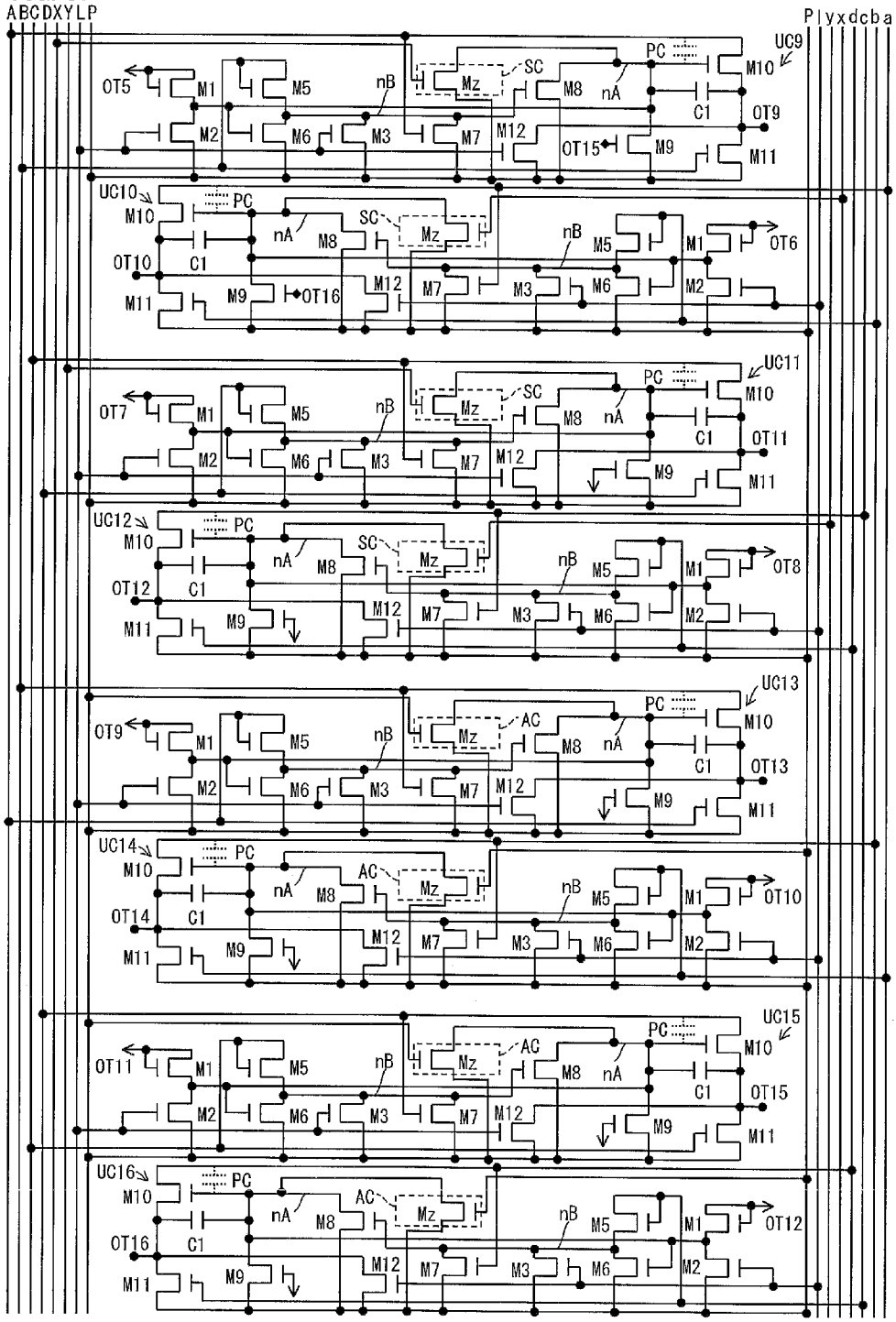

FIG. 87 is a circuit diagram (ninth through 16$^{th}$ stages) illustrating another modification of Example 8.

Figure 88:
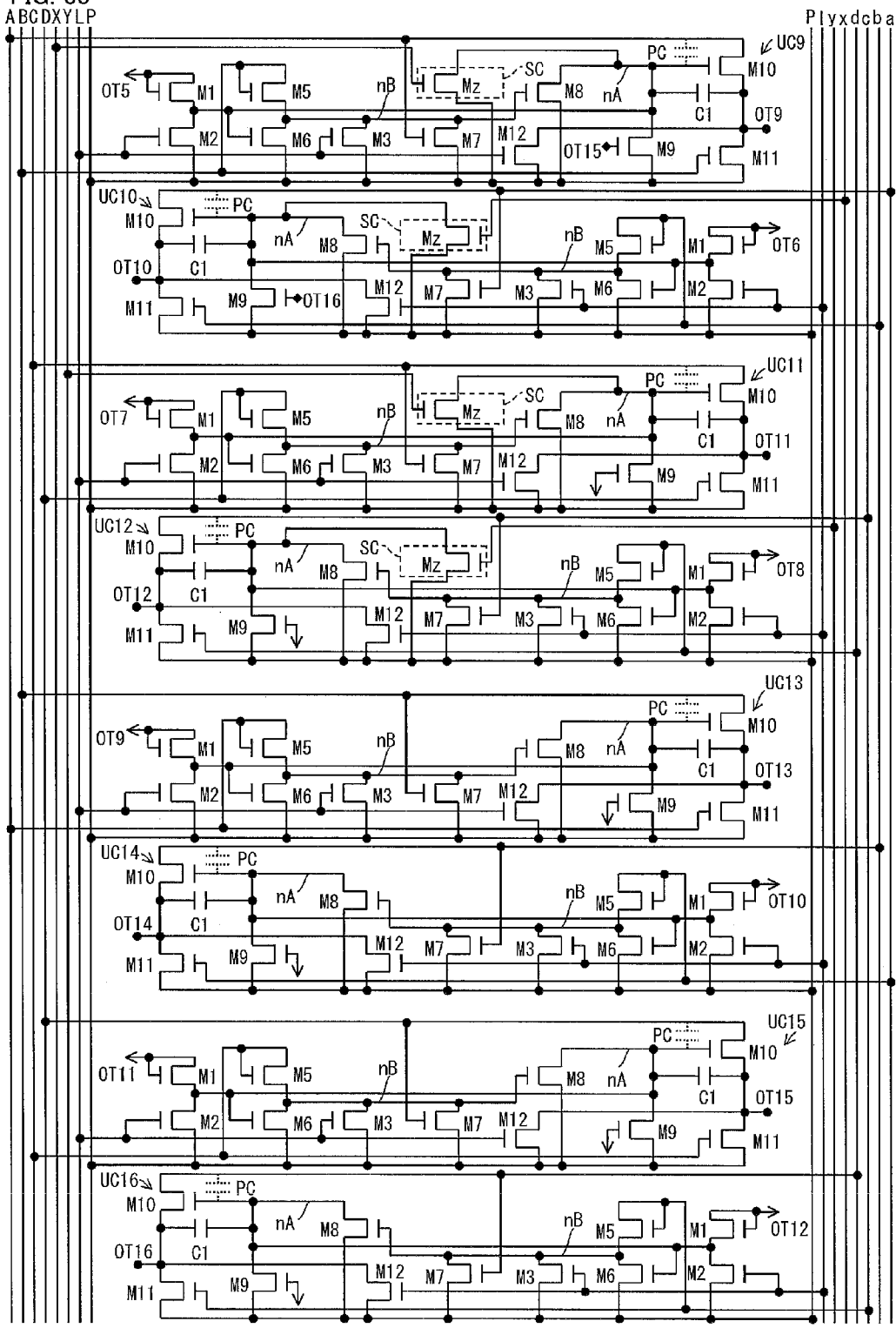

FIG. 88 is a circuit diagram (ninth through 16$^{th}$ stages) illustrating another modification of Example 9.

DESCRIPTION OF EMBODIMENTS

Figure 2:
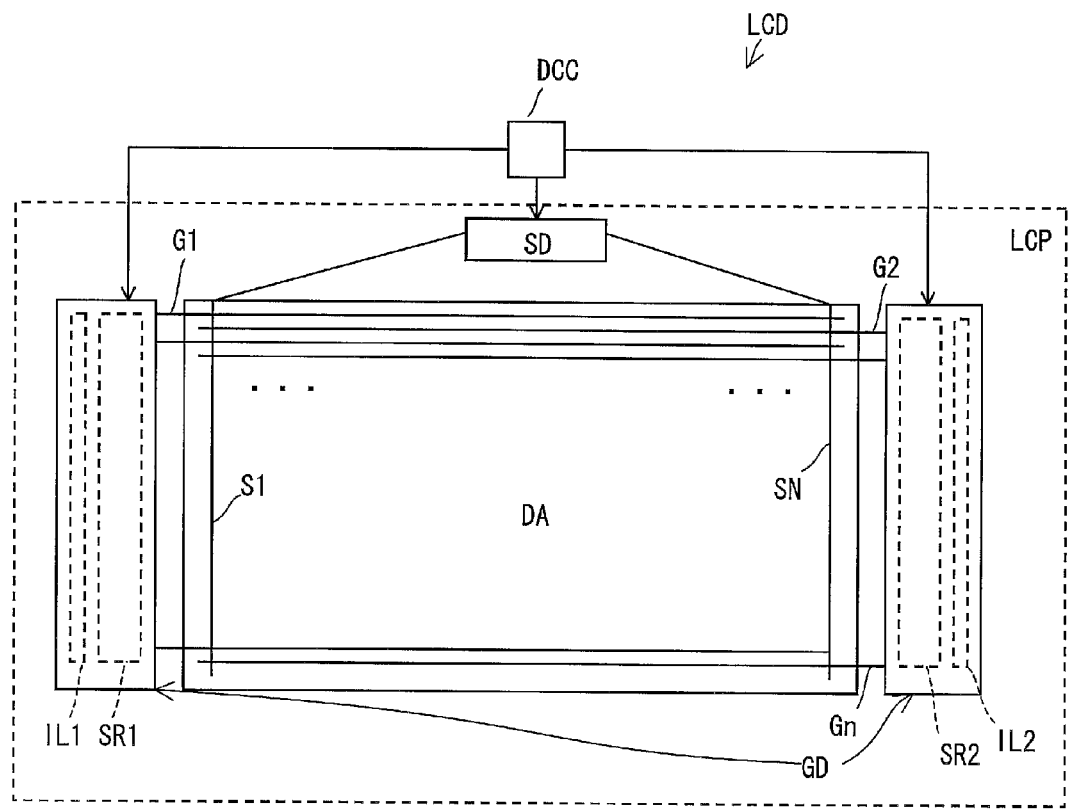
FIG. 2 is a block diagram illustrating an example configuration of a display device of the present embodiment.

The following description will discuss an embodiment of the present invention with reference to FIGS. 1 through 88. As illustrated in FIG. 2, a liquid crystal display device LCD of the embodiment of the present invention includes (i) a liquid crystal panel LCP, (ii) a gate driver GD for driving scan signal lines G1 through Gn of the liquid crystal panel LCP, (iii) a source driver SD for driving data signal lines 51 through Sn of the liquid crystal panel LCP, and (iv) a display control circuit DCC for controlling the gate driver GD and the source driver SD. Note that the gate driver GD and the source driver SD may be provided monolithically with the liquid crystal panel LCP.

The gate driver GD includes (i) a first shift register SR1, (ii) a plurality of lines IL1 connected to the first shift register SR1, (iii) a second shift register SR2, and (iv) a plurality of lines IL2 connected to the second shift register SR2. The first shift register SR1 and the plurality of lines IL1 are provided on one side of opposite sides of a display section DA (on a left side of FIG. 1 where short sides of the liquid crystal panel are located right and left, respectively). Signals are supplied to the first shift register SR1 via the plurality of lines IL1. The second shift register SR2 and the plurality of lines IL2 are provided on the other side of the opposite sides of the display section DA (on a right side of FIG. 1 where the short sides of the liquid crystal panel are located right and left, respectively). Signals are supplied to the second shift register SR2 via the plurality of lines IL2. The first shift register SR1 is connected to odd-numbered scan signal lines (G1 . . . Gn−1) of the scan signal lines G1 through Gn. The second shift register SR2 is connected to even-numbered scan signal lines (G2 . . . Gn) of the scan signal lines G1 through Gn.

Example 1

FIG. 1 illustrates an example configuration of a unit circuit UCm of an m$^{th}$ stage (where m is a natural number) in first and second shift registers SR1 and SR2 of Example 1. Note that the m$^{th}$ stage where m is an odd number is included in the first shift register SR1, whereas the m$^{th}$ stage where m is an even number is included in the second shift register SR2.

As illustrated in FIG. 1, the unit circuit UCm has four input terminals CK1 through CK4, a set terminal STm, a reset terminal RTm, an output terminal OTm, a control terminal CTm, an initialization terminal LTm, N-channel transistors M1 through M12, and a capacitor C1. The output terminal OTm is connected to an m$^{th}$ scan signal line Gm of the liquid crystal panel.

As illustrated in FIG. 1, the transistor M10 has (i) a drain connected to the input terminal CK1, (ii) a source connected to one electrode of the capacitor C1, a drain of the transistor M11, a drain of the transistor M12, and the output terminal OTm, and (iii) a gate (node nA) connected to the other electrode of the capacitor C1, a drain of the transistor M9, a drain of the transistor M8, a gate of the transistor M6, a source of the transistor M1, and a drain of the transistor M2. The transistor M8 has a gate (node nB) connected to a source of the transistor M4, a drain of the transistor M7, a drain of the transistor M3, a drain of the transistor M6, and a source of the transistor M5. The transistors M2, M3, M6 through M9, M11, and M12 have respective sources connected to a low power supply electric potential VSS (VGL). The transistor M1 has a drain and a gate which are connected to the set terminal STm. The transistor M5 has a drain and a gate which are connected to the input terminal CK2. The transistor M4 (control transistor) has a drain and a gate which are connected to the control terminal CTm. The transistors M2, M3, and M12 have respective gates connected to the initialization terminal LTm. The transistor M7 has a gate connected to the input terminal CK3. The transistor M9 has a gate connected to the reset terminal RTm. The transistor M11 has a gate connected to the input terminal CK4.

Figure 3:
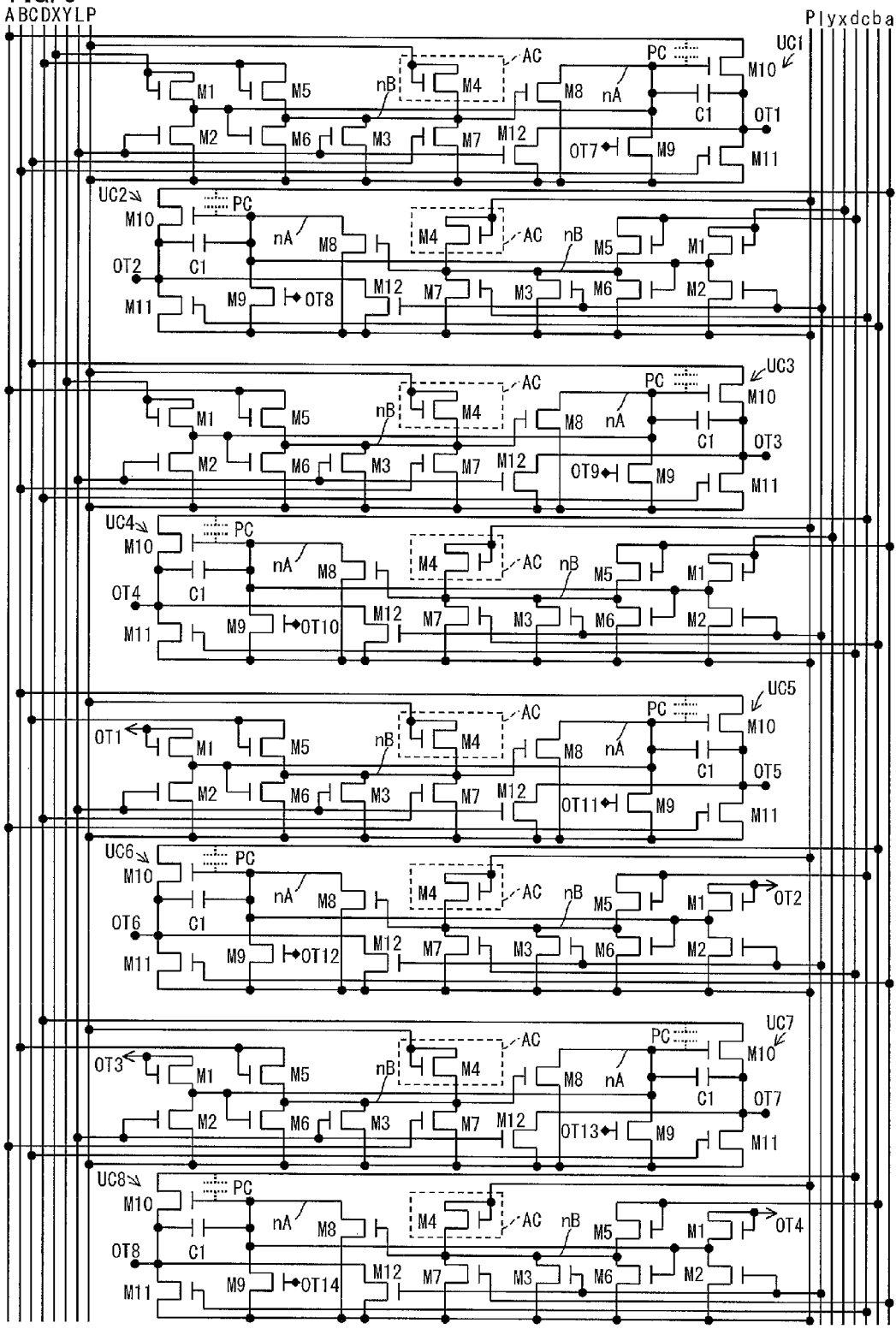
FIG. 3 is a circuit diagram illustrating first through eighth stages of the shift register of Example 1.
Figure 4:
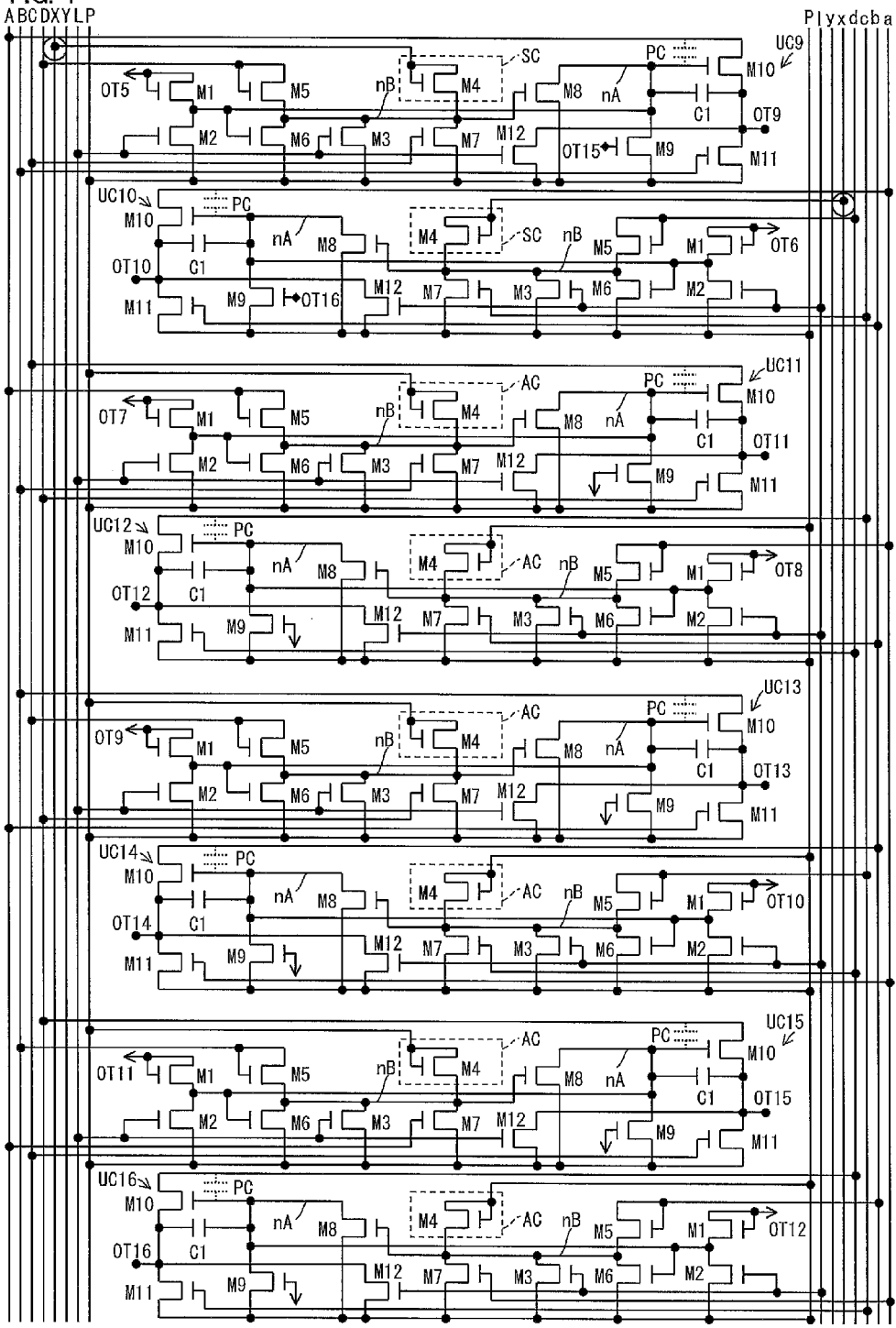
FIG. 4 is a circuit diagram illustrating ninth through $16^{th}$ stages of the shift register of Example 1.
Figure 5:
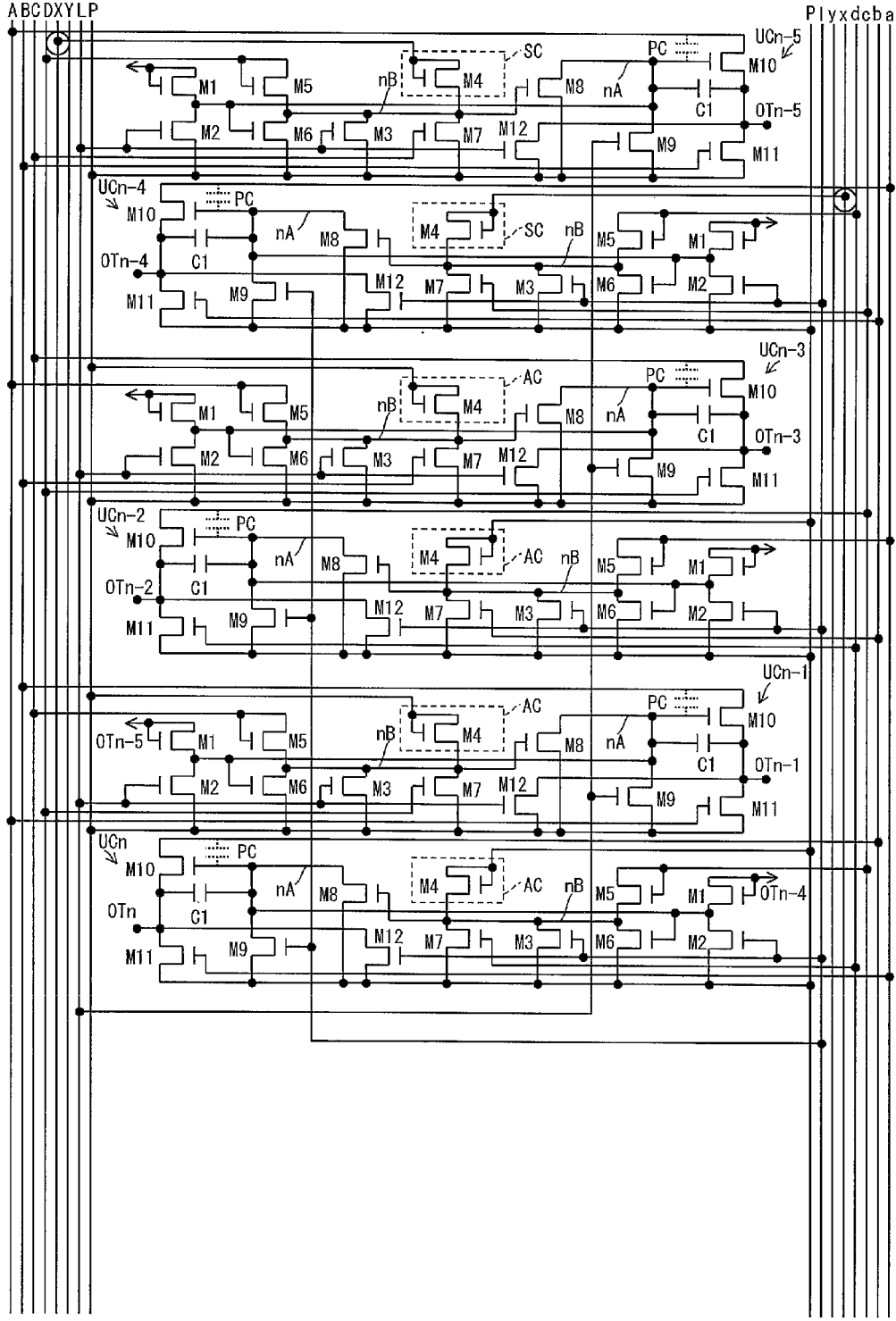
FIG. 5 is a circuit diagram illustrating $(n-5)^{th}$ through $n^{th}$ stages of the shift register of Example 1.

FIG. 1 and FIGS. 3 through 5 illustrate a configuration of first through n$^{th}$ stages (m=1 to n) of the first and second shift registers of Example 1. As illustrated in FIGS. 3 through 5, the plurality of lines IL1 illustrated in FIG. 2 include (i) lines (trunks) A through D via which respective clock signals CKA through CKD (four phases) are supplied, (ii) lines (trunks) X and Y via which respective (gate) start pulse signals SPX and SPY (two phases) are supplied, (iii) a line (trunk) L via which an initialization signal INTL is supplied, and (iv) a line (power supply line) P via which a low power supply electric potential VSS is supplied. The plurality of lines IL2 illustrated in FIG. 2 include (i) lines (trunks) a through d via which respective clock signals CKa through CKd (four phases) are supplied, (ii) lines (trunks) x and y via which respective (gate) start pulse signals SPx and Spy (two phases) are supplied, (iii) a line (trunk) 1 via which an initialization signal INTl is supplied, and (iv) a line (power supply line) P via which a low power supply electric potential VSS is supplied. Note that the total number of the scan signal lines of the liquid crystal panel LCP is, for example, 1286 (1280 scan signal lines in the display section, no dummy scan signal line on an upper side of the display section, and six dummy scan signal lines on a lower side of the display section). That is, it is assumed that n=1286. In other words, the total number of the stages included in the first and second shift registers SR1 and SR2 is 1286=8× 160+6. Note that there is particularly no problem even if the six dummy scan signal lines are not provided.

A unit circuit UCm where m=8k+1 (where k is 0 (zero) or a positive integer) has (i) an input terminal CK1 connected to the line A via which a clock signal CKA is supplied, (ii) an input terminal CK2 connected to the line D via which a clock signal CKD is supplied, (iii) an input terminal CK3 connected to the line C via which a clock signal CKC is supplied, and (iv) an input terminal CK4 connected to the line B via which a clock signal CKB is supplied. A unit circuit UCm where m=8k+2 has (i) an input terminal CK1 connected to the line a via which a clock signal CKa is supplied, (ii) an input terminal CK2 connected to the line d via which a clock signal CKd is supplied, (iii) an input terminal CK3 connected to the line c via which a clock signal CKc is supplied, and (iv) an input terminal CK4 connected to the line b via which a clock signal CKb is supplied.

A unit circuit UCm where m=8k+3 (where k is 0 (zero) or a positive integer) has (i) an input terminal CK1 connected to the line C via which a clock signal CKC is supplied, (ii) an input terminal CK2 connected to the line A via which a clock signal CKA is supplied, (iii) an input terminal CK3 connected to the line B via which a clock signal CKB is supplied, and (iv) an input terminal CK4 connected to the line D via which a clock signal CKD is supplied. A unit circuit UCm where m=8k+4 has (i) an input terminal CK1 connected to the line c via which a clock signal CKc is supplied, (ii) an input terminal CK2 connected to the line a via which a clock signal CKa is supplied, (iii) an input terminal CK3 connected to the line b via which a clock signal CKb is supplied, and (iv) an input terminal CK4 connected to the line d via which a clock signal CKd is supplied.

A unit circuit UCm where m=8k+5 (where k is 0 (zero) or a positive integer) has (i) an input terminal CK1 connected to the line B via which a clock signal CKB is supplied, (ii) an input terminal CK2 connected to the line C via which a clock signal CKC is supplied, (iii) an input terminal CK3 connected to the line D via which a clock signal CKD is supplied, and (iv) an input terminal CK4 connected to the line A via which a clock signal CKA is supplied. A unit circuit UCm where m=8k+6 has (i) an input terminal CK1 connected to the line b via which a clock signal CKb is supplied, (ii) an input terminal CK2 connected to the line c via which a clock signal CKc is supplied, (iii) an input terminal CK3 connected to the line d via which a clock signal CKd is supplied, and (iv) an input terminal CK4 connected to the line a via which a clock signal CKa is supplied.

A unit circuit UCm where m=8k+7 (where k is 0 (zero) or a positive integer) has (i) an input terminal CK1 connected to the line D via which a clock signal CKD is supplied, (ii) an input terminal CK2 connected to the line B via which a clock signal CKB is supplied, (iii) an input terminal CK3 connected to the line A via which a clock signal CKA is supplied, and (iv) an input terminal CK4 connected to the line C via which a clock signal CKC is supplied. A unit circuit UCm where m=8k+8 (where k is 0 (zero) or a positive integer) has (i) an input terminal CK1 connected to the line d via which a clock signal CKd is supplied, (ii) an input terminal CK2 connected to the line b via which a clock signal CKb is supplied, (iii) an input terminal CK3 connected to the line a via which a clock signal CKa is supplied, and (iv) an input terminal CK4 connected to the line c via which a clock signal CKc is supplied.

A unit circuit UCm where m=5 to (n−6) has (i) a set terminal STm connected to an output terminal OT(m−4) of an (m−4)$^{th}$ stage and (ii) a reset terminal RTm connected to an output terminal OT(m+6) of an (m+6)$^{th}$ stage. A unit circuit UCm where m=1 has (i) a set terminal STm connected to the line X via which a start pulse signal SPX is supplied and (ii) a reset terminal RTm connected to an output terminal OT7 of an (m+6)$^{th}$ stage. A unit circuit UCm where m=2 has (i) a set terminal STm connected to the line x via which a start pulse signal SPx is supplied and (ii) a reset terminal RTm connected to an output terminal OT8 of an (m+3)$^{th}$ stage. A unit circuit UCm where m=3 has (i) a set terminal STm connected to the line Y via which a start pulse signal SPY is supplied and (ii) a reset terminal RTm connected to an output terminal OT9 of an (m+6)$^{th}$ stage. A unit circuit UCm where m=4 has (i) a set terminal STm connected to the line y via which a start pulse signal SPy is supplied and (ii) a reset terminal RTm connected to an output terminal OT10 of an (m+6)$^{th}$ stage. A unit circuit UCm where m=(n−5), (n−3), or (n−1) has (i) a set terminal STm connected to an output terminal OT(m−4) of an (m−4)$^{th}$ stage and (ii) a reset terminal RTm connected to the line L via which an initialization signal INTL is supplied. A unit circuit UCm where m=(n−4), (n−2), or n has (i) a set terminal STm connected to an output terminal OT(m−4) of an (m−4)$^{th}$ stage and (ii) a reset terminal RTm connected to the line l via which an initialization signal INTl is supplied.

Figure 6:
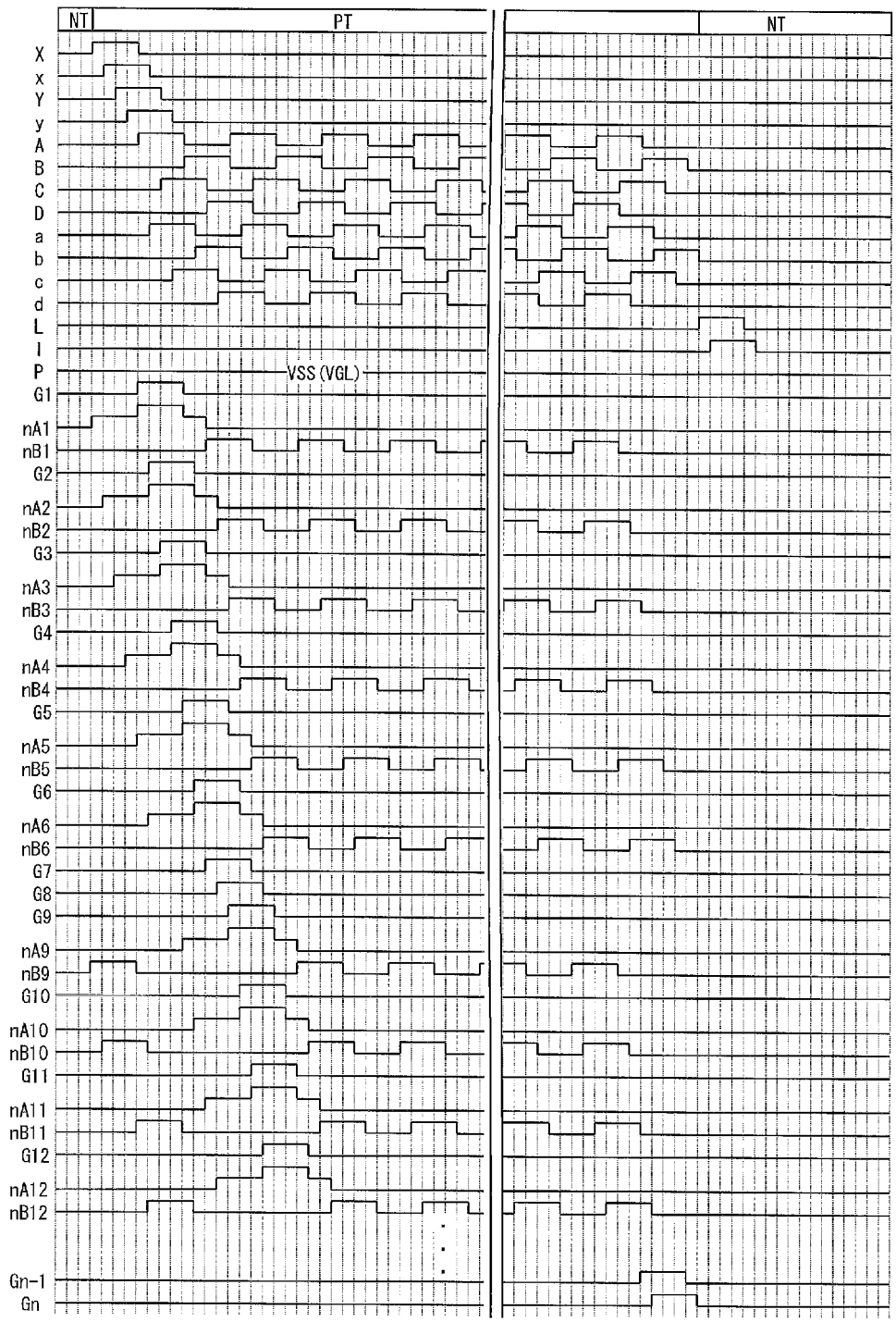
FIG. 6 is a timing chart illustrating an operation of the shift register of Example 1.

FIG. 6 illustrates fluctuations in electric potential (signal waveforms) of the lines A through D, the lines a through d, the lines X and Y, the lines x and y, the lines L and l, the lines P, the scan signal lines G1 through Gn (connected to the respective stages), nodes nA (of the respective stages), and nodes nB (of the respective stages), which are illustrated in FIGS. 1 through 5. As illustrated in FIG. 6, all of (i) clock signals CKA through CKD which are supplied via the respective lines A through D, (ii) clock signals CKa through CKd which are supplied via the respective lines a through d, (iii) start pulse signals SPX, SPY, SPx, and SPy which are supplied via the respective lines X, Y, x, and y, and (iv) initialization signals INTL and INTl which are supplied via the respective lines L and l become "High" during an active period which extends for four horizontal scan periods. All of the clock signals CKA through CKD and the clock signals CKa through CKd are inactive (show Low) during a non-operation period NT of the shift registers before a start of an operation period PT of the shift registers (before a rising edge of the start pulse signal SPX). Assume that a period during which the scan signal lines of the display section are scanned is a vertical scan period. In this case, the vertical scan period is included in the operation period PT, whereas the non-operation period NT is included in a vertical blanking period.

The start pulse signal SPx is later than the start pulse signal SPX by one horizontal scan period. The start pulse signal SPY is later than the start pulse signal SPx by one horizontal scan period. The start pulse signal SPy is later than the start pulse signal SPY by one horizontal scan period.

In synchronization with a falling edge of the start pulse signal SPX (inactivation of the start pulse signal SPX), the clock signal CKA rises (becomes active). The clock signal CKa is later than the clock signal CKA by one horizontal scan period. The clock signal CKC is later than the clock signal CKa by one horizontal scan period. The clock signal CKc is later than the clock signal CKC by one horizontal scan period. The clock signal CKB is later than the clock signal CKc by one horizontal scan period. The clock signal CKb is later than the clock signal CKB by one horizontal scan period. The clock signal CKD is later than the clock signal CKb by one horizontal scan period. The clock signal CKd is later than the clock signal CKD by one horizontal scan period.

In this case, a clock signal CKA to be supplied to the input terminal CK1 of the unit circuit UCm where m=8k+1 (where k is not less than 1 (one)) initially rises after an operation period starts, while a clock signal CKD to be supplied to the input terminal CK2 of the unit circuit UCm (where m=8k+1) is still inactive (while a node nB of the unit circuit UCm (where m=8k+1) is showing "Low", and a transistor M8 of the unit circuit UCm (where m=8k+1) is in an OFF state).

Paying attention to this point, the inventors of the present invention configure the unit circuit UCm (where m=8k+1), which belongs to a second intermediate stage, to include a control circuit SC that includes a transistor M4 and to have a control terminal CTm connected to the line X via which a start pulse signal SPX is supplied, the control terminal CTm being connected to a drain of and a gate of the transistor M4 (see FIGS. 1, 4, and 5). With this configuration, in response to a rising edge of a start pulse signal SPX (when an operation period PT starts), (i) the node nB is caused to show "High" whereby the transistor M8 can be turned on, and (ii) a node nA (a gate of a transistor M10) can be charged to show "Low". This prevents such a malfunction that a pulse is outputted from an output terminal OTm (due to a parasitic capacitance PC which is formed by the gate of and a drain of the transistor M10) even if the clock signal CKD is still inactive when the clock signal CKA initially rises after the operation period starts.

Similarly, a clock signal CKa to be supplied to the input terminal CK1 of the unit circuit UCm where m=8k+2 (where k is not less than 1 (one)) initially rises after an operation period starts, while a clock signal CKd to be supplied to the input terminal CK2 of the unit circuit UCm (where m=8k+2) is still inactive. Therefore, this unit circuit UCm is also configured to include a control circuit SC that includes a transistor M4 and to have a control terminal CTm connected to the line x via which a start pulse signal SPx is supplied, the control terminal CTm being connected to a drain of and a gate of the transistor M4 (see FIGS. 1, 4, and 5). With this configuration, in response to a rising edge of a start pulse signal SPx, (i) a node nB is caused to show "High" whereby a transistor M8 can be turned on, and (ii) a node nA (a gate of a transistor M10) can be charged to show "Low". This prevents such a malfunction that a pulse is outputted from an output terminal OTm (due to a parasitic capacitance PC which is formed by the gate of and a drain of the transistor M10) even if the clock signal CKd is still inactive when the clock signal CKa initially rises after the operation period starts.

It is possible to reduce loads (e.g., dullness) of start pulse signals SPX and SPx, by supplying the start pulse signals SPX and SPx to only the unit circuits UCm where m=1, 2, 8k+1, and 8k+2 respectively (where k is not less than 1 (one)).

Note that the unit circuit UCm where m=1 or 2 has the set output terminal STm (connected to a gate of and a drain of a transistor M1) to which a start pulse signal (SPX or SPx) is supplied. Therefore, the unit circuit UCm where m=1 or 2 is configured to include, instead of a control circuit SC, an adjustment circuit AC that includes a transistor M4 and to have a control terminal CTm connected to a corresponding one of the lines P via which a low power supply electric potential VSS is supplied, the control terminal CTm being connected to a drain of and a gate of the transistor M4. In a case of the unit circuit UCm where m=8k+3, 8k+4, 8k+5, 8k+6, 8k+7, or 8k+8 (where k is not less than 0 (zero)), a clock signal to be supplied to the input terminal CK1 initially rises after an operation period starts, while a clock signal to be supplied to the input terminal CK2 is active (while the clock signal is at least not inactive). This rarely causes such a malfunction that a pulse is outputted from an output terminal OTm (due to a parasitic capacitance PC which is formed by a gate of and a drain of a transistor M10) in response to an initial rising edge of the clock signal to be supplied to the input terminal CK1 after the operation period starts. Therefore, the unit circuit UCm is configured to include, instead of a control circuit SC, an adjustment circuit AC that includes a transistor M4 and to have a control terminal CTm connected to the corresponding one of the lines P via which a low power supply electric potential VSS is supplied, the control terminal CTm being connected to a drain of and a gate of the transistor M4. By providing, in the unit circuit UCm, the adjustment circuit AC which is identical in configuration to the control circuit SC, it is possible for the first through $n^{th}$ stages to have identical loads around respective transistors M4. This makes it possible to prevent waveforms of output signals supplied to the scan signal lines from differing from one stage to another.

The following description will discuss an operation of a unit circuit UC1 (see FIG. 3) of the first stage. In response to a rising edge of a start pulse signal SPX supplied via the line X, (i) a transistor M1 is turned on whereby a node nA (nA1 in FIG. 6) is caused to show "High", and (ii) transistors M6 and M10 are turned on. A node nB (nB1 in FIG. 6) is caused to show "Low" whereby a transistor M8 is turned off. In response to a rising edge of a clock signal CKA supplied via the line A in this state, an electric potential of the node nA is further increased. This causes a pulse (pulse width: 4H) of the clock signal CKA to be outputted from an output terminal OT1. In response to a falling edge of the clock signal CKA, the electric potential of the node nA is decreased. Subsequently, the node nB and the node nA are caused to show "High" and "Low" respectively (the transistor M10 is turned off), in response to a rising edge of a clock signal CKD supplied via the line D (when the transistor M8 and a transistor M9 are turned on) in synchronization with an output of a pulse from an output terminal OT7 of a unit circuit UC7 of the seventh stage. The unit circuit UC1 completes a reset. Thereafter, transistors M2, M3, and M12 are turned on, in response to a rising edge of an initialization signal INTL in synchronization with a falling edge of a pulse outputted from an output terminal OTn of a unit circuit UCn of a final stage. This charges the node nA, the node nB, and the output terminal OT1 to show "Low". Note that, at and after the rising edge of the initialization signal INTL, clock signals CKA through CKD and clock signals CKa through CKd stop (are kept inactive "Low").

The following description will discuss an operation of a unit circuit UC5 (see FIG. 3) of the fifth stage. When the unit circuit UC1 of the first stage outputs a pulse from the output terminal OT1, (i) a transistor M1 is turned on whereby a node nA (nA5 in FIG. 6) is caused to show "High", and (ii) transistors M6 and M10 are turned on. A node nB (nB5 in FIG. 6) is caused to show "Low" whereby a transistor M8 is turned off. In response to a rising edge of a clock signal CKB supplied via the line B in this state, an electric potential of the node nA is further increased. This causes a pulse (pulse width: 4H) of the clock signal CKB to be outputted from an output terminal OT5. In response to a falling edge of the clock signal CKB, the electric potential of the node nA is decreased. Subsequently, the node nB and the node nA are caused to show "High" and "Low" respectively (the transistor M10 is turned off), in response to a rising edge of a clock signal CKC supplied via the line C (when the transistor M8 and a transistor M9 are turned on) in synchronization with an output of a pulse from an output terminal OT11 of a unit circuit UC11 of the $11^{th}$ stage. The unit circuit UC5 completes a reset. Thereafter, transistors M2, M3, and M12 are turned on, in response to a rising edge of an initialization signal INTL in synchronization with a falling edge of a pulse outputted from the output terminal OTn of the unit circuit UCn of the final stage. This charges the node nA, the node nB, and the output terminal OT5 to show "Low".

Figure 9:
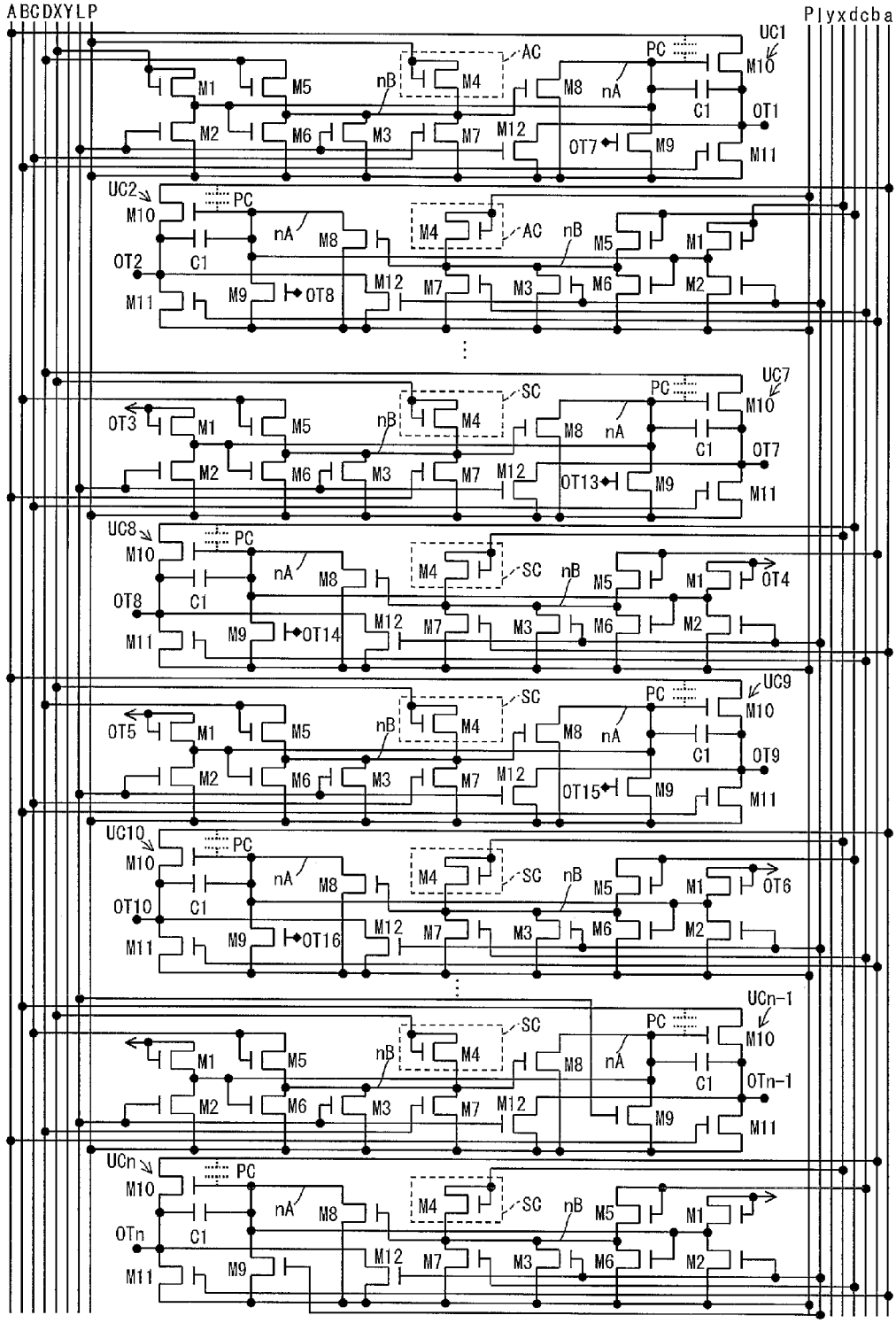
FIG. 9 is a circuit diagram illustrating a second modification of the shift register of Example 1.

The following description will discuss an operation of a unit circuit UC9 (see FIG. 4) of the ninth stage. In response to a rising edge of a start pulse signal SPX, (i) a node nB (nB9 in FIG. 6) is caused to show "High" whereby a transistor M8 is turned on, and (ii) a node nA (nA9 in FIG. 9) is charged to show "Low". This prevents such a malfunction that a pulse is outputted from an output terminal OT9 in response to an initial rising edge of a clock signal CKA after an operation period starts. Thereafter, when the unit circuit UC5 of the fifth stage outputs a pulse from the output terminal OT5, (i) a transistor M1 is turned on whereby the node nA is caused to show "High", and (ii) transistors M6 and M10 are turned on. The node nB is caused to show "Low" whereby the transistor M8 is turned off. In response to a rising edge of a clock signal CKA supplied via the line A in this state, an electric potential of the node nA is further increased. This causes a pulse (pulse width: 4H) of the clock signal CKA to be outputted from the output terminal OT9. In response to a falling edge of the clock signal CKA, the electric potential of the node nA is decreased. Subsequently, the node nB and the node nA are caused to show "High" and "Low" respectively (the transistor M10 is turned off), in response to a rising edge of a clock signal CKD supplied via the line D (when the transistor M8 and a transistor M9 are turned on) in synchronization with an output of a pulse from an output terminal OT15 of a unit circuit UC15 of the 15$^{th}$ stage. The unit circuit UC9 completes a reset. Thereafter, transistors M2, M3, and M12 are turned on in response to a rising edge of an initialization signal INTL. This charges the node nA, the node nB, and the output terminal OT9 to show "Low".

The following description will discuss an operation of the unit circuit UCn (see FIG. 5) of the n$^{th}$ stage. When a pulse is outputted from an output terminal OT(n−4) of a unit circuit UC(n−4) of the (n−4)$^{th}$ stage, (i) a transistor M1 is turned on whereby a node nA is caused to show "High", and (ii) transistors M6 and M10 are turned on. A node nB is caused to show "Low" whereby a transistor M8 is turned off. In response to a rising edge of a clock signal CKb supplied via the line b in this state, an electric potential of the node nA is further increased. This causes a pulse (pulse width: 4H) of the clock signal CKb to be outputted from the output terminal OTn. In response to a falling edge of the clock signal CKb, the electric potential of the node nA is decreased. Subsequently, in response to a rising edge of an initialization signal INTl supplied via the line l (when a transistor M9 is turned on), the node nA is caused to show "Low" (the transistor M10 is turned off). The unit circuit UCn completes a reset. In synchronization with timing at which the node nA is caused to show "Low", the node nB and the output terminal OTn are charged to show "Low".

Figure 7:
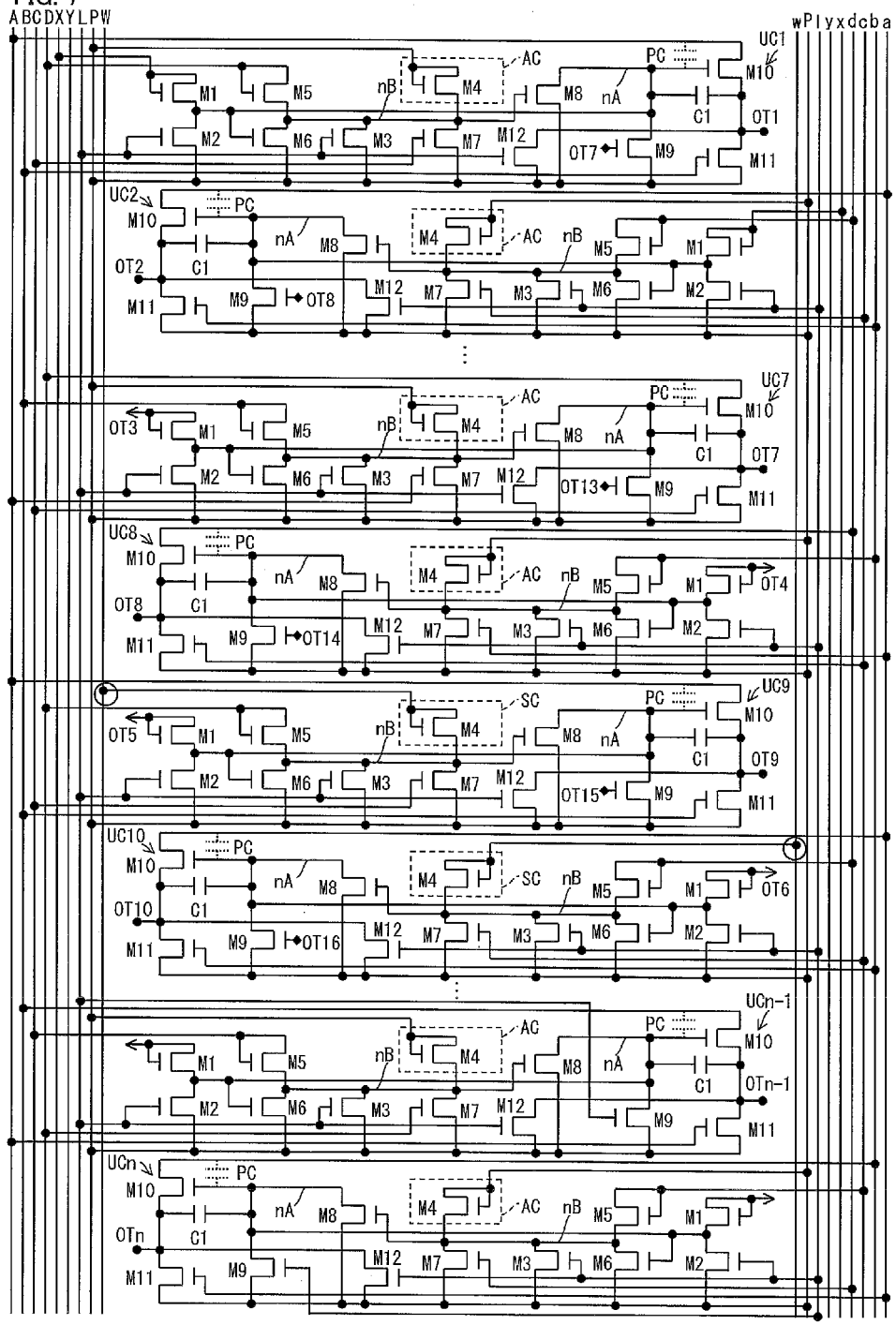
FIG. 7 is a circuit diagram illustrating a first modification of the shift register of Example 1.
Figure 8:
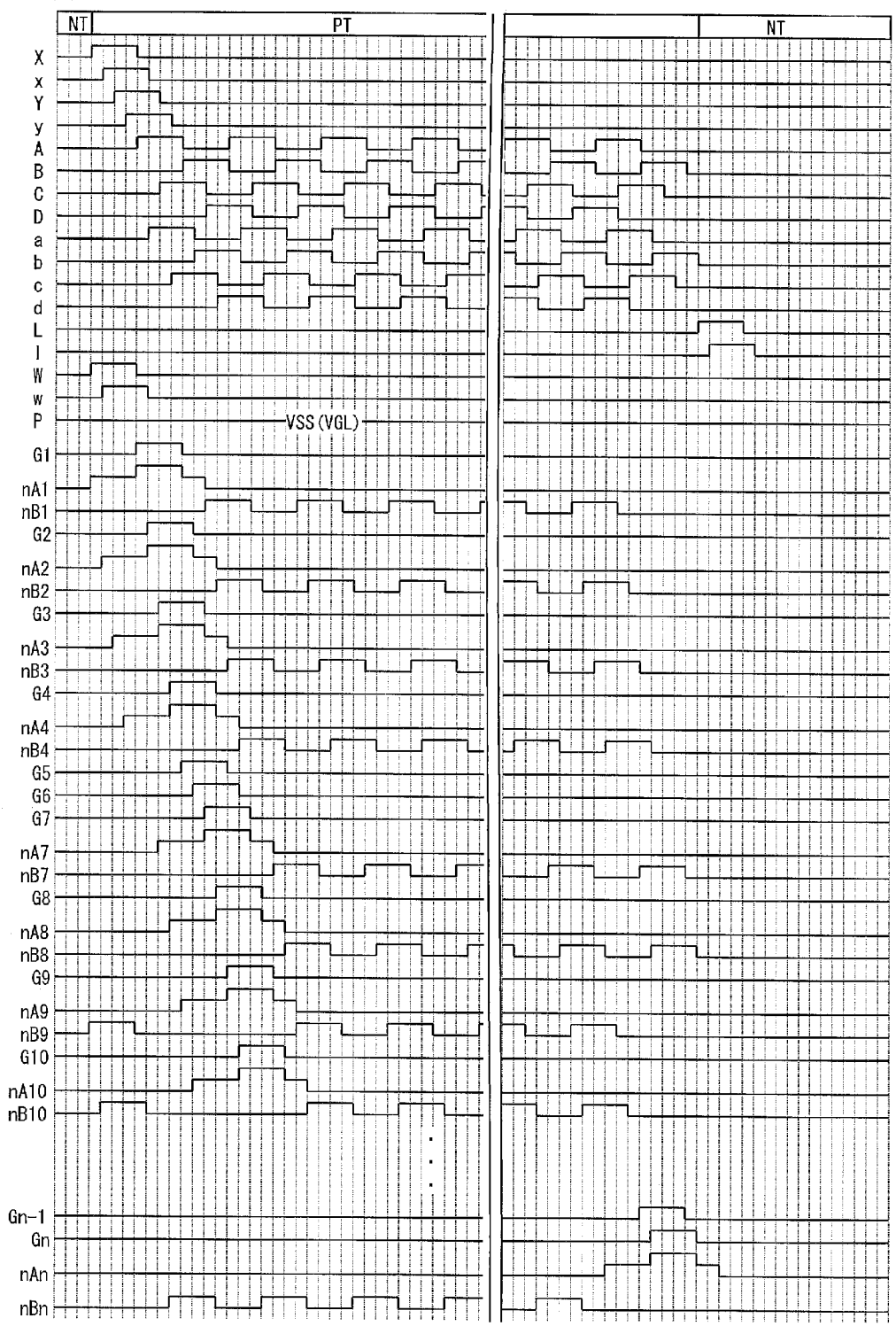
FIG. 8 is a timing chart illustrating an operation of a shift register illustrated in FIG. 7.

FIGS. 3 through 5 illustrate a case where a drain of and a gate of a transistor M4 of a control circuit SC are connected to the line (X or x) via which a start pulse signal SPX or SPx is supplied. The case is illustrative only. The drain of and the gate of the transistor M4 of the control circuit SC may be connected to a line (W or w) which is different from the line (X or x) (see FIG. 7). With this configuration, it is possible to supply, to the line W connected to odd-numbered stages, a control signal which is synchronized with a start pulse signal SPX, and it is possible to supply, to the line w connected to even-numbered stages, a control signal which is synchronized with a start pulse signal SPx (see FIG. 8 that illustrates a fluctuation in electric potential (signal waveform) of each section illustrated in FIG. 7). This makes it possible to reduce loads of the start pulse signals.

Figure 10:
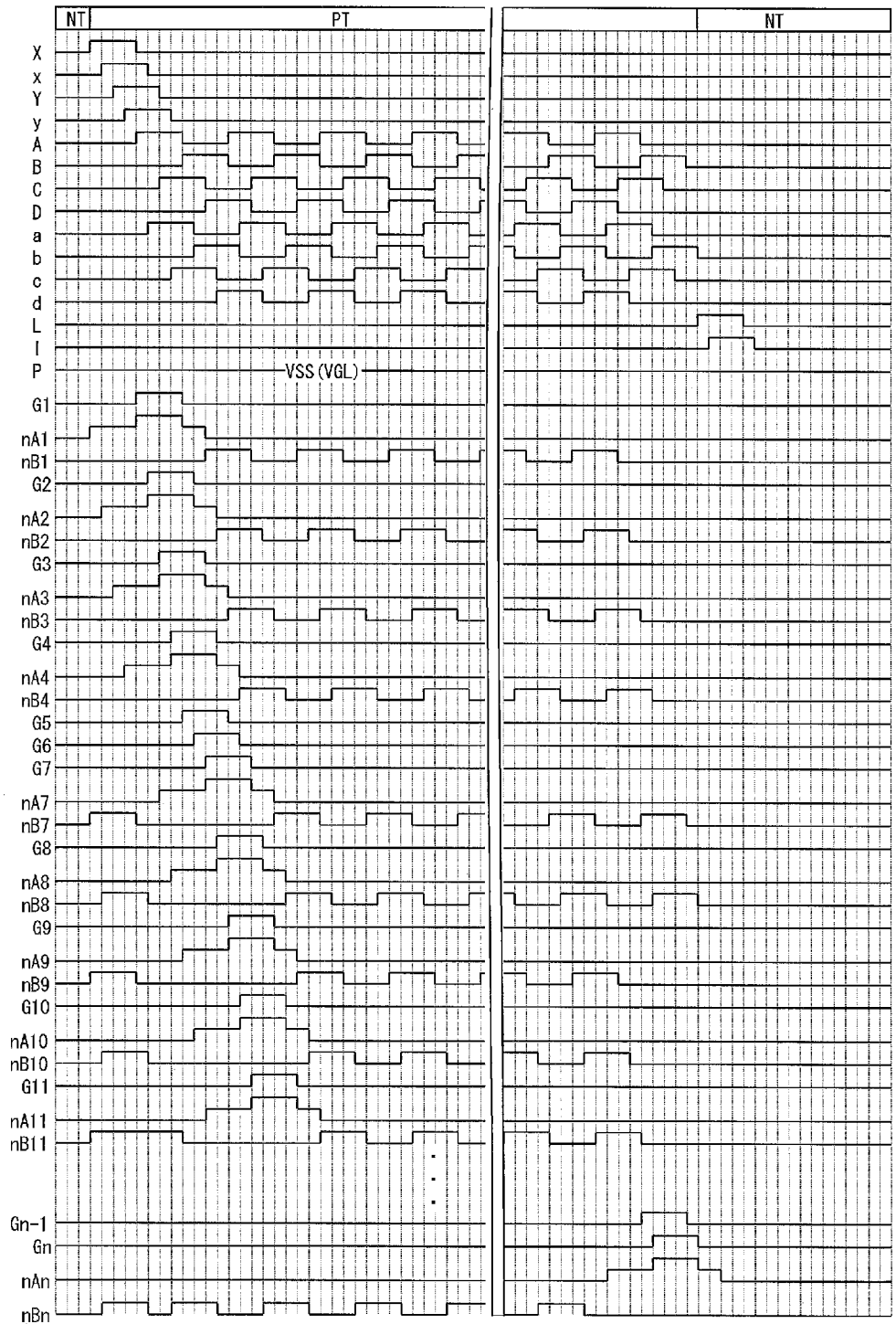
FIG. 10 is a timing chart illustrating an operation of a shift register illustrated in FIG. 9.
Figure 11:
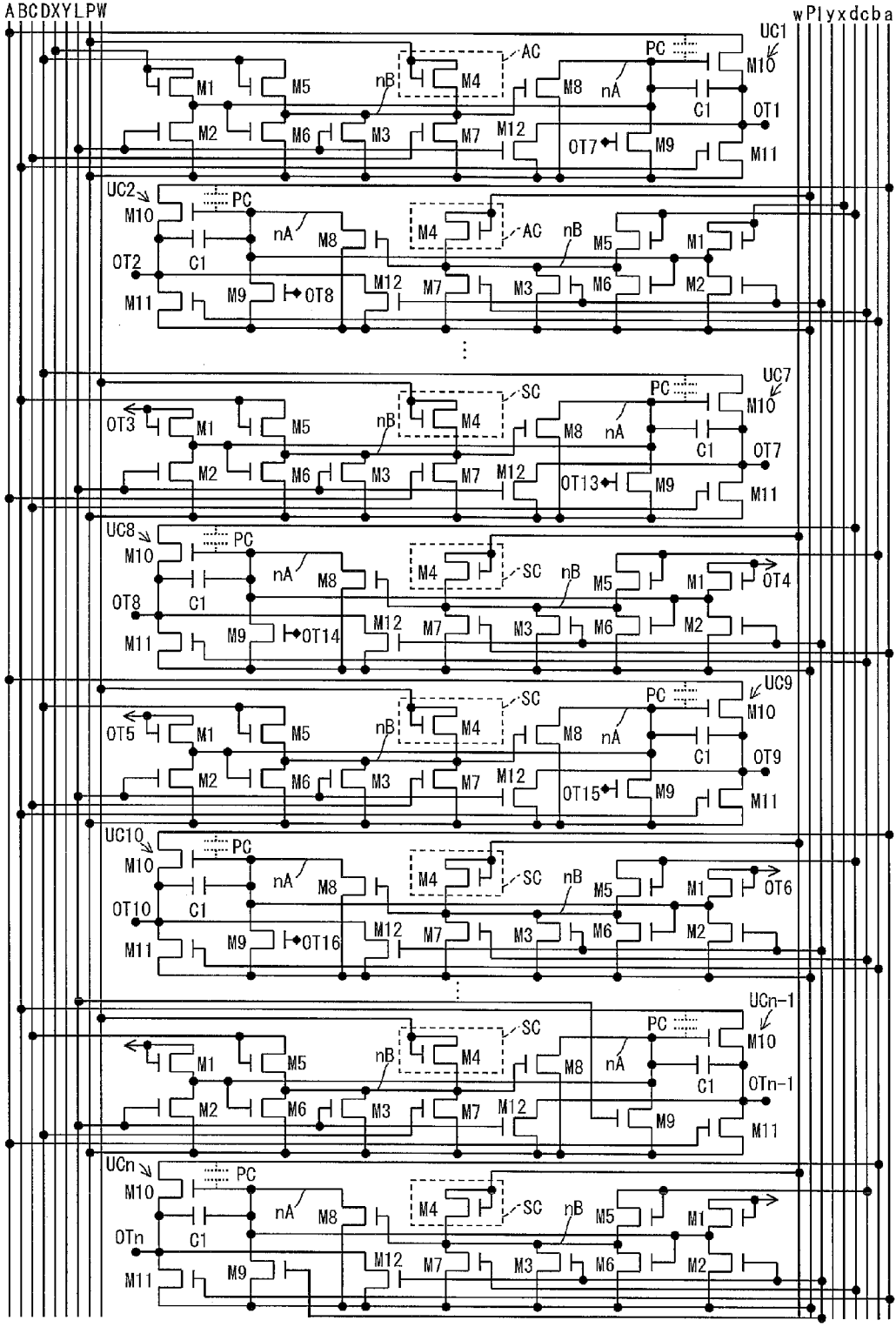
FIG. 11 is a circuit diagram illustrating a third modification of the shift register of Example 1.
Figure 12:
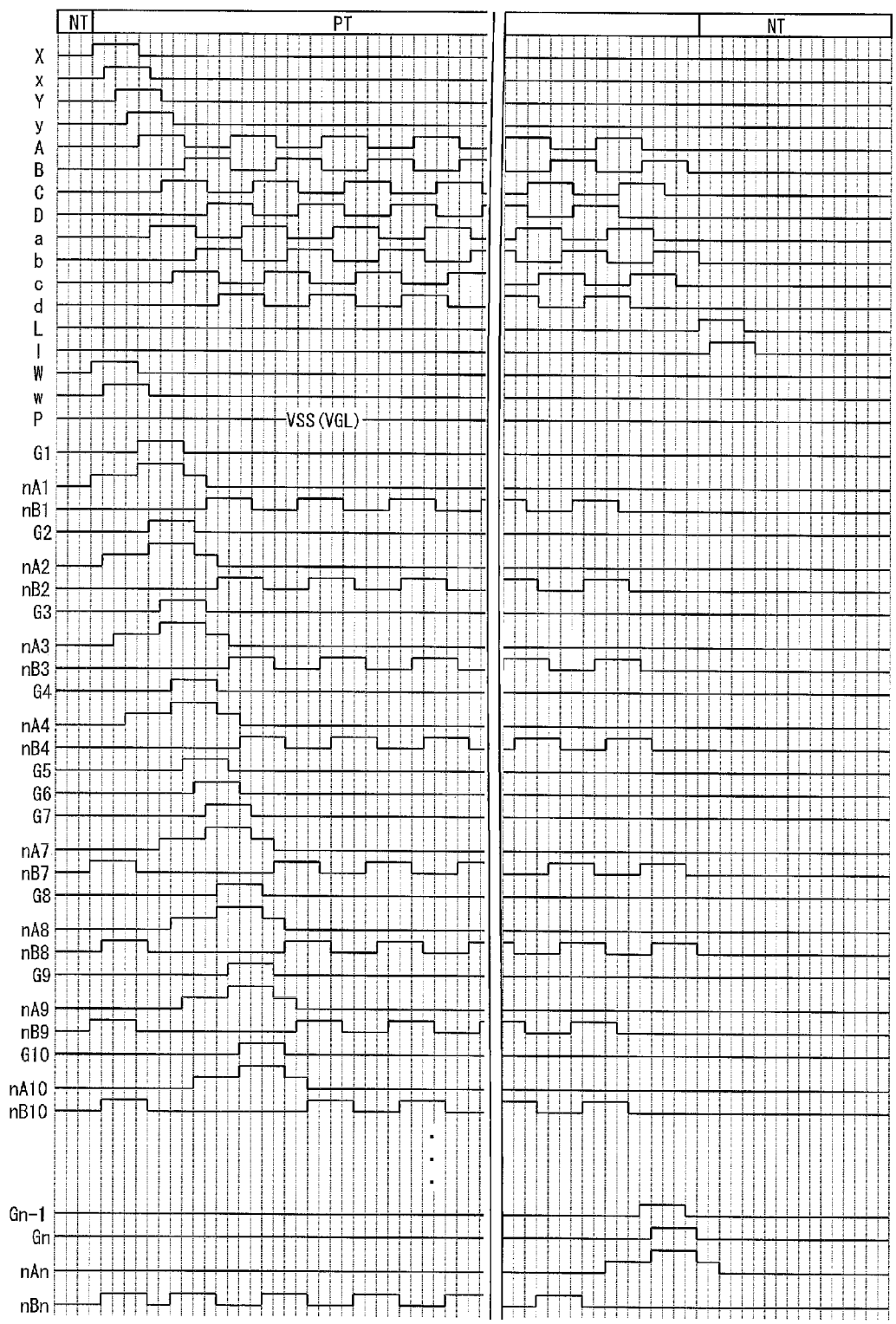
FIG. 12 is a timing chart illustrating an operation of a shift register illustrated in FIG. 11.

FIGS. 3 through 5 illustrate a case where only the unit circuit UCm where m=8k+1 and the unit circuit UCm where 8k+2 (where k is not less than 1 (one)) each includes the control circuit SC. The case is illustrative only. Each unit circuit UCm where m=5 to n may include a control circuit SC, whereas each unit circuit UCm where m=1 to 4 may include an adjustment circuit AC (see FIG. 9 and FIG. 10 that illustrates a fluctuation in electric potential (signal waveform) of each section illustrated in FIG. 9). With this configuration, it is possible to prevent, in all stages, a malfunction which will be caused in response to an initial rising edge of a clock signal after an operation period starts. In a case of a configuration illustrated in FIGS. 9 and 10, a drain of and a gate of a transistor M4 of the control circuit SC may also be connected to a line (W or w) which is different from a line (X or x) (see FIG. 11). With this configuration, it is possible to supply, to the line W connected to odd-numbered stages, a control signal which is synchronized with a start pulse signal SPX, and it is possible to supply, to the line w connected to even-numbered stages, a control signal which is synchronized with a start pulse signal SPx (see FIG. 12 that illustrates a fluctuation in electric potential (signal waveform) of each section illustrated in FIG. 11). This makes it possible to reduce loads of the start pulse signals.

FIG. 1 and FIGS. 3 through 5 illustrate a case where the lines (L and l) via which respective initialization signals INTL and INTl are supplied are provided. The case is illustrative only. Without any lines (L and l) provided (with the lines (L and l) removed), the initialization terminal LTm of the unit circuit UCm may be connected to the line (X or x) via which a start pulse signal SPX or SPx is supplied (see (a) of FIG. 13). With this configuration, it is possible to supply, via the lines (X and x), two initialization pulses ((i) a first pulse (pulse width: 4H) which rises in synchronization with a falling edge of a pulse outputted from the output terminal of the final stage, and (ii) a second pulse identical in type to the first pulse, a rising edge of the second pulse being later than that of the first pulse by one horizontal scan period) (see (b) of FIG. 13). This makes it possible to reduce the number of lines via which signals are inputted.

Example 2

FIG. 1 and FIGS. 3 through 5 illustrate a case where an adjustment circuit AC is provided in each unit circuit other than the unit circuit UCm where m=8k+1 and the unit circuit UCm where m=8k+2 (where k is not less than 1 (one)). The case is illustrative only. As illustrated in (a) and (b) of FIG. 14, it is possible to configure (i) each unit circuit UCi where i=8k+1 or 8k+2 (where k is not less than 1 (one)) to include a control circuit SC that includes a transistor M4, and (ii) each unit circuit UCj where j=1, 2, 8k+3, 8k+4, 8k+5, 8k+6, 8k+7, or 8k+8 (where k is not less than 0 (zero)) to include no adjustment circuit AC. FIGS. 15 through 17 illustrate a configuration of first through n$^{th}$ stages (m=1 to n) of first and second shift registers, each of unit circuits of the respective first through n$^{th}$ stages being configured as illustrated in (a) or (b) of FIG. 14. Note that see FIG. 6 as to a fluctuation in electric potential (signal waveform) of each section illustrated in FIGS. 15 through 17. Example 2 reduces the number of transistors included in each of the first and second shift registers. It is therefore possible to increase a production yield.

FIGS. 15 through 17 illustrate a case where a drain of and a gate of the transistor M4 of the control circuit SC are connected to a line (X or x) via which a start pulse signal SPX or SPx is supplied. The case is illustrative only. The drain of and the gate of the transistor M4 of the control circuit SC may be connected to a line (W or w) which is different from the line (X or x) (see FIG. 18). With this configuration, it is possible to supply, to the line W connected to odd-numbered stages, a control signal which is synchronized with a start pulse signal SPX, and it is possible to supply, to the line w connected to even-numbered stages, a control signal which is synchronized with a start pulse signal SPx. This makes it possible to reduce loads of the start pulse signals.

(a) and (b) of FIG. 14, and FIGS. 15 through 17 illustrate a case where lines (L and l) via which respective initialization signals INTL and INTl are supplied are provided. The case is illustrative only. Without any lines (L and l) provided (with the lines (L and l) removed), each of initialization terminals LTi and LTj may be connected to the line (X or x) via which a start pulse signal SPX or SPx is supplied (see (a) and (b) of FIG. 19). With this configuration, it is possible to supply, via the lines (X and x), two initialization pulses ((i) a first pulse (pulse width: 4H) which rises in synchronization with a falling edge of a pulse outputted from an output terminal of a final stage, and (ii) a second pulse identical in type to the first pulse, a rising edge of the second pulse being later than that of the first pulse by one horizontal scan period) (see (c) of FIG. 19). This makes it possible to reduce the number of lines via which signals are inputted.

Example 3

FIG. 1 and FIGS. 3 through 5 illustrate a case where the unit circuit UCm of the $m^{th}$ stage (where m=1 to n) includes the transistor M4. The case is illustrative only. As illustrated in FIG. 20, a unit circuit UCm may include a transistor Mz (instead of a transistor M4). As illustrated in FIG. 20, a transistor M10 has (i) a drain connected to an input terminal CK1, (ii) a source connected to one electrode of a capacitor C1, a drain of a transistor M11, a drain of a transistor M12, and an output terminal OTm, and (iii) a gate (node nA) connected to the other electrode of the capacitor C1, a drain of a transistor M9, a drain of a transistor M8, a drain of the transistor Mz, a gate of a transistor M6, a source of a transistor M1, and a drain of a transistor M2. The transistor M8 has a gate (node nB) connected to a drain of a transistor M7, a drain of a transistor M3, a drain of the transistor M6, and a source of a transistor M5. The transistors Mz, M2, M3, M6 through M9, M11, and M12 have respective sources which are connected to a low power supply electric potential VSS (VGL). The transistor M1 has a drain and a gate which are connected to a set terminal STm. The transistor M5 has a drain and a gate which are connected to an input terminal CK2. The transistor Mz (control transistor) has a gate connected to a control terminal CTm. The transistors M2, M3, and M12 have respective gates which are connected to an initialization terminal LTm. The transistor M7 has a gate connected to an input terminal CK3. The transistor M9 has a gate connected to a reset terminal RTm. The transistor M11 has a gate connected to an input terminal CK4.

FIGS. 21 through 23 illustrate a configuration of first through $n^{th}$ stages (m=1 to n) of first and second shift registers of Example 3. Note that FIGS. 21 through 23 are identical to FIG. 1 and FIGS. 3 through 5 in connection relationship between (i) lines A through D, lines a through d, lines X and Y, lines x and y, lines L and l, and lines P and (ii) the four input terminals CK1 through CK4, the set terminal STm, the reset terminal RTm, the output terminal OTm, the control terminal CTm, and the initialization terminal LTm, all of which belong to the unit circuit UCm (where m=1 to n).

FIG. 24 illustrates fluctuations in electric potential (signal waveform) of the lines A through D, the lines a through d, the lines X and Y, the lines x and y, the lines L and l, and the lines P, scan signal lines G1 through Gn (connected to the respective first through $n^{th}$ stages), nodes nA (of the respective stages), and nodes nB (of the respective stages), all of which are illustrated in FIGS. 21 through 23. As illustrated in FIG. 24, (i) clock signals CKA through CKD which are supplied via the respective lines A through D, (ii) clock signals CKa through CKd which are supplied via the respective lines a through d, (iii) start pulse signals SPX, SPY, SPx, and SPy which are supplied via the respective lines X, Y, x, and y, and (iv) initialization signals INTL and INTl which are supplied via the respective lines L and l are identical to those illustrated in FIG. 6.

In this case, a clock signal CKA to be supplied to an input terminal CK1 of a unit circuit UCm where m=8k+1 (where k is not less than 1 (one)) initially rises after an operation period starts, while a clock signal CKD to be supplied to an input terminal CK2 of the unit circuit UCm is still inactive (while a node nB is showing "Low", and a transistor M8 is in an OFF state).

Paying attention to this point, the inventors of the present invention configure the unit circuit UCm (where m=8k+1), which belongs to a second intermediate stage, to include a control circuit SC that includes a transistor Mz and to have a control terminal CTm connected to the line X via which a start pulse signal SPX is supplied, the control terminal CTm being connected to a gate of the transistor Mz (see FIGS. 20 through 23). With this configuration, in response to a rising edge of a start pulse signal SPX (when an operation period PT starts), it is possible to turn on the transistor Mz, and to charge a node nA (a gate of a transistor M10) so as to show "Low". This prevents such a malfunction that a pulse is outputted from an output terminal OTm (due to a parasitic capacitance PC which is formed by the gate of and a drain of the transistor M10) even if the clock signal CKD is still inactive when the clock signal CKA initially rises after the operation period starts.

Similarly, a clock signal CKa to be supplied to an input terminal CK1 of a unit circuit UCm where m=8k+2 (k is not less than 1 (one)) initially rises after an operation period starts, while a clock signal CKd to be supplied to an input terminal CK2 of the unit circuit UCm is still inactive. Therefore, this unit circuit UCm is configured to include a control circuit SC that includes a transistor Mz, and to have a control terminal CTm connected to the line x via which a start pulse signal SPx is supplied, the control terminal CTm being connected to a gate of the transistor Mz (see FIGS. 20 through 23). With this configuration, in response to a rising edge of a start pulse signal SPx, it is possible to turn on the transistor Mz, and to charge a node nA (a gate of a transistor M10) so as to show "Low". This prevents such a malfunction that a pulse is outputted from an output terminal OTm (due to a parasitic capacitance PC which is formed by the gate of and a drain of the transistor M10) even if the clock signal CKd is still inactive when the clock signal CKa initially rises after the operation period starts.

Note that a unit circuit UCm where m=1 or 2 has a set output terminal STm (connected to a gate of and a drain of a transistor M1 of the unit circuit UCm) via which a start pulse signal (SPX or SPx) is supplied. Therefore, the unit circuit UCm is configured to (i) include, instead of a control circuit SC, an adjustment circuit AC that includes a transistor Mz and (ii) have a control terminal CTm connected to a corresponding one of the lines P via which a low power supply electric potential VSS is supplied, the control terminal CTm being connected to a gate of the transistor Mz. In a case of a unit circuit UCm where m=8k+3, 8k+4, 8k+5, 8k+6, 8k+7, or 8k+8 (where k is not less than 0 (zero)), a clock signal to be supplied to an input terminal CK1 initially rises after an operation period starts, while a clock signal to be supplied to an input terminal CK2 is active (while the clock signal is at least not inactive). This rarely causes such a malfunction that a pulse is outputted from an output terminal OTm (due to a parasitic capacitance PC which is formed by a gate of and a drain of a transistor M10) in response to an initial rising edge of the clock signal to be supplied to the input terminal CK1 after the operation period starts. Therefore, the unit circuit UCm is configured to (i) include, instead of a control circuit SC, an adjustment circuit AC that includes a transistor Mz and (ii) have a control terminal CTm connected to a corresponding one of the lines P via which a low power supply electric potential VSS is supplied, the control terminal CTm being connected to a gate of the transistor Mz. By providing, in the unit circuit UCm, the adjustment circuit AC which is identical in configuration to the control circuit SC, it is possible for the first through $n^{th}$ stages to have identical loads around respective transistors Mz.

The following description will discuss an operation of a unit circuit UC1 (see FIG. 21) of the first stage. In response to a rising edge of a start pulse signal SPX supplied via the line X, (i) a transistor M1 is turned on whereby a node nA (nA1 in FIG. 24) is caused to show "High", and (ii) transistors M6 and M10 are turned on. A node nB (nB1 in FIG. 24) is caused to show "Low" whereby a transistor M8 is turned off. In response to a rising edge of a clock signal CKA supplied via the line A in this state, an electric potential of the node nA is further increased. This causes a pulse (pulse width: 4H) of the clock signal CKA to be outputted from an output terminal OT1. In response to a falling edge of the clock signal CKA, the electric potential of the node nA is decreased. Subsequently, the node nB and the node nA are caused to show "High" and "Low" respectively (the transistor M10 is turned off), in response to a rising edge of a clock signal CKD supplied via the line D (when the transistor M8 and a transistor M9 are turned on) in synchronization with an output of a pulse from an output terminal OT7 of a unit circuit UC7 of the seventh stage. The unit circuit UC1 completes a reset. Thereafter, transistors M2, M3, and M12 are turned on, in response to a rising edge of an initialization signal INTL in synchronization with a falling edge of a pulse outputted from an output terminal OTn of a unit circuit UCn of a final stage. This charges the node nA, the node nB, and the output terminal OT1 to show "Low". Note that, at and after the rising edge of the initialization signal INTL, clock signals CKA through CKD and clock signals CKa through CKd stop (are kept inactive "Low").

The following description will discuss an operation of a unit circuit UC5 (see FIG. 21) of the fifth stage. When the unit circuit UC1 of the first stage outputs a pulse from the output terminal OT1, (i) a transistor M1 is turned on whereby a node nA (nA5 in FIG. 24) is caused to show "High", and (ii) transistors M6 and M10 are turned on. A node nB (nB5 in FIG. 24) is caused to show "Low" whereby a transistor M8 is turned off. In response to a rising edge of a clock signal CKB supplied via the line B in this state, an electric potential of the node nA is further increased. This causes a pulse (pulse width: 4H) of the clock signal CKB to be outputted from an output terminal OT5. In response to a falling edge of the clock signal CKB, the electric potential of the node nA is decreased. Subsequently, the node nB and the node nA are caused to show "High" and "Low" respectively (the transistor M10 is turned off), in response to a rising edge of a clock signal CKC supplied via the line C (when the transistor M8 and a transistor M9 are turned on) in synchronization with an output of a pulse from an output terminal OT11 of a unit circuit UC11 of the 11$^{th}$ stage. The unit circuit UC5 completes a reset. Thereafter, transistors M2, M3, and M12 are turned on, in response to a rising edge of an initialization signal INTL in synchronization with a falling edge of a pulse outputted from the output terminal OTn of the unit circuit UCn of the final stage. This charges the node nA, the node nB, and the output terminal OT5 to show "Low".

The following description will discuss an operation of a unit circuit UC9 (see FIG. 22) of the ninth stage. In response to a rising edge of a start pulse signal SPX, (i) a transistor Mz is turned on, and (ii) a node nA (nA9 in FIG. 24) is charged to show "Low". This prevents such a malfunction that a pulse is outputted from an output terminal OT9 in response to an initial rising edge of a clock signal CKA after an operation period starts. Thereafter, when the unit circuit UC5 of the fifth stage outputs a pulse from the output terminal OT5, (i) a transistor M1 is turned on whereby the node nA is caused to show "High", and (ii) transistors M6 and M10 are turned on. A node nB (nB9 in FIG. 24) is caused to show "Low" whereby a transistor M8 is turned off. In response to a rising edge of a clock signal CKA supplied via the line A in this state, an electric potential of the node nA is further increased. This causes a pulse (pulse width: 4H) of the clock signal CKA to be outputted from the output terminal OT9. In response to a falling edge of the clock signal CKA, the electric potential of the node nA is decreased. Subsequently, the node nB and the node nA are caused to show "High" and "Low" respectively (the transistor M10 is turned off), in response to a rising edge of a clock signal CKD supplied via the line D (when the transistor M8 and a transistor M9 are turned on) in synchronization with an output of a pulse from an output terminal OT15 of a unit circuit UC15 of the 15$^{th}$ stage. The unit circuit UC9 completes a reset. Thereafter, transistors M2, M3, and M12 are turned on in response to a rising edge of an initialization signal INTL. This charges the node nA, the node nB, and the output terminal OT9 to show "Low".

The following description will discuss an operation of the unit circuit UCn (see FIG. 23) of the n$^{th}$ stage. When a pulse is outputted from an output terminal OT(n−4) of a unit circuit UC(n−4) of the (n−4)$^{th}$ stage, (i) a transistor M1 is turned on whereby a node nA is caused to show "High", and (ii) transistors M6 and M10 are turned on. A node nB is caused to show "Low" whereby a transistor M8 is turned off. In response to a rising edge of a clock signal CKb supplied via the line b in this state, an electric potential of the node nA is further increased. This causes a pulse (pulse width: 4H) of the clock signal CKb to be outputted from the output terminal OTn of the unit circuit UCn. In response to a falling edge of the clock signal CKb, the electric potential of the node nA is decreased. Subsequently, in response to a rising edge of an initialization signal INTl supplied via the line l (when a transistor M9 is turned on), the node nA is caused to show "Low" (the transistor M10 is turned off). The unit circuit UCn completes a reset. In synchronization with timing at which the node nA is caused to show "Low", the node nB and the output terminal OTn are charged to show "Low".

FIGS. 21 through 23 illustrate a case where a gate of a transistor Mz of a control circuit SC is connected to the line (X or x) via which a start pulse signal SPX or SPx is supplied. The case is illustrative only. The gate of the transistor Mz of the control circuit SC may be connected to a line (W or w) which is different from the line (X and x) (see FIG. 25). With this configuration, it is possible to supply, to the line W connected to odd-numbered stages, a control signal which is synchronized with a start pulse signal SPX, and it is possible to supply, to the line w connected to even-numbered stages, a control signal which is synchronized with a start pulse signal SPx (see FIG. 26 that illustrates a fluctuation in electric potential (signal waveform) of each section illustrated in FIG. 25). This makes it possible to reduce loads of the start pulse signals.

FIGS. 21 through 23 illustrate a case where only the unit circuit UCm where m=8k+1 and the unit circuit UCm where m 8k+2 (where k is not less than 1 (one)) each includes the control circuit SC. The case is illustrative only. Each unit circuit UCm where m=5 to n may include a control circuit SC, whereas each unit circuit UCm where m=1 to 4 may include an adjustment circuit AC (see FIG. 27 and FIG. 28 that illustrates a fluctuation in electric potential (signal waveform) of each section illustrated in FIG. 27). With this configuration, it is possible to prevent, in all stages, a malfunction which will be caused in response to an initial rising edge of a clock signal after an operation period starts. In a case of a configuration illustrated in FIGS. 27 and 28, a gate of a transistor M4 of the control circuit SC may also be connected to a line (W or w) which is different from a line (X or x) (see FIG. 29). Note that see FIG. 28 as to a fluctuation in electric potential of each section illustrated in FIG. 29. With this configuration, it is possible to supply, to the line W connected to odd-numbered stages, a control signal which is synchronized with a start pulse signal SPX, and it is possible to supply, to the line w connected to even-numbered stages, a control signal which is synchronized with a start pulse signal SPx. This makes it possible to reduce loads of the start pulse signals.

FIG. 20 through 23 illustrate a case where the lines (L and l) via which respective initialization signals INTL and INTl are supplied are provided. The case is illustrative only. Without any lines (L and l) provided (with the lines (L and l) removed), the initialization terminal LTm of the unit circuit UCm may be connected to line (X or x) via which a start pulse signal SPX or SPx is supplied (see (a) of FIG. 30). With this configuration, it is possible to supply, via the lines (X and x), two initialization pulses ((i) a first pulse (pulse width: 4H) which rises in synchronization with a falling edge of a pulse outputted from an output terminal of a final stage, and (ii) a second pulse identical in type to the first pulse, a rising edge of the second pulse being later than that of the first pulse by one horizontal scan period) (see (b) of FIG. 30). This makes it possible to reduce the number of lines via which signals are inputted.

Example 4

FIGS. 20 through 23 illustrate a case where an adjustment circuit AC is provided in each unit circuit other than the unit circuit UCm where m=8k+1 and the unit circuit UCm where m=8k+2 (where k is not less than 1 (one)). The case is illustrative only. As illustrated in (a) and (b) of FIG. 31, it is possible to configure (i) each unit circuit UCi where i=8k+1 or i=8k+2 (where k is not less than 1 (one)) to include a control circuit SC that includes a transistor Mz, and (ii) each unit circuit UCj where j=1, 2, 8k+3, 8k+4, 8k+5, 8k+6, 8k+7, or 8k+8 (where k is not less than 0 (zero)) to include no adjustment circuit AC. FIGS. 32 through 34 illustrate a configuration of first through $n^{th}$ stages (m=1 to n) of first and second shift registers, each of unit circuits of the respective first through $n^{th}$ stages being configured as illustrated in (a) or (b) of FIG. 31. Note that see FIG. 24 as to a fluctuation in electric potential (signal waveform) of each section illustrated in FIGS. 32 through 34. Example 4 reduces the number of transistors included in each of the first and second shift registers. It is therefore possible to increase a production yield.

FIGS. 32 through 34 illustrate a case where a gate of the transistor Mz of the control circuit SC is connected to a line (X or x) via which a start pulse signal SPX or SPx is supplied. The case is illustrative only. The gate of the transistor Mz of the control circuit SC may be connected to a line (W or w) which is different from the line (X or x) (see FIG. 35). With this configuration, it is possible to supply, to the line W connected to odd-numbered stages, a control signal which is synchronized with a start pulse signal SPX, and it is possible to supply, to the line w connected to even-numbered stages, a control signal which is synchronized with a start pulse signal SPx. This makes it possible to reduce loads of the start pulse signals.

(a) and (b) of FIG. 31, and FIGS. 32 through 34 illustrate a case where lines (L and l) via which respective initialization signals INTL and INTl are supplied are provided. The case is illustrative only. Without any lines (L and l) provided (with the lines (L and l) removed), each of initialization terminals LTi and LTj may be connected to the line (X or x) via which a start pulse signal SPX or SPx is supplied (see (a) and (b) of FIG. 36). With this configuration, it is possible to supply, via the lines X and x, two initialization pulses ((i) a first pulse (pulse width: 4H) which rises in synchronization with a falling edge of a pulse outputted from an output terminal of a final stage, and (ii) a second pulse identical in type to the first pulse, a rising edge of the second pulse being later than that of the first pulse by one horizontal scan period) (see (c) of FIG. 36). This makes it possible to reduce the number of lines via which signals are inputted.

Example 5

A configuration is available in which a control terminal CTm is connected to a gate of a transistor M2 which is employed instead of the transistor Mz of Example 4 as a control transistor. That is, as illustrated in (a) and (b) of FIG. 37, (i) each unit circuit UCi where i=8k+1 or 8k+2 (k is not less than 1 (one)) may be configured to include a control circuit SC that includes a transistor M2 and to have a control terminal CTm connected to a gate of the transistor M2, and (ii) each unit circuit UCj where j=1, 2, 8k+3, 8k+4, 8k+5, 8k+6, 8k+7, or 8k+8 (where k is not less than 0 (zero)) may be configured so that an initialization terminal TLi is connected to a gate of a transistor M2.

FIG. 38 illustrates a configuration of first through $n^{th}$ stages (m=1 to n) of first and second shift registers of Example 5. Note that FIG. 38 is identical to FIG. 1 and FIGS. 3 through 5 in connection relationship between (i) lines A through D, lines a through d, lines X and Y, lines x and y, lines L and l, and lines P and (ii) four input terminals CK1 through CK4, a set terminal STm, a reset terminal RTm, an output terminal OTm, a control terminal CTm, and an initialization terminal LTm, all of which belong to a unit circuit UCm (where m=1 to n). Note also that see FIG. 24 as to a fluctuation in electric potential (signal waveform) of each section illustrated in FIG. 38.

In this case, a clock signal CKA to be supplied to an input terminal CK1 of a unit circuit UCm where m=8k+1 (where k is not less than 1 (one)) initially rises after an operation period starts, while a clock signal CKD to be supplied to an input terminal CK2 of the unit circuit UCm is still inactive (while a node nB is showing "Low", and a transistor M8 is in an OFF state).

Paying attention to this point, the inventors of the present invention configure the unit circuit UCi (where i=8k+1), which belongs to a second intermediate stage, so that the control circuit CTi which is connected to the gate of the transistor M2 is connected to the line X via which a start pulse signal SPX is supplied (see FIGS. 37 and 38). With this configuration, in response to a rising edge of a start pulse signal SPX (when an operation period PT starts), it is possible to turn on the transistor M2, and to charge a node nA (a gate of a transistor M10) so as to show "Low". This prevents such a malfunction that a pulse is outputted from an output terminal OTm (due to a parasitic capacitance PC which is formed by the gate of and a drain of the transistor M10) even if the clock signal CKD is still inactive when the clock signal CKA initially rises after the operation period starts.

Similarly, the unit circuit UCi where i=8k+2 (k is not less than 1 (one)) is configured so that the control circuit CTi which is connected to the gate of the transistor M2 is connected to the line x via which a start pulse signal SPx is supplied (see FIGS. 37 and 38). With this configuration, in response to a rising edge of a start pulse signal SPx, it is possible to turn on the transistor M2, and to charge a node nA (a gate of a transistor M10) so as to show "Low". This prevents such a malfunction that a pulse is outputted from an output terminal OTm (due to a parasitic capacitance PC which is formed by the gate of and a drain of the transistor M10) even if a clock signal CKd is still inactive when a clock signal CKa initially rises after an operation period starts.

The following description will discuss an operation of a unit circuit UC7 (see FIG. 38) of the seventh stage. When a pulse is outputted from an output terminal of a unit circuit of the third stage, (i) a transistor M1 is turned on whereby a node nA (nA7 in FIG. 24) is caused to show "High", and (ii) transistors M6 and M10 are turned on. A node nB (nB7 in FIG. 24) is caused to show "Low" whereby a transistor M8 is turned off. In response to a rising edge of a clock signal CKD supplied via the line D in this state, an electric potential of the node nA is further increased. This causes a pulse (pulse width: 4H) of the clock signal CKD to be outputted from an output terminal OT7. In response to a falling edge of the clock signal CKD, the electric potential of the node nA is decreased. Subsequently, the node nB and the node nA are caused to show "High" and "Low" respectively (the transistor M10 is turned off), in response to a rising edge of a clock signal CKB supplied via the line B (when the transistor M8 and a transistor M9 are turned on) in synchronization with an output of a pulse from an output terminal of a unit circuit of the 13$^{th}$ stage. The unit circuit UC7 completes a reset. Thereafter, transistors M2, M3, and M12 are turned on, in response to a rising edge of an initialization signal INTL in synchronization with a falling edge of a pulse outputted from an output terminal OTn of a unit circuit UCn of a final stage. This charges the node nA, the node nB, and the output terminal OT7 to show "Low".

The following description will discuss an operation of a unit circuit UC9 (see FIG. 38) of the ninth stage. In response to a rising edge of a start pulse signal SPX, (i) a transistor M2 is turned on, and (ii) a node nA (nA9 in FIG. 24) is charged to show "Low". This prevents such a malfunction that a pulse is outputted from an output terminal OT9 in response to an initial rising edge of a clock signal CKA after an operation period starts. Subsequently, when a pulse is outputted from an output terminal OT5 of a unit circuit UC5 of the fifth stage, (i) a transistor M1 is turned on whereby the node nA is caused to show "High", and (ii) transistors M6 and M10 are turned on. A node nB (nB9 in FIG. 24) is caused to show "Low" whereby a transistor M8 is turned off. In response to a rising edge of a clock signal CKA supplied via the line A in this state, an electric potential of the node nA is further increased. This causes a pulse (pulse width: 4H) of the clock signal CKA to be outputted from the output terminal OT9. In response to a falling edge of the clock signal CKA, the electric potential of the node nA is decreased. Subsequently, the node nB and the node nA are caused to show "High" and "Low" respectively (the transistor M10 is turned off), in response to a rising edge of a clock signal CKD supplied via the line D (when the transistor M8 and a transistor M9 are turned on) in synchronization with an output of a pulse from an output terminal OT15 of a unit circuit UC15 of the 15$^{th}$ stage. The unit circuit UC9 completes a reset. Thereafter, transistors M3 and M12 are turned on in response to a rising edge of an initialization signal INTL. This charges the node nB and the output terminal OT9 to show "Low".

FIG. 38 illustrates a case where the gate of the transistor Mz of the control circuit SC is connected to the line (X or x) via which a start pulse signal SPX or SPx is supplied. The case is illustrative only. The gate of the transistor M2 of the control circuit SC may be connected to a line (W or w) which is different from the line (X or x) (see FIG. 39). With this configuration, it is possible to supply, to the line W connected to odd-numbered stages, a control signal which is synchronized with a start pulse signal SPX, and it is possible to supply, to the line w connected to even-numbered stages, a control signal which is synchronized with a start pulse signal SPx. This makes it possible to reduce loads of the start pulse signals.

Example 6

FIG. 40 illustrates a configuration of a unit circuit UCm of an m$^{th}$ stage (where m is a natural number) in first and second shift registers SR1 and SR2 of Example 6. Note that the m$^{th}$ stage where m is an odd number is included in the first shift register SR1, whereas the m$^{th}$ stage where m is an even number is included in the second shift register SR2.

As illustrated in FIG. 40, the unit circuit UCm has two input terminals CK1 and CK2, a set terminal STm, a reset terminal RTm, an output terminal OTm, a control terminal CTm, an initialization terminal LTm, N-channel transistors M1 through M12, and a capacitor C1. The output terminal OTm is connected to an m$^{th}$ scan signal line Gm of a liquid crystal panel.

As illustrated in FIG. 40, the input terminal CK1 is connected to a drain of the transistor M10 and a gate of the transistor M7. The transistor M10 has (i) a source connected to one electrode of the capacitor C1, a drain of the transistor M11, a drain of the transistor M12, and the output terminal OTm, and (ii) a gate (node nA) connected to the other electrode of the capacitor C1, a drain of the transistor M9, a drain of the transistor M8, a gate of the transistor M6, a source of the transistor M1, and a drain of the transistor M2. The transistor M8 has a gate (node nB) connected to a source of the transistor M4, a drain of the transistor M7, a drain of the transistor M3, a drain of the transistor M6, and a source of the transistor M5. The transistors M2, M3, M6 through M9, M11, and M12 have respective sources connected to a low power supply electric potential VSS (VGL). The transistor M1 has a drain and a gate which are connected to the set terminal STm. The input terminal CK2 is connected to (i) a drain of and a gate of the transistor M5 and (ii) a gate of the transistor M11. The transistor M4 (control transistor) has a drain and a gate which are connected to the control terminal CTm. The transistors M2, M3, and M12 have respective gates connected to the initialization terminal LTm. The transistor M9 has a gate connected to the reset terminal RTm. The transistor M11 has a gate connected to the input terminal CK2.

FIGS. 40 through 43 illustrate a configuration of first through n[th] stages (m=1 to n) of the first and second shift registers of Example 6. Similar to Example 1, in Example 6, a plurality of lines IL1 (see FIG. 2) include (i) lines (trunks) A through D via which respective clock signals CKA through CKD (four phases) are supplied, (ii) lines (trunks) X and Y via which respective (gate) start pulse signals SPX and SPY (two phases) are supplied, (iii) a line (trunk) L via which an initialization signal INTL is supplied, and (iv) a line (power supply line) P via which a low power supply electric potential VSS is supplied (see FIGS. 41 through 43). Further, a plurality of lines IL2 (see FIG. 2) include (i) lines (trunks) a through d via which respective clock signals CKa through CKd (four phases) are supplied, (ii) lines (trunks) x and y via which respective (gate) start pulse signals SPx and Spy (two phases) are supplied, (iii) a line (trunk) l via which an initialization signal INTl is supplied, and (iv) a line (power supply line) P via which a low power supply electric potential VSS is supplied (see FIGS. 41 through 43).

A unit circuit UCm where m=8k+1 (where k is 0 (zero) or a positive integer) has (i) an input terminal CK1 connected to the line A via which a clock signal CKA is supplied, and (ii) an input terminal CK2 connected to the line B via which a clock signal CKB is supplied. A unit circuit UCm where m=8k+2 has (i) an input terminal CK1 connected to the line a via which a clock signal CKa is supplied, and (ii) an input terminal CK2 connected to the line b via which a clock signal CKb is supplied.

A unit circuit UCm where m=8k+3 (where k is 0 (zero) or a positive integer) has (i) an input terminal CK1 connected to the line C via which a clock signal CKC is supplied, and (ii) an input terminal CK2 connected to the line D via which a clock signal CKD is supplied. A unit circuit UCm where m=8k+4 has (i) an input terminal CK1 connected to the line c via which a clock signal CKc is supplied, and (ii) an input terminal CK2 connected to the line d via which a clock signal CKd is supplied.

A unit circuit UCm where m=8k+5 (where k is 0 (zero) or a positive integer) has (i) an input terminal CK1 connected to the line B via which a clock signal CKB is supplied, and (ii) an input terminal CK2 connected to the line A via which a clock signal CKA is supplied. A unit circuit UCm where m=8k+6 has (i) an input terminal CK1 connected to the line b via which a clock signal CKb is supplied, and (ii) an input terminal CK2 connected to the line a via which a clock signal CKa is supplied.

A unit circuit UCm where m=8k+7 (where k is 0 (zero) or a positive integer) has (i) an input terminal CK1 connected to the line D via which a clock signal CKD is supplied, and (ii) an input terminal CK2 connected to the line C via which a clock signal CKC is supplied. A unit circuit UCm where m=8k+8 (where k is 0 (zero) or a positive integer) has (i) an input terminal CK1 connected to the line d via which a clock signal CKd is supplied, and (ii) an input terminal CK2 connected to the line c via which a clock signal CKc is supplied.

A unit circuit UCm where m=5 to (n−6) has (i) a set terminal STm connected to an output terminal OT(m−4) of an (m−4)[th] stage and (ii) a reset terminal RTm connected to an output terminal OT(m+6) of an (m+6)[th] stage. A unit circuit UCm where m=1 has (i) a set terminal STm connected to the line X via which a start pulse signal SPX is supplied and (ii) a reset terminal RTm connected to an output terminal OT7 of an (m+6)[th] stage. A unit circuit UCm where m=2 has (i) a set terminal STm connected to the line x via which a start pulse signal SPx is supplied and (ii) a reset terminal RTm connected to an output terminal OT8 of an (m+6)[th] stage. A unit circuit UCm where m=3 has (i) a set terminal STm connected to the line Y via which a start pulse signal SPY is supplied and (ii) a reset terminal RTm connected to an output terminal OT9 of an (m+6)[th] stage. A unit circuit UCm where m=4 has (i) a set terminal STm connected to the line y via which a start pulse signal SPy is supplied and (ii) a reset terminal RTm connected to an output terminal OT10 of an (m+6)[th] stage. A unit circuit UCm where m=(n−5), (n−3), or (n−1) has (i) a set terminal STm connected to an output terminal OT(m−4) of an (m−4)[th] stage and (ii) a reset terminal RTm connected to the line L via which an initialization signal INTL is supplied. A unit circuit UCm where m=(n−4), (n−5), or n has (i) a set terminal STm connected to the output terminal OT(m−4) of an (m−4)[th] stage and (ii) a reset terminal RTm connected to the line l via which an initialization signal INTl is supplied.

FIG. 44 illustrates fluctuations in electric potential (signal waveforms) of the lines A through D, the lines a through d, the lines X and Y, the lines x and y, the lines L and l, the lines P, scan signal lines G1 through Gn (connected to the respective stages), nodes nA (of the respective stages), and nodes nB (of the respective stages), which are illustrated in FIGS. 41 through 43. FIG. 44 is identical to FIG. 6.

In this case, a clock signal CKA to be supplied to the input terminal CK1 of the unit circuit UCm where m=8k+1 (where k is not less than 1 (one)) initially rises after an operation period starts, while a clock signal CKB to be supplied to the input terminal CK2 of the unit circuit UCm (where m=8k+1) is still inactive (while a node nB is showing "Low", and a transistor M8 is in an OFF state).

Paying attention to this point, the inventors of the present invention configure the unit circuit UCm (where m=8k+1), which belongs to a second intermediate stage, to include a control circuit SC that includes a transistor M4 and to have a control terminal CTm connected to the line X via which a start pulse signal SPX is supplied, the control terminal CTm being connected to a drain of and a gate of the transistor M4 (see FIG. 42). With this configuration, in response to a rising edge of a start pulse signal SPX (when an operation period PT starts), (i) a node nB is caused to show "High" whereby a transistor M8 can be turned on, and (ii) a node nA (a gate of a transistor M10) can be charged to show "Low". This prevents such a malfunction that a pulse is outputted from an output terminal OTm (due to a parasitic capacitance PC which is formed by the gate of and a drain of the transistor M10) even if the clock signal CKB is still inactive when the clock signal CKA initially rises after the operation period starts.

Similarly, a clock signal CKa to be supplied to the input terminal CK1 of the unit circuit UCm where m=8k+2 (k is not less than 1 (one)) initially rises after an operation period starts, while a clock signal CKb to be supplied to the input terminal CK2 of the unit circuit UCm (where m=8k+2) is still inactive. Therefore, this unit circuit UCm is also configured to include a control circuit SC that includes a transistor M4 and to have a control terminal CTm connected to the line x via which a start pulse signal SPx is supplied, the control terminal CTm being connected to a drain of and a gate of the transistor M4 (see FIG. 42). With this configuration, in response to a rising edge of a start pulse signal SPx, (i) a node nB is caused to show "High" whereby a transistor M8 can be turned on, and (ii) a node nA (a gate of a transistor M10) can be charged to show "Low". This prevents such a malfunction that a pulse is outputted from an output terminal OTm (due to a parasitic capacitance PC which is formed by the gate of and a drain of the transistor M10) even if the clock signal CKb is still inactive when the clock signal CKa initially rises after the operation period starts.

Similarly, the unit circuit UCm where m=8k+3 (where k is not less than 1 (one)) is configured to include a control circuit SC that includes a transistor M4 and to have a control terminal CTm connected to the line X via which a start pulse signal SPX is supplied, the control terminal CTm being connected to a drain of and a gate of the transistor M4 (see FIG. 42). With this configuration, in response to a rising edge of a start pulse signal SPX, (i) a node nB is caused to show "High" whereby a transistor M8 can be turned on, and (ii) a node nA (a gate of a transistor M10) can be charged to show "Low". This prevents such a malfunction that a pulse is outputted from an output terminal OTm (due to a parasitic capacitance PC which is formed by the gate of and a drain of the transistor M10) even if a clock signal CKD is still inactive when a clock signal CKC initially rises after an operation period starts.

Moreover, the unit circuit UCm where m=8k+4 (where k is not less than 1 (one)) is configured to include a control circuit SC that includes a transistor M4 and to have a control terminal CTm connected to the line x via which a start pulse signal SPx is supplied, the control terminal CTm being connected to a drain of and a gate of the transistor M4 (see FIG. 42). With this configuration, in response to a rising edge of a start pulse signal SPx, (i) a node nB is caused to show "High" whereby a transistor M8 can be turned on, and (ii) a node nA (a gate of a transistor M10) can be charged to show "Low". This prevents such a malfunction that a pulse is outputted from an output terminal OTm (due to a parasitic capacitance PC which is formed by the gate of and a drain of the transistor M10) even if a clock signal CKD is still inactive when a clock signal CKC initially rises after an operation period starts.

It is possible to reduce loads (e.g., dullness) of start pulse signals SPX and SPx, by supplying the start pulse signals SPX and SPx to only the unit circuits UCm where m=1 through 4, 8k+1, 8k+2, 8k+3, and 8k+4, respectively (where k is not less than 1 (one)).

Note that the unit circuit UCm where m=1 to 4 has the set output terminal STm (connected to a gate of and a drain of a transistor M1) via which a start pulse signal (SPX, SPx, SPY, or SPy) is supplied. Therefore, the unit circuit UCm where m=1 to 4 is configured to (i) include, instead of a control circuit SC, an adjustment circuit AC that includes a transistor M4 and (ii) have a control terminal CTm connected to a corresponding one of the lines P via which a low power supply electric potential VSS is supplied, the control terminal CTm being connected to a drain of and a gate of the transistor M4. In a case of the unit circuit UCm where m=8, 8k+5, 8k+6, 8k+7, or 8k+8 (where k is not less than 0 (zero)), a clock signal to be supplied to the input terminal CK1 initially rises after an operation period starts, while a clock signal to be supplied to the input terminal CK2 is active (while the clock signal is at least not inactive). This rarely causes such a malfunction that a pulse is outputted from an output terminal OTm (due to a parasitic capacitance PC which is formed by a gate of and a drain of a transistor M10) in response to an initial rising of the clock signal to be supplied to the input terminal CK1 after the operation period starts. Therefore, the unit circuit UCm is configured to (i) include, instead of a control circuit SC, an adjustment circuit AC that includes a transistor M4 and (ii) have a control terminal CTm connected to a corresponding one of the lines P via which a low power supply electric potential VSS is supplied, the control terminal CTm being connected to a drain of and a gate of the transistor M4. By providing, in the unit circuit UCm, the adjustment circuit AC which is identical in configuration to the control circuit SC, it is possible for the first through $n^{th}$ stages to have identical loads around respective transistors M4. This makes it possible to prevent waveforms of output signals supplied to the scan signal lines from differing from one stage to another.

The following description will discuss an operation of a unit circuit UC1 (see FIG. 41) of the first stage. In response to a rising edge of a start pulse signal SPX supplied via the line X, (i) a transistor M1 is turned on whereby a node nA (nA1 in FIG. 44) is caused to show "High", and (ii) transistors M6 and M10 are turned on. A node nB (nB1 in FIG. 44) is caused to show "Low" whereby a transistor M8 is turned off. In response to a rising edge of a clock signal CKA supplied via the line A in this state, an electric potential of the node nA is further increased. This causes a pulse (pulse width: 4H) of the clock signal CKA to be outputted from an output terminal OT1. In response to a falling edge of the clock signal CKA, the electric potential of the node nA is decreased. Subsequently, when a pulse is outputted from an output terminal OT7 of a unit circuit UC7 of the seventh stage (when a transistor 9 is turned on), the node nB and the node nA are caused to show "High" and "Low" respectively (the transistor M10 is turned off). The unit circuit UC1 completes a reset. Thereafter, transistors M2, M3, and M12 are turned on, in response to a rising edge of an initialization signal INTL in synchronization with a falling edge of a pulse outputted from an output terminal OTn of a unit circuit UCn of a final stage. This charges the node nA, the node nB, and the output terminal OT1 to show "Low". Note that, at and after the rising edge of the initialization signal INTL, clock signals CKA through CKD and clock signals CKa through CKd stop (are kept inactive "Low").

The following description will discuss an operation of a unit circuit UC5 (see FIG. 41) of the fifth stage (a first intermediate stage). When the unit circuit UC1 of the first stage outputs a pulse from the output terminal OT1, (i) a transistor M1 is turned on whereby a node nA (nA5 in FIG. 44) is caused to show "High", and (ii) transistors M6 and M10 are turned on. A node nB (nB5 in FIG. 44) is caused to show "Low" whereby a transistor M8 is turned off. In response to a rising edge of a clock signal CKB supplied via the line B in this state, an electric potential of the node nA is further increased. This causes a pulse (pulse width: 4H) of the clock signal CKB to be outputted from an output terminal OT5. In response to a falling edge of the clock signal CKB, the electric potential of the node nA is decreased. Subsequently, when a pulse is outputted from an output terminal OT11 of a unit circuit UC11 of the 11$^{th}$ stage (a transistor M9 is turned on), the node nB and the node nA are caused to show "High" and "Low" respectively (the transistor M10 is turned off). The unit circuit UC5 completes a reset. Thereafter, transistors M2, M3, and M12 are turned on, in response to a rising edge of an initialization signal INTL in synchronization with a falling edge of a pulse outputted from the output terminal OTn of the unit circuit UCn of the final stage. This charges the node nA, the node nB, and the output terminal OT5 to show "Low".

The following description will discuss an operation of a unit circuit UC9 (see FIG. 42) of the ninth stage (a second intermediate stage). In response to a rising edge of a start pulse signal SPX, (i) a node nB (nB9 in FIG. 44) is caused to show "High" whereby a transistor M8 is turned on, and (ii) a node nA (nA9 in FIG. 44) is charged to show "Low". This prevents such a malfunction that a pulse is outputted from an output terminal OT9 in response to an initial rising edge of a clock signal CKA after an operation period starts. Thereafter, when the unit circuit UC5 of the fifth stage outputs a pulse from the output terminal OT5, (i) a transistor M1 is turned on whereby the node nA is caused to show "High", and (ii) transistors M6 and M10 are turned on. The node nB is caused to show "Low" whereby the transistor M8 is turned off. In response to a rising edge of a clock signal CKA supplied via the line A in this state, an electric potential of the node nA is further increased. This causes a pulse (pulse width: 4H) of the clock signal CKA to be outputted from the output terminal OT9. In response to a falling edge of the clock signal CKA, the electric potential of the node nA is decreased. Subsequently, when a pulse is outputted from an output terminal OT15 of a unit circuit UC15 of the 15$^{th}$ stage (when a transistor M9 is turned on), the node nB and the node nA are caused to show "High" and "Low" respectively (the transistor M10 is turned off). The unit circuit UC9 completes a reset. Thereafter, transistors M2, M3, and M12 are turned on in response to a rising edge of an initialization signal INTL. This charges the node nA, the node nB, and the output terminal OT9 to show "Low".

The following description will discuss an operation of the unit circuit UCn (see FIG. 43) of the n$^{th}$ stage. When a pulse is outputted from an output terminal OT(n–4) of a unit circuit UC(n–4) of the (n–4)$^{th}$ stage, (i) a transistor M1 is turned on whereby a node nA is caused to show "High", and (ii) transistors M6 and M10 are turned on. A node nB is caused to show "Low" whereby a transistor M8 is turned off. In response to a rising edge of a clock signal CKb supplied via the line b in this state, an electric potential of the node nA is further increased. This causes a pulse (pulse width: 4H) of the clock signal CKb to be outputted from the output terminal OTn. In response to a falling edge of the clock signal CKb, the electric potential of the node nA is decreased. Subsequently, in response to a rising edge of an initialization signal INTl supplied via the line l (when a transistor M9 is turned on), the node nA is caused to show "Low" (the transistor M10 is turned off). The unit circuit UCn completes a reset. In synchronization with timing at which the node nA is caused to show "Low", the node nB and the output terminal OTn are charged to show "Low".

FIGS. 41 through 43 illustrate a case where a drain of and a gate of a transistor M4 of a control circuit SC are connected to the line (X or x) via which a start pulse signal SPX or SPx is supplied. The case is illustrative only. The drain of and the gate of the transistor M4 of the control circuit SC may be connected to a line (W or w) which is different from the line (X or x) (see FIG. 45). With this configuration, it is possible to supply, to the line W connected to odd-numbered stages, a control signal which is synchronized with a start pulse signal SPX, and it is possible to supply, to the line w connected to even-numbered stages, a control signal which is synchronized with a start pulse signal SPx (see FIG. 46 that illustrates a fluctuation in electric potential (signal waveform) of each section illustrated in FIG. 45). This makes it possible to reduce loads of the start pulse signals.

FIGS. 41 through 43 illustrate a case where only the unit circuits UCm where m=8k+1, 8k+2, 8k+3, and 8k+4 respectively (where k is not less than 1 (one)) each include the control circuit SC. The case is illustrative only. Each unit circuit UCm where m=5 to n may include a control circuit SC, whereas each unit circuit UCm where m=1 to 4 may include an adjustment circuit AC (see FIG. 47 and FIG. 48 that illustrates a fluctuation in electric potential (signal waveform) of each section illustrated in FIG. 47). With this configuration, it is possible to prevent, in all stages, a malfunction which will be caused in response to an initial rising edge of a clock signal after an operation period starts. In a case of a configuration illustrated in FIGS. 47 and 48, a drain of and a gate of a transistor M4 of the control circuit SC may also be connected to a line (W or w) which is different from a line (X or x) (see FIG. 49). With this configuration, it is possible to supply, to the line W connected to odd-numbered stages, a control signal which is synchronized with a start pulse signal SPX, and it is possible to supply, to the line w connected to even-numbered stages, a control signal which is synchronized with a start pulse signal SPx (see FIG. 50 that illustrates a fluctuation in electric potential (signal waveform) of each section illustrated in FIG. 49). This makes it possible to reduce loads of the start pulse signals.

FIGS. 40 through 43 illustrate a case where the lines (L and l) via which respective initialization signals INTL and INTl are supplied are provided. The case is illustrative only. Without any lines (L and l) provided (with the lines (L and l) removed), the initialization terminal LTm of the unit circuit UCm may be connected to the line (X or x) via which a start pulse signal SPX or SPx is supplied (see (a) of FIG. 51). With this configuration, it is possible to supply, via the lines (X and x), two initialization pulses ((i) a first pulse (pulse width: 4H) which rises in synchronization with a falling edge of a pulse outputted from the output terminal of the final stage, and (ii) a second pulse identical in type to the first pulse, a rising edge of the second pulse being later than that of the first pulse by one horizontal scan period) (see (b) of FIG. 51). This makes it possible to reduce the number of lines via which signals are inputted.

Example 7

FIGS. 40 through 43 illustrate a case where an adjustment circuit AC is provided in each unit circuit other than the unit circuits UCm where m=8k+1, 8k+2, 8k+3, and 8k+4 respectively (where k is not less than 1 (one)). The case is illustrative only. As illustrated in (a) and (b) of FIG. 52, it is possible to configure (i) each unit circuit UCi where i=8k+1, 8k+2, 8k+3, or 8k+4 (where k is not less than 1 (one)) to include a control circuit SC that includes a transistor M4, and (ii) each unit circuit UCj where j=1 to 4, 8k+5, 8k+6, 8k+7, or 8k+8 (where k is not less than 0 (zero)) to include no adjustment circuit AC. FIGS. 53 through 55 illustrate a configuration of first through n$^{th}$ stages (m=1 to n) of first and second shift registers, each of unit circuits of the respective first through n$^{th}$ stages being configured as illustrated in (a) or (b) of FIG. 52. Note that see FIG. 44 as to a fluctuation in electric potential (signal waveform) of each section illustrated in FIGS. 53 through 55. Example 7 reduces the number of transistors included in each of the first and second shift registers. It is therefore possible to increase a production yield.

FIGS. 53 through 55 illustrate a case where a drain of and a gate of the transistor M4 of the control circuit SC are connected to a line (X or x) via which a start pulse signal SPX or SPx is supplied. The case is illustrative only. The drain of and the gate of the transistor M4 of the control circuit SC may be connected to a line (W or w) which is different from the line (X or x) (see FIG. 56). With this configuration, it is possible to supply, to the line W connected to odd-numbered stages, a control signal which is synchronized with a start pulse signal SPX, and it is possible to supply, to the line w connected to even-numbered stages, a control signal which is synchronized with a start pulse signal SPx. This makes it possible to reduce loads of the start pulse signals.

FIGS. 52 through 55 illustrate a case where lines (L and l) via which respective initialization signals INTL and INTl are supplied are provided. The case is illustrative only. Without any lines (L and l) provided (with the lines (L and l) removed), each of initialization terminals LTi and LTj may be connected to the line (X or x) via which a start pulse signal SPX or SPx is supplied (see (a) and (b) of FIG. 57). With this configuration, it is possible to supply, via the lines X and x, two initialization pulses ((i) a first pulse (pulse width: 4H) which rises in synchronization with a falling edge of a pulse outputted from an output terminal of a final stage, and (ii) a second pulse identical in type to the first pulse, a rising edge of the second pulse being later than that of the first pulse by one horizontal scan period) (see (c) of FIG. 57). This makes it possible to reduce the number of lines via which signals are inputted.

Example 8

FIGS. 40 through 43 illustrate a case where the unit circuit UCm of the $m^{th}$ stage (where m=1 to n) includes the transistor M4. The case is illustrative only. As illustrated in FIG. 58, a unit circuit UCm may include a transistor Mz (instead of the transistor M4). As illustrated in FIG. 58, a drain of a transistor M10 and a gate of a transistor M7 are connected to an input terminal CK1. The transistor M10 has (i) a source connected to one electrode of a capacitor C1, a drain of a transistor M11, a drain of a transistor M12, and an output terminal OTm, and (ii) a gate (node nA) connected to the other electrode of the capacitor C1, a drain of a transistor M9, a drain of a transistor M8, a drain of the transistor Mz, a gate of the transistor M6, a source of a transistor M1, and a drain of a transistor M2. The transistor M8 has a gate (node nB) connected to a drain of the transistor M7, a drain of a transistor M3, a drain of the transistor M6, and a source of a transistor M5. The transistors Mz, M2, M3, M6 through M9, M11, and M12 have respective sources connected to a low power supply electric potential VSS (VGL). The transistor M1 has a drain and a gate which are connected to a set terminal STm. The transistor M5 has a drain and a gate which are connected to an input terminal CK2. The transistor M11 has a gate connected to the input terminal CK2. The transistor Mz (control transistor) has a gate connected to a control terminal CTm. The transistors M2, M3, and M12 have respective gates connected to an initialization terminal LTm. The transistor M9 has a gate connected to a reset terminal RTm.

FIGS. 59 through 61 illustrate a configuration of first through $n^{th}$ stages (m=1 to n) of first and second shift registers of Example 8. Note that FIGS. 59 through 61 are identical to FIGS. 40 through 43 in connection relationship between (i) lines A through D, lines a through d, lines X and Y, lines x and y, lines L and l, and lines P and (ii) the two input terminals CK1 and CK2, the set terminal STm, the reset terminal RTm, the output terminal OTm, the control terminal CTm, and the initialization terminal LTm, all of which belong to the unit circuit UCm (where m=1 to n).

FIG. 62 illustrates fluctuations in electric potential (signal waveforms) of the lines A through D, the lines a through d, the lines X and Y, the lines x and y, the lines L and l, and the lines P, scan signal lines G1 through Gn (connected to the respective stages), nodes nA (of the respective stages), and nodes nB (of the respective stages), all of which are illustrated in FIGS. 59 through 61. As illustrated in FIG. 62, (i) clock signals CKA through CKD which are supplied via the respective lines A through D, (ii) clock signals CKa through CKd which are supplied via the respective lines a through d, (iii) start pulse signals SPX, SPY, SPx, and SPy which are supplied via the respective lines X, Y, x, and y, and (iv) initialization signals INTL and INTl which are supplied via the respective lines L and l are identical to those illustrated in FIG. 44 (FIG. 6).

In this case, a clock signal CKA to be supplied to an input terminal CK1 of a unit circuit UCm where m=8k+1 (where k is not less than 1 (one)) initially rises after an operation period starts, while a clock signal CKB to be supplied to an input terminal CK2 of the unit circuit UCm is still inactive (while a node nB is showing "Low", and a transistor M8 is in an OFF state).

Paying attention to this point, the inventors of the present invention configure the unit circuit UCm (where m=8k+1), which belongs to a second intermediate stage, to include a control circuit SC that includes a transistor Mz and to have a control terminal CTm connected to the line X via which a start pulse signal SPX is supplied, the control terminal CTm being connected to a gate of the transistor Mz (see FIG. 60). With this configuration, in response to a rising edge of a start pulse signal SPX (when an operation period PT starts), it is possible to turn on the transistor Mz, and to charge a node nA (a gate of a transistor M10) so as to show "Low". This prevents such a malfunction that a pulse is outputted from an output terminal OTm (due to a parasitic capacitance PC which is formed by the gate of and a drain of the transistor M10) even if the clock signal CKB is still inactive when the clock signal CKA initially rises after the operation period starts.

A unit circuit UCm where m=8k+2 (where k is not less than 1 (one)) is also configured to include a control circuit SC that includes a transistor Mz and to have a control terminal CTm connected to the line x via which a start pulse signal SPx is supplied, the control terminal CTm being connected to a gate of the transistor Mz (see FIG. 60). With this configuration, in response to a rising edge of a start pulse signal SPx, it is possible to turn on the transistor Mz, and to charge a node nA (a gate of a transistor M10) so as to show "Low". This prevents such a malfunction that a pulse is outputted from an output terminal OTm (due to a parasitic capacitance PC which is formed by the gate of and a drain of the transistor M10) even if a clock signal CKb is still inactive when a clock signal CKa initially rises after an operation period starts.

A circuit UCm where m=8k+3 (where k is not less than 1 (one)) is also configured to include a control circuit SC that includes a transistor Mz and to have a control terminal CTm connected to the line X via which a start pulse signal SPX is supplied, the control terminal CTm being connected to a gate of the transistor Mz (see FIG. 60). With this configuration, in response to a rising edge of a start pulse signal SPX, it is possible to turn on the transistor Mz, and to charge a node nA (a gate of a transistor M10) so as to show "Low". This prevents such a malfunction that a pulse is outputted from an output terminal OTm (due to a parasitic capacitance PC which is formed by the gate of and a drain of the transistor M10) even if a clock signal CKD is still inactive when a clock signal CKC initially rises after an operation period starts.

A unit circuit UCm where m=8k+4 (where k is not less than 1 (one)) is also configured to include a control circuit SC that includes a transistor Mz and to have a control terminal CTm connected to the line x via which a start pulse signal SPx is supplied, the control terminal CTm being connected to a gate of the transistor Mz (see FIG. 60). With this configuration, in response to a rising edge of a start pulse signal SPx, it is possible to turn on the transistor Mz, and to charge a node nA (a gate of a transistor M10) so as to show "Low". This prevents such a malfunction that a pulse is outputted from an output terminal OTm (due to a parasitic capacitance PC which is formed by the gate of and a drain of the transistor M10) even if a clock signal CKd is still inactive when a clock signal CKc initially rises after an operation period starts.

Note that each unit circuit UCm where m=1 to 4 has a set output terminal STm (connected to a gate of and a drain of a transistor M1) via which a start pulse signal (SPX, SPx, SPY, or SPy) is supplied. Therefore, the each unit circuit UCm is configured to (i) include, instead of a control circuit SC, an adjustment circuit AC that includes a transistor Mz and (ii) have a control terminal CTm connected to a corresponding one of the lines P via which a low power supply electric potential VSS is supplied, the control terminal CTm being connected to a gate of the transistor Mz. In a case of each unit circuit UCm where m=8k+5, 8k+6, 8k+7, or 8k+8 (where k is not less than 0 (zero)), a clock signal to be supplied to an input terminal CK1 initially rises after an operation period starts, while a clock signal to be supplied to an input terminal CK2 is active (while the clock signal is at least not inactive). This rarely causes such a malfunction that a pulse is outputted from an output terminal OTm (due to a parasitic capacitance PC which is formed by a gate of and a drain of a transistor M10) in response to an initial rising edge of the clock signal to be supplied to the input terminal CK1 after the operation period starts. Therefore, the each unit circuit UCm (where m=8k+5, 8k+6, 8k+7, or 8k+8) is configured to (i) include, instead of a control circuit SC, an adjustment circuit AC that includes a transistor Mz and (ii) have a control terminal CTm connected to a corresponding one of the lines P via which a low power supply electric potential VSS is supplied, the control terminal CTm being connected to a gate of the transistor M4. By providing, in the each unit circuit UCm, the adjustment circuit AC which is identical in configuration to the control circuit SC, it is possible for the first through n$^{th}$ stages to have identical loads around respective transistors Mz.

The following description will discuss an operation of a unit circuit UC5 (see FIG. 60) of the fifth stage (a first intermediate stage). When a pulse is outputted from an output terminal OT1 of a unit circuit UC1 of the first stage, (i) a transistor M1 is turned on whereby a node nA (nA5 in FIG. 62) is caused to show "High", and (ii) transistors M6 and M10 are turned on. A node nB (nB5 in FIG. 62) is caused to show "Low" whereby a transistor M8 is turned off. In response to a rising edge of a clock signal CKB supplied via the line B in this state, an electric potential of the node nA is further increased. This causes a pulse (pulse width: 4H) of the clock signal CKB to be outputted from an output terminal OT5. In response to a falling edge of the clock signal CKB, the electric potential of the node nA is decreased. Subsequently, when a pulse is outputted from an output terminal OT11 of a unit circuit UC11 of the 11$^{th}$ stage (when a transistor M9 is turned on), the node nB and the node nA are caused to show "High" and "Low" respectively (the transistor M10 is turned off). The unit circuit UC5 completes a reset. Thereafter, transistors M2, M3, and M12 are turned on, in response to a rising edge of an initialization signal INTL in synchronization with a falling edge of a pulse outputted from an output terminal OTn of a unit circuit UCn of a final stage. This charges the node nA, the node nB, and the output terminal OT5 to show "Low".

The following description will discuss an operation of a unit circuit UC9 (see FIG. 60) of the ninth stage (a second intermediate stage). In response to a rising edge of a start pulse signal SPX, (i) a transistor Mz is turned on, and (ii) a node nA (nA9 in FIG. 62) is charged to show "Low". This prevents such a malfunction that a pulse is outputted from an output terminal OT9 in response to an initial rising edge of a clock signal CKA after an operation period starts. Thereafter, when the unit circuit UC5 of the fifth stage outputs a pulse from the output terminal OT5, (i) a transistor M1 is turned on whereby the node nA is caused to show "High", and (ii) transistors M6 and M10 are turned on. A node nB is caused to show "Low" whereby a transistor M8 is turned off. In response to a rising edge of a clock signal CKA supplied via the line A in this state, an electric potential of the node nA is further increased. This causes a pulse (pulse width: 4H) of the clock signal CKA to be outputted from the output terminal OT9. In response to a falling edge of the clock signal CKA, the electric potential of the node nA is decreased. Subsequently, when a pulse is outputted from an output terminal OT15 of a unit circuit UC15 of the 15$^{th}$ stage (when a transistor M9 is turned on), the node nB and the node nA are caused to show "High" and "Low" respectively (the transistor M10 is turned off). The unit circuit UC9 completes a reset. Thereafter, transistors M2, M3, and M12 are turned on in response to a rising edge of an initialization signal INTL. This charges the node nA, the node nB, and the output terminal OT9 to show "Low".

FIGS. 59 through 61 illustrate a case where the gate of the transistor Mz of the control circuit SC is connected to the line (X or x) via which a start pulse signal SPX or SPx is supplied. The case is illustrative only. The gate of the transistor M4 of the control circuit SC may be connected to a line (W or w) which is different from the line (X or x) (see FIG. 63). With this configuration, it is possible to supply, to the line W connected to odd-numbered stages, a control signal which is synchronized with a start pulse signal SPX, and it is possible to supply, to the line w connected to even-numbered stages, a control signal which is synchronized with a start pulse signal SPx (see FIG. 64 that illustrates a fluctuation in electric potential (signal waveform) of each section illustrated in FIG. 63). This makes it possible to reduce loads of the start pulse signals.

FIGS. 59 through 61 illustrate a case where only the unit circuits UCm where m=8k+1, 8k+2, 8k+3, and 8k+4, respectively (where k is not less than 1 (one)) each include the control circuit SC. The case is illustrative only. Each unit circuit UCm where m=5 to n may include a control circuit SC, whereas each unit circuit UCm where m=1 to 4 may include an adjustment circuit AC (see FIG. 65 and FIG. 66 that illustrates a fluctuation in electric potential (signal waveform) of each section illustrated in FIG. 65). With this configuration, it is possible to prevent, in all stages, a malfunction which will be caused in response to an initial rising edge of a clock signal after an operation period starts. In a case of a configuration illustrated in FIGS. 65 and 66, a gate of a transistor M4 of the control circuit SC of the each unit circuit UCm (where m=1 to 4) may also be connected to a line (W or w) which is different from the line (X or x) (see FIG. 67) With this configuration, it is possible to supply, to the line W connected to odd-numbered stages, a control signal which is synchronized with a start pulse signal SPX, and it is possible to supply, to the line w connected to even-numbered stages, a control signal which is synchronized with a start pulse signal SPx. Note that see FIG. 64 as to a fluctuation in electric potential of each section illustrated in FIG. 67. This makes it possible to reduce loads of the start pulse signals.

FIGS. 59 through 61 illustrate a case where the lines (L and l) via which respective initialization signals INTL and INTl are supplied are provided. The case is illustrative only. Without any lines (L and l) provided (with the lines (L and l) removed), the initialization terminal LTm of the unit circuit UCm may be connected to the line (X or x) via which a start pulse signal SPX or SPx is supplied (see (a) of FIG. 68). With this configuration, it is possible to supply, via the lines (X and x), two initialization pulses ((i) a first pulse (pulse width: 4H) which rises in synchronization with a falling edge of a pulse outputted from the output terminal of the final stage, and (ii) a second pulse identical in type to the first pulse, a rising edge of the second pulse being later than that of the first pulse by one horizontal scan period) (see (b) of FIG. 68). This makes it possible to reduce the number of lines via which signals are inputted.

Example 9

FIGS. 59 through 61 illustrate a case where an adjustment circuit AC is provided in each unit circuit other than the unit circuits UCm where m=8k+1, 8k+2, 8k+3, and 8k+4 respectively (where k is not less than 1 (one)). The case is illustrative only. As illustrated in (a) and (b) of FIG. 69, it is possible to configure (i) each unit circuit UCi where i=8k+1, 8k+2, 8k+3, or 8k+4 (where k is not less than 1 (one)) to include a control circuit SC that includes a transistor Mz, and (ii) each unit circuit UCj where j=1, 2, 8k+5, 8k+6, 8k+7, or 8k+8 (where k is not less than 0 (zero)) to include no adjustment circuit AC. FIGS. 70 through 72 illustrate a configuration of first through $n^{th}$ stages (m=1 to n) of first and second shift registers, each of unit circuits of the respective first through $n^{th}$ stages being configured as illustrated in (a) or (b) of FIG. 69. Note that see FIG. 62 as to a fluctuation in electric potential (signal waveform) of each section illustrated in FIGS. 70 through 72. Example 9 reduces the number of transistors included in each of the first and second shift registers. It is therefore possible to increase a production yield.

FIGS. 70 through 72 illustrate a case where a gate of the transistor M4 of the control circuit SC is connected to a line (X or x) via which a start pulse signal SPX or SPx is supplied. The case is illustrative only. The gate of the transistor M4 of the control circuit SC may be connected to a line (W or w) which is different from the line (X or x) (see FIG. 73). With this configuration, it is possible to supply, to the line W connected to odd-numbered stages, a control signal which is synchronized with a start pulse signal SPX, and it is possible to supply, to the line w connected to even-numbered stages, a control signal which is synchronized with a start pulse signal SPx. This makes it possible to reduce loads of the start pulse signals.

FIGS. 58 through 61 illustrate a case where lines (L and l) via which respective initialization signals INTL and INTl are supplied are provided. The case is illustrative only. Without any lines (L and l) provided (with the lines (L and l) removed), each of initialization terminals LTi and LTj may be connected to the line (X or x) via which a start pulse signal SPX or SPx is supplied (see (a) and (b) of FIG. 74). With this configuration, it is possible to supply, via the lines (X and x), two initialization pulses ((i) a first pulse (pulse width: 4H) which rises in synchronization with a falling edge of a pulse outputted from an output terminal of a final stage, and (ii) a second pulse identical in type to the first pulse, a rising edge of the second pulse being later than that of the first pulse by one horizontal scan period) (see (c) of FIG. 74). This makes it possible to reduce the number of lines via which signals are inputted.

Example 10

A configuration is available in which a control terminal CTm is connected to a gate of a transistor M2 which is employed instead of the transistor Mz of Example 9 as a control transistor. That is, as illustrated in (a) and (b) of FIG. 75, (i) each unit circuit UCi where i=8k+1, 8k+2, 8k+3, or 8k+4 (k is not less than 1 (one)) may be configured to include a control circuit SC that includes a transistor M2 and to have a control terminal CTm connected to a gate of the transistor M2, and (ii) each unit circuit UCj where j=1, 2, 8k+5, 8k+6, 8k+7, or 8k+8 (where k is not less than 0 (zero)) may be configured so that a gate of a transistor M2 is connected to an initialization terminal TLi.

FIG. 76 illustrates a configuration of first through $n^{th}$ stages (m=1 to n) of first and second shift registers of Example 10. Note that FIG. 76 is identical to FIGS. 40 through 43 in connection relationship between (i) lines A through D, lines a through d, lines X and Y, lines x and y, lines L and l, and lines P and (ii) two input terminals CK1 and CK2, a set terminal STm, a reset terminal RTm, an output terminal OTm, a control terminal CTm, and an initialization terminal LTm, all of which belong to a unit circuit UCm (where m=1 to n). Note also that see FIG. 62 as to a fluctuation in electric potential (signal waveform) of each section illustrated in FIG. 76.

In this case, a clock signal CKA to be supplied to an input terminal CK1 of a unit circuit UCm where m=8k+1 (where k is not less than 1 (one)) initially rises after an operation period starts, while a clock signal CKD to be supplied to an input terminal CK2 of the unit circuit UCm is still inactive (while a node nB is showing "Low", and a transistor M8 is in an OFF state).

Paying attention to this point, the inventors of the present invention configure the unit circuit UCi (where i=8k+1), which belongs to a second intermediate stage, so that the control circuit CTi connected to the gate of the transistor M2 is connected to the line X via which a start pulse signal SPX is supplied (see FIGS. 75 and 76). With this configuration, in response to a rising edge of a start pulse signal SPX (when an operation period PT starts), it is possible to turn on the transistor M2, and to charge a node nA (a gate of a transistor M10) so as to show "Low". This prevents such a malfunction that a pulse is outputted from an output terminal OTm (due to a parasitic capacitance PC which is formed by the gate of and a drain of the transistor M10) even if the clock signal CKB is still inactive when the clock signal CKA initially rises after the operation period starts.

The unit circuit UCi where i=8k+2 (k is not less than 1 (one)) is also configured so that the control circuit CTi connected to the gate of the transistor M2 is connected to the line x via which a start pulse signal SPx is supplied. With this configuration, in response to a rising edge of a start pulse signal SPx, it is possible to turn on the transistor M2, and to charge a node nA (a gate of a transistor M10) so as to show "Low". This prevents such a malfunction that a pulse is outputted from an output terminal OTm (due to a parasitic capacitance PC which is formed by the gate of and a drain of the transistor M10) even if a clock signal CKb is still inactive when a clock signal CKa initially rises after an operation period starts.

The circuit UCm where m=8k+3 (where k is not less than 1 (one)) is also configured so that the control circuit CTi connected to the gate of the transistor M2 is connected to the line X via which a start pulse signal SPX is supplied. With this configuration, in response to a rising edge of a start pulse signal SPX, it is possible to turn on the transistor M2, and to charge a node nA (a gate of a transistor M10) so as to show "Low". This prevents such a malfunction that a pulse is outputted from an output terminal OTm (due to a parasitic capacitance PC which is formed by the gate of and a drain of the transistor M10) even if a clock signal CKD is still inactive when a clock signal CKC initially rises after an operation period starts.

The unit circuit UCi where i=8k+4 (k is not less than 1 (one)) is also configured so that the control circuit CTi connected to the gate of the transistor M2 is connected to the line x via which a start pulse signal SPx is supplied. With this configuration, in response to a rising edge of a start pulse signal SPx, it is possible to turn on the transistor M2, and to charge a node nA (a gate of a transistor M10) so as to show "Low". This prevents such a malfunction that a pulse is outputted from an output terminal OTm (due to a parasitic capacitance PC which is formed by the gate of and a drain of the transistor M10) even if a clock signal CKd is still inactive when a clock signal CKc initially rises after an operation period starts.

The following description will discuss an operation of a unit circuit UC7 (see FIG. 76) of the seventh stage. When a pulse is outputted from an output terminal of a unit circuit of the third stage, (i) a transistor M1 is turned on whereby a node nA (nA7 in FIG. 62) is caused to show "High", and (ii) transistors M6 and M10 are turned on. A node nB (nB7 in FIG. 62) is caused to show "Low" whereby a transistor M8 is turned off. In response to a rising edge of a clock signal CKD supplied via the line D in this state, an electric potential of the node nA is further increased. This causes a pulse (pulse width: 4H) of the clock signal CKD to be outputted from an output terminal OT7. In response to a falling edge of the clock signal CKD, the electric potential of the node nA is decreased. Subsequently, when a pulse is outputted from an output terminal OT13 of a unit circuit UC13 of the 13$^{th}$ stage (when a transistor 9 is turned on), the node nB and the node nA are caused to show "High" and "Low" respectively (the transistor M10 is turned off). The unit circuit UC7 completes a reset. Thereafter, transistors M2, M3, and M12 are turned on, in response to a rising edge of an initialization signal INTL in synchronization with a falling edge of a pulse outputted from an output terminal OTn of a unit circuit UCn of a final stage. This charges the node nA, the node nB, and the output terminal OT7 to show "Low".

The following description will discuss an operation of a unit circuit UC9 (see FIG. 76) of the ninth stage. In response to a rising edge of a start pulse signal SPX, (i) a transistor M2 is turned on, and (ii) a node nA (nA9 in FIG. 62) is charged to show "Low". This prevents such a malfunction that a pulse is outputted from an output terminal OT9 in response to an initial rising edge of a clock signal CKA after an operation period starts. Thereafter, when a pulse is outputted from an output terminal OT5 of a unit circuit UC5 of the fifth stage, (i) a transistor M1 is turned on whereby the node nA is caused to show "High", and (ii) transistors M6 and M10 are turned on. A node nB (nB9 in FIG. 62) is caused to show "Low" whereby a transistor M8 is turned off. In response to a rising edge of a clock signal CKA supplied via the line A in this state, an electric potential of the node nA is further increased. This causes a pulse (pulse width: 4H) of the clock signal CKA to be outputted from the output terminal OT9. In response to a falling edge of the clock signal CKA, the electric potential of the node nA is decreased. Subsequently, when a pulse is outputted from an output terminal OT15 of a unit circuit UC15 of the 15$^{th}$ stage (when a transistor 9 is turned on), the node nB and the node nA are caused to show "High" and "Low" respectively (the transistor M10 is turned off). The unit circuit UC9 completes a reset. Thereafter, transistors M3 and M12 are turned on in response to a rising edge of an initialization signal INTL. This charges the node nB and the output terminal OT9 to show "Low".

FIG. 76 illustrates a case where the gate of the transistor Mz of the control circuit SC is connected to the line (X or x) via which a start pulse signal SPX or SPx is supplied. The case is illustrative only. The gate of the transistor M2 of the control circuit SC may be connected to a line (W or w) which is different from the line (X or x) (see FIG. 77). With this configuration, it is possible to supply, to the line W connected to odd-numbered stages, a control signal which is synchronized with a start pulse signal SPX, and it is possible to supply, to the line w connected to even-numbered stages, a control signal which is synchronized with a start pulse signal SPx. This makes it possible to reduce loads of the start pulse signals.

Concerning Examples 1 through 10

The gate driver illustrated in FIG. 2 includes (i) the lines (trunks) X, Y, x, and y via which respective (gate) start pulse signals SPX, SPY, SPx, and SPy (four phases) are supplied, and (ii) the first shift register SR1 and the second shift register SR2 of Example 1 to 10. Desirably, the lines (trunks) X, Y, x, and y do not overlap the first and second shift resisters SR1 and SR2 so that loads of the start pulse signals are reduced. For example, in a case where the gate driver is monolithically provided on the liquid crystal panel, (i) the lines X and Y are provided between the first shift register SR1 and one of two edges (glass edge surfaces) which serve as respective short sides of a glass substrate, and (ii) the lines x and y are provided between the second shift register SR2 and the other of the two edges (see (a) of FIG. 78). Alternatively, the lines X and Y are provided between the display section DA and the first shift register SR1 (the lines A through D and the line L are provided between the one of the two edges and the first shift register SR1), and the lines x and y are provided between the display section DA and the second shift register SR2 (the lines a through d and the line l are provided between the other of the two edges and the second shift register SR2) (see (b) of FIG. 78). Note that, in a case of no frame space, lines such as the lines L and l can be provided so as to overlap the respective first and second shift registers SR1 and SR2 (see (c) of FIG. 78).

In a case where, without the lines (L and l) provided (with the lines (L and l) removed), each initialization terminal LTm is connected to the line (X, x, Y, or y) via which a start pulse signal is supplied, it is possible to supply only one start pulse (which rises immediately before an operation period starts) to the lines (X, x, Y, and y) (see FIG. 79).

In a case where a line W/w is used, a pulse supplied to the line W/w rises before an initial clock of a clock signal (CKA) whose phase advances most, and may not be identical in terms of time to a start pulse (see FIG. 80).

The above Examples have described a case where a control transistor included in a control circuit SC is connected to the line X or the line x. In order to reduce loads of start pulse signals, the control transistor may be selectively connected to the line X, the line x, the line Y, or the line y (so that loads are distributed not to two lines but to four lines). For example, FIG. 5 of Example 1 is modified to FIG. 81 which illustrates a case where (i) a drain of and a gate of a transistor M4 of a unit circuit UC(n−5) are connected to a line Y and (ii) a drain of and a gate of a transistor M4 of a unit circuit UC(n−4) are connected to a line y. Similarly, FIG. 17 of Example 2 is modified to FIG. 82, FIG. 23 of Example 3 is modified to FIG. 83, and FIG. 34 of Example 4 is modified to FIG. 84. FIG. 42 of Example 6 is modified to FIG. 85 which illustrates a case where (i) a drain of and a gate of a transistor M4 of a unit circuit UC11 are connected to a line Y and (ii) a drain of and a gate of a transistor M4 of a unit circuit UC11 are connected to a line y. Similarly, FIG. 54 of Example 7 is modified to FIG. 86, FIG. 60 of Example 8 is modified to FIG. 87, and FIG. 71 of Example 9 is modified to FIG. 88.

It is possible to employ, as each transistor of the first and second shift registers SR1 and SR2 of Example 1 to 10, a TFT (Thin Film Transistor) whose semiconductor layer is made of an oxide semiconductor such as IGZO (InGaZnOx). In a case where the TFT is employed as the each transistor, it is considered that an electric current easily leaks due to a raise of an electric potential of a gate (node nA) of a transistor M10, the raise being caused by a parasitic capacitance PC which is formed by the gate of and a drain of the transistor M10 (this is because a TFT which includes an oxide semiconductor has an excellent ON characteristic). Therefore, it can be said that it is significant to charge the node nA so as to certainly show VSS (Low) when an operation period starts, as has been described in the above Examples. Further, a vertical blanking period (including non-operation period) is often extended so that a liquid crystal panel which includes an oxide semiconductor reduces its power consumption. During such an extended vertical blanking period, a node nA will probably discharge electric power. Therefore, it can also be said in terms of this that it is significant to charge the node nA so as to certainly show VSS when an operation period starts.

Needless to say, it is possible to employ, as each transistor of the first and second shift registers SR1 and SR2 of Example 1 to 10, a TFT (Thin Film Transistor) whose semiconductor layer is made of amorphous silicon or poly-silicon. Such a TFT leaks larger amount of electric current in an OFF state than a TFT which includes an oxide semiconductor, and a node nA will probably discharge electric power during a vertical blanking period (even if it is not a long vertical blanking period). Particularly, in a case where amorphous silicon is used, (i) the transistor M10 has a large parasitic capacitance, and (ii) the transistor M10 easily leaks large amount of electric current due to a raise of a drain in response to a rising edge of a clock. Therefore, it can be said that it is significant to charge the node nA so as to certainly show VSS when an operation period starts.

A shift register of the present invention is configured to include an initial stage, a first intermediate stage, a second intermediate stage, and a final stage, each of the first and second intermediate stages having (i) a first input terminal, (ii) a second input terminal, (iii) an output terminal connected to the first input terminal via an output transistor, and (iv) a setting circuit, which is connected to the second input terminal and the output transistor, for setting an electric potential of a control terminal of the output transistor, a clock signal which is supplied to the first input terminal and a clock signal which is supplied to the second input terminal being different in phase from each other, the second intermediate stage having a control circuit (i) which is connected to the setting circuit of the second intermediate stage and (ii) to which a control signal is supplied, an operation period being a period of time (i) from activation of a shift start signal which is supplied to the initial stage (ii) to a change in signal which is outputted from the final stage from activation to inactivation (or a period of time from activation of a shift start signal to a rest of the final stage), when a clock signal which is supplied to the first input terminal of the second intermediate stage is initially activated after an operation period starts, a clock signal which is supplied to the second input terminal of the second intermediate stage being inactive.

By providing the setting circuit in the second intermediate stage, it is possible to prevent malfunction of the second intermediate stage even in a case where a clock signal which is supplied to the second input terminal of the second intermediate stage is inactive when a clock signal which is supplied to the first input terminal of the second intermediate stage is initially activated after an operation period starts.

The shift register of the present invention can be configured so that the clock signal supplied to the first input terminal of the second intermediate stage, and the clock signal supplied to the second input terminal of the second intermediate stage are kept inactive before the operation period starts.

The shift register of the present invention can be configured so that, when the clock signal supplied to the first input terminal of the first intermediate stage is initially activated after the operation period starts, the clock signal supplied to the second input terminal of the first intermediate stage is not inactive.

The shift register of the present invention can be configured so that the first intermediate stage does not include the control circuit.

The shift register of the present invention can be configured so that the first intermediate stage includes an adjustment circuit which is (i) identical in configuration to the control circuit and (ii) supplied with a constant electric potential signal instead of the control signal.

The shift register of the present invention can be configured so that the first intermediate stage includes an initialization circuit which is (i) identical in configuration to the control circuit and (ii) supplied with an initialization signal.

The shift register of the present invention can be configured so that the control signal is the shift start signal which is supplied to the initial stage.

The shift register of the present invention can be configured so that the setting circuit includes a first setting transistor and a second setting transistor, the second setting transistor has a control terminal connected via the first setting transistor to the second input terminal, the control terminal of the output transistor is connected to a constant electric potential source via the second setting transistor, and when the clock signal supplied to the second input terminal is active, the output transistor is turned off.

The shift register of the present invention can be configured so that the control circuit includes a control transistor which (i) is connected to the control terminal of the second setting transistor and (ii) has a control terminal supplied with the control signal.

The shift register of the present invention can be configured so that the control circuit includes a control transistor which (i) is connected to the control terminal of the output transistor and (ii) has a control terminal supplied with the control signal.

The shift register of the present invention can be configured so that the output transistor has a semiconductor layer made of an oxide semiconductor.

The shift register of the present invention can be configured to further include a third intermediate stage, wherein: the third intermediate stage includes (i) a first input terminal, (ii) a second input terminal, (iii) an output terminal connected to the first input terminal via an output transistor, and (iv) a setting circuit, which is connected to the second input terminal and the output transistor, for setting an electric potential of a control terminal of the output transistor; the first input terminal and the second input terminal are supplied with respective clock signals different in phase from each other; the third intermediate stage includes a control circuit which is (i) connected to the setting circuit and (ii) supplied with a control signal; when the clock signal supplied to the first input terminal of the third intermediate stage is initially activated after the operation period starts, the clock signal supplied to the second input terminal of the third intermediate stage is inactive; and the control signal supplied to the control circuit of the second intermediate stage, and the control signal supplied to the control circuit of the third intermediate stage are supplied via respective different lines.

A driver circuit of the present invention is configured to include: the shift register; a control line via which the control signal is supplied; a first clock line via which the clock signal is supplied to the first input terminal; and a second clock line via which the clock signal is supplied to the second input terminal.

The driver circuit of the present invention can be configured so that the shift register does not overlap with the control line.

The present invention is not limited to the embodiment above. An embodiment obtained by modifying as appropriate the embodiment based on technical knowledge, and a combination of such modified embodiments are encompassed in the embodiment of the present invention.

INDUSTRIAL APPLICABILITY

A liquid crystal display device of the present invention is suitably applicable to, for example, various liquid crystal displays and liquid crystal televisions.

REFERENCE SIGNS LIST

LCD: Liquid crystal display device
SR1: First shift register
SR2: Second shift register
GD: Gate driver
SD: Source Driver
DCC: Display control circuit
GLm: Scan signal line (connected to an $m^{th}$ stage)
UCm: Unit circuit (of an $m^{th}$ stage)
CK1 through CK4: Input terminal
STm: Set terminal (of an $m^{th}$ stage)
CTm: Control terminal (of an $m^{th}$ stage)
RTm: Reset terminal (of an $m^{th}$ stage)
OTm: Output terminal (of an $m^{th}$ stage)
M1 through M12: Transistor
SC: Control circuit
AC: Adjustment circuit
A through D: Lines via which respective clock signals CKA through CKD are supplied
a through d: Lines via which respective clock signals CKa through CKd are supplied
X and Y: Lines via which respective start pulse signals SPX and SPY (control signals) are supplied
x and y: Lines via which respective start pulse signals SPx and SPy (control signals) are supplied
L and l: Lines via which respective initialization signals INTL and INTl are supplied
P: Line via which a power supply electric potential (VSS) is supplied
W and w: Lines via which control signals are supplied
PT: Operation period
NT: Non-operation period

The invention claimed is:

1. A shift register, comprising an initial stage, a first intermediate stage, a second intermediate stage, and a final stage, wherein:
   each of the first and second intermediate stages includes (i) a first input terminal supplied with a clock signal, (ii) a second input terminal supplied with a clock signal different in phase from the clock signal supplied to the first input terminal, (iii) an output terminal connected to the first input terminal via an output transistor, and (iv) a setting circuit, which is connected to the second input terminal and the output transistor, for setting an electric potential of a control terminal of the output transistor;
   the second intermediate stage includes a control circuit which is (i) connected to the setting circuit and (ii) supplied with a control signal;
   an operation period (i) starts at a time when a shift start signal supplied to the initial stage is activated and (ii) ends at a time when an output of the final stage changes from activation to inactivation;
   when the clock signal supplied to the first input terminal of the second intermediate stage is initially activated after the operation period starts, the clock signal supplied to the second input terminal of the second intermediate stage is inactive;
   the first intermediate stage includes an adjustment circuit that is connected to the setting circuit; and
   the adjustment circuit includes an adjustment transistor with a control terminal that is supplied with a constant electric potential signal.

2. The shift register as set forth in claim 1, wherein the clock signal supplied to the first input terminal of the second intermediate stage, and the clock signal supplied to the second input terminal of the second intermediate stage are kept inactive before the operation period starts.

3. The shift register as set forth in claim 1, wherein, when the clock signal supplied to the first input terminal of the first intermediate stage is initially activated after the operation period starts, the clock signal supplied to the second input terminal of the first intermediate stage is not inactive.

4. The shift register as set forth in claim 1, wherein the shift start signal serves as the control signal.

5. The shift register as set forth in claim 1, wherein the setting circuit includes a first setting transistor and a second setting transistor,
   the second setting transistor has a control terminal connected via the first setting transistor to the second input terminal,
   the control terminal of the output transistor is connected to a constant electric potential source via the second setting transistor, and
   when the clock signal supplied to the second input terminal is active, the output transistor is turned off.

6. The shift register as set forth in claim 5, wherein the adjustment transistor is connected to the control terminal of the second setting transistor.

7. The shift register as set forth in claim 5, wherein the adjustment transistor is connected to the control terminal of the output transistor.

8. The shift register as set forth in claim 1, wherein the output transistor has a semiconductor layer made of an oxide semiconductor.

9. The shift register as set forth in claim 1, further comprising a third intermediate stage, wherein:
the third intermediate stage includes (i) a first input terminal, (ii) a second input terminal, (iii) an output terminal connected to the first input terminal via an output transistor, and (iv) a setting circuit, which is connected to the second input terminal and the output transistor, for setting an electric potential of a control terminal of the output transistor;
the first input terminal and the second input terminal are supplied with respective clock signals different in phase from each other;
the third intermediate stage includes a control circuit which is (i) connected to the setting circuit and (ii) supplied with a control signal;
when the clock signal supplied to the first input terminal of the third intermediate stage is initially activated after the operation period starts, the clock signal supplied to the second input terminal of the third intermediate stage is inactive; and
the control signal supplied to the control circuit of the second intermediate stage, and the control signal supplied to the control circuit of the third intermediate stage are supplied via respective different lines.

10. A driver circuit, comprising:
a shift register as set forth in claim 1;
a control line via which the control signal is supplied;
a first clock line via which the clock signal is supplied to the first input terminal; and
a second clock line via which the clock signal is supplied to the second input terminal.

11. The driver circuit as set forth in claim 10, wherein the shift register does not overlap with the control line.

12. A display device, comprising a shift register as set forth in claim 1.

13. A shift register comprising an initial stage, a first intermediate stage, a second intermediate stage, and a final stage, wherein:
each of the first and second intermediate stages includes (i) a first input terminal supplied with a clock signal, (ii) a second input terminal supplied with a clock signal different in phase from the clock signal supplied to the first input terminal, (iii) an output terminal connected to the first input terminal via an output transistor, and (iv) a setting circuit, which is connected to the second input terminal and the output transistor, for setting an electric potential of a control terminal of the output transistor;
the second intermediate stage includes a control circuit which is (i) connected to the setting circuit and (ii) supplied with a control signal;
an operation period (i) starts at a time when a shift start signal supplied to the initial stage is activated and (ii) ends at a time when an output of the final stage changes from activation to inactivation;
when the clock signal supplied to the first input terminal of the second intermediate stage is initially activated after the operation period starts, the clock signal supplied to the second input terminal of the second intermediate stage is inactive; and
the first intermediate stage does not include the control circuit.

14. A shift register, comprising an initial stage, a first intermediate stage, a second intermediate stage, a third intermediate stage, and a final stage, wherein:
each of the first and second intermediate stages includes (i) a first input terminal supplied with a clock signal, (ii) a second input terminal supplied with a clock signal different in phase from the clock signal supplied to the first input terminal, (iii) an output terminal connected to the first input terminal via an output transistor, and (iv) a setting circuit, which is connected to the second input terminal and the output transistor, for setting an electric potential of a control terminal of the output transistor;
the second intermediate stage includes a control circuit which is (i) connected to the setting circuit and (ii) supplied with a control signal;
an operation period (i) starts at a time when a shift start signal supplied to the initial stage is activated and (ii) ends at a time when an output of the final stage changes from activation to inactivation;
when the clock signal supplied to the first input terminal of the second intermediate stage is initially activated after the operation period starts, the clock signal supplied to the second input terminal of the second intermediate stage is inactive;
the third intermediate stage includes (i) a first input terminal, (ii) a second input terminal, (iii) an output terminal connected to the first input terminal via an output transistor, and (iv) a setting circuit, which is connected to the second input terminal and the output transistor, for setting an electric potential of a control terminal of the output transistor;
the first input terminal and the second input terminal of the third intermediate stage are supplied with respective clock signals different in phase from each other;
the third intermediate stage includes a control circuit which is (i) connected to the setting circuit and (ii) supplied with a control signal;
when the clock signal supplied to the first input terminal of the third intermediate stage is initially activated after the operation period starts, the clock signal supplied to the second input terminal of the third intermediate stage is inactive; and
the control signal supplied to the control circuit of the second intermediate stage, and the control signal supplied to the control circuit of the third intermediate stage are supplied via respective different lines.

15. The shift register as set forth in claim 14, wherein the clock signal supplied to the first input terminal of the second intermediate stage, and the clock signal supplied to the second input terminal of the second intermediate stage are kept inactive before the operation period starts.

16. The shift register as set forth in claim 14, wherein, when the clock signal supplied to the first input terminal of the first intermediate stage is initially activated after the operation period starts, the clock signal supplied to the second input terminal of the first intermediate stage is not inactive.

17. The shift register as set forth in claim 14, wherein the shift start signal serves as the control signal.

18. The shift register as set forth in claim 14, wherein the setting circuit includes a first setting transistor and a second setting transistor,
the second setting transistor has a control terminal connected via the first setting transistor to the second input terminal, the control terminal of the output transistor is connected to a constant electric potential source via the second setting transistor, and when the clock signal supplied to the second input terminal is active, the output transistor is turned off.

19. The shift register as set forth in claim 18, wherein the control circuit includes a control transistor which (i) is connected to the control terminal of the second setting transistor and (ii) has a control terminal supplied with the control signal.

20. The shift register as set forth in claim 18, wherein the control circuit includes a control transistor which (i) is connected to the control terminal of the output transistor and (ii) has a control terminal supplied with the control signal.

* * * * *